(12) United States Patent
Lee et al.

(10) Patent No.: US 12,302,551 B2
(45) Date of Patent: May 13, 2025

(54) SEMICONDUCTOR MEMORY DEVICE AND METHOD OF FABRICATING THE SAME

(71) Applicant: SAMSUNG ELECTRONICS CO., LTD., Suwon-si (KR)

(72) Inventors: Kiseok Lee, Hwaseong-si (KR); Keunnam Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 403 days.

(21) Appl. No.: 17/745,960

(22) Filed: May 17, 2022

(65) Prior Publication Data

US 2023/0157002 A1 May 18, 2023

(30) Foreign Application Priority Data

Nov. 12, 2021 (KR) .......................... 10-2021-0155938

(51) Int. Cl.
*H10B 12/00* (2023.01)

(52) U.S. Cl.
CPC ............. *H10B 12/30* (2023.02); *H10B 12/05* (2023.02); *H10B 12/50* (2023.02)

(58) Field of Classification Search
CPC ......... H10B 12/30; H10B 12/05; H10B 12/50
See application file for complete search history.

(56) References Cited

U.S. PATENT DOCUMENTS

| 9,214,470 | B2 | 12/2015 | Ahn |
| 9,812,505 | B2 | 11/2017 | Sakotsubo |
| 10,784,272 | B2 | 9/2020 | Lee et al. |
| 2016/0005760 | A1* | 1/2016 | Lee ...................... H10D 30/693 257/324 |
| 2020/0279601 | A1 | 9/2020 | Kim et al. |
| 2021/0012828 | A1 | 1/2021 | Kim et al. |
| 2021/0091093 | A1 | 3/2021 | Kanamori et al. |
| 2021/0242208 | A1 | 8/2021 | Manfrini et al. |
| 2021/0249415 | A1 | 8/2021 | Kang et al. |
| 2021/0272637 | A1 | 9/2021 | Chen et al. |
| 2022/0285372 | A1* | 9/2022 | Choi ...................... H10B 43/35 |
| 2023/0352529 | A1* | 11/2023 | Jo ...................... H10D 30/6757 |
| 2024/0397716 | A1* | 11/2024 | Yang ...................... H10B 41/35 |

FOREIGN PATENT DOCUMENTS

| KR | 10-2023-0070106 A | 5/2023 |
| TW | 202139426 A | 10/2021 |
| TW | I741691 B | 10/2021 |
| WO | WO 2021/162856 A1 | 8/2021 |

* cited by examiner

*Primary Examiner* — Richard A Booth
(74) *Attorney, Agent, or Firm* — Muir Patent Law, PLLC

(57) ABSTRACT

A semiconductor memory device including a stack including layer groups vertically stacked on a substrate, each of the layer groups including a word line, a lower channel layer, an upper channel layer, and a data storing element electrically connected to the lower channel layer and the upper channel layer; and a bit line at a side of the stack, the bit line extending vertically, wherein the bit line includes a protruding portion connected to the lower channel layer and the upper channel layer of each layer group, the word line of each layer group extends in a first direction parallel to a top surface of the substrate, and the word line of each layer group is sandwiched between the lower channel layer and the upper channel layer of the layer group.

20 Claims, 125 Drawing Sheets

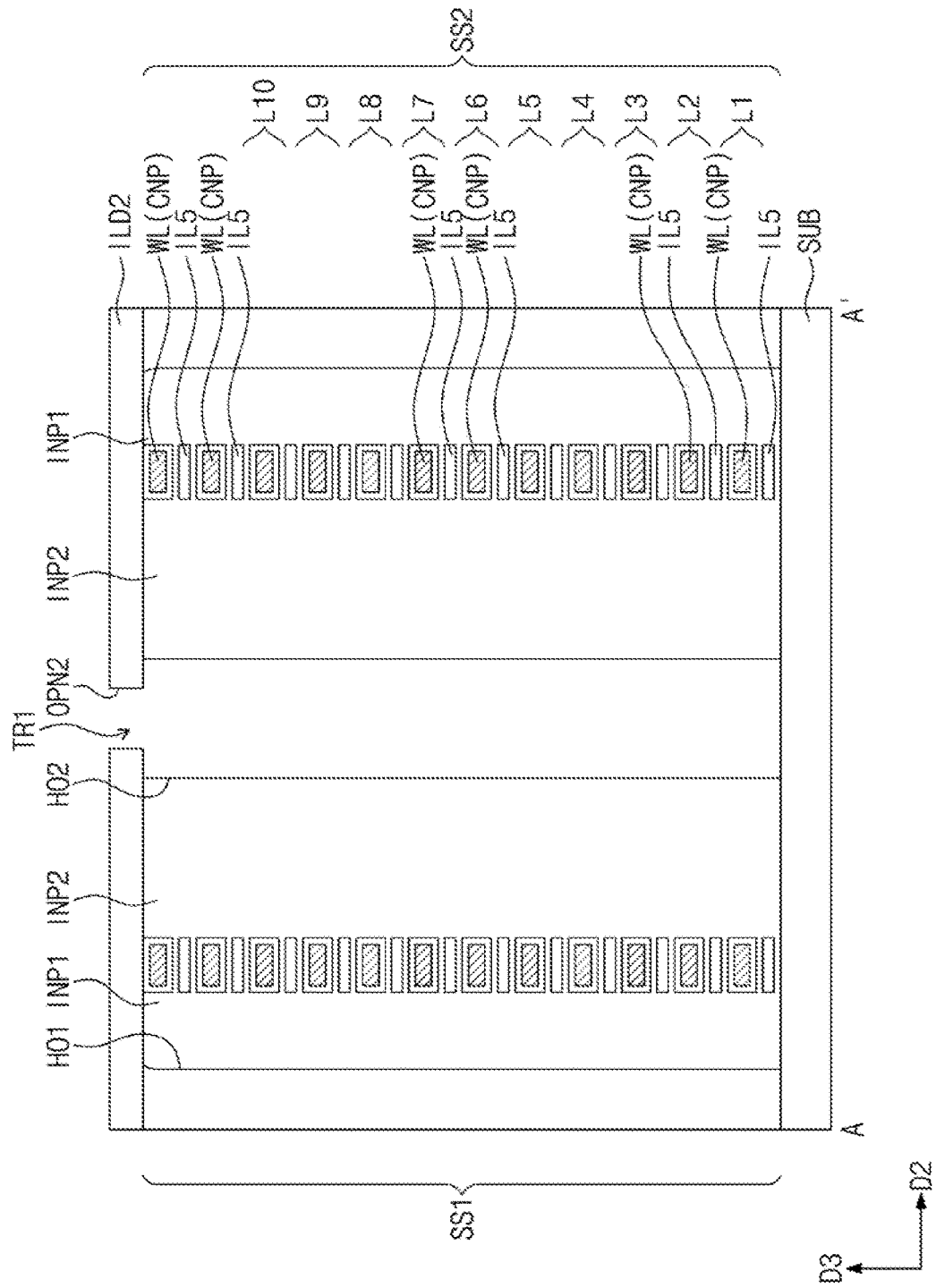

SEMICONDUCTOR MEMORY DEVICE AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2021-0155938, filed on Nov. 12, 2021, in the Korean Intellectual Property Office, the entire contents of which are hereby incorporated by reference.

BACKGROUND

1. Field

Embodiments relate to a semiconductor device and a method of fabricating the same.

2. Description of the Related Art

Higher integration of semiconductor devices may help satisfy consumer demands for superior performance and inexpensive prices. In the case of semiconductor devices, integration is an important factor in determining product prices, and increased integration may be desirable. In the case of two-dimensional or planar semiconductor devices, their integration may be mainly determined by the area occupied by a unit memory cell, and integration may be greatly influenced by the level of a fine pattern forming technology.

SUMMARY

The embodiments may be realized by providing a semiconductor memory device including a stack including layer groups vertically stacked on a substrate, each of the layer groups including a word line, a lower channel layer, an upper channel layer, and a data storing element electrically connected to the lower channel layer and the upper channel layer; and a bit line at a side of the stack, the bit line extending vertically, wherein the bit line includes a protruding portion connected to the lower channel layer and the upper channel layer of each layer group, the word line of each layer group extends in a first direction parallel to a top surface of the substrate, and the word line of each layer group is sandwiched between the lower channel layer and the upper channel layer of the layer group.

The embodiments may be realized by providing a semiconductor memory device including a stack including layer groups vertically stacked on a substrate, each of the layer groups including a word line, a lower channel layer, an upper channel layer, and a data storing element electrically connected to the lower channel layer and the upper channel layer; and a bit line at a side of the stack, the bit line extending vertically, wherein in each of the layer groups, the upper channel layer and the lower channel layer are vertically separated from each other, the word line of each of the layer groups extends horizontally between the lower channel layer and the upper channel layer, the lower channel layer and the upper channel layer of each of the layer groups are electrically connected to the bit line, the layer groups include a first layer group and a second layer group, which are sequentially stacked, and a first vertical distance between the lower channel layer of the first layer group and the upper channel layer of the first layer group is different from a second vertical distance between the upper channel layer of the first layer group and the lower channel layer of the second layer group.

The embodiments may be realized by providing a semiconductor memory device including a stack including layer groups vertically stacked on a substrate, each of the layer groups including a memory cell transistor and a data storing element electrically connected to the memory cell transistor; and a bit line at a side of the stack, the bit line extending vertically, wherein the bit line electrically connects the stacked memory cell transistors of the layer groups to each other, the memory cell transistor of each of the layer groups includes a lower channel layer between the bit line and the data storing element; an upper channel layer between the bit line and the data storing element, the upper channel layer being vertically separated from the lower channel layer; and a word line between the lower channel layer and the upper channel layer, the word line of each of the layer groups includes a gate portion sandwiched between and overlapped with the lower channel layer and the upper channel layer; and a connecting portion connecting the gate portions that are adjacent to each other, and a width of the gate portion is larger than a width of the connecting portion, as measured in a same direction.

BRIEF DESCRIPTION OF THE DRAWINGS

Features will be apparent to those of skill in the art by describing in detail exemplary embodiments with reference to the attached drawings in which:

FIGS. 11A, 13A, 15A, 17A, 19A, 21A, 23A, 25A, 27A, 29A, 31A, 33A, 35A, 37A, 39A, 41A, 43A, and 45A are sectional views taken along lines A-A' of FIGS. 10, 12, 14, 16, 18, 20, 22, 24, 26, 28, 30, 32, 34, 36, 38, 40, 42, and 44, respectively.

DETAILED DESCRIPTION

Figure 1:
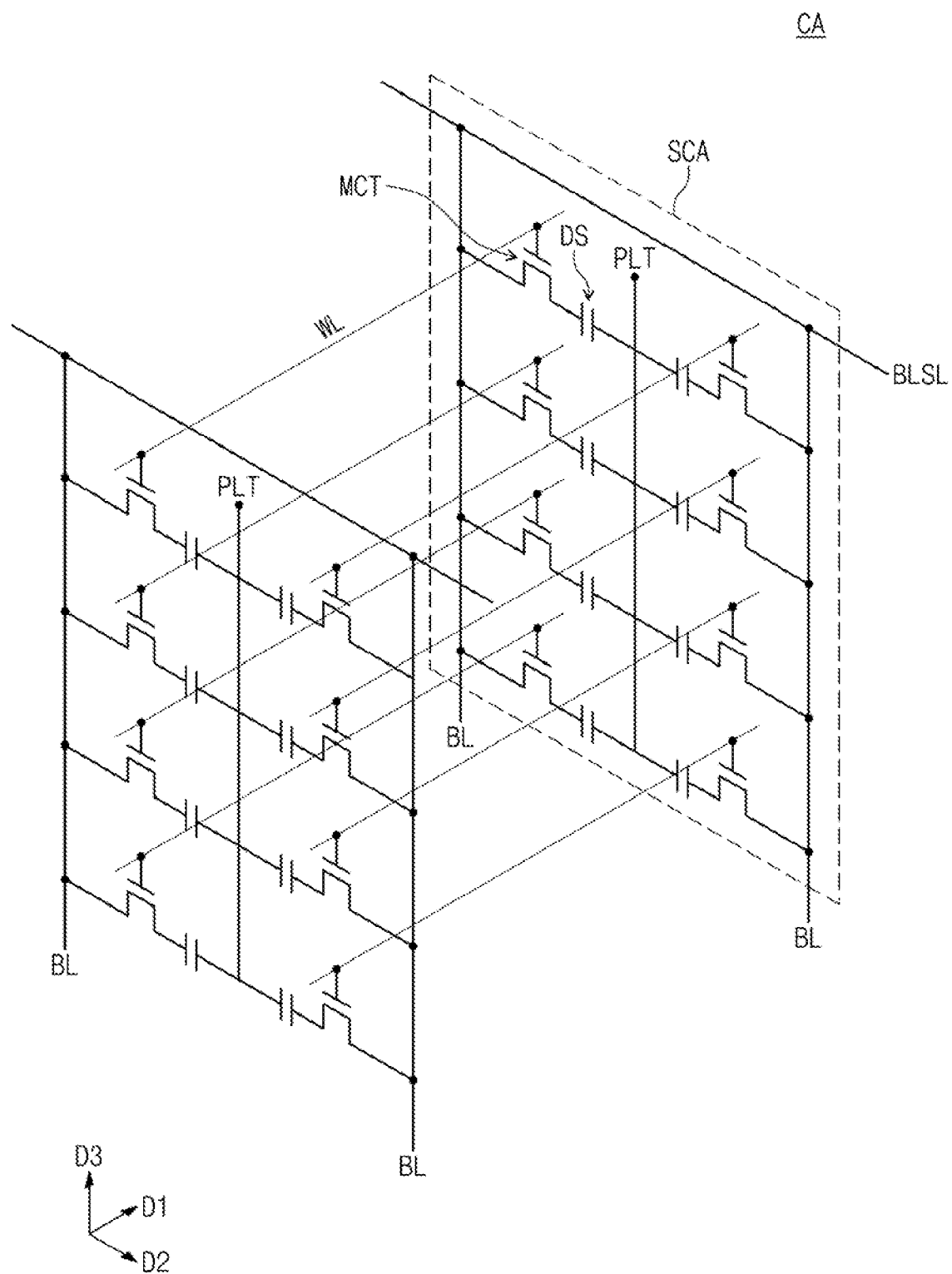
FIG. 1 is a circuit diagram of a cell array of a three-dimensional semiconductor memory device according to an embodiment.

FIG. 1 is a circuit diagram of a cell array of a three-dimensional semiconductor memory device according to an embodiment.

Referring to FIG. 1, a three-dimensional semiconductor memory device may include a cell array CA including a plurality of sub-cell arrays SCA. The sub-cell arrays SCA may be arranged in a first direction D1.

Each of the sub-cell arrays SCA may include a plurality of bit lines BL, a plurality of word lines WL, and a plurality of memory cell transistors MCT. Each of the memory cell transistors MCT may be between a corresponding one of the word lines WL and a corresponding one of the bit lines BL.

Each of the bit lines BL may be a conductive pattern (e.g., metal line) which extends (e.g., lengthwise) in a direction (i.e., a third direction D3) perpendicular to a substrate. The bit lines BL in each sub-cell array SCA may be arranged in a second direction D2. The bit line BL may be connected in common to the memory cell transistors MCT, which are stacked in the third direction D3.

The word lines WL may be conductive patterns (e.g., metal lines), which are stacked on the substrate in the third direction D3. Each of the word lines WL may extend (e.g., lengthwise) in the first direction D1. Each of the word lines WL may be connected in common to the memory cell transistors MCT of the sub-cell arrays SCA while extending in the first direction D1.

The memory cell transistor MCT may include a gate and a first source/drain, which are respectively connected to the word line WL and the bit line BL. The memory cell transistor MCT may further include a second source/drain, which is connected to a data storing element DS. In an implementation, the data storing element DS may be a capacitor. The second source/drain of the memory cell transistor MCT may be connected to a first electrode of the capacitor.

Figure 2:
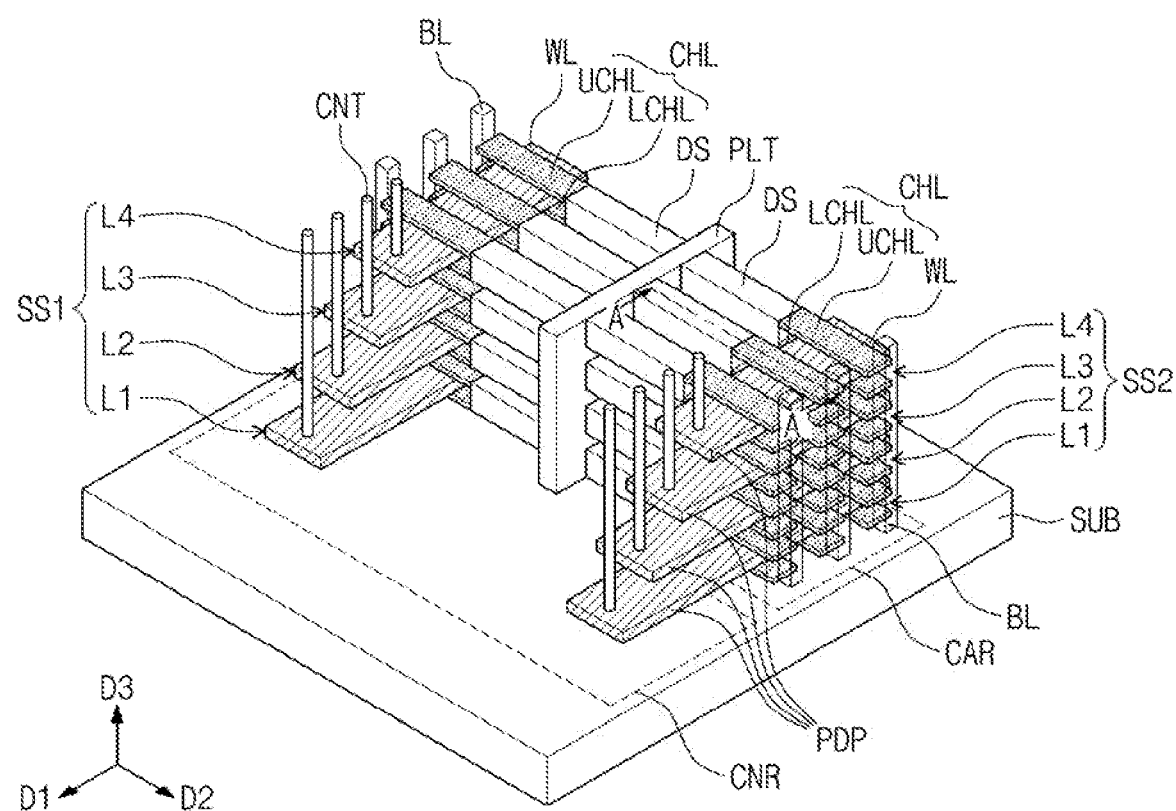
FIG. 2 is a perspective view of a three-dimensional semiconductor memory device according to an embodiment.
Figure 3:
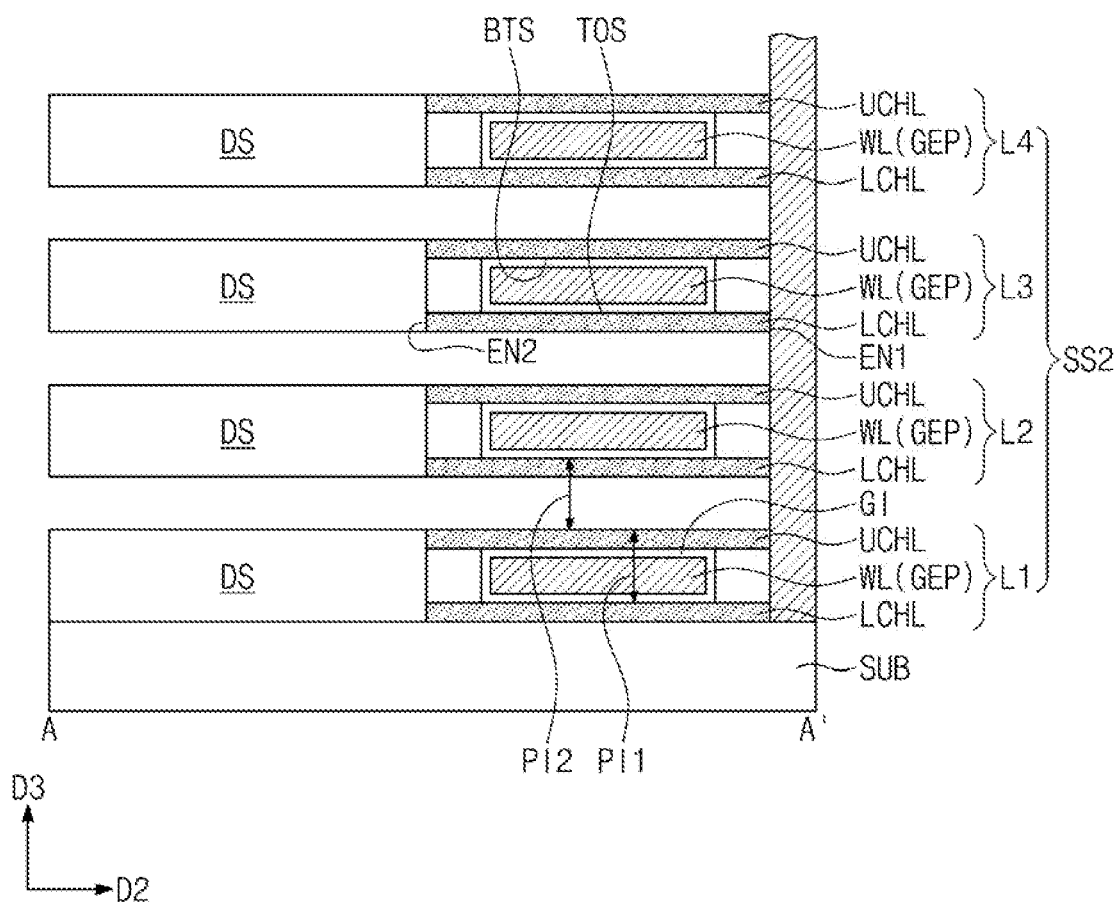
FIG. 3 is a sectional view taken along a line A-A' of FIG. 2.
Figure 4A:
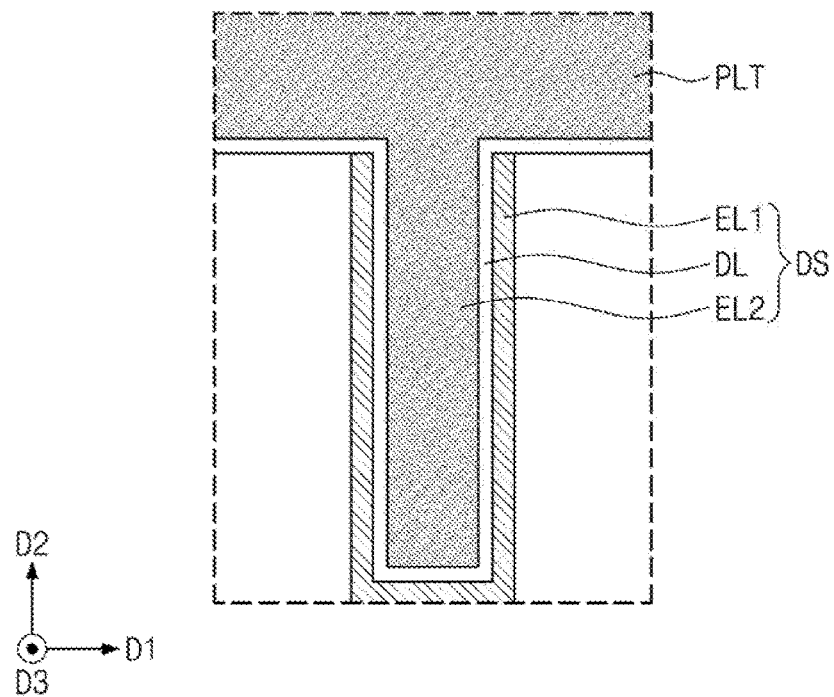
FIGS. 4A to 4C are plan views of some examples of a data storing element of FIG. 2.
Figure 4B:
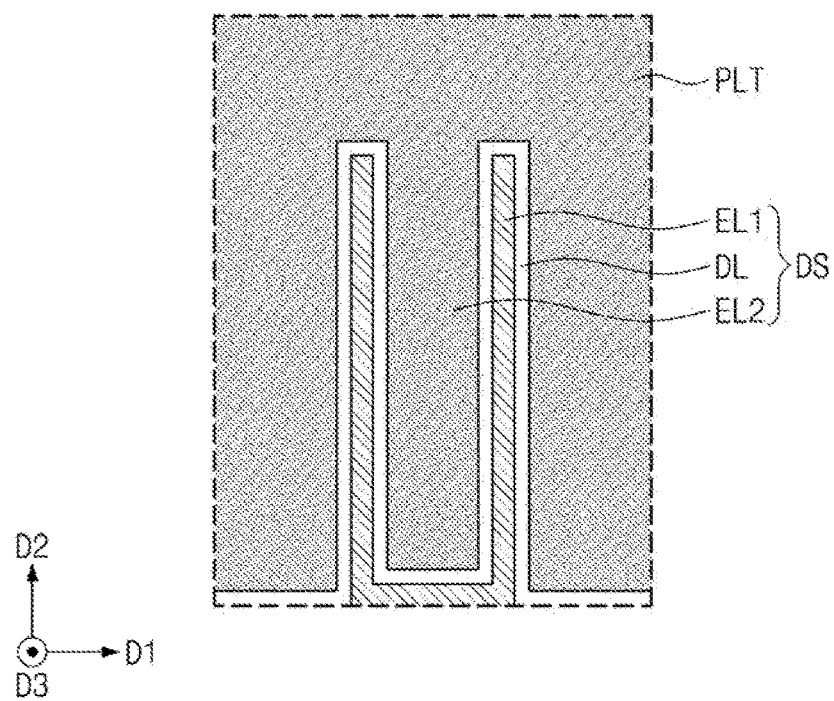
Figure 4C:
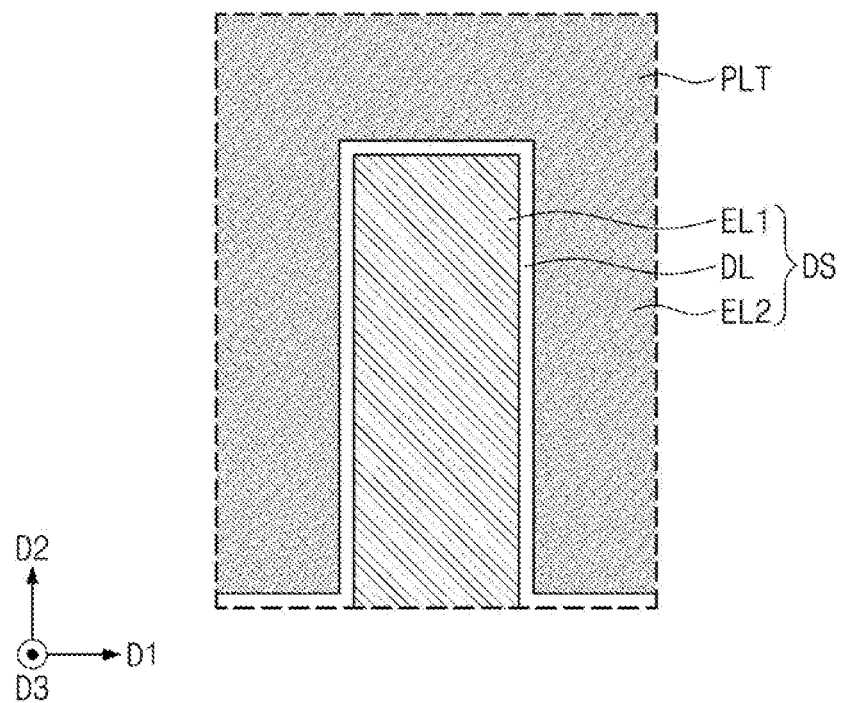

FIG. 2 is a perspective view of a three-dimensional semiconductor memory device according to an embodiment. FIG. 3 is a sectional view taken along a line A-A' of FIG. 2. FIGS. 4A to 4C are plan views of some examples of a data storing element of FIG. 2.

Referring first to FIGS. 1 and 2, a first stack SS1 and a second stack SS2 may be on a substrate SUB. The substrate SUB may be, e.g., a silicon wafer, a germanium wafer, or a silicon-germanium wafer. The substrate SUB may include a cell array region CAR and a connection region CNR. As used herein, the term "or" is not an exclusive term, e.g., "A or B" would include A, B, or A and B.

The first and second stacks SS1 and SS2 may extend in from the cell array region CAR of the substrate SUB to the connection region CNR in the first direction D1. The first and second stacks SS1 and SS2 on the cell array region CAR of the substrate SUB may constitute the cell array CA of the three-dimensional semiconductor memory device previously described with reference to FIG. 1.

In an implementation, each of the first and second stacks SS1 and SS2 may include a first layer (e.g., layer group) L1, a second layer L2, a third layer L3, and a fourth layer L4, which are sequentially stacked on the substrate SUB. The first to fourth layers L1 to L4 may be sequentially stacked to be spaced apart from each other in the vertical or third direction D3. Each of the first to fourth layers L1 to L4 may include the word line WL extending in in the first direction D1, a plurality of channel layers CHL on the word line WL, and a plurality of data storing elements DS connected to the channel layers CHL, respectively.

The word line WL in each layer may be a line-shaped pattern extending in the first direction D1. The word line WL may include a plurality of gate portions GEP, which are adjacent to the channel layers CHL, respectively (e.g., see FIG. 3). The word line WL may be formed of or include a conductive material. In an implementation, the conductive material may include, e.g., doped semiconductor materials (e.g., doped silicon, doped germanium, or the like), conductive metal nitrides (e.g., titanium nitride, tantalum nitride, or the like), metals (e.g., tungsten, titanium, tantalum, or the like), or metal-semiconductor compounds (e.g., tungsten silicide, cobalt silicide, titanium silicide, or the like).

Referring to FIG. 3, a gate insulating layer GI may cover a surface of the word line WL. In an implementation, the surface of the word line WL may be surrounded or wrapped with the gate insulating layer GI. The gate insulating layer GI may be formed of or include a high-k dielectric material, silicon oxide, silicon nitride, or silicon oxynitride, and may have a single- or multi-layered structure. In an implementation, the high-k dielectric materials may include, e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The channel layers CHL of each layer may be arranged in the first direction D1. Each of the channel layers CHL may extend in the second direction D2 crossing the first direction D1. Each of the channel layers CHL may include an upper channel layer UCHL and a lower channel layer LCHL, which are respectively on and below the gate portion GEP of the word line WL. The upper channel layer UCHL and the lower channel layer LCHL may serve as channel regions of a single memory cell transistor. The upper and lower channel layers UCHL and LCHL may be spaced apart from each other and, In an implementation, they may behave like a single channel layer. A relationship between the upper and lower channel layers UCHL and LCHL and the gate portion GEP of the word line WL will be described in more detail with reference to FIG. 3.

The gate insulating layer GI may be between the upper and lower channel layers UCHL and LCHL and the word line WL. In an implementation, the upper and lower channel layers UCHL and LCHL may be spaced apart from the word line WL by the gate insulating layer GI. The upper and lower channel layers UCHL and LCHL may include a semiconductor material, which may be formed on the word line WL using a deposition process. The channel layer CHL may include a semiconductor material, which may be used as a channel region of a memory cell transistor even when it has an amorphous structure as a result of the deposition process.

In an implementation, the upper and lower channel layers UCHL and LCHL may be formed of or include an amorphous oxide semiconductor material. In an implementation, the channel layer CHL may be formed of or include a compound containing oxygen (O) and at least two of zinc (Zn), indium (In), gallium (Ga), and tin (Sn). In an implementation, the upper and lower channel layers UCHL and LCHL may be formed of or include indium gallium zinc oxide (IGZO) or indium tin zinc oxide (ITZO).

In an implementation, the upper and lower channel layers UCHL and LCHL may be formed of or include a two-dimensional semiconductor material. In an implementation, the upper and lower channel layers UCHL and LCHL may be formed of or include, e.g., metal chalcogenide, transition metal chalcogenide, graphene, or phosphorene. The metal chalcogenide or transition metal chalcogenide may be a metal compound, which may be represented by the chemical formula of $MX_y$, where y may be an integer (e.g., 1, 2, or 3). In the chemical formula, M may be a metal atom or a transition metal atom and may include, e.g., W, Mo, Ti, Zn, Zs, or Zr. In the chemical formula, X may be a chalcogen atom and may include, e.g., S, Se, O, or Te. In an implementation, the upper and lower channel layers UCHL and LCHL may be formed of or include, e.g., graphene, phosphorene, $MoS_2$, $MoSe_2$, $MoTe_2$, $WS_2$, $WSe_2$, $WTe_2$, $ReS_2$, $ReSe_2$, $TiS_2$, $TiSe_2$, $TiTe_2$, ZnO, $ZnS_2$, $ZsSe_2$, $WO_3$, or $MoO_3$. Each of the upper and lower channel layers UCHL and LCHL may have a mono-layered structure or a multi-layered structure, in which 2 to 100 layers are stacked. The multi-layered structure may be realized using several pairs of monolayers coupled by a Van der Waals force.

By using the channel layer CHL according to an embodiment, it may be possible to prevent a floating body effect, which could otherwise occur when a channel region is formed of a semiconductor material such as silicon (Si). In addition, the amorphous oxide semiconductor material or the two-dimensional semiconductor material for the channel layer CHL may be formed using a deposition process, it may be easy to realize vertically-stacked channels or a three-dimensional structure of channels.

Referring back to FIG. 2, the data storing element DS may be connected to an end of the channel layer CHL. The data storing element DS may be parallel to an extension direction of the channel layer CHL (i.e., the second direction D2). A first electrode EL1 of the data storing element DS, which will be described below, may be extended parallel to the second direction D2.

The data storing element DS may be a memory element, which is configured to store data. A capacitor, a magnetic tunnel junction pattern, or a variable resistance material (e.g., a phase-change material) may be used as a memory element in the data storing element DS. In an implementation, the data storing element DS may be a capacitor.

The data storing elements DS of the first and second stacks SS1 and SS2 may be three-dimensionally arranged. The data storing elements DS may be connected in common to a plate PLT provided between the first and second stacks SS1 and SS2.

FIGS. 4A to 4C illustrate some examples of the capacitor provided as the data storing element DS. Referring to FIG. 4A, the data storing element DS may include a first electrode EL1, a second electrode EL2, and a dielectric layer DL. The first electrode EL1 may be connected to an end of the channel layer CHL. The end of the channel layer CHL connected to the first electrode EL1 may be a drain region (or a source region). The second electrode EL2 may be connected to the plate PLT. The dielectric layer DL may be between the first electrode EL1 and the second electrode EL2. The first electrode EL1 may have a hollow cylinder shape. The second electrode EL2 may be in an internal space of the hollow cylindrical first electrode EL1.

Each of the first and second electrodes EL1 and EL2 may be independently formed of or include, e.g., metallic materials (e.g., titanium, tantalum, tungsten, copper, or aluminum), conductive metal nitrides (e.g., titanium nitride or tantalum nitride), or doped semiconductor materials (e.g., doped silicon or doped germanium). The dielectric layer DL may be formed of or include, e.g., high-k dielectric materials (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate).

Referring to FIG. 4B, the first electrode EL1 may have a hollow cylinder shape, like that in FIG. 4A. The second electrode EL2 may be not only in an internal space of the first electrode EL1 but also on an outer surface of the first electrode EL1. In an implementation, the second electrode EL2 may surround the first electrode EL1.

Referring to FIG. 4C, the first electrode EL1 may be provided in the form of a solid cylinder or a pillar. The second electrode EL2 may face an outer surface of the first electrode EL1.

In an implementation, the capacitor of the data storing element DS may have various shapes illustrated in FIGS. 4A to 4C, or may have other suitable shapes.

Referring back to FIGS. 2 and 3, a plurality of the bit lines BL, which extend in a vertical direction (i.e., the third direction D3), may be on the substrate SUB. The channel layers UCHL and LCHL, which are vertically stacked in the third direction D3, may be connected to each other through the bit line BL. The bit lines BL may be arranged in the first direction D1. Each of the bit lines BL may be electrically connected to the source regions (or the drain regions) of the vertically-stacked channel layers UCHL and LCHL. The bit line BL may be formed of or include a conductive material (e.g., doped semiconductor materials, conductive metal nitrides, metals, or metal-semiconductor compounds).

The three-dimensional semiconductor memory device may include the bit line BL, which is vertically extended, and the word line WL, which is horizontally extended to cross the bit line BL. Accordingly, it may be possible to reduce a process defect in a process of forming a three-dimensional memory cell array and to improve reliability of the device.

Each of the word lines WL may include a pad portion PDP on the connection region CNR of the substrate SUB. The pad portion PDP may be at an end of the word line WL. The pad portions PDP stacked on the connection region CNR may be arranged to form a staircase structure. Contacts CNT may be respectively coupled to the pad portions PDP of the staircase structure.

In an implementation, empty spaces in the first and second stacks SS1 and SS2 may be filled with an insulating material. In an implementation, the insulating material may include, e.g., silicon oxide, silicon nitride, or silicon oxynitride. Interconnection lines, which are electrically connected to the bit lines BL and the word lines WL, may be on the first and second stacks SS1 and SS2. In an implementation, the interconnection line may be electrically connected to the word line WL through the contact CNT.

Referring back to FIG. 3, the upper and lower channel layers UCHL and LCHL and the gate portion GEP of the word line WL of each of the first to fourth layers L1 to L4 may constitute one of the memory cell transistors MCT illustrated in FIG. 1. Each of the upper and lower channel layers UCHL and LCHL may include a first end EN1 and a second end EN2, which are opposite to each other in the second direction D2. The first end EN1 of the channel layer UCHL or LCHL may be used as a source region (or a drain region) and may be connected to the bit line BL. The second end EN2 of the channel layer UCHL or LCHL may be used as the drain region (or the source region) and may be connected to the data storing element DS.

The gate portion GEP may be sandwiched between the upper and lower channel layers UCHL and LCHL. In an implementation, the gate portion GEP may be between a top surface TOS of the lower channel layer LCHL and a bottom surface BTS of the upper channel layer UCHL. The gate portion GEP may have an inner gate structure, which may be in a space enclosed by the channel layer UCHL and LCHL. In the memory cell transistor according to an embodiment, a channel region may enclose a gate electrode or to have a three-dimensional structure. The top surface TOS of the lower channel layer LCHL and the bottom surface BTS of the upper channel layer UCHL may be covered with the gate insulating layer GI.

A distance (in the third direction D3, e.g., a vertical distance) between the lower channel layer LCHL of the first layer L1 and the upper channel layer UCHL of the first layer L1 may be a first distance PI1. In the present specification, the term "distance" may mean a vertical pitch. In an implementation, the first distance PI1 may be a vertical distance between a top surface of the lower channel layer LCHL of the first layer L1 and a top surface of the upper channel layer UCHL of the second layer L2.

A vertical distance between the upper channel layer UCHL of the first layer L1 and the lower channel layer LCHL of the second layer L2 may be a second distance PI2. In an implementation, the first distance PI1 may be different from the second distance PI2. In an implementation, the first distance PI1 may be larger or smaller than the second distance PI2. In an implementation, the first distance PI1 may be substantially equal to the second distance PI2.

Figure 5:
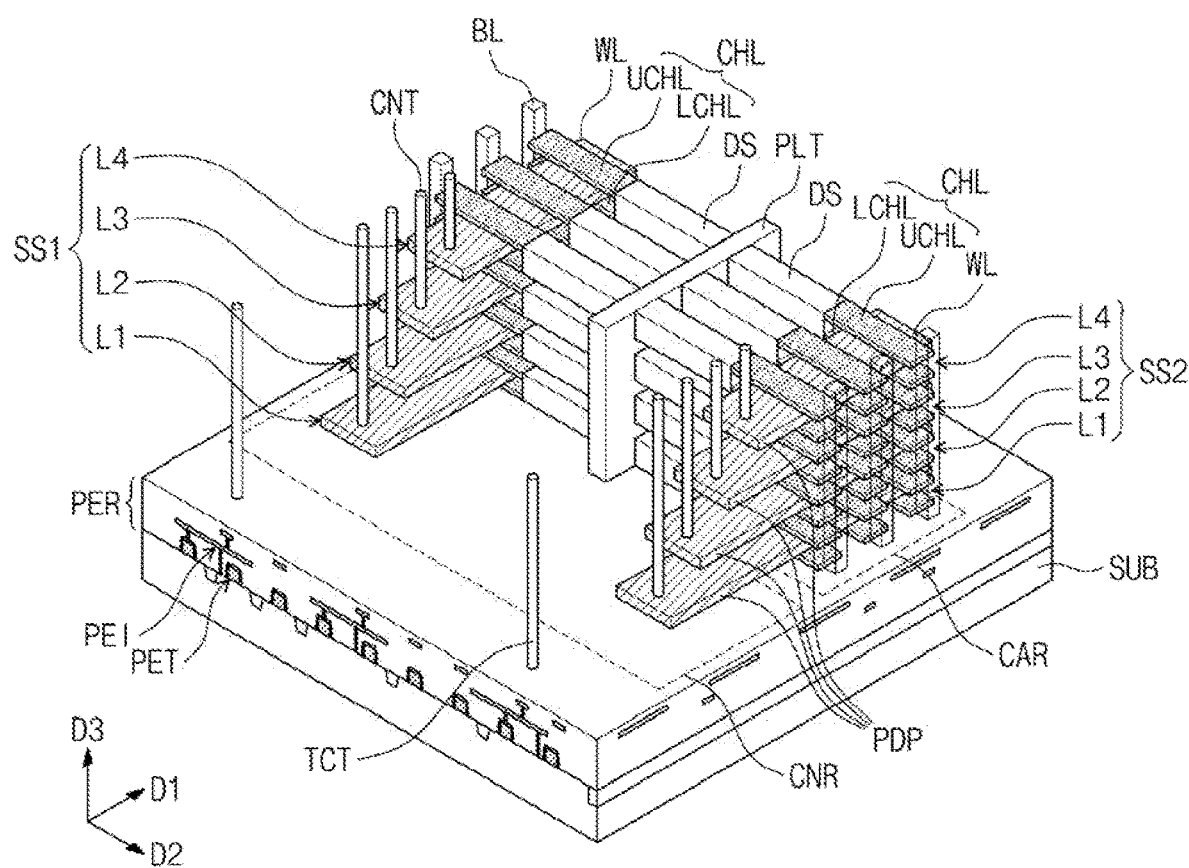
FIGS. 5, 6, and 7 are perspective views, each of which illustrates a three-dimensional semiconductor memory device according to an embodiment.
Figure 6:
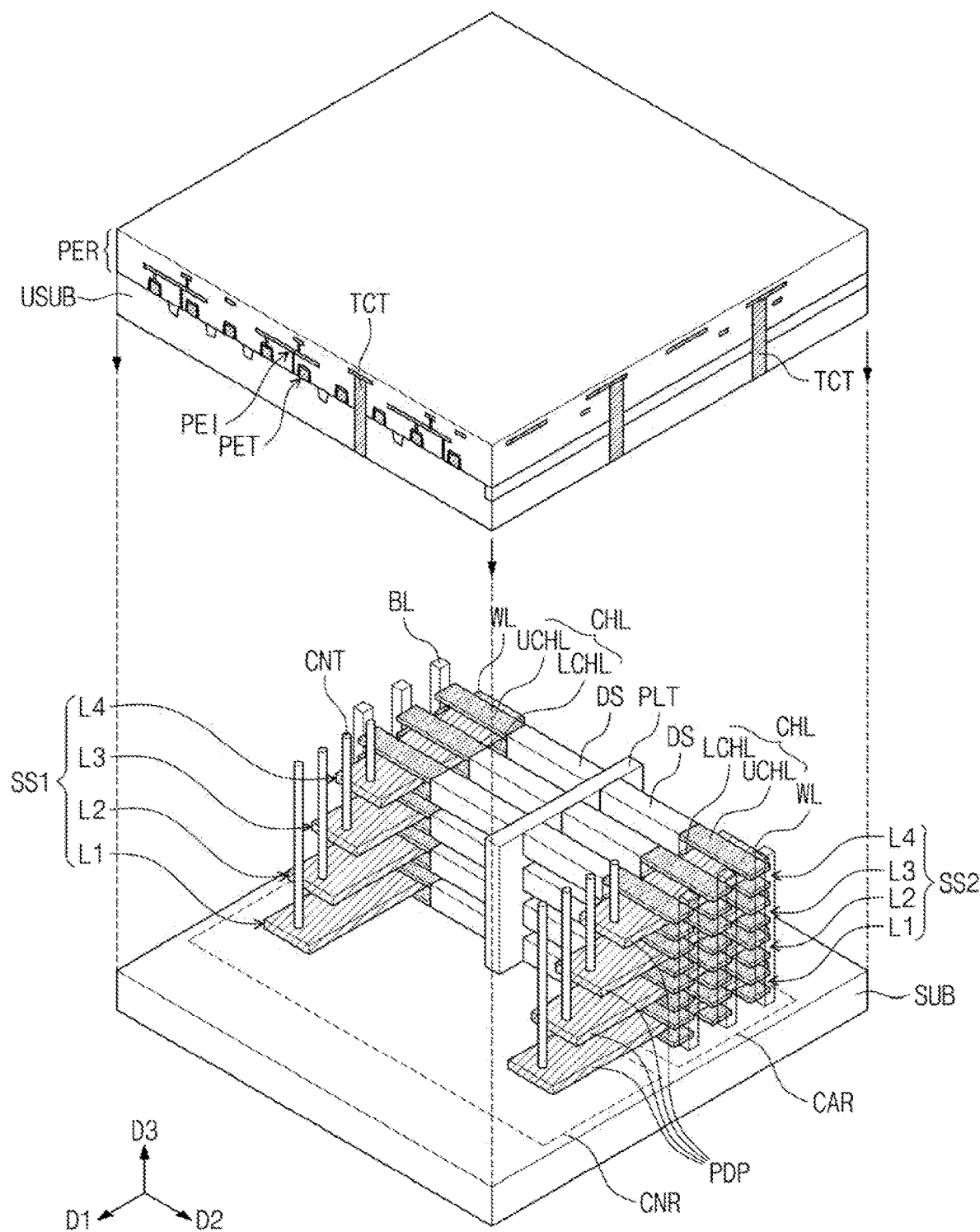
Figure 7:
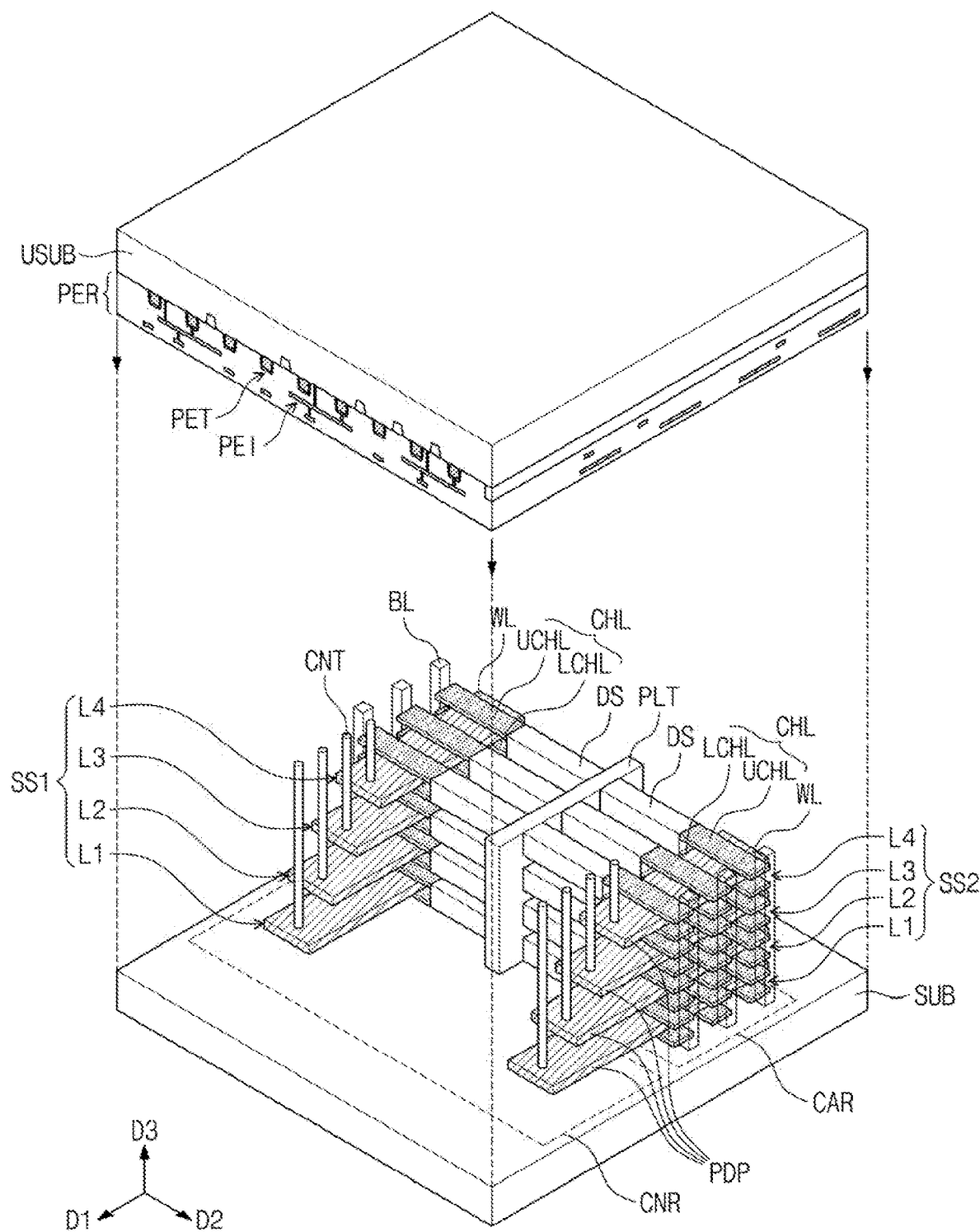

FIGS. 5, 6, and 7 are perspective views, each of which illustrates a three-dimensional semiconductor memory device according to an embodiment. In the following description of the embodiments of FIGS. 5 to 7, an element previously described with reference to FIGS. 1 to 4C may be identified by the same reference number without repeating an overlapping description thereof.

Referring to FIG. 5, a peripheral circuit layer PER may be on the substrate SUB. The peripheral circuit layer PER may be between the substrate SUB and the first and second stacks SS1 and SS2. In an implementation, the peripheral circuit layer PER may be below a memory cell array layer composed of the first and second stacks SS1 and SS2.

The peripheral circuit layer PER may include a plurality of peripheral transistors PET and a plurality of peripheral interconnection lines PEI, which are on the substrate SUB. The peripheral interconnection lines PEI may be on the peripheral transistors PET and may be connected to the peripheral transistors PET through contact plugs.

The penetration contacts TCT may be further between the peripheral circuit layer PER. The penetration contact TCT may vertically extend from the interconnection lines on the first and second stacks SS1 and SS2 toward the peripheral circuit layer PER. The peripheral circuit layer PER may be electrically connected to the interconnection lines on the first and second stacks SS1 and SS2 through the penetration contacts TCT.

In an implementation, the peripheral circuit layer PER may include sense amplifiers electrically connected to the bit lines BL. In an implementation, the peripheral circuit layer PER may include row decoders or sub-word line drivers, which are electrically connected to the word lines WL.

Referring to FIG. 6, an upper substrate USUB and a peripheral circuit layer PER may be on the memory cell array layer composed of the first and second stacks SS1 and SS2. The peripheral circuit layer PER may be provided on the upper substrate USUB (e.g., a semiconductor wafer). The peripheral circuit layer PER may be configured to have substantially the same features as that in FIG. 5. The upper substrate USUB may be bonded to the substrate SUB, on which the first and second stacks SS1 and SS2 are provided, in a wafer bonding manner.

At least one penetration contact TCT may vertically extend from the peripheral interconnection line PEI of the peripheral circuit layer PER to penetrate the upper substrate USUB. The penetration contact TCT may be connected to the interconnection lines on the first and second stacks SS1 and SS2. In an implementation, the peripheral circuit layer PER may be electrically connected to the interconnection lines on the first and second stacks SS1 and SS2 through the penetration contacts TCT.

Referring to FIG. 7, an upper substrate USUB and a peripheral circuit layer PER may be on the memory cell array layer composed of the first and second stacks SS1 and SS2. The peripheral circuit layer PER may face the substrate SUB. In an implementation, the upper substrate USUB may be at a topmost level of the memory device and may be exposed to the outside.

In an implementation, a metal pad (e.g., copper) may be between the peripheral circuit layer PER and the memory cell array layer to electrically connect them to each other. In an implementation, a first metal pad, which is at the uppermost level of the memory cell array layer, may be bonded to a second metal pad, which is at the lowermost level of the peripheral circuit layer PER, to electrically connect the interconnection line of the memory cell array layer to the peripheral interconnection line PEI of the peripheral circuit layer PER.

Figure 8:
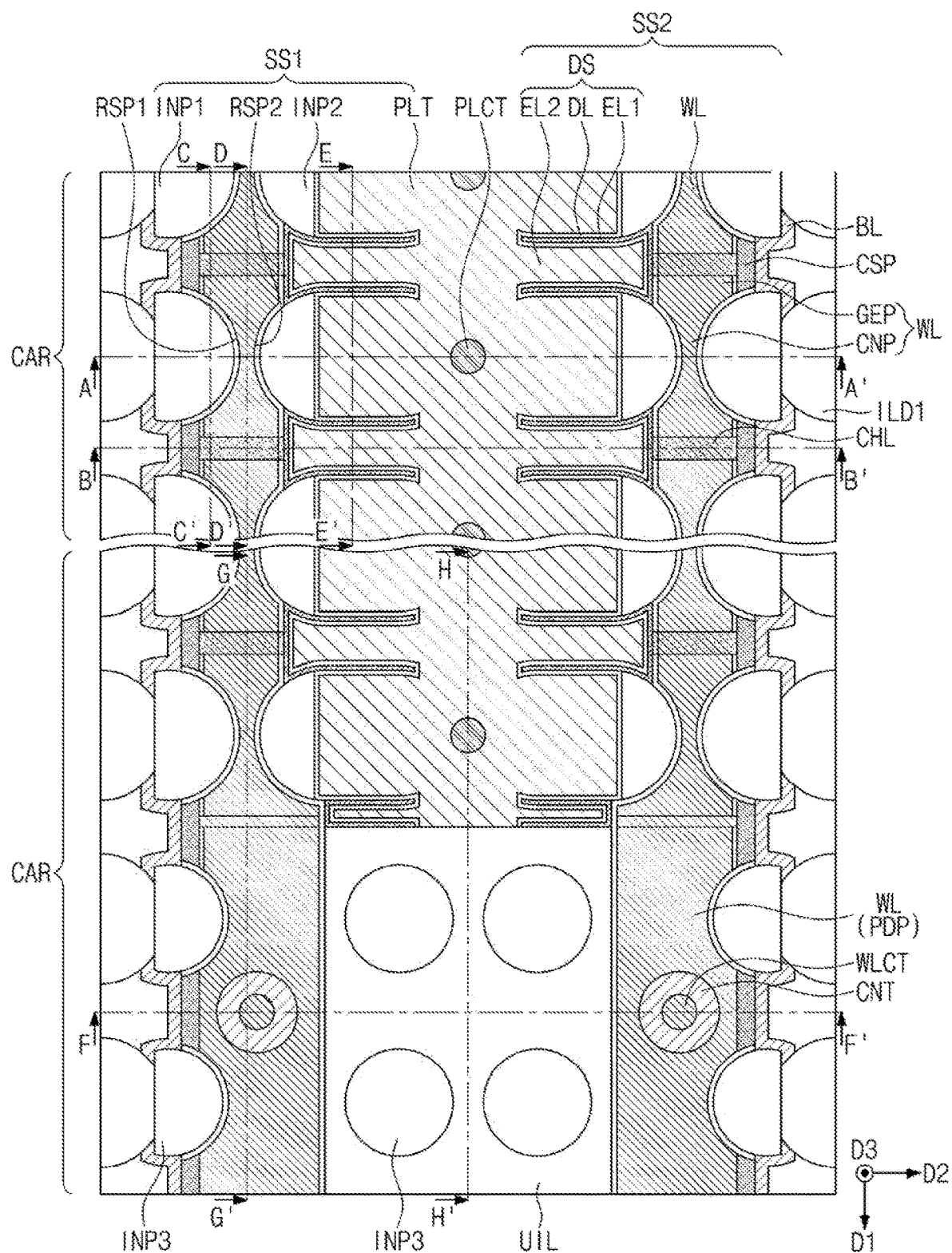
FIG. 8 is a plan view of a three-dimensional semiconductor memory device according to an embodiment.

FIG. 8 is a plan view of a three-dimensional semiconductor memory device according to an embodiment. FIGS. 9A to 9H are sectional views, which are respectively taken along lines A-A', B-B', C-C', D-D', E-E', F-F', G-G', and H-H' of FIG. 8. In the following description of the embodiment of FIGS. 8 and 9A to 9H, an element previously described with reference to FIGS. 1 to 7 may be identified by the same reference number without repeating an overlapping description thereof.

First, a cell array structure, which is on the cell array region CAR of the substrate SUB, will be described with reference to FIGS. 8 and 9A to 9E. The first and second stacks SS1 and SS2 may be on the cell array region CAR of the substrate SUB. The first and second stacks SS1 and SS2, which are adjacent to each other in the second direction D2, may be spaced apart from each other with the plate PLT therebetween. The first and second stacks SS1 and SS2 may have a mirror-symmetry to each other with respect to the plate PLT.

Figure 9A:
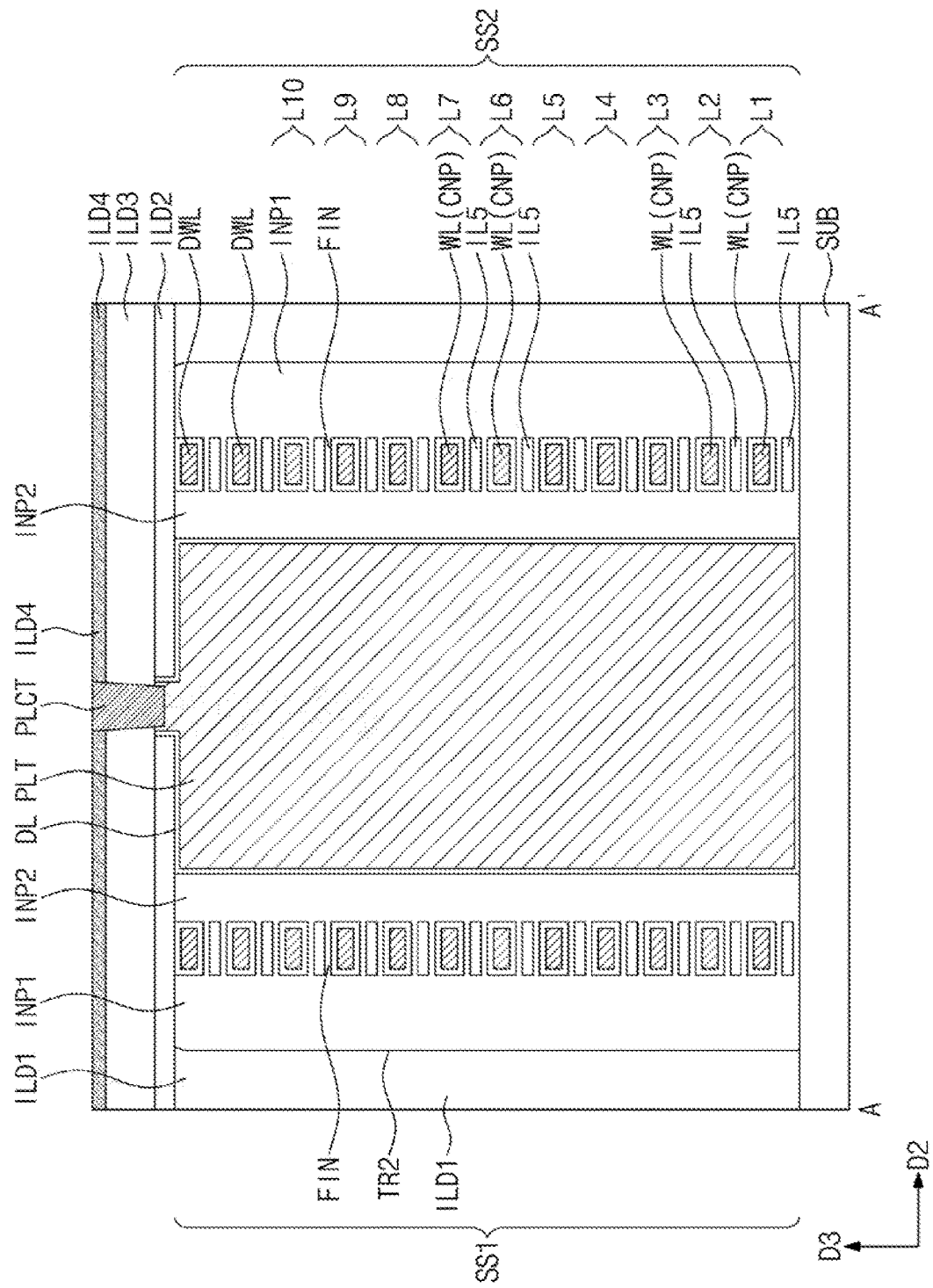
FIGS. 9A to 9H are sectional views, which are respectively taken along lines A-A', B-B', C-C', D-D', E-E', F-F', G-G', and H-H' of FIG. 8.
Figure 9B:
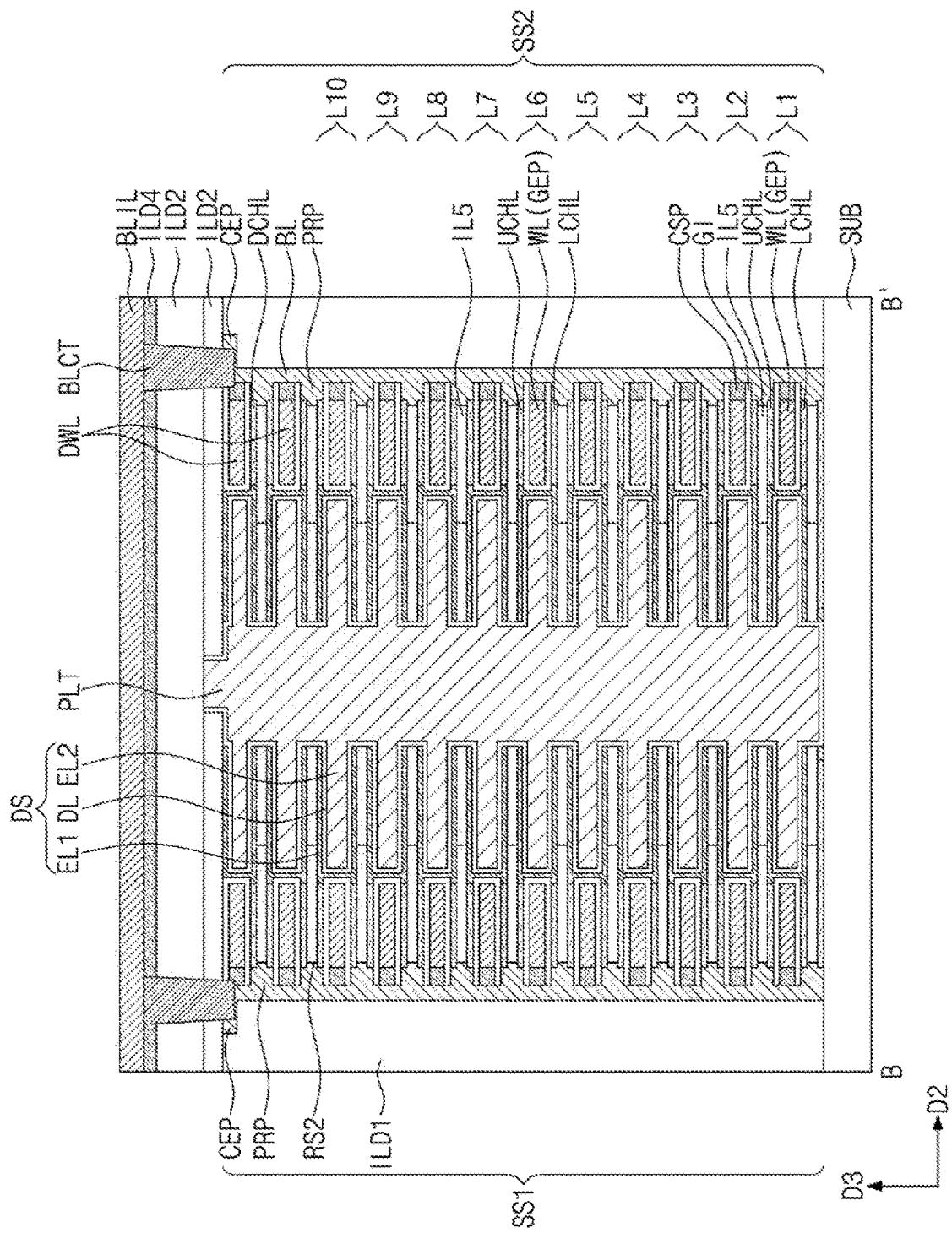
Figure 9C:
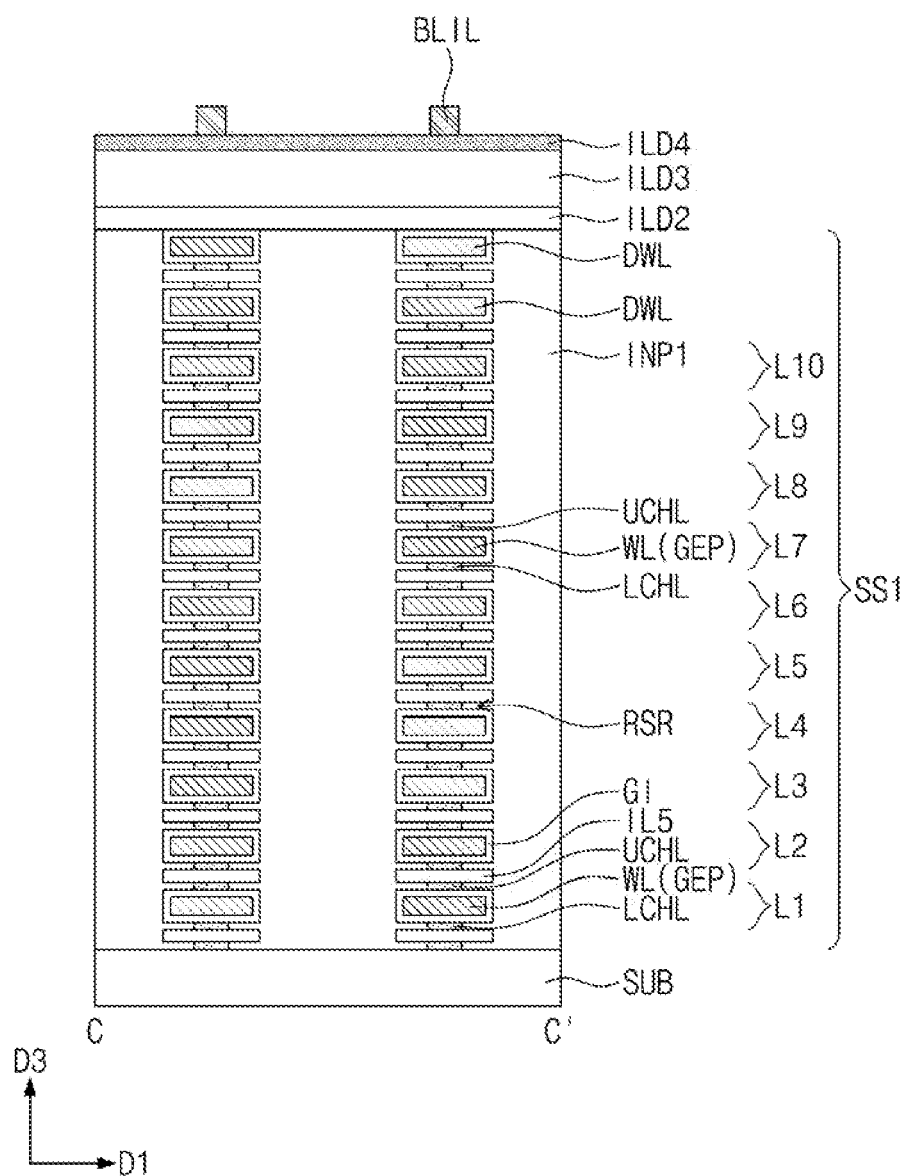

Referring to FIG. 9B, each of the first and second stacks SS1 and SS2 may include first to tenth layers L1 to L10, which are sequentially stacked on the substrate SUB. Each of the first to tenth layers L1 to L10 may include the word line WL, the upper and lower channel layers UCHL and LCHL, the gate insulating layer GI, a capping pattern CSP, and a protruding portion PRP, which is a portion of the bit line BL. Each of the first to tenth layers L1 to L10 may further include the data storing element DS, which is electrically connected to the upper and lower channel layers UCHL and LCHL. In an implementation, the first to tenth layers L1 to L10 may be present, or additional layers may be repeatedly stacked on the tenth layer L10. In each of the first to tenth layers L1 to L10, the gate portion GEP of the word line WL may be sandwiched between the upper and lower channel layers UCHL and LCHL.

A fifth insulating layer IL5 may be between adjacent layers. In an implementation, the fifth insulating layer IL5 may be between the upper channel layer UCHL of the first layer L1 and the lower channel layer LCHL of the second layer L2. In an implementation, the fifth insulating layer IL5 may include a silicon oxide layer.

The bit line BL may extend in the vertical direction (i.e., the third direction D3) or along a sidewall of a corresponding one of the stacks SS1 and SS2. The bit line BL may include a plurality of protruding portions PRP, which horizontally extend toward the channel layer UCHL or LCHL. The upper and lower channel layers UCHL and LCHL in each layer may be connected to each other by the protruding portion PRP of the bit line BL. The channel layers UCHL and LCHL of the first to tenth layers L1 to L10, which are aligned to each other in the third direction D3, may be connected in common to the bit line BL through the protruding portions PRP.

The word lines WL of the first to tenth layers L1 to L10 may be stacked to be aligned to each other in the third direction D3. Each of the word lines WL may have a line shape extending in the first direction D1. The word line WL may include the gate portions GEP and connecting portions CNP, which may connect the gate portions GEP to each other. The gate portions GEP may be respectively between the upper and lower channel layers UCHL and LCHL. The connecting portion CNP may connect the gate portions GEP, which are adjacent to each other in the first direction D1, to each other. The gate portions GEP, which are arranged in the first direction D1, may be connected to each other by the connecting portions CNP, thereby constituting a single word line WL.

Referring to FIG. 8, when viewed in a plan view, the word line WL may have a first recessed sidewall RSP1 and a second recessed sidewall RSP2, which are opposite to each other in the second direction D2. The connecting portion CNP may be defined by the first and second recessed sidewalls RSP1 and RSP2. Due to the presence of the first and second recessed sidewalls RSP1 and RSP2, the connecting portion CNP may have a linewidth smaller than that of the gate portion GEP. The connecting portion CNP may have a bottleneck shape. Owing to the connecting portion CNP defined by the first and second recessed sidewalls RSP1 and RSP2, the word line WL may have a wavy sidewall profile, rather than a straight or flat profile.

Referring to FIG. 9B, the capping pattern CSP may be between the gate portion GEP of the word line WL and the bit line BL. The capping pattern CSP may electrically disconnect or isolate the gate portion GEP of the word line WL from the bit line BL.

The gate portion GEP may be between the upper and lower channel layers UCHL and LCHL in each layer. As described above, the memory cell transistor may have an inner gate structure (i.e., a three-dimensional structure), in which the gate portion GEP is placed in the channel layer UCHL and LCHL. Owing to the three-dimensional structure of the gate portion GEP and the channel layer UCHL or LCHL, the channel controllability by the gate portion GEP may be improved in the memory cell transistor according to the present embodiment.

In an implementation, as previously described with reference to FIG. 3, a first vertical distance between the lower and upper channel layers LCHL and UCHL in one of the layers may be different from a second vertical distance between the lower and upper channel layers LCHL and UCHL in others of the layers.

In an implementation, the fifth insulating layer IL5 between a vertically-adjacent pair of the word lines WL may include a shielding pattern. The shielding pattern may help suppress a crosstalk issue between adjacent ones of the word lines WL and thereby may reduce a coupling capacitance therebetween. In an implementation, the shielding pattern, along with the word line WL, may extend in the first direction D1 and may be connected to a node applied with a ground voltage.

In an implementation, the fifth insulating layer IL5 between the vertically-adjacent pair of the word lines WL may include an air gap. Due to a relatively low dielectric constant of the air gap, it is possible to help suppress a crosstalk issue between the adjacent ones of the word lines WL and thereby to reduce a coupling capacitance therebetween. If the air gap were absent, a thickness of the fifth insulating layer IL5 could be increased to lower a capacitance between the word lines WL. However, according to the present embodiment, the air gap having a low dielectric constant may be between the word lines WL, and it is possible to reduce the thickness of the fifth insulating layer IL5. As a result, the stacks SS1 and SS2 may have a relatively small thickness.

Each of the channel layers UCHL and LCHL may include a channel region, a source region, and a drain region. The source region (or the drain region) of the channel layer UCHL or LCHL may be connected to the protruding portion PRP of the bit line BL. The drain region (or the source region) of the channel layer UCHL or LCHL may be connected to the first electrode EL1 of the data storing element DS. The channel region of the channel layer UCHL or LCHL may be between the source region and the drain region. The channel region of the channel layer UCHL or LCHL may be vertically overlapped with the gate portion GEP.

The gate insulating layer GI may be between the channel layer UCHL or LCHL and the gate portion GEP. The gate insulating layer GI may cover a surface of the word line WL. The gate insulating layer GI may cover a surface of the capping pattern CSP.

The protruding portion PRP of the bit line BL may extend to an end of the channel layer UCHL or LCHL and may be in direct contact with the channel layer UCHL or LCHL. As a result, the bit line BL may be electrically connected to the source region (or the drain region) of the channel layer UCHL or LCHL.

Referring to FIGS. 8 and 9A, a plurality of first insulating pillars INP1 may penetrate the stacks SS1 and SS2. The first insulating pillars INP1 may be arranged in the first direction D1. The first recessed sidewall RSP1 of the word line WL may be defined by each of the first insulating pillars INP1.

A plurality of second insulating pillars INP2 may penetrate the stacks SS1 and SS2. The second insulating pillars INP2 may be arranged in the first direction D1. The second insulating pillars INP2 may be adjacent to the first insulating pillars INP1, and the connecting portions CNP of the word line WL may be respectively between first and second insulating pillars INP1 and INP2. The second recessed sidewall RSP2 of the word line WL may be defined by each of the second insulating pillars INP2.

Figure 9D:
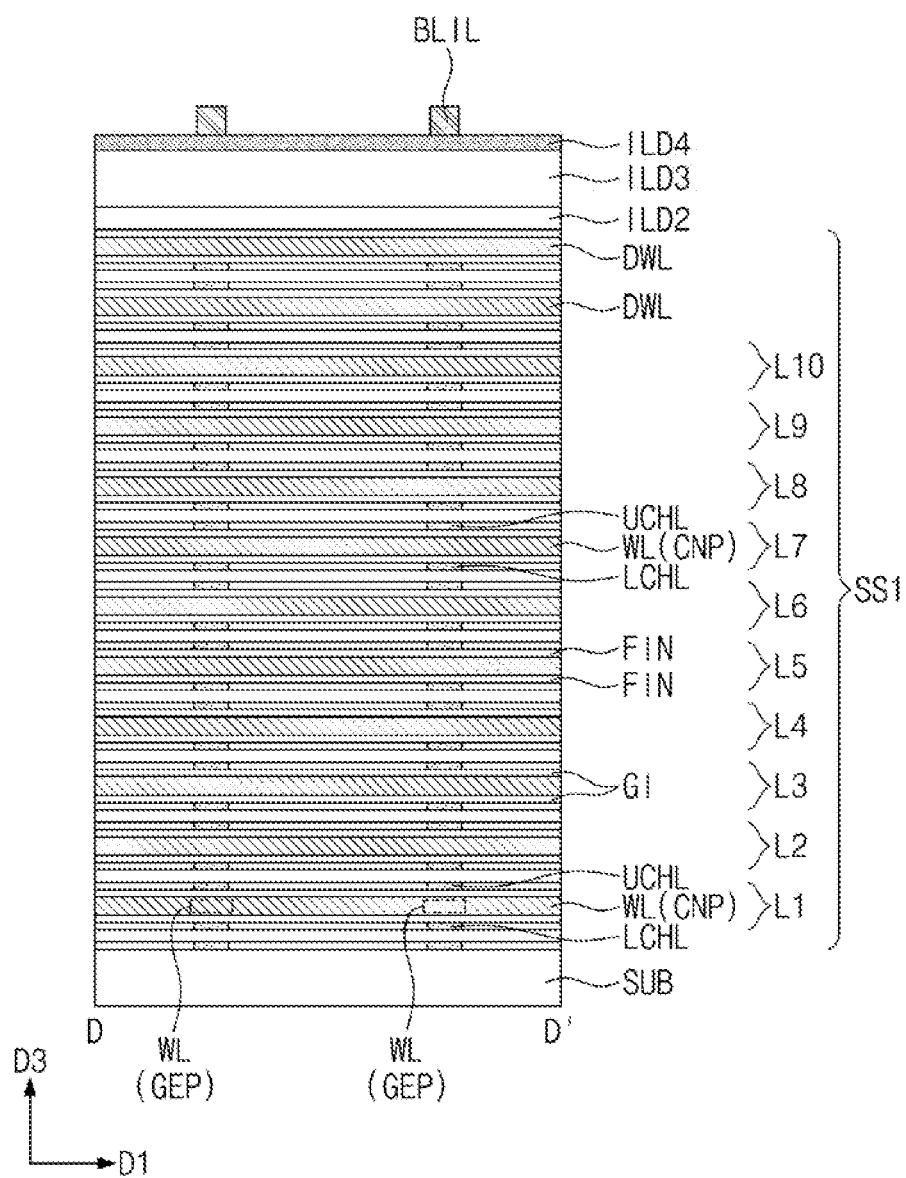

Referring to FIG. 9A, the first and second insulating pillars INP1 and INP2 may be electrically connected to each other by a filling insulating layer FIN. Referring to FIG. 9D, the channel layers UCHL and LCHL in adjacent ones of the layers may be separated from each other by the filling insulating layer FIN and the fifth insulating layer IL5. In an implementation, each of the first and second insulating pillars INP1 and INP2 may be formed of or include silicon oxide.

Figure 9E:
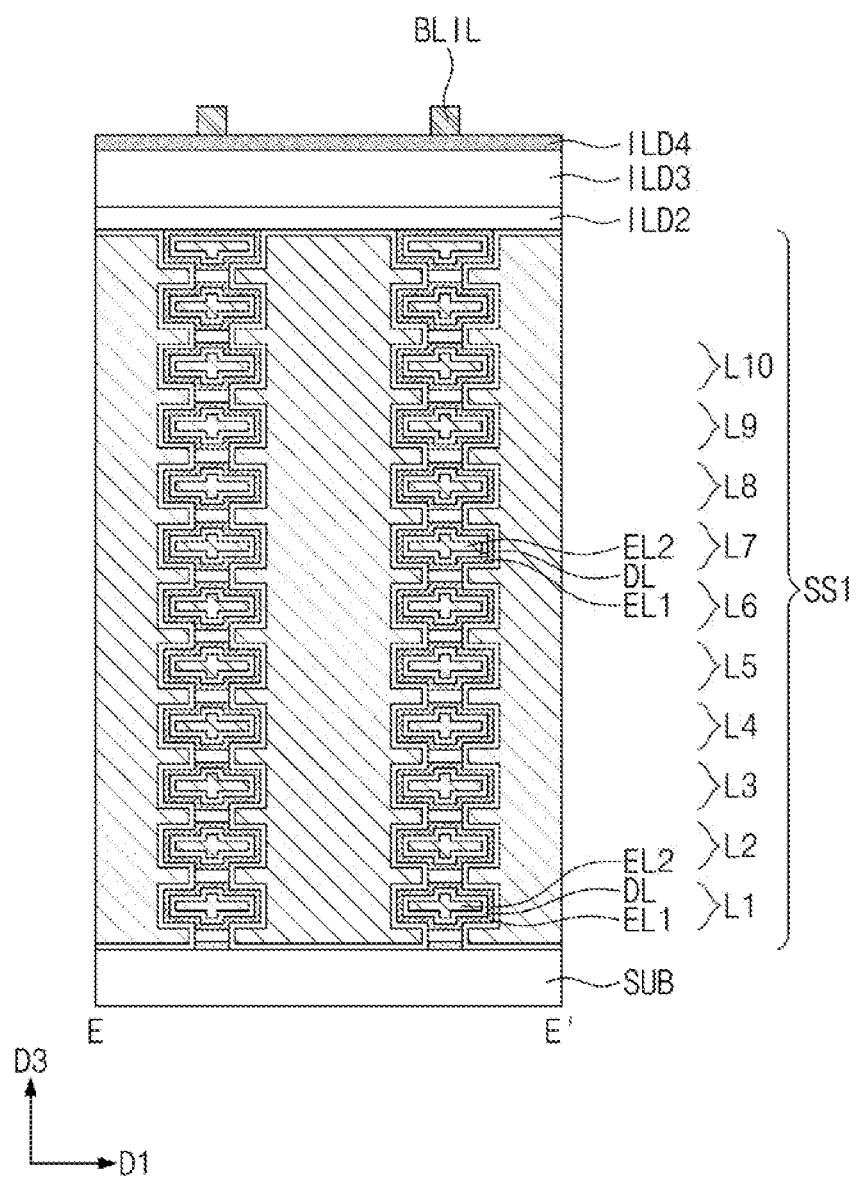
Figure 9F:
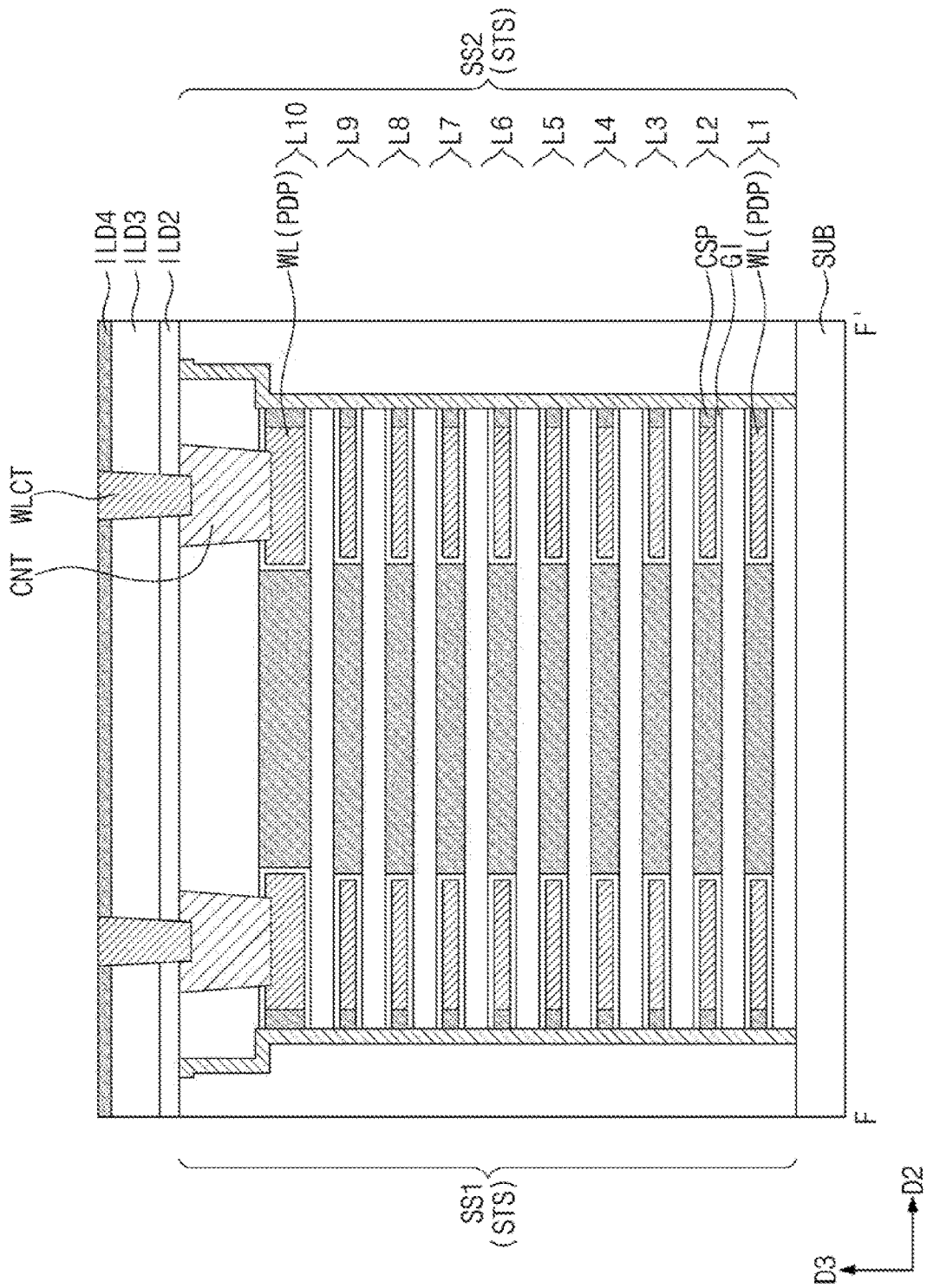

Referring to FIGS. 9B and 9E, each of the data storing elements DS may include the first electrode EL1, the dielectric layer DL, and the second electrode EL2. The data storing elements DS in each of the first and second stacks SS1 and SS2 may share one dielectric layer DL and one second electrode EL2. In an implementation, a plurality of first electrodes EL1 may be in each of the first and second stacks SS1 and SS2, and surfaces of the first electrodes EL1 may be covered with one dielectric layer DL. In an implementation, one second electrode EL2 may be on one dielectric layer DL.

The data storing element DS in the present embodiment may have the capacitor structure previously described with reference to FIG. 4A. In an implementation, as shown in FIG. 9E, the first electrode EL1 may have a hollow cylinder shape. The second electrode EL2 may be in the cylindrical internal space of the first electrode EL1. In an implementation, the data storing element DS may have the same structure as that illustrated in FIG. 4B or 4C.

The first electrodes EL1 in each layer may be arranged in the first direction D1.

The first electrode EL1 may be connected to an end of the channel layer UCHL or LCHL. In an implementation, the first electrode EL1 may be connected to the drain region (or the source region) of the channel layer UCHL or LCHL. The second electrodes EL2 may be connected in common to the plate PLT. The plate PLT may be between the first and second stacks SS1 and SS2.

Each of the first and second stacks SS1 and SS2 may include at least one dummy word line DWL and at least one dummy channel layer DCHL, which are on the uppermost layer (e.g., the tenth layer L10). In an implementation, the dummy word line DWL and the dummy channel layer DCHL may be a buffer structure in a process of forming the memory cell transistors and the data storing elements DS which are composed of the first to tenth layers L1 to L10.

A first interlayer insulating layer ILD1 may be on a side surface of each of the first and second stacks SS1 and SS2. The first interlayer insulating layer ILD1 may cover the bit lines BL. The bit lines BL, which are arranged in the first direction D1, may be electrically separated from each other by the first interlayer insulating layer ILD1.

A second interlayer insulating layer ILD2 may be on the first and second stacks SS1 and SS2. Referring to FIG. 9A, the plate PLT may include an upper portion that extends to penetrate the second interlayer insulating layer ILD2 and to have an upward protruding shape. Third and fourth interlayer insulating layers ILD3 and ILD4 may be on the second interlayer insulating layer ILD2. Each of the first to fourth interlayer insulating layers ILD1 to ILD4 may include a silicon nitride layer, a silicon oxynitride layer, a carbon-containing silicon oxide layer, a carbon-containing silicon nitride layer, or a carbon-containing silicon oxynitride layer.

Each of the bit lines BL may include a pad CEP at the top level thereof. A bit-line contact BLCT may penetrate the second to fourth interlayer insulating layers ILD2, ILD3, and ILD4. The bit-line contact BLCT may be coupled to the pad CEP of the bit line BL.

Bit line straps BLIL may be on the fourth interlayer insulating layer ILD4. The bit-line straps BLIL may be line-shaped patterns, which extend in the second direction D2 and parallel to each other. Each of the bit-line straps BLIL may be a metal line. The bit-line strap BLIL may be connected to the bit-line contact BLCT, and the bit-line strap BLIL may be electrically connected to the bit line BL through the bit-line contact BLCT.

A plate contact PLCT may penetrate the third and fourth interlayer insulating layers ILD3 and ILD4 and to be coupled to the protruding portion of the plate PLT. The plate contact PLCT may be electrically connected to an upper metal line through a via plug.

Now, a pad structure on the connection region CNR of the substrate SUB will be described in more detail with reference to FIGS. 8 and 9F to 9H. The word lines WL may extend from the cell array region CAR to the connection region CNR in the first direction D1. Each of the word lines WL may include the pad portion PDP, which is on the connection region CNR.

The word lines WL on the connection region CNR may form the staircase structure (hereinafter, STS), as previously described with reference to FIG. 2. A height of the staircase structure STS may decrease in the first direction D1. Due to the staircase structure STS, top surfaces of the stacked word lines WL may be exposed sequentially to the outside of the stack SS1 or SS2 from top to bottom.

Figure 9G:
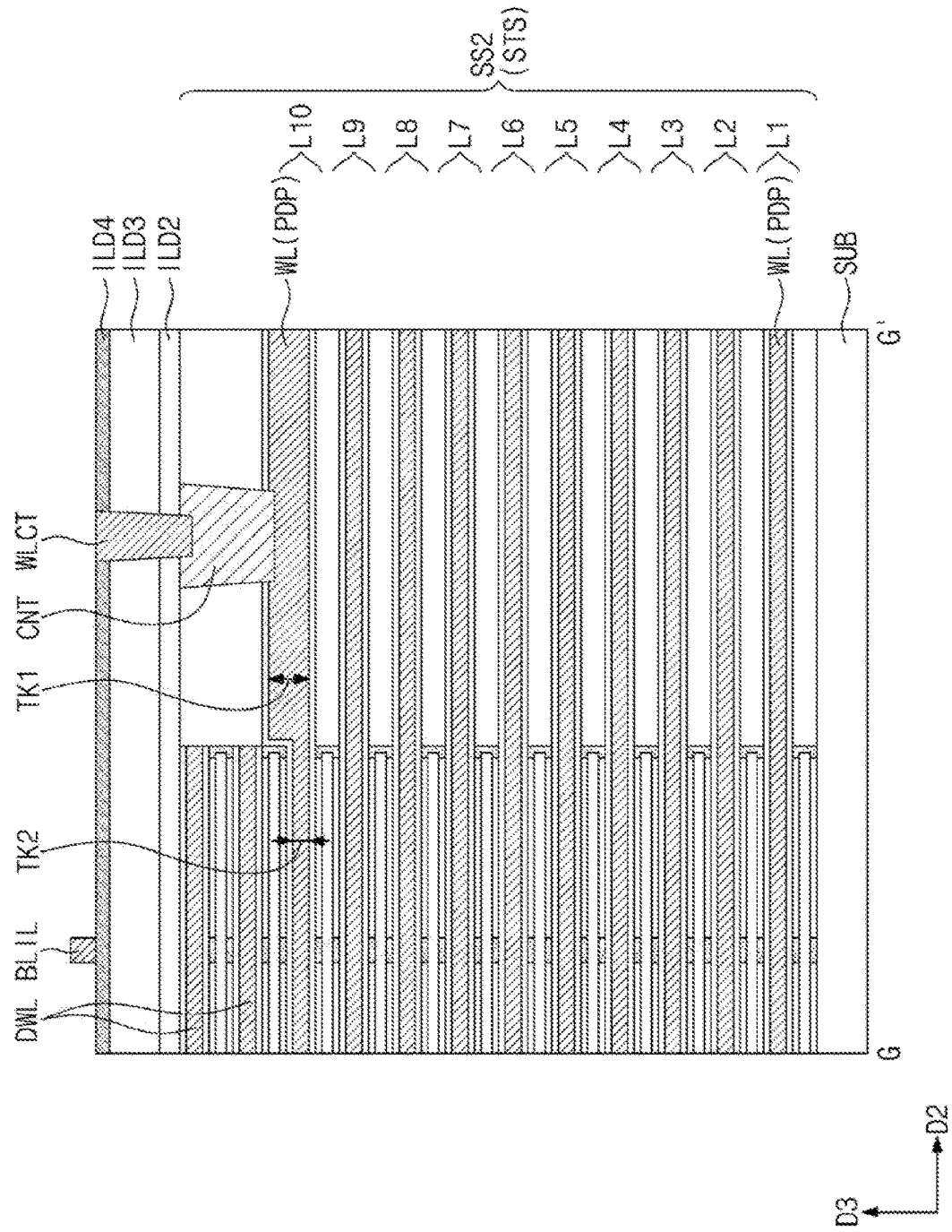
Figure 9H:
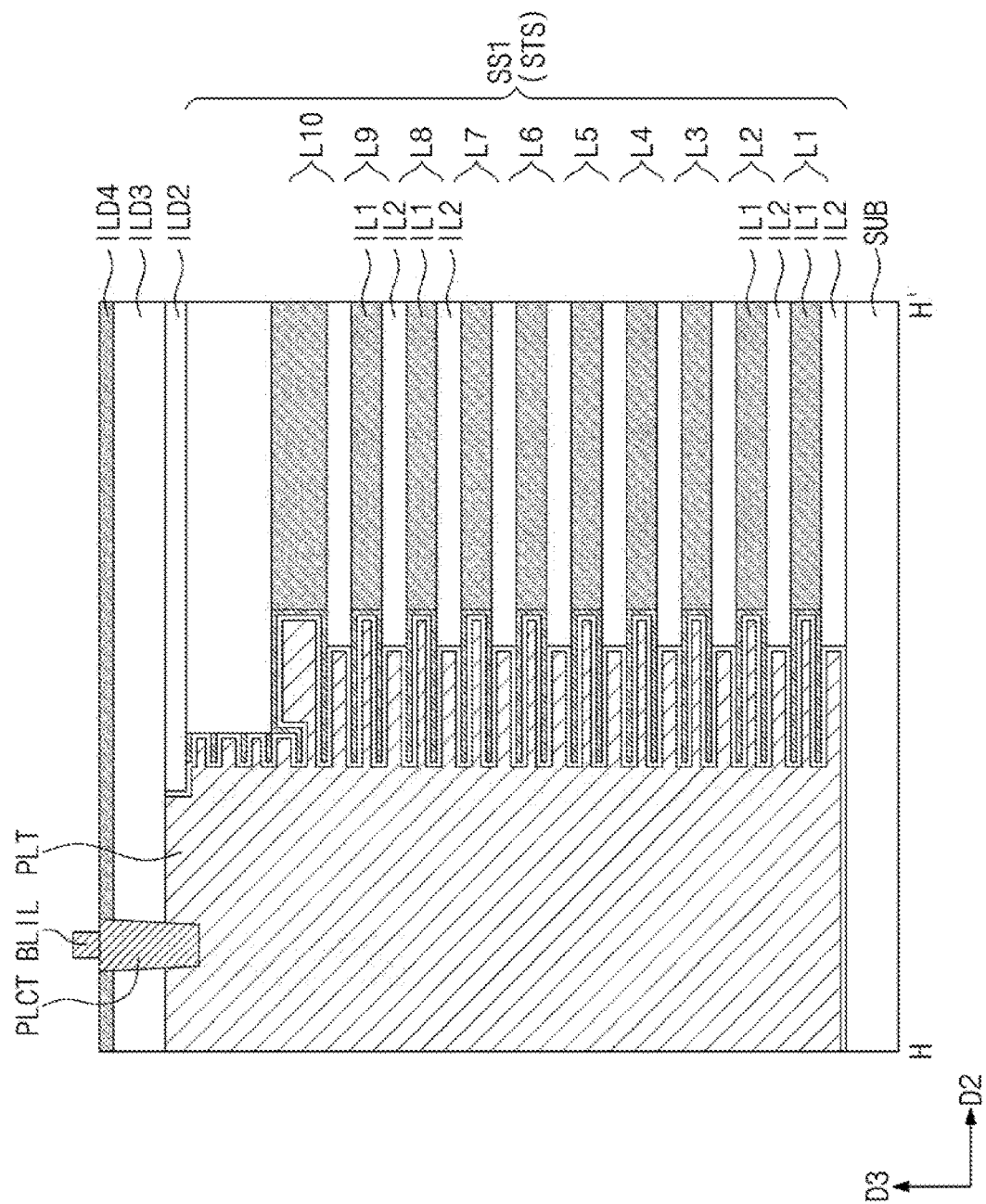
Figure 10:
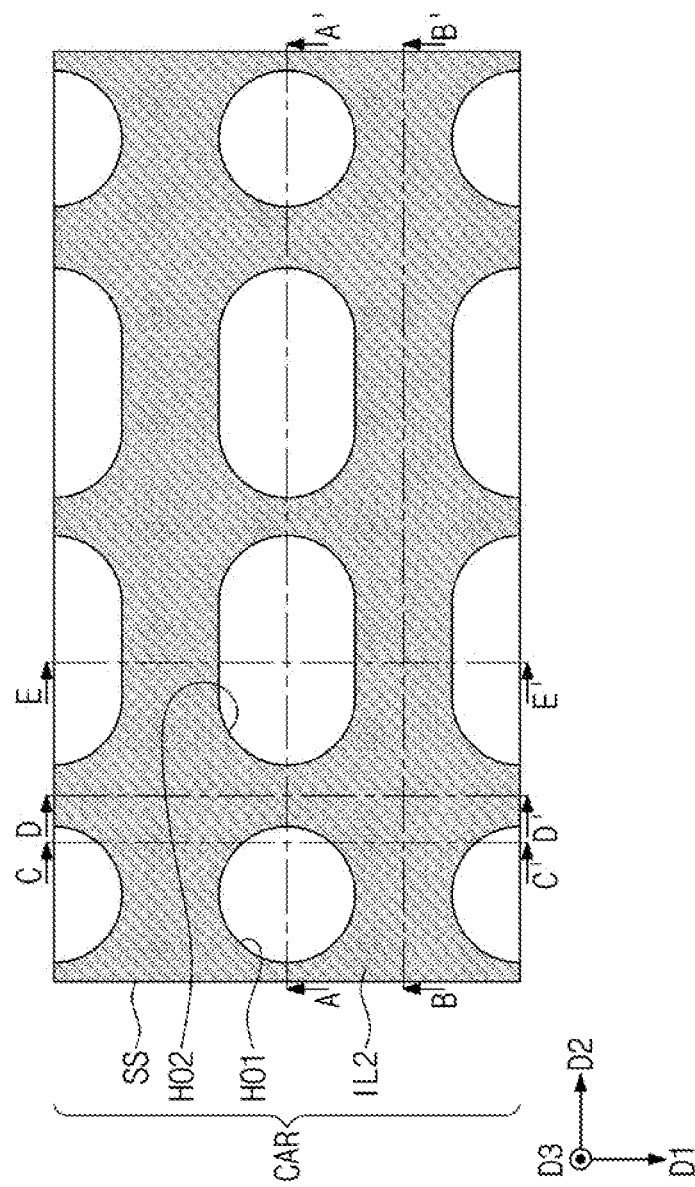
FIGS. 10, 12, 14, 16, 18, 20, 22, 24, 26, 28, 30, 32, 34, 36, 38, 40, 42, and 44 are plan views of stages in a method of fabricating a three-dimensional semiconductor memory device according to an embodiment.
Figure 11A:
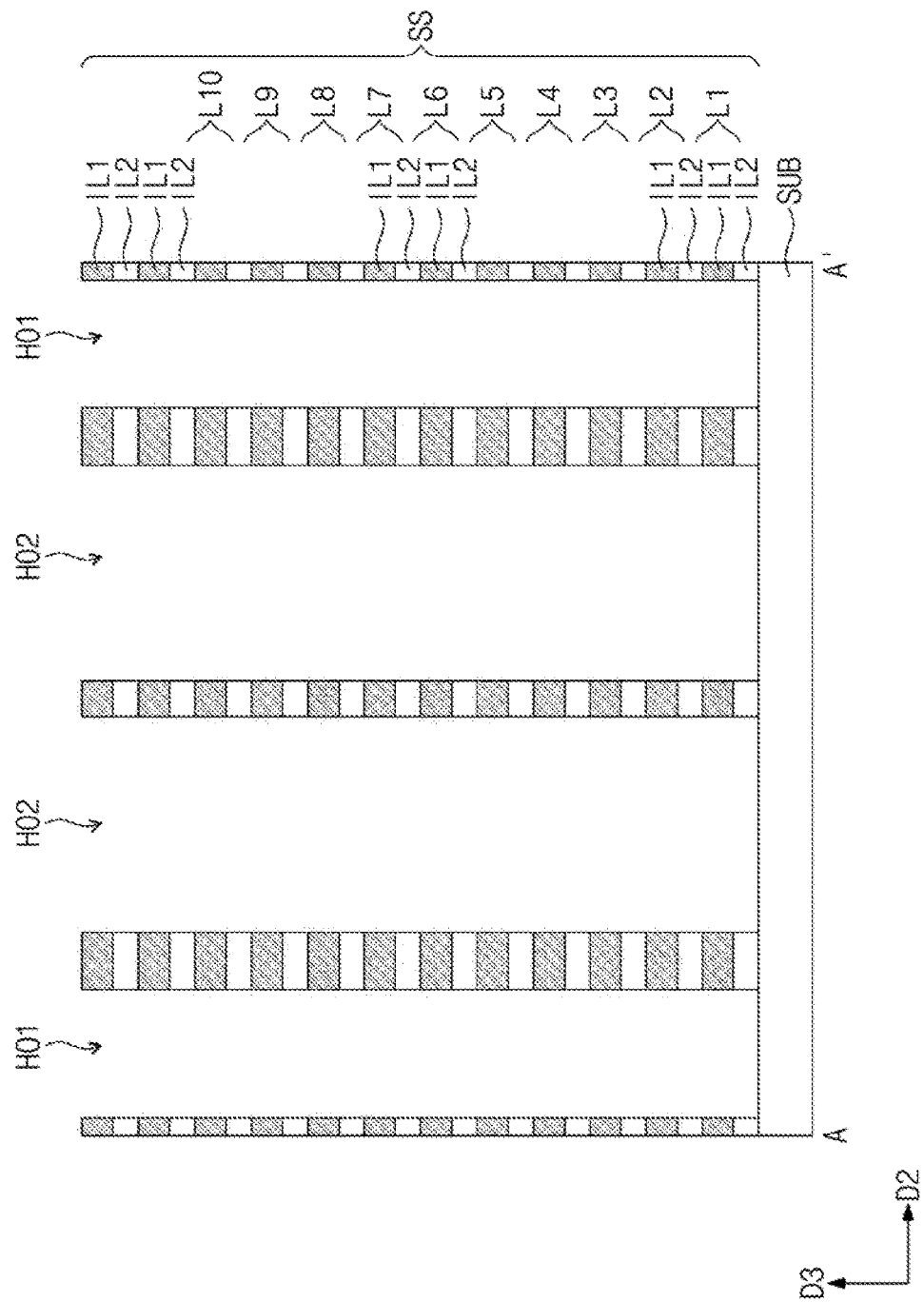
Figure 11B:
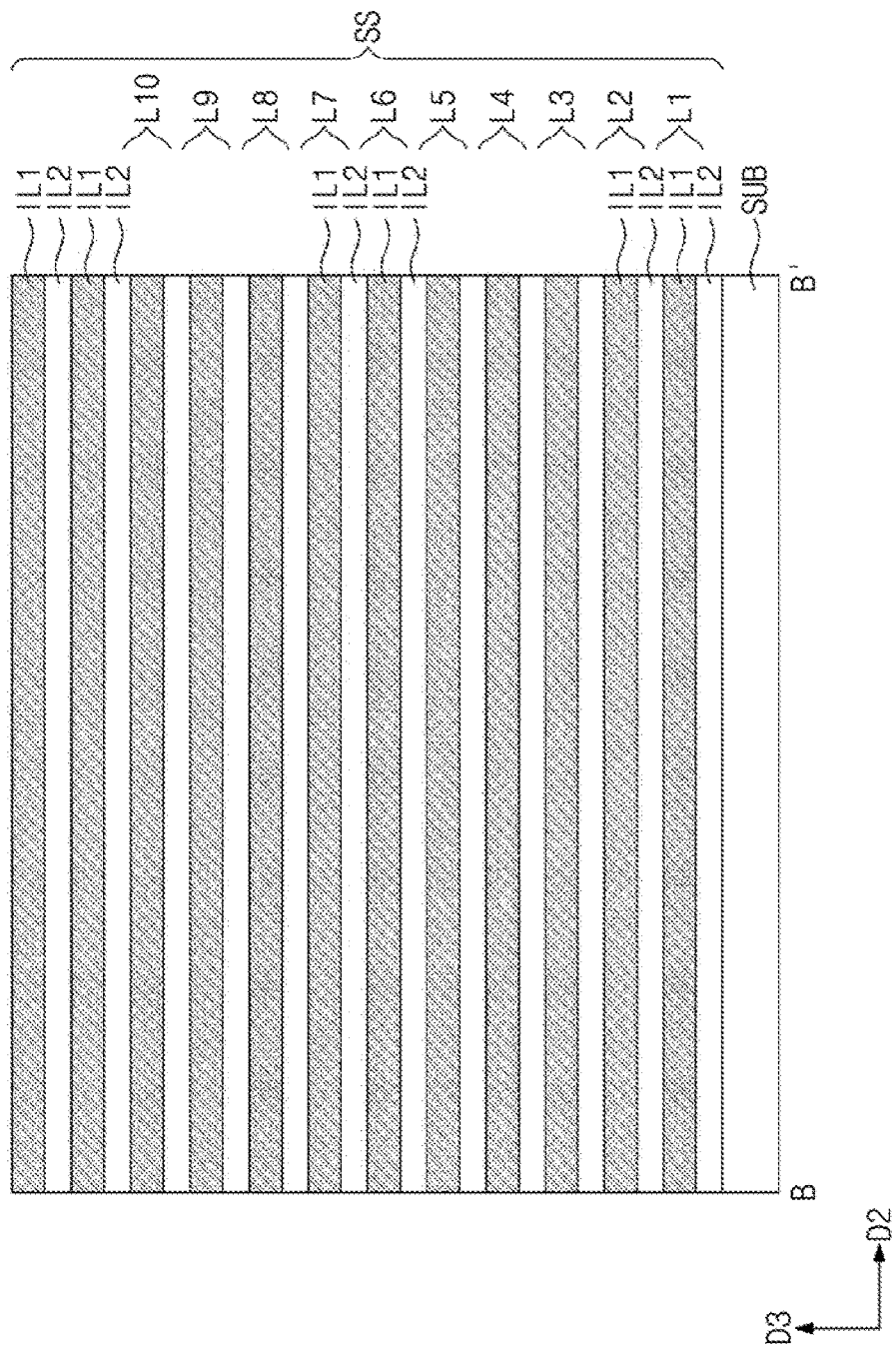
FIGS. 11B, 13B, 15B, 17B, 19B, 21B, 23B, 25B, 27B, 29B, 31B, 33B, 35B, 37B, 39B, 41B, 43B, and 45B are sectional views taken along lines B-B' of FIGS. 10, 12, 14, 16, 18, 20, 22, 24, 26, 28, 30, 32, 34, 36, 38, 40, 42, and 44, respectively.
Figure 11C:
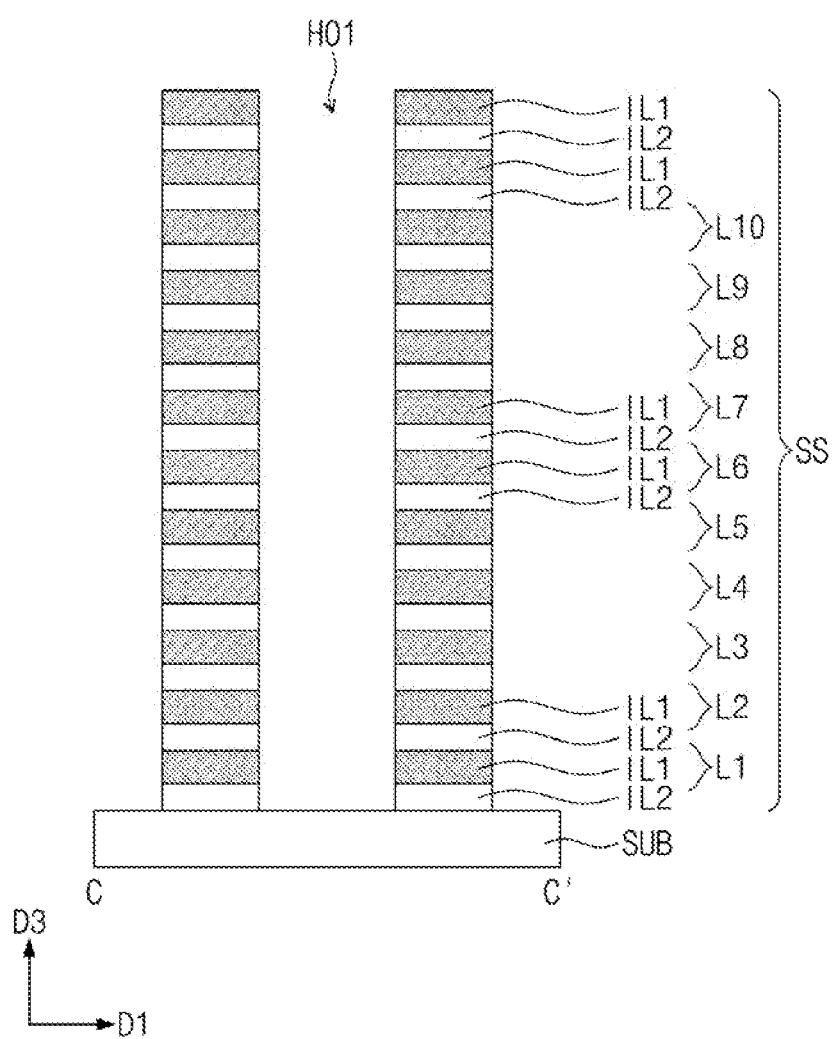
FIGS. 11C, 13C, 15C, 17C, 19C, 21C, 23C, 25C, 27C, 29C, 31C, 33C, 35C, 37C, 39C, 41C, 43C, and 45C are sectional views taken along lines C-C' of FIGS. 10, 12, 14, 16, 18, 20, 22, 24, 26, 28, 30, 32, 34, 36, 38, 40, 42, and 44, respectively.
Figure 11D:
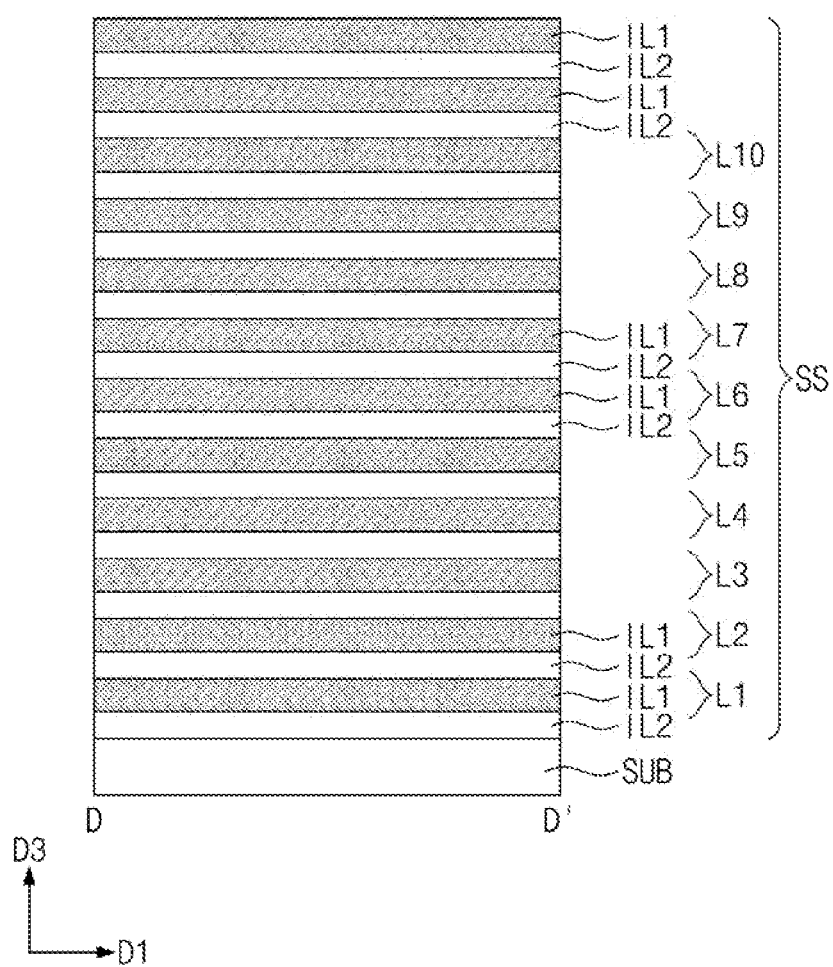
FIGS. 11D, 13D, 15D, 17D, 19D, 21D, 23D, 25D, 27D, 29D, 31D, 33D, 35D, 37D, 39D, 41D, 43D, and 45D are sectional views taken along lines D-D' of FIGS. 10, 12, 14, 16, 18, 20, 22, 24, 26, 28, 30, 32, 34, 36, 38, 40, 42, and 44, respectively.
Figure 11E:
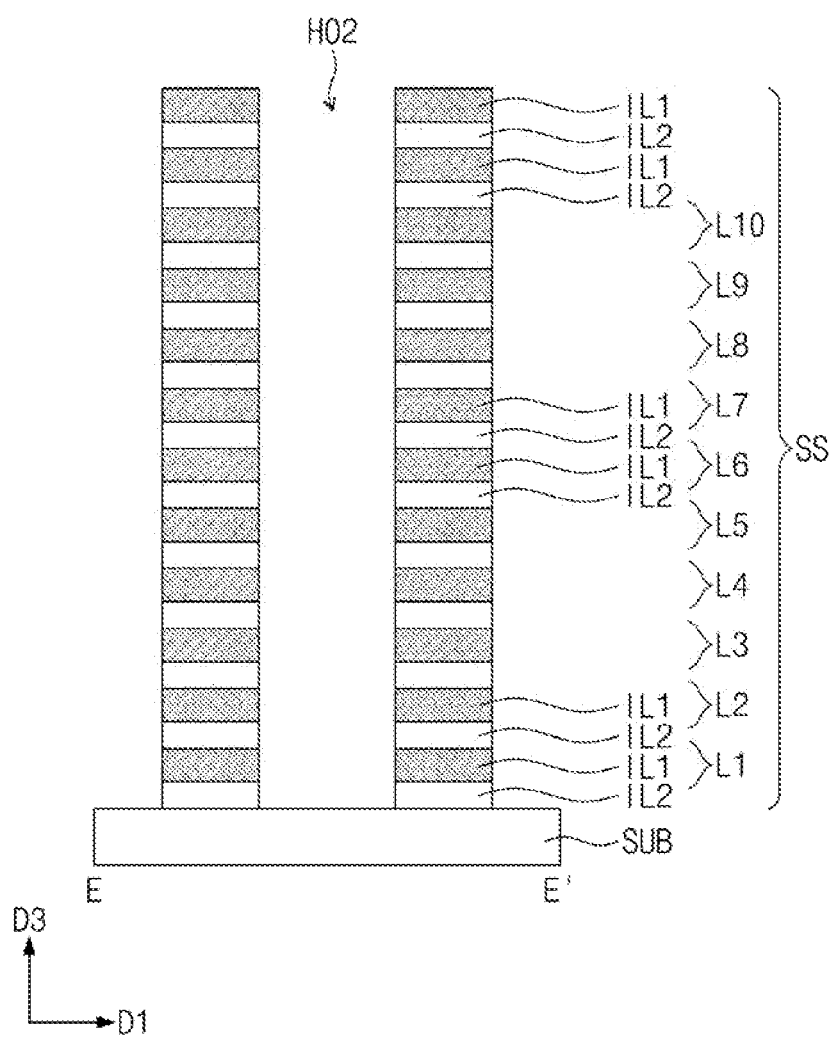
FIGS. 11E, 13E, 15E, 17E, 19E, 21E, 23E, 25E, 27E, 29E, 31E, 33E, 35E, 37E, 39E, 41E, 43E, and 45E are sectional views taken along lines E-E' of FIGS. 10, 12, 14, 16, 18, 20, 22, 24, 26, 28, 30, 32, 34, 36, 38, 40, 42, and 44, respectively.
Figure 12:
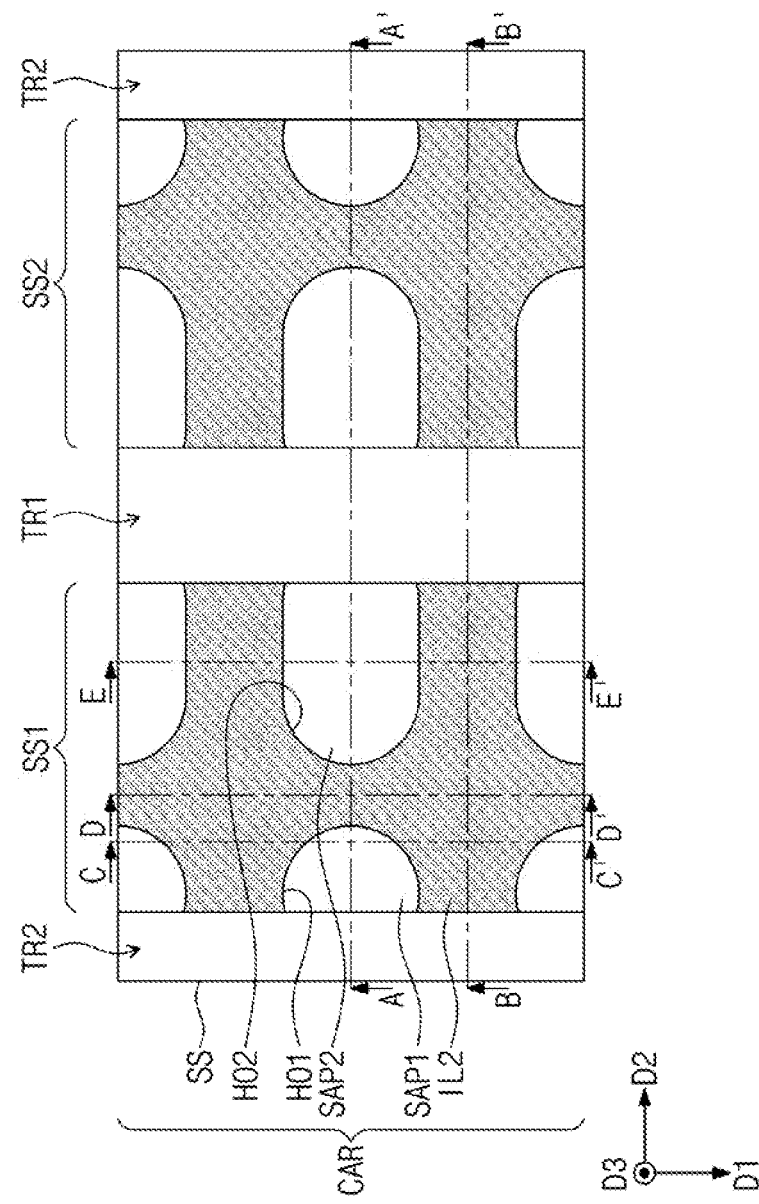
Figure 13A:
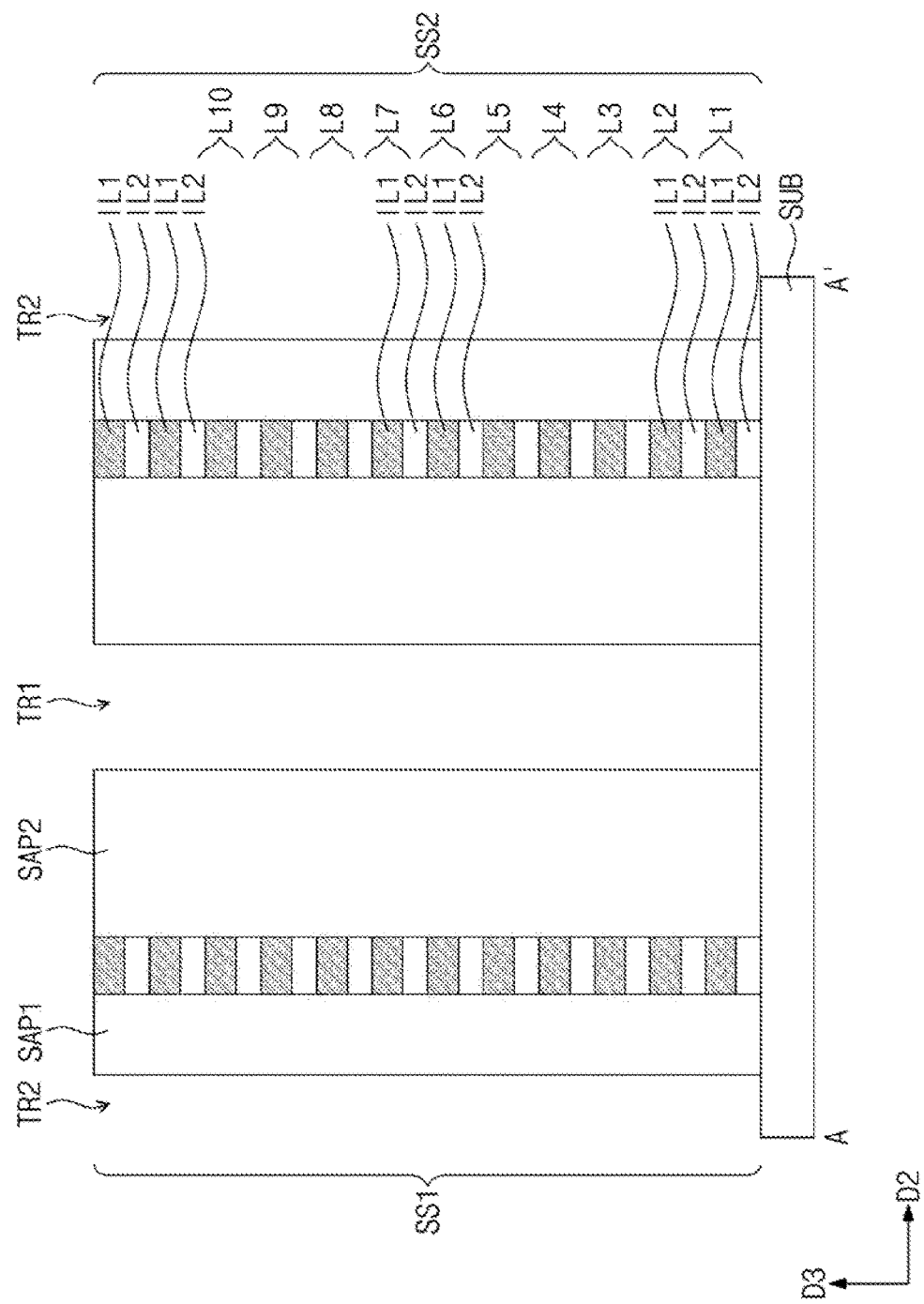
Figure 13B:
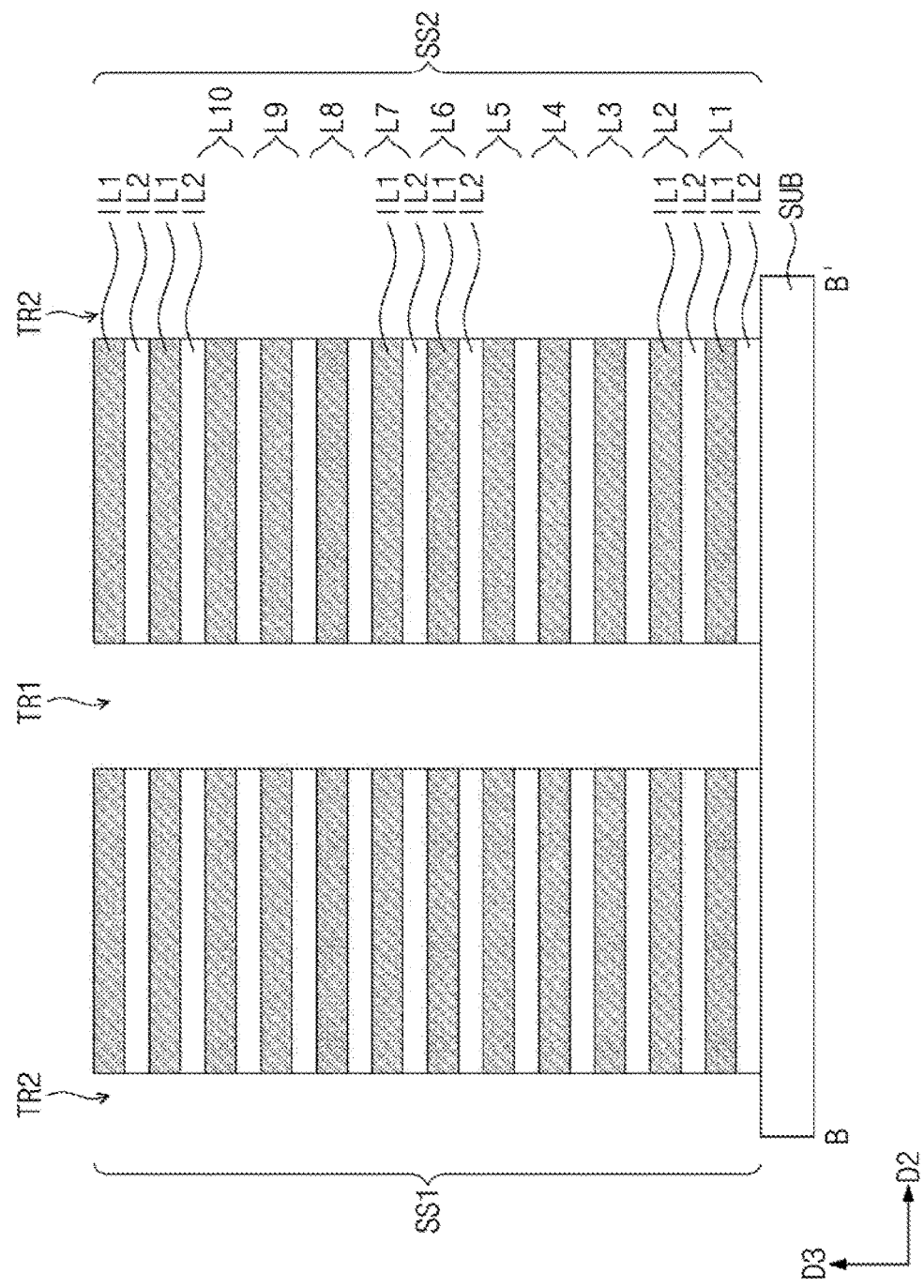
Figure 13C:
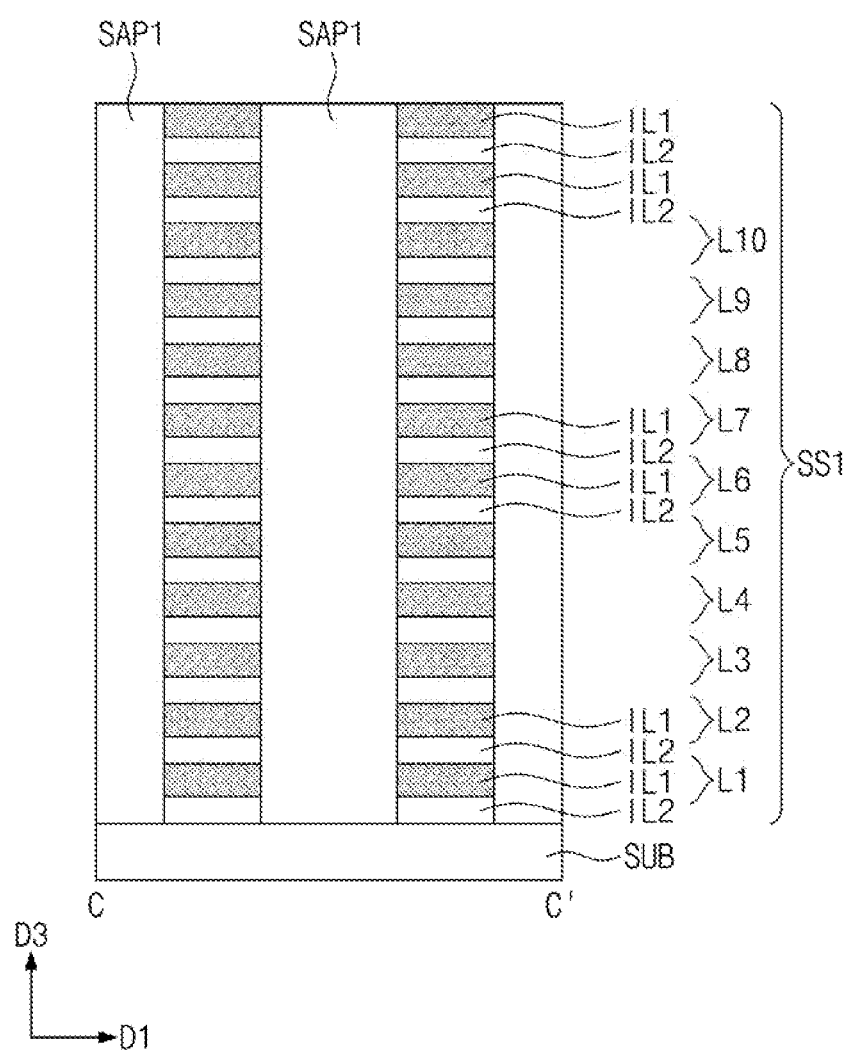
Figure 13D:
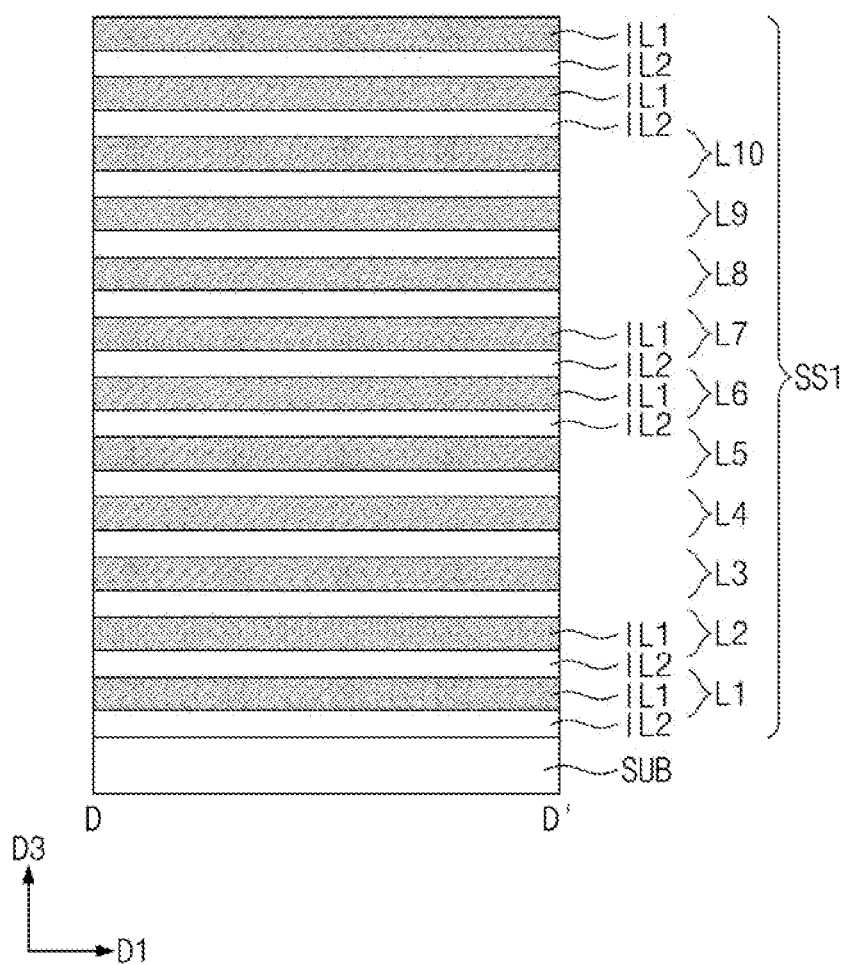
Figure 13E:
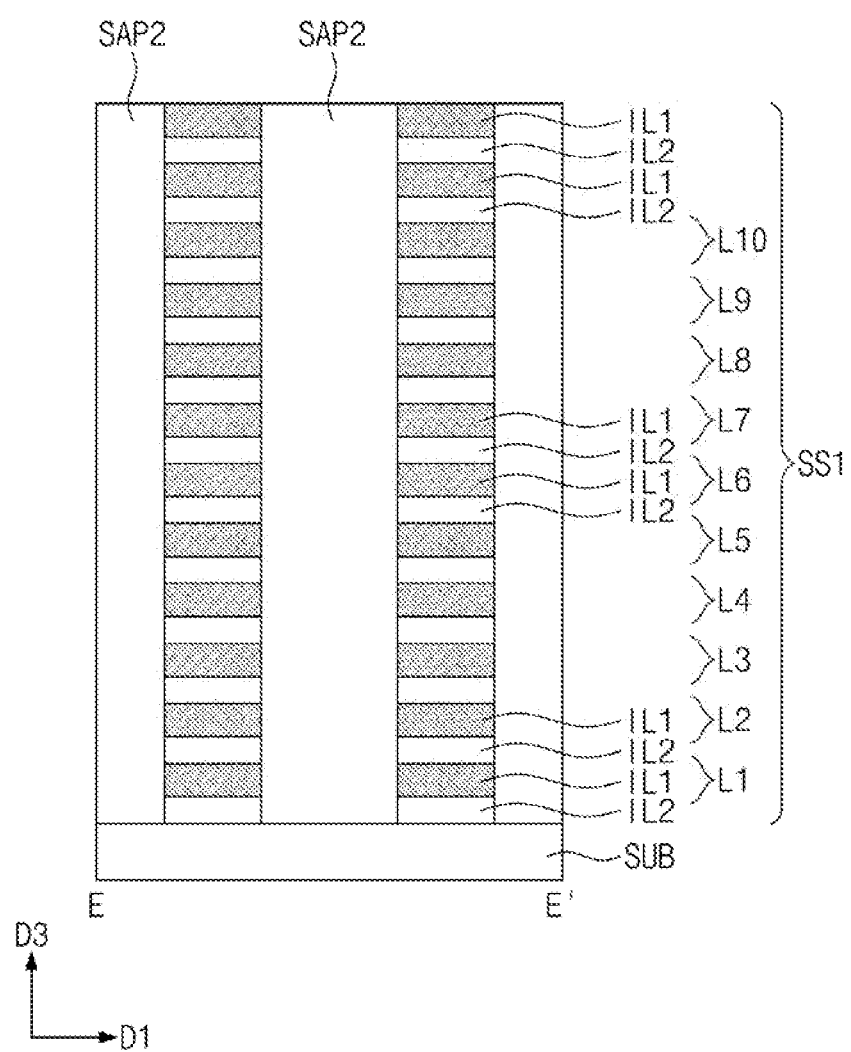
Figure 14:
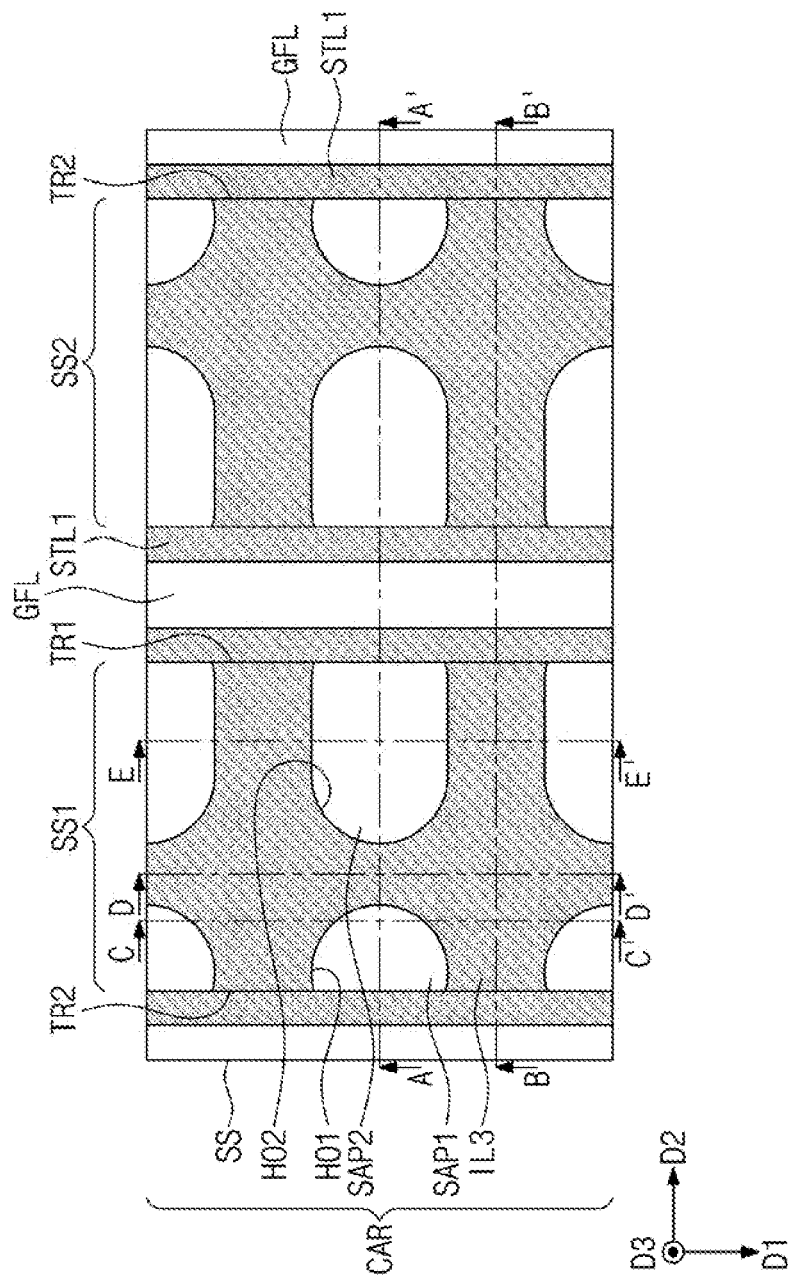
Figure 15A:
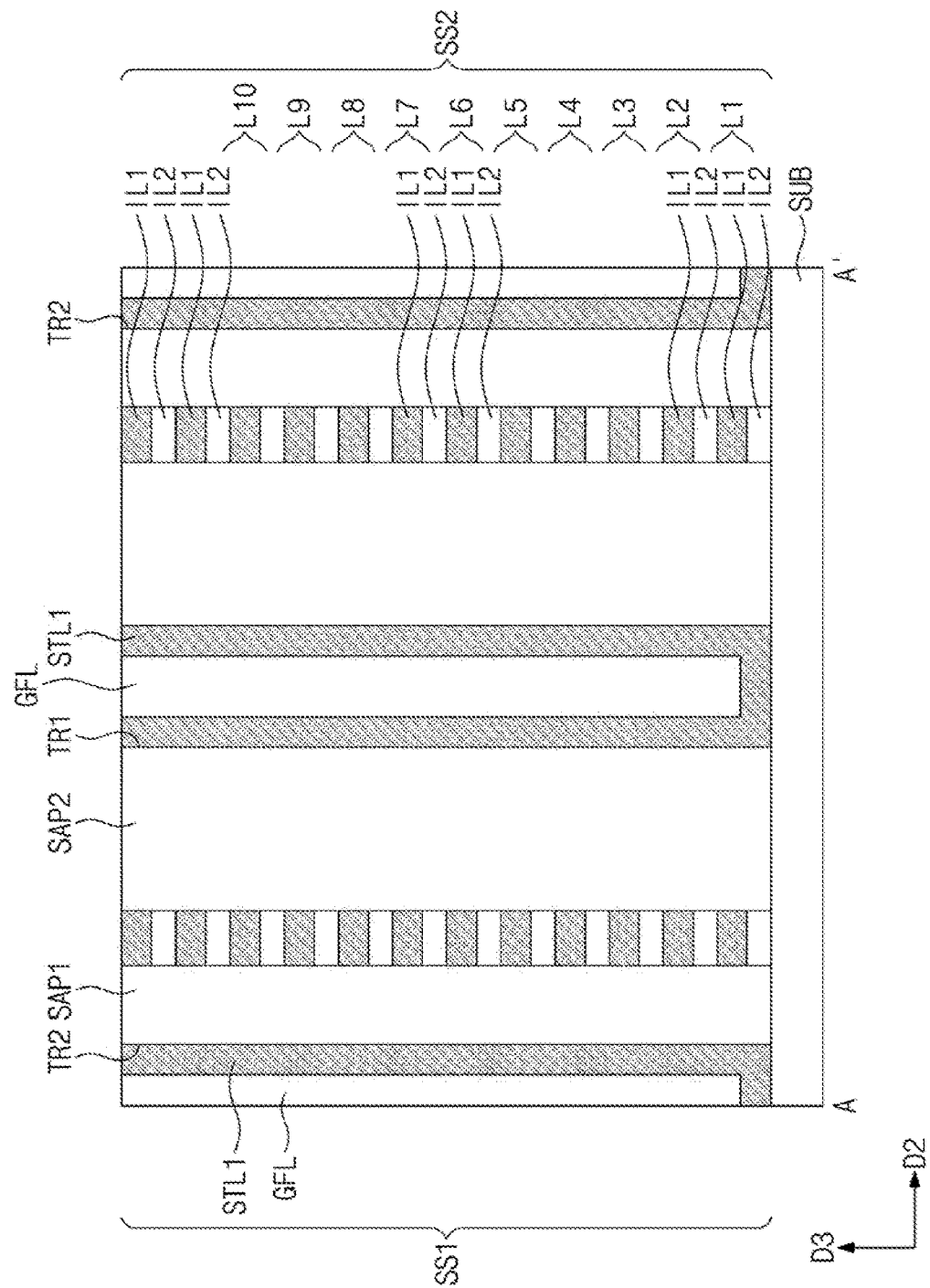
Figure 15B:
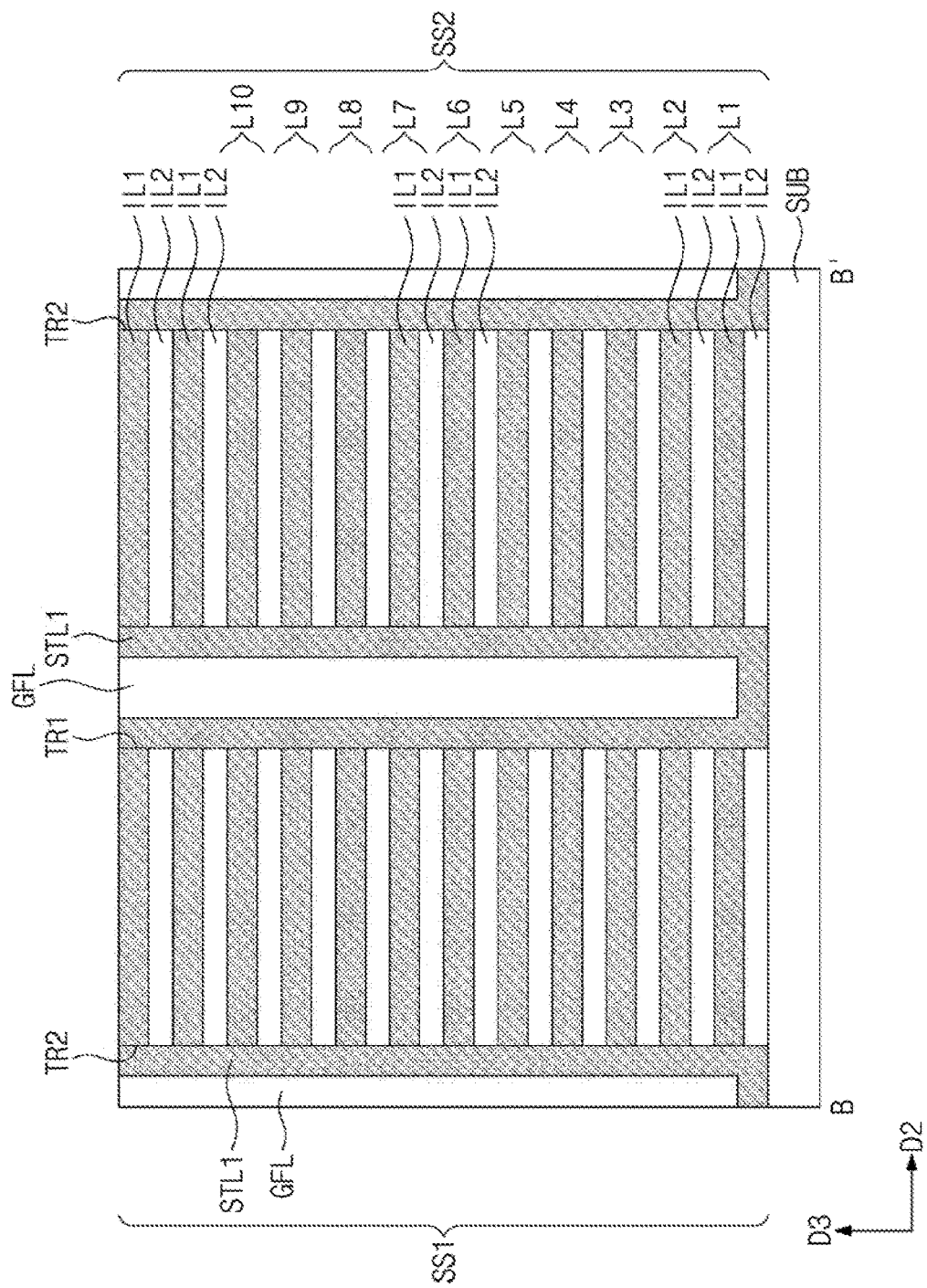
Figure 15C:
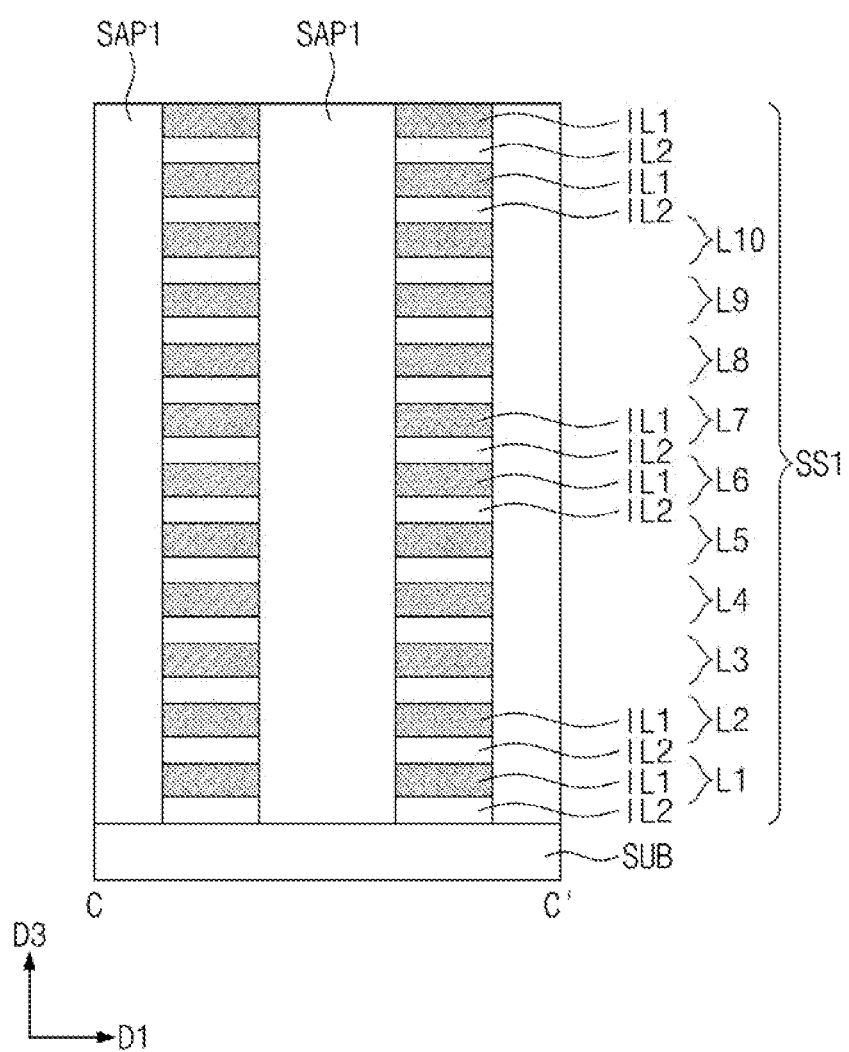
Figure 15D:
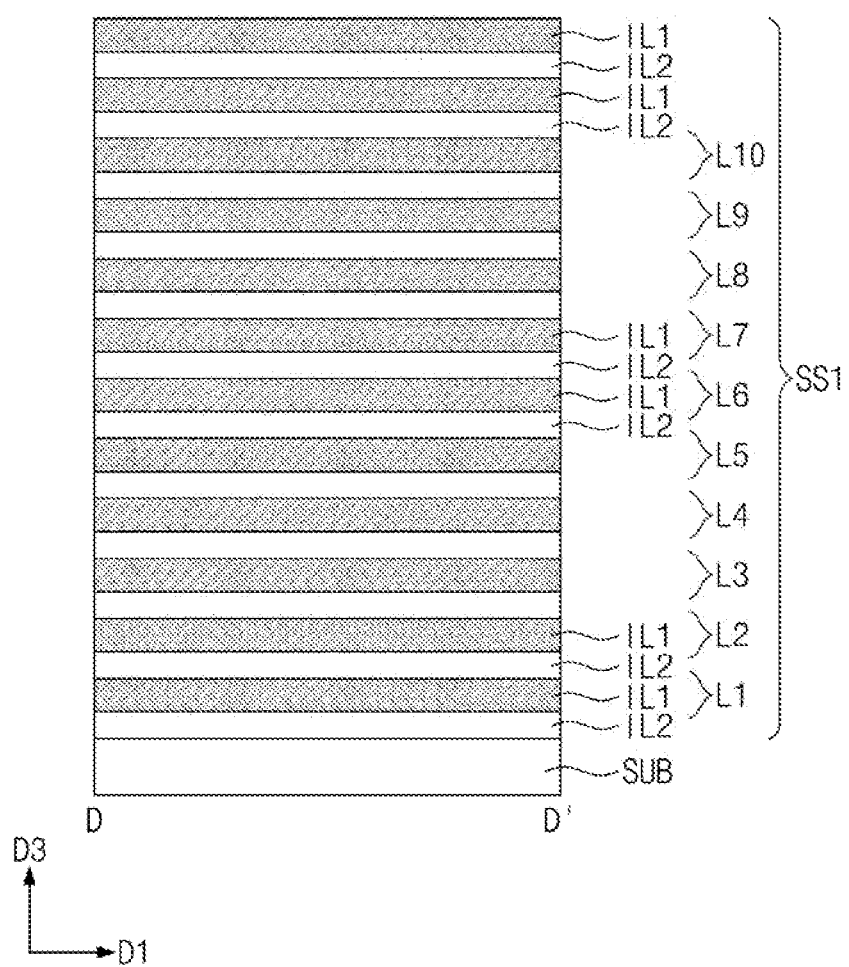
Figure 15E:
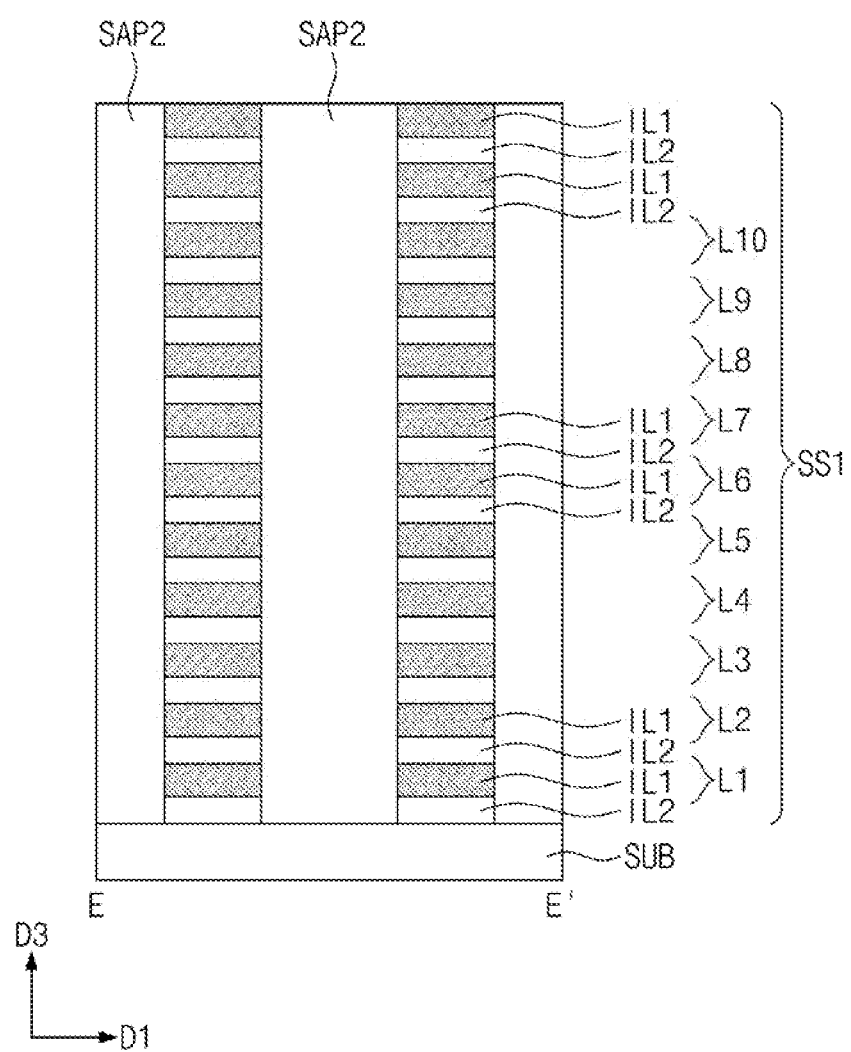
Figure 16:
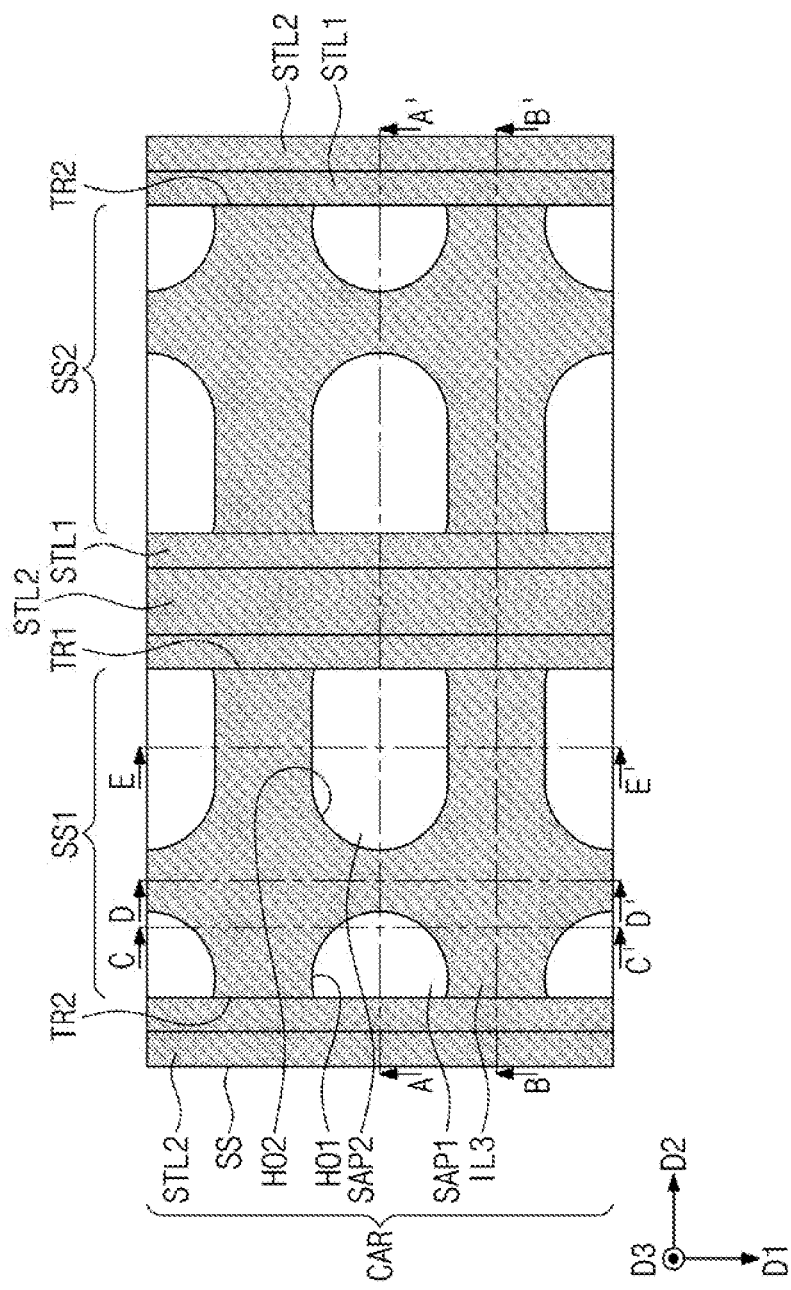
Figure 17A:
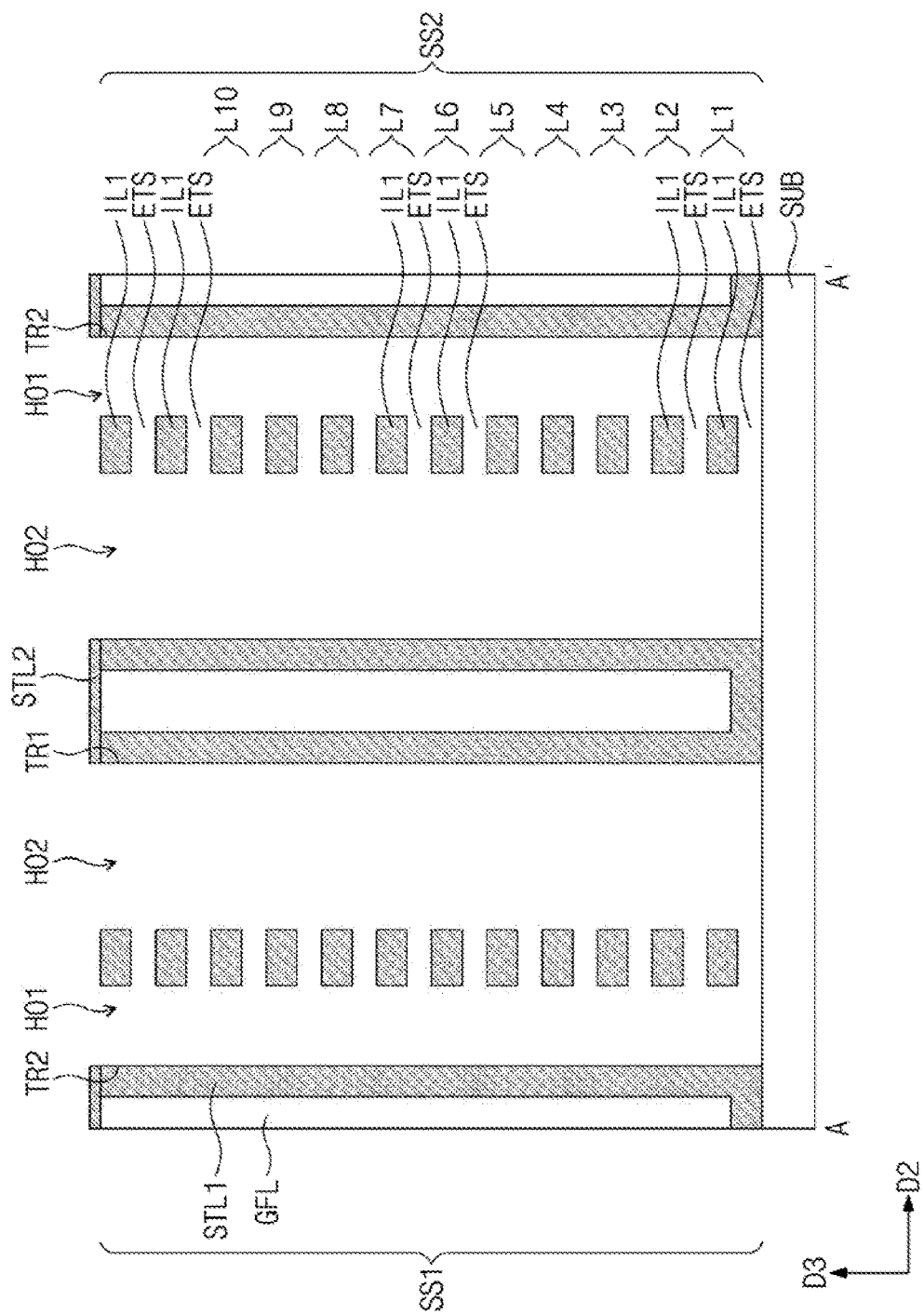
Figure 17B:
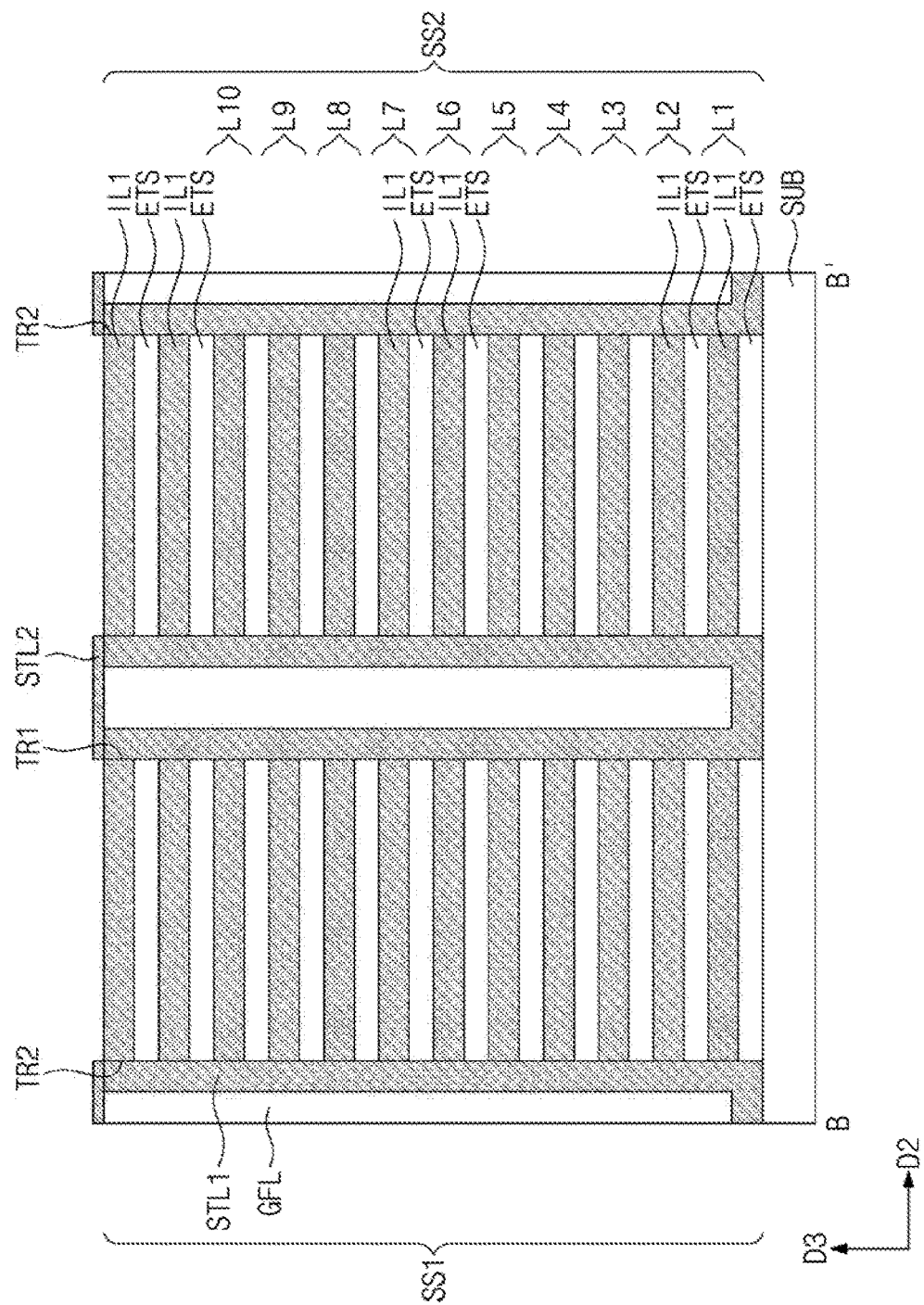
Figure 17C:
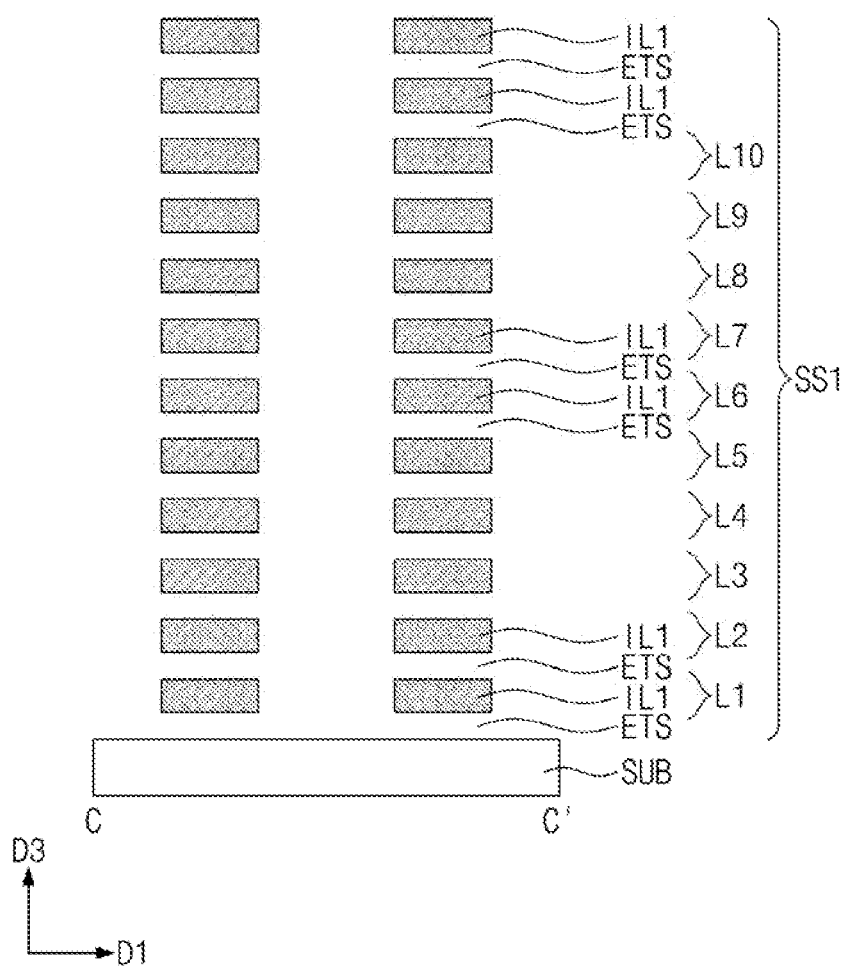
Figure 17D:
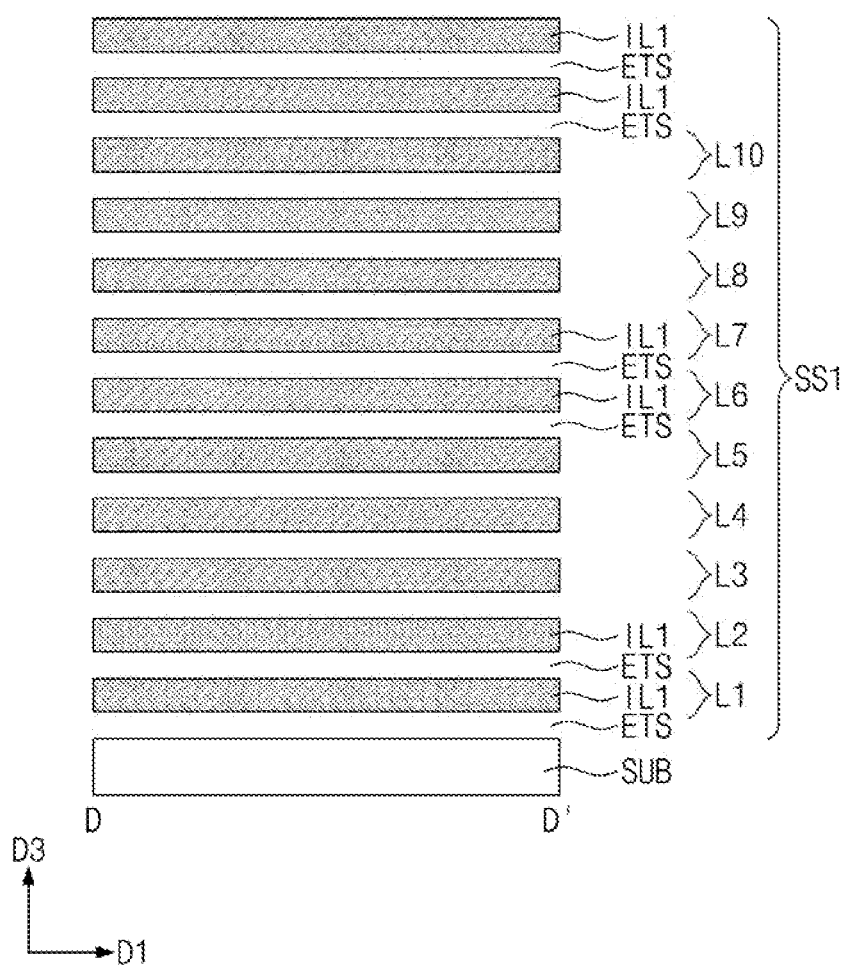
Figure 17E:
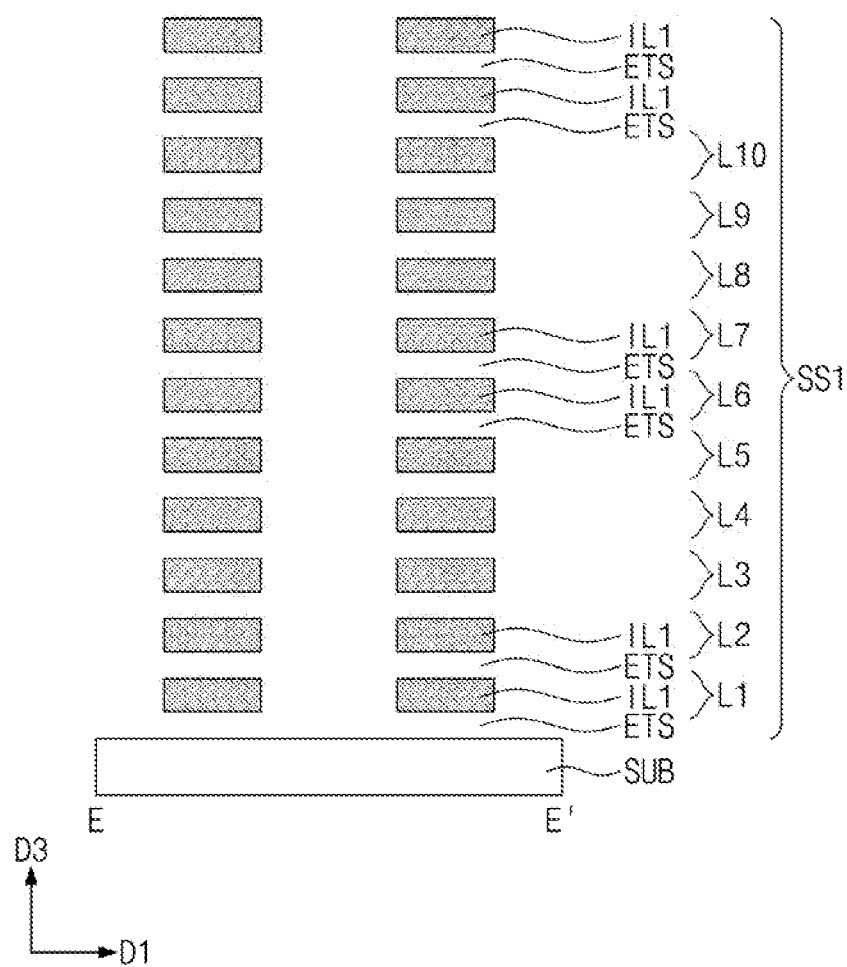
Figure 18:
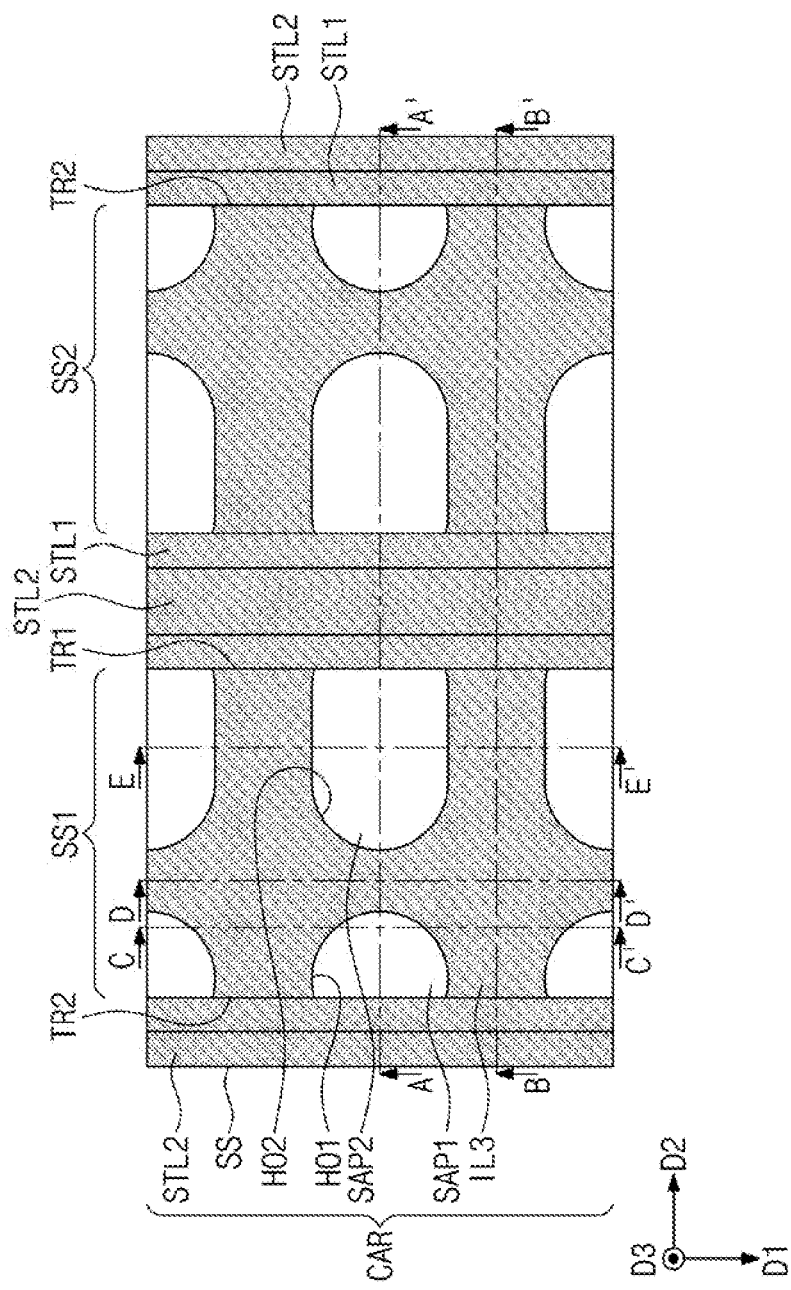
Figure 19A:
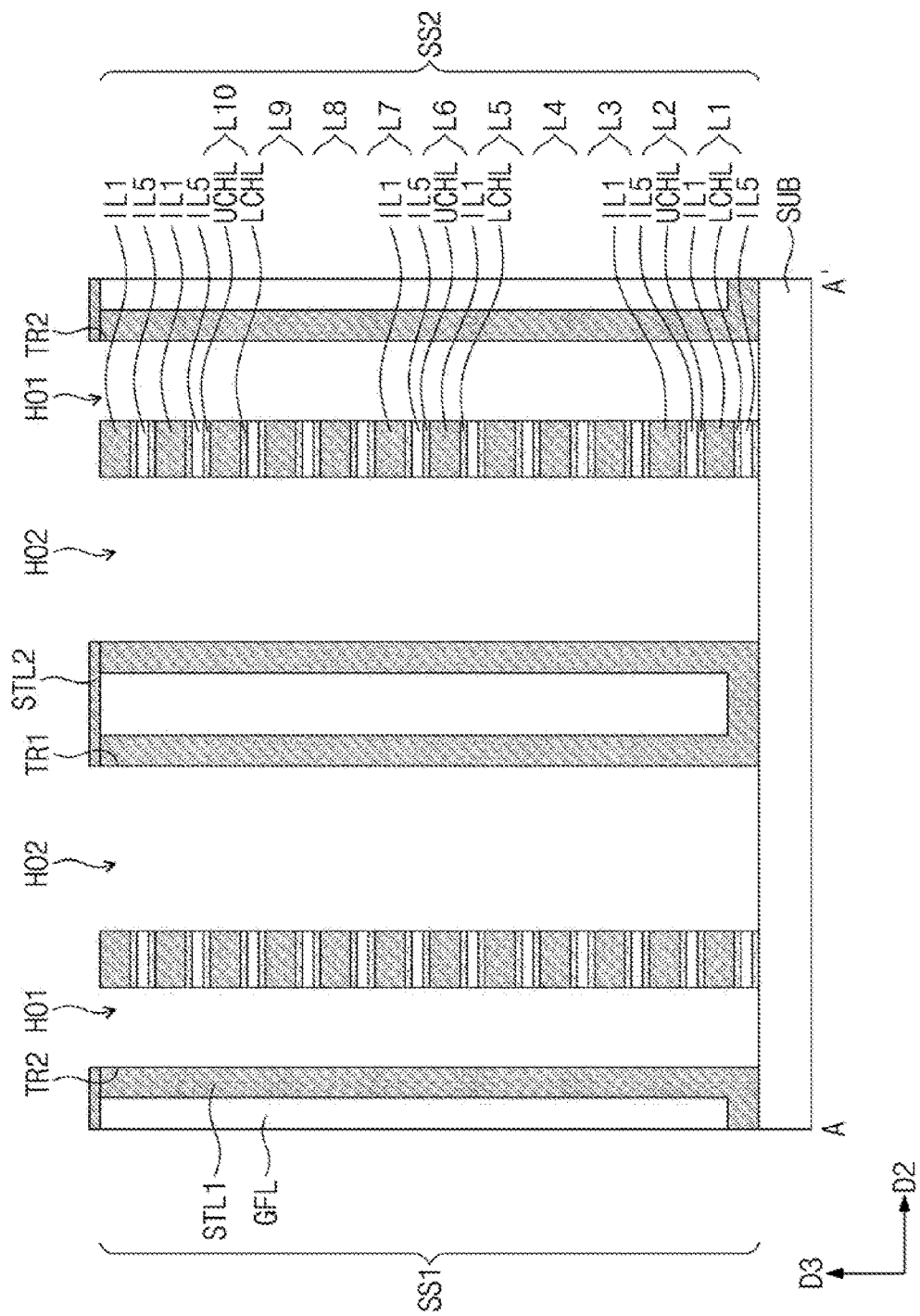
Figure 19B:
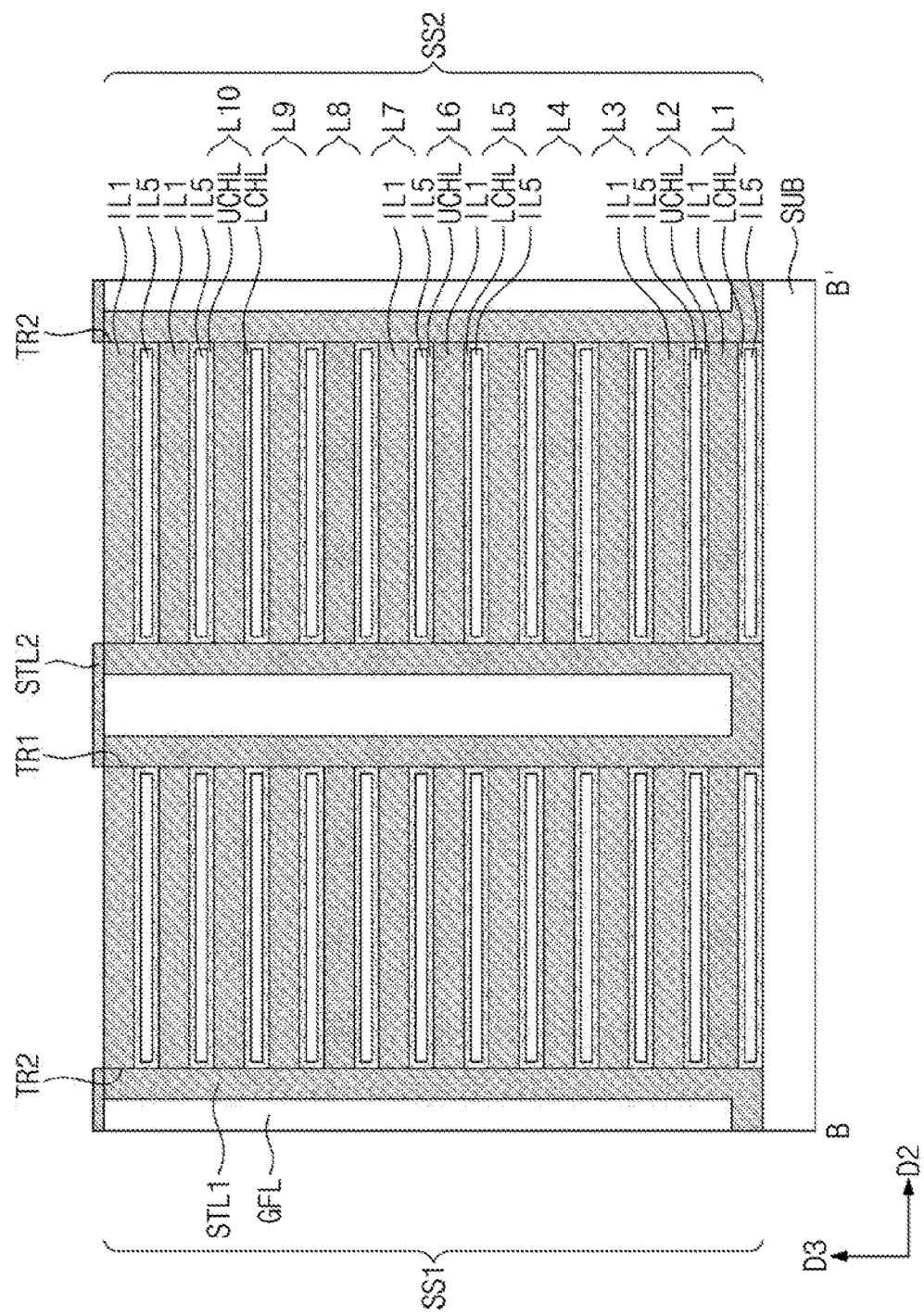
Figure 19C:
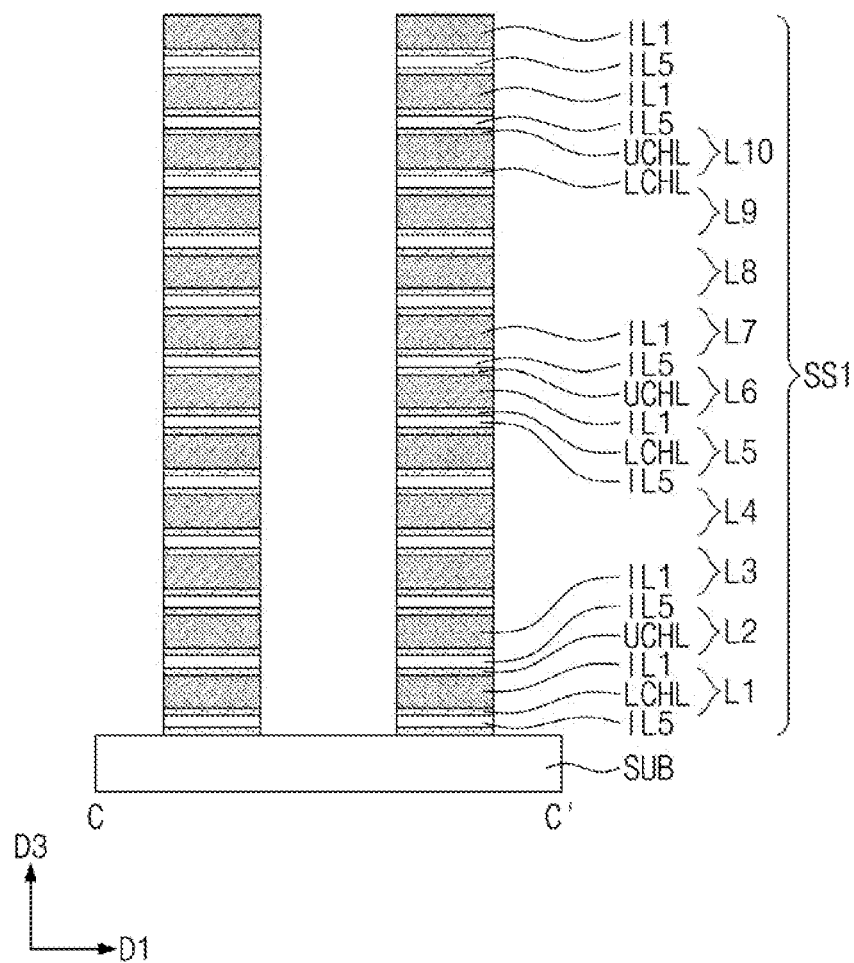
Figure 19D:
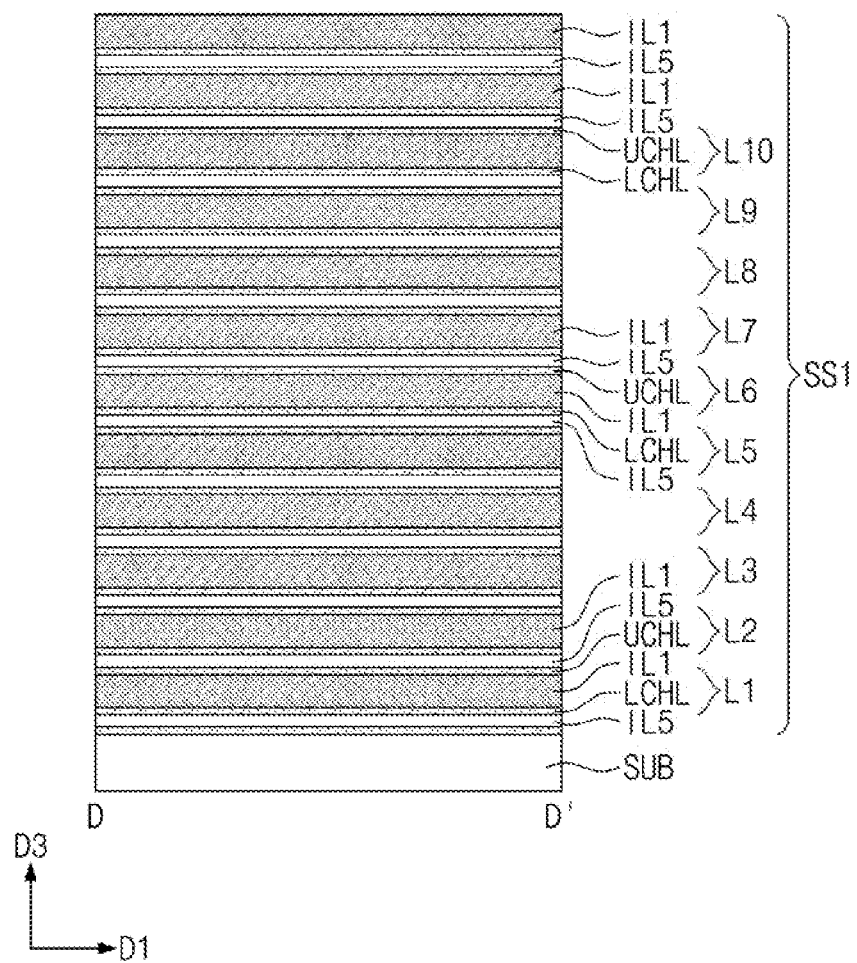
Figure 19E:
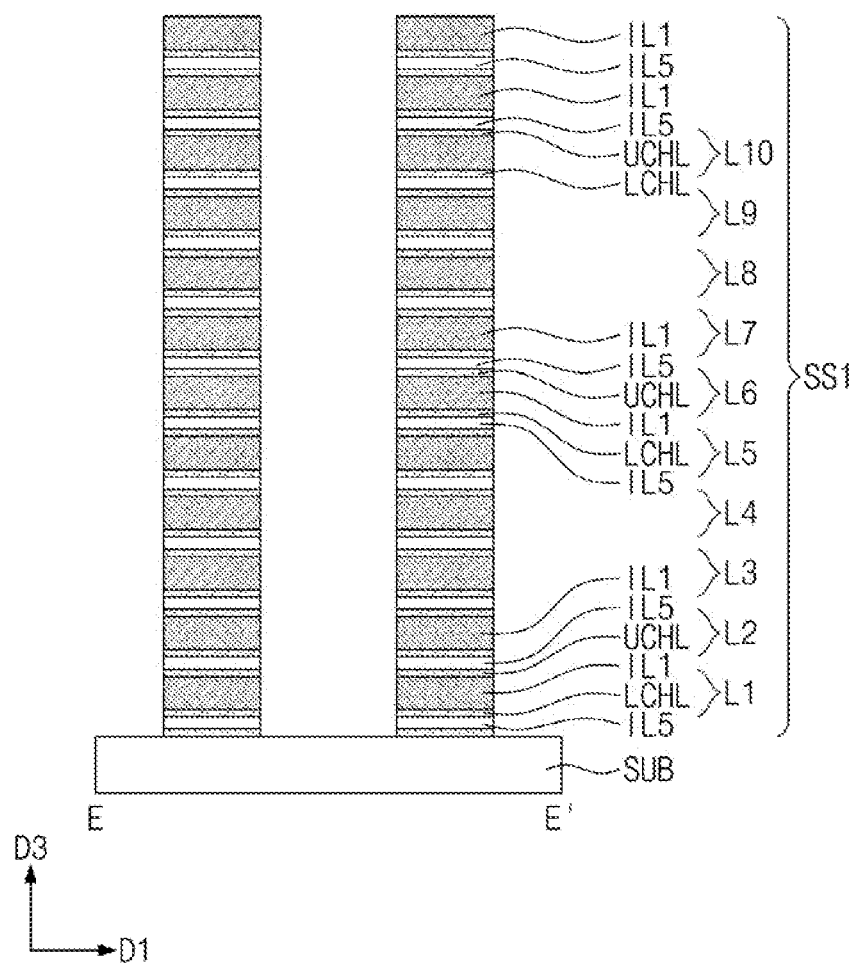

FIG. 9G illustrates the pad portion PDP in the uppermost one of the word line WL (i.e., in the word line WL of the tenth layer L10). The word line WL may have a second thickness TK2. The pad portion PDP of the word line WL may have a first thickness TK1. The first thickness TK1 may be larger than the second thickness TK2. For example, the thickness of the word line WL may be abruptly increased at the pad portion PDP.

Referring to FIG. 9G, an upper insulating layer UIL may be provided on the staircase structure STS. The upper insulating layer UIL may cover the staircase structure STS. The contact CNT may penetrate the upper insulating layer UIL and may be connected to the pad portion PDP. In an implementation, the contact CNT may be coupled to the pad portion PDP of the word line WL of the tenth layer L10. A bottom surface of the contact CNT may be lower than a top surface of the pad portion PDP.

As the staircase structure STS extends in the first direction D1, the pad portions PDP of the first to ninth layers L1 to L9 may be sequentially (i.e., from top to bottom) exposed to the outside of the stack SS1 or SS2. The contacts CNT may be respectively coupled to the exposed pad portions PDP in the same manner as described with reference to FIG. 2.

The contacts CNT may be respectively coupled with word-line contacts WLCT, which penetrate the second to fourth interlayer insulating layers ILD2 to ILD4. The word-line contacts WLCT may be electrically connected to upper metal lines through via plugs.

According to an embodiment, the three-dimensional semiconductor memory device may include the word lines WL, which are sequentially stacked and have end portions serving as the pad portions PDP, respectively. A signal applied to the pad portion PDP may be directly delivered to the cell array region CAR through the word line WL. This may make it possible to improve an operation speed and electric characteristics of the memory device.

FIGS. 10, 12, 14, 16, 18, 20, 22, 24, 26, 28, 30, 32, 34, 36, 38, 40, 42, and 44 are plan views of stages in a method of fabricating a three-dimensional semiconductor memory device according to an embodiment. FIGS. 11A, 13A, 15A, 17A, 19A, 21A, 23A, 25A, 27A, 29A, 31A, 33A, 35A, 37A, 39A, 41A, 43A, and 45A are sectional views taken along lines A-A' of FIGS. 10, 12, 14, 16, 18, 20, 22, 24, 26, 28, 30, 32, 34, 36, 38, 40, 42, and 44, respectively. FIGS. 11B, 13B, 15B, 17B, 19B, 21B, 23B, 25B, 27B, 29B, 31B, 33B, 35B, 37B, 39B, 41B, 43B, and 45B are sectional views taken along lines B-B' of FIGS. 10, 12, 14, 16, 18, 20, 22, 24, 26, 28, 30, 32, 34, 36, 38, 40, 42, and 44, respectively. FIGS. 11C, 13C, 15C, 17C, 19C, 21C, 23C, 25C, 27C, 29C, 31C, 33C, 35C, 37C, 39C, 41C, 43C, and 45C are sectional views taken along lines C-C' of FIGS. 10, 12, 14, 16, 18, 20, 22, 24, 26, 28, 30, 32, 34, 36, 38, 40, 42, and 44, respectively. FIGS. 11D, 13D, 15D, 17D, 19D, 21D, 23D, 25D, 27D, 29D, 31D, 33D, 35D, 37D, 39D, 41D, 43D, and 45D are sectional views taken along lines D-D' of FIGS. 10, 12, 14, 16, 18, 20, 22, 24, 26, 28, 30, 32, 34, 36, 38, 40, 42, and 44, respectively. FIGS. 11E, 13E, 15E, 17E, 19E, 21E, 23E, 25E, 27E, 29E, 31E, 33E, 35E, 37E, 39E, 41E, 43E, and 45E are sectional views taken along lines E-E' of FIGS. 10, 12, 14, 16, 18, 20, 22, 24, 26, 28, 30, 32, 34, 36, 38, 40, 42, and 44, respectively.

A method of fabricating a three-dimensional memory cell array on the cell array region CAR of the substrate SUB will be described. Referring to FIGS. 10 and 11A to 11E, a stack SS may be formed on the substrate SUB. The formation of the stack SS may include sequentially stacking the first to tenth layers L1 to L10.

In an implementation, a second insulating layer IL2 may be formed on the substrate SUB. First insulating layers IL1 and second insulating layers IL2 may be alternately and repeatedly stacked on the second insulating layer IL2. Each of the first to tenth layers L1 to L10 may include one first insulating layer IL1.

The first insulating layers IL1 may be formed of or include silicon nitride. The second insulating layers IL2 may be formed of or include a material (e.g., silicon oxide) having an etch selectivity with respect to the first insulating layers IL1.

The stack SS may be patterned to form first holes HO1 and second holes HO2 penetrating the stack SS. The first holes HO1 may be arranged at a specific pitch in the first direction D1. The second holes HO2 may be formed to be adjacent to the first holes HO1, respectively, in the second direction D2. The second holes HO2 may be arranged at the specific pitch in the first direction D1. Each of the first and second holes HO1 and HO2 may be formed to expose a top surface of the substrate SUB.

Referring to FIGS. 12 and 13A to 13E, first sacrificial pillars SAP1 and second sacrificial pillars SAP2 may be respectively formed by filling the first and second holes HO1 and HO2 with an insulating material. The first sacrificial pillars SAP1 may be formed to completely fill the first holes HO1, respectively, and the second sacrificial pillars SAP2 may be formed to completely fill the second holes HO2, respectively. In an implementation, the first and second sacrificial pillars SAP1 and SAP2 may be formed of or include silicon oxide.

The stack SS may be patterned to form first and second trenches TR1 and TR2 penetrating the stack SS. The stack SS may be bisected into the first stack SS1 and the second stack SS2 by the first and second trenches TR1 and TR2.

The first trench TR1 may be between the first and second stacks SS1 and SS2.

The second trench TR2 may be at a side of each of the first and second stacks SS1 and SS2. A sidewall of each of the second sacrificial pillars SAP2 may be exposed through the first trench TR1. A sidewall of each of the first sacrificial pillars SAP1 may be exposed through the second trench TR2.

Referring to FIGS. 14 and 15A to 15E, a first stopper layer STL1 may be conformally formed in each of the first and second trenches TR1 and TR2. In an implementation, the first stopper layer STL1 may be formed to have a thickness that is too small to completely fill the trench TR1 or TR2. The first stopper layer STL1 may have a roughly U-shaped section (e.g., see FIGS. 15A and 15B).

A gap-fill layer GFL may be formed in each of the first and second trenches TR1 and TR2. The gap-fill layer GFL may be formed on the first stopper layer STL1. The gap-fill layer GFL may be formed to completely fill (e.g., remaining parts of) the trench TR1 or TR2. In an implementation, the first stopper layer STL1 may be formed of or include silicon nitride, and the gap-fill layer GFL may be formed of or include silicon oxide.

Referring to FIGS. 16 and 17A to 17E, a second stopper layer STL2 may be formed to cover a top surface of the first stopper layer STL1 and a top surface of the gap-fill layer GFL. In an implementation, the second stopper layer STL2 may be formed to cover only the top surface of the first stopper layer STL1 and the top surface of the gap-fill layer GFL, and in this case, top surfaces of the first and second stacks SS1 and SS2 may be exposed to the outside of the second stopper layer STL2. Top surfaces of the first and second sacrificial pillars SAP1 and SAP2 may be exposed to the outside of the second stopper layer STL2.

A wet etching process using the second stopper layer STL2 as an etch mask may be performed to selectively remove the first and second sacrificial pillars SAP1 and SAP2. The first and second sacrificial pillars SAP1 and SAP2 may be removed, and the first and second holes HO1 and HO2 may be again exposed to the outside.

The wet etching process may be performed to selectively etch only a silicon oxide layer, such as the first and second sacrificial pillars SAP1 and SAP2. Thus, the second insulating layers IL2 in the first and second stacks SS1 and SS2 may also be removed during the removal process of the first and second sacrificial pillars SAP1 and SAP2. This may be because the second insulating layers IL2 include silicon oxide.

Empty spaces ETS may be formed as the removal of the second insulating layers IL2. In an implementation, the empty spaces ETS may be formed in the first and second stacks SS1 and SS2 by the wet etching process. The first and second holes HO1 and HO2, which are adjacent to each other, may be connected to each other through the empty spaces ETS (e.g., see FIG. 17A). Each of the empty spaces ETS may be between adjacent ones of the first insulating layers IL1.

In an implementation, the gap-fill layer GFL may include silicon oxide, and it may not be removed by the etching process and may be left as it is, because it is encapsulated or sealed by the first and second stopper layers STL1 and STL2.

Referring to FIGS. 18 and 19A to 19E, the channel layer UCHL or LCHL may be conformally deposited on the substrate SUB. The channel layer UCHL or LCHL may be formed in each of the empty spaces ETS. The channel layer UCHL or LCHL may be formed on a bottom surface of each of the first insulating layers IL1. In an implementation, the channel layer UCHL or LCHL may be formed on a top surface of each of the first insulating layers IL1.

The channel layer UCHL or LCHL may be formed using a chemical vapor deposition (CVD) process or an atomic layer deposition (ALD) process. The channel layer UCHL or LCHL may be formed to a relatively small thickness such that the entirety of the empty space ETS is not filled with the channel layer UCHL or LCHL.

In an implementation, the channel layer UCHL or LCHL may include a semiconductor material that may be formed using a deposition process or that may be suitably used as a channel of a memory cell transistor. In an implementation, the channel layer UCHL or LCHL may be formed of or include an amorphous oxide semiconductor material (e.g., IGZO or ITZO). In an implementation, the channel layer UCHL or LCHL may be formed of or include a two-dimensional semiconductor material (e.g., metal chalcogenide, graphene, or phosphorene).

Next, the fifth insulating layer IL5 may be deposited on the substrate SUB. The fifth insulating layer IL5 may be formed to completely fill each of the empty spaces ETS. As wet trimming process may be performed on the fifth insulating layer IL5 to leave the fifth insulating layer IL5 in only the empty space ETS. In an implementation, the fifth insulating layer IL5 may be formed of or include silicon oxide.

The channel layer UCHL or LCHL may be etched using the fifth insulating layers IL5 as an etch mask, and as a result, the upper channel layer UCHL and the lower channel layer LCHL may be formed in each of the empty spaces ETS. In an implementation, the channel layer UCHL or LCHL in each layer may include the upper channel layer UCHL and the lower channel layer LCHL. The upper channel layer UCHL and the lower channel layer LCHL may be connected to each other (e.g., see FIG. 19B). The fifth insulating layer IL5 may be between the upper channel layer UCHL and the lower channel layer LCHL.

Referring to FIGS. 20 and 21A to 21E, a wet etching process may be performed on the sidewalls of the channel layers UCHL and LCHL, which are exposed through the first and second holes HO1 and HO2. The wet etching process may be performed to partially etch each of the channel layers UCHL and LCHL in a horizontal direction. The wet etching process may be performed to selectively etch only the channel layers UCHL and LCHL. A recessed region RSR may be formed, as a result of the partial etching of each of the channel layers UCHL and LCHL.

Figure 20:
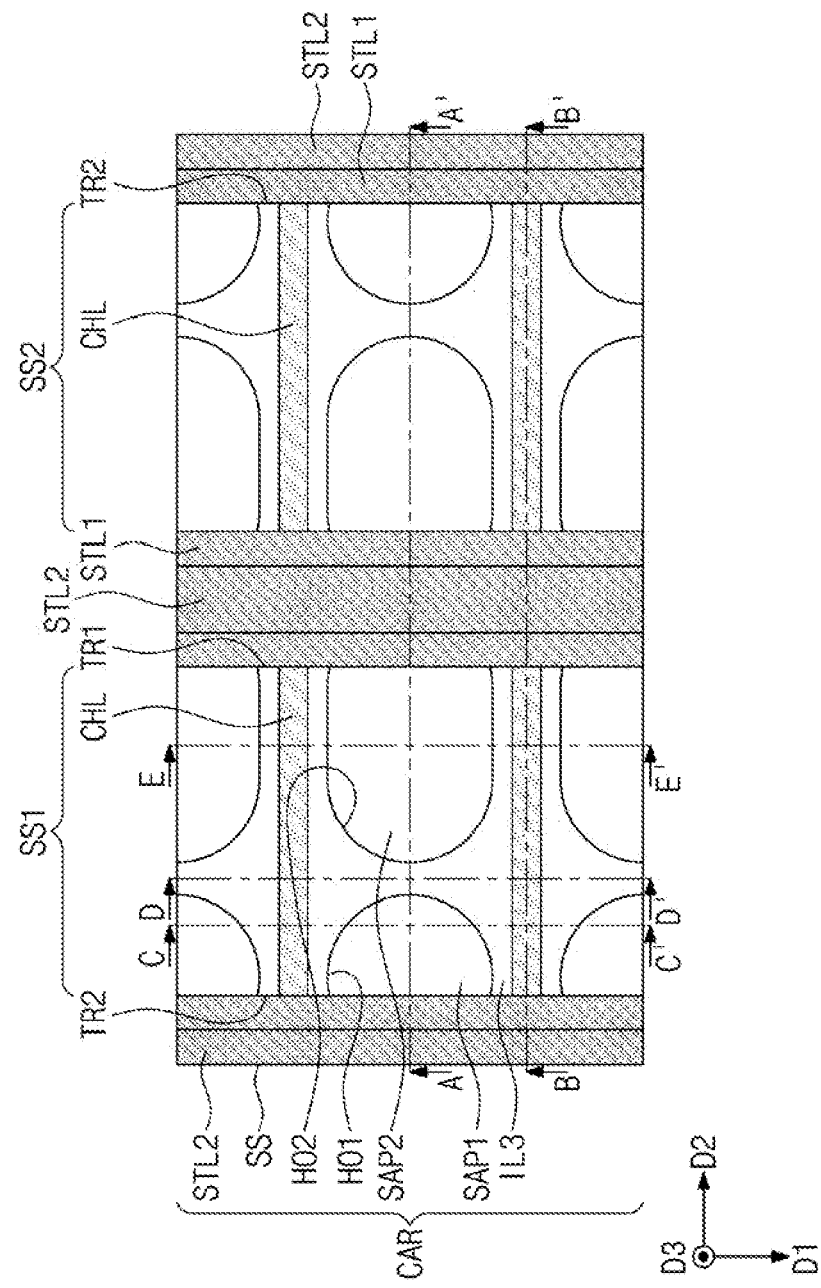
Figure 21A:
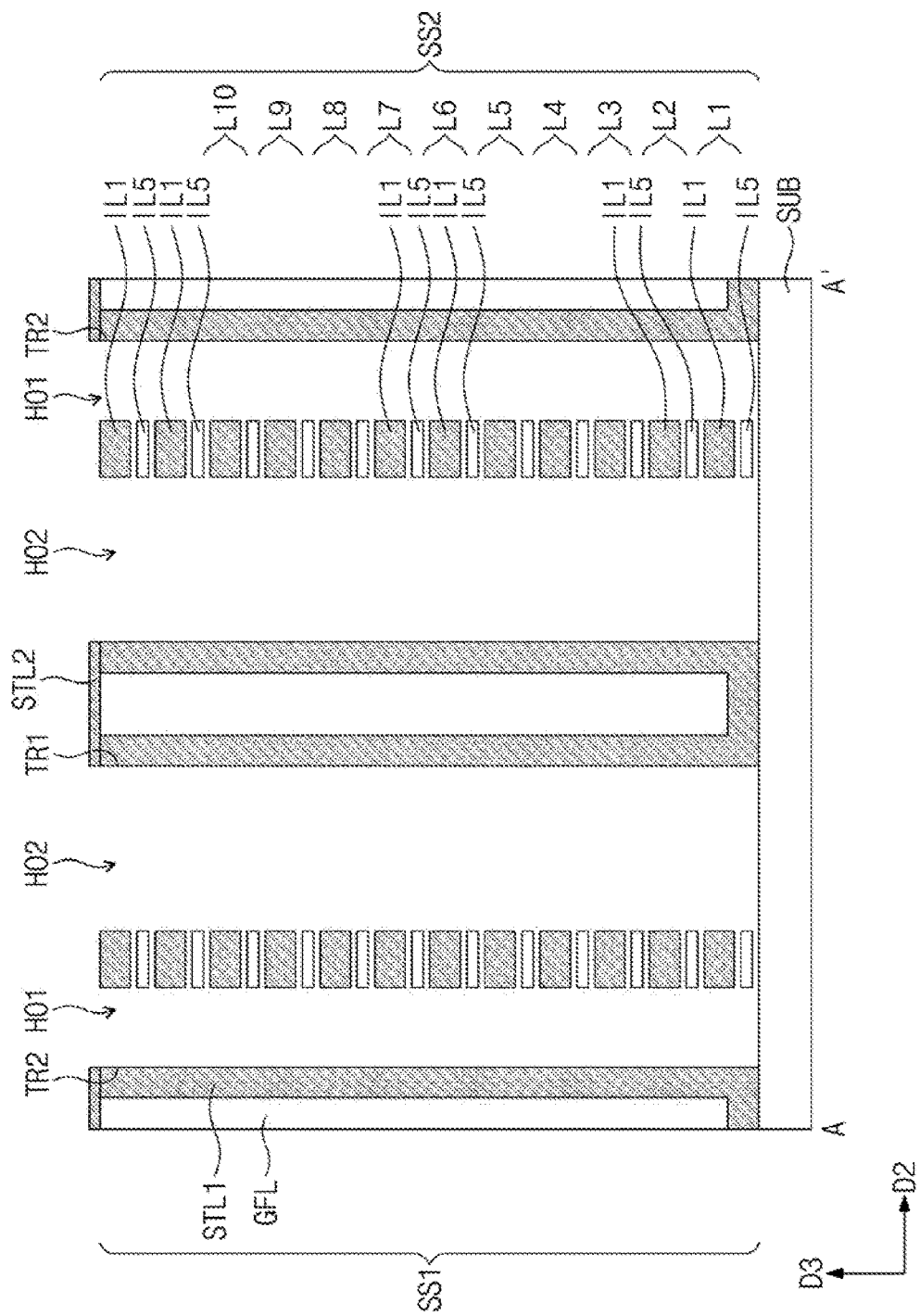
Figure 21B:
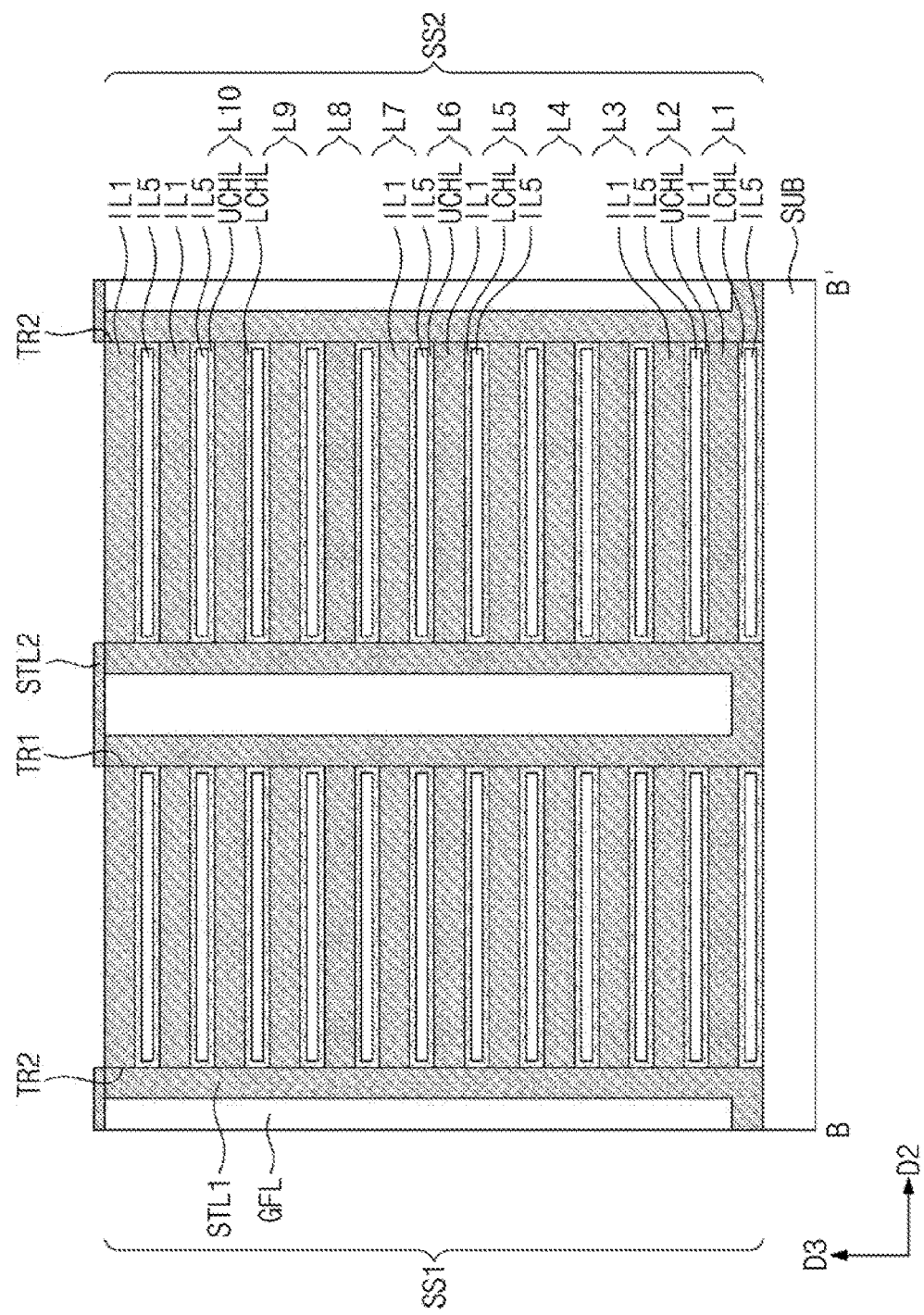
Figure 21C:
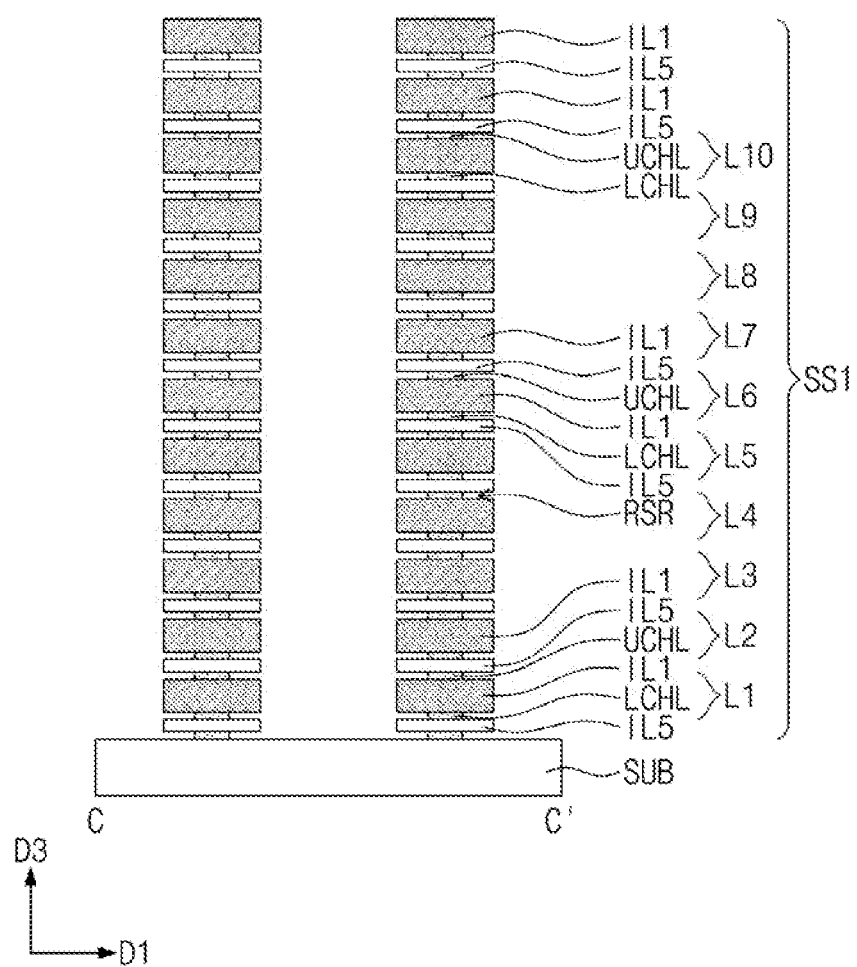

Referring to FIG. 20, each of the channel layers UCHL and LCHL may have a bar shape extending in the second direction D2, as a result of the horizontal and partial wet etching process. In an implementation, a width of the channel layer UCHL or LCHL in the first direction D1 may be reduced by the wet etching process, as shown in FIG. 21C.

Figure 21D:
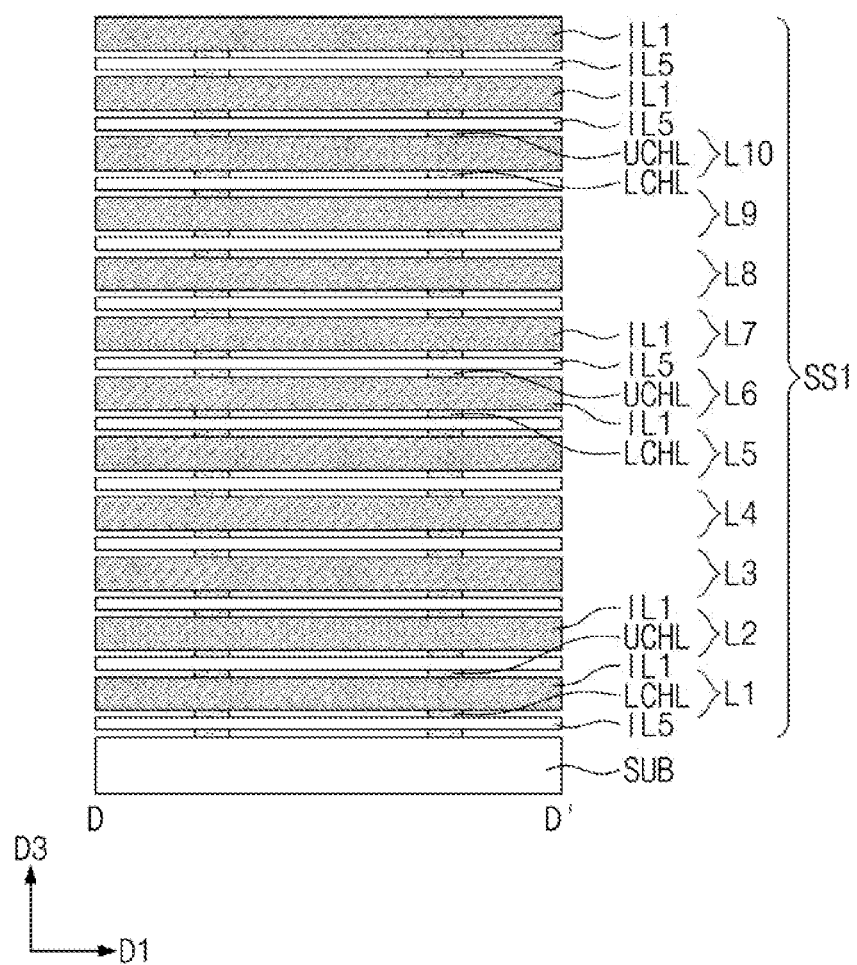
Figure 21E:
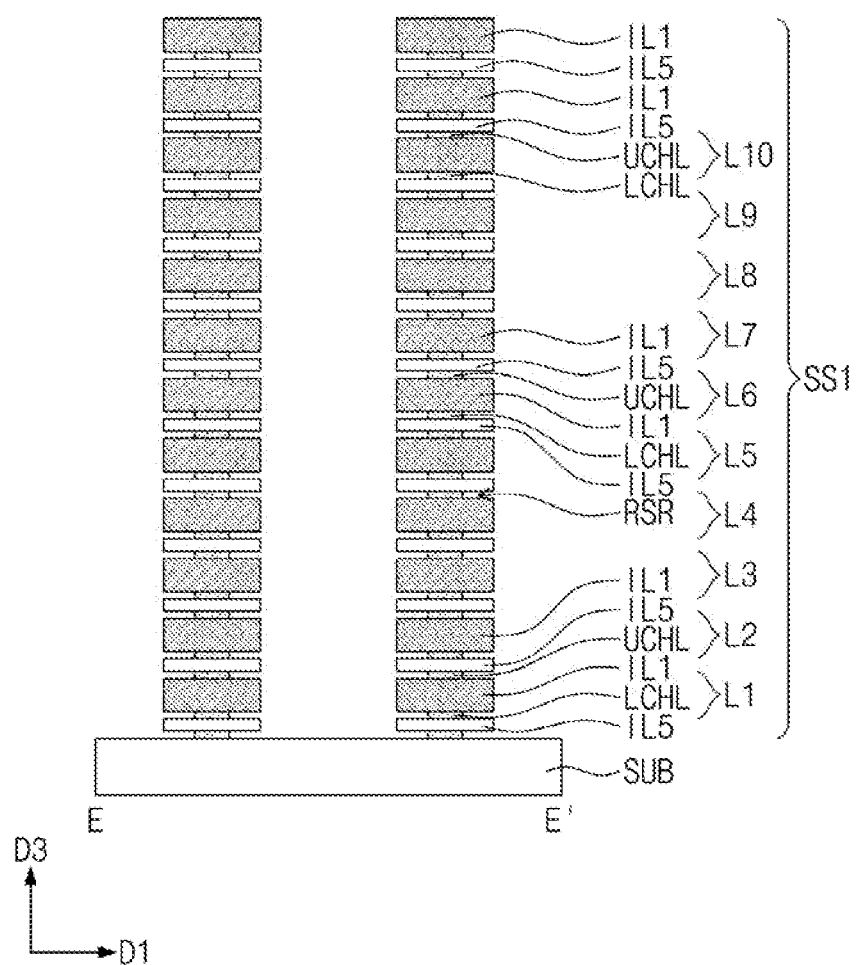
Figure 22:
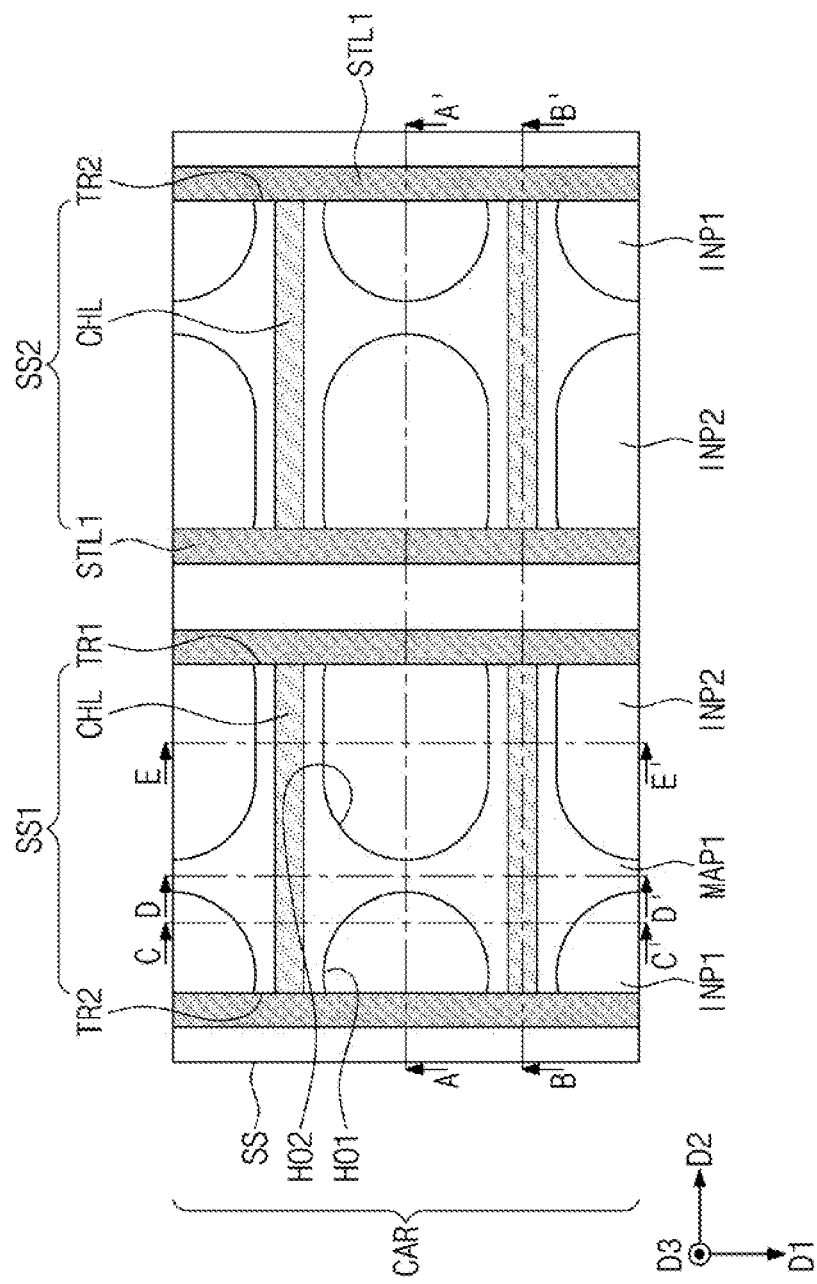

Referring to FIG. 21D, the channel layer UCHL or LCHL in each of the layers L1 to L10 may be divided into a plurality of channel layers UCHL and LCHL by the wet etching process. In an implementation, one channel layer UCHL or LCHL may be divided into a plurality of the channel layers UCHL and LCHL, which are horizontally spaced apart from each other. The recessed region RSR may be between the channel layers UCHL and LCHL, which are horizontally spaced apart from each other.

Referring to FIGS. 22 and 23A to 23E, the first insulating pillars INP1 and the second insulating pillars INP2 may be respectively formed by filling the first and second holes HO1 and HO2 with an insulating material. The first insulating pillars INP1 may be formed to completely fill the first holes HO1, respectively, and the second insulating pillars INP2 may be formed to completely fill the second holes HO2, respectively. In an implementation, the first and second insulating pillars INP1 and INP2 may be formed of or include silicon oxide.

Figure 23A:
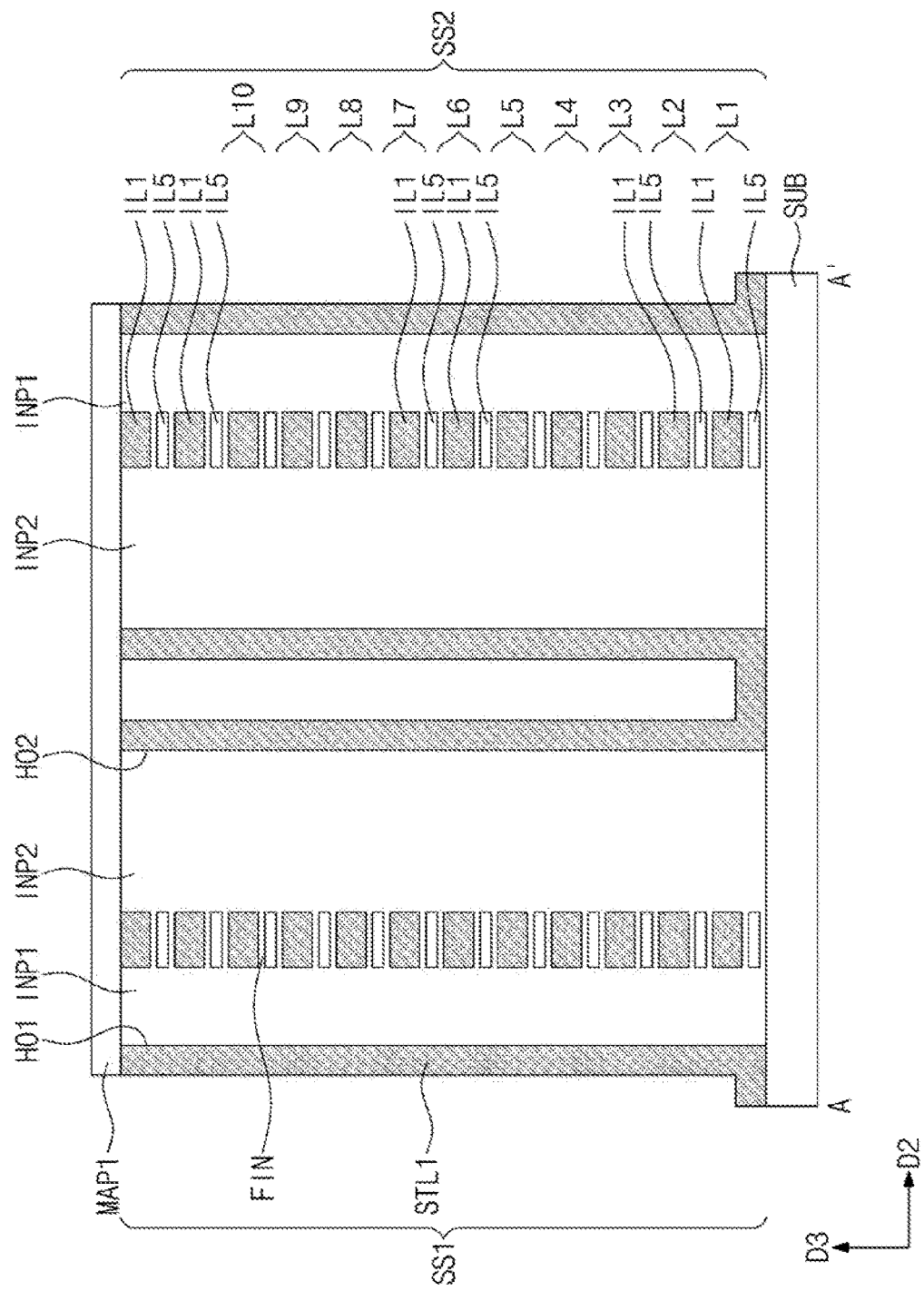
Figure 23B:
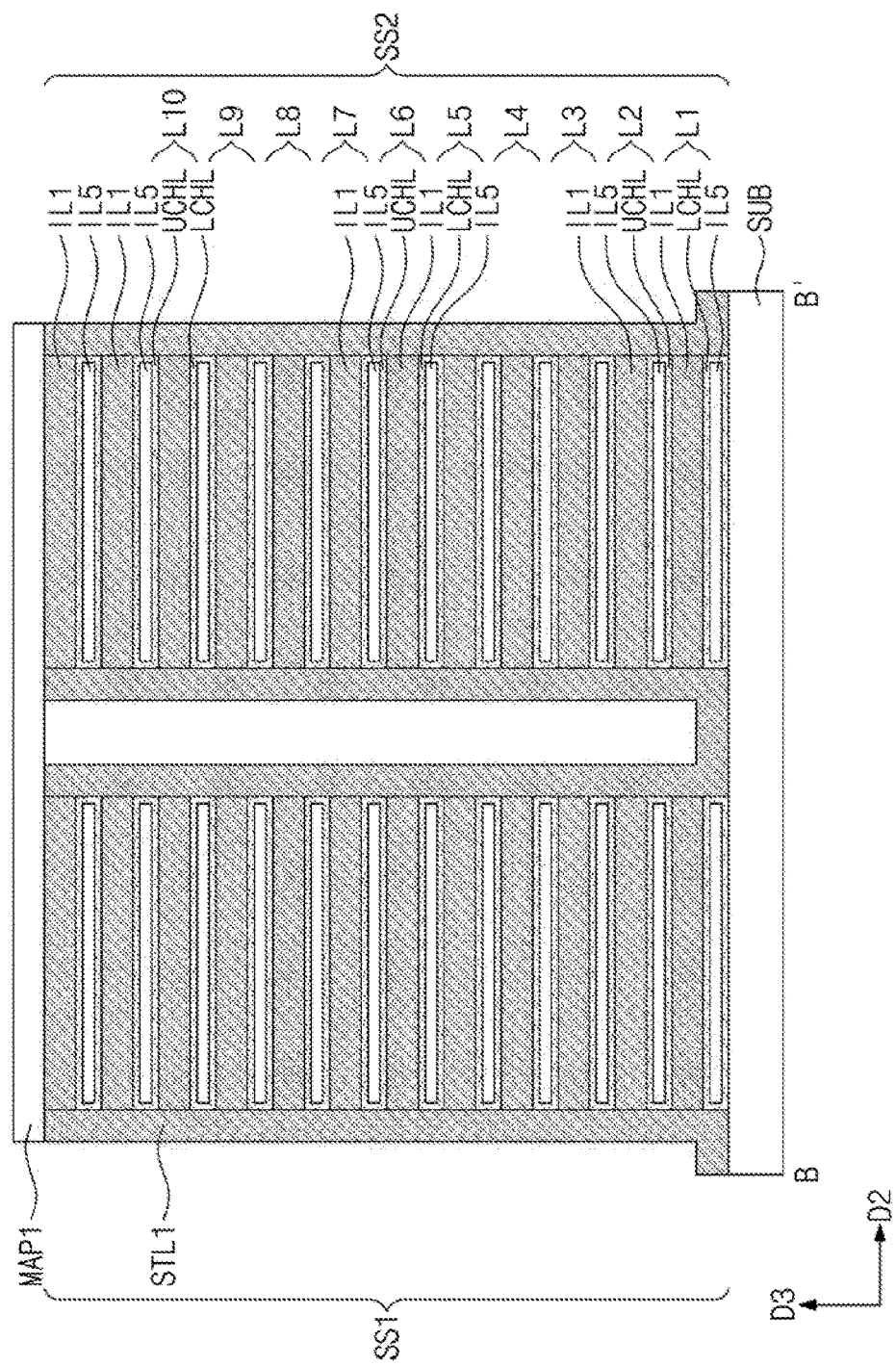
Figure 23C:
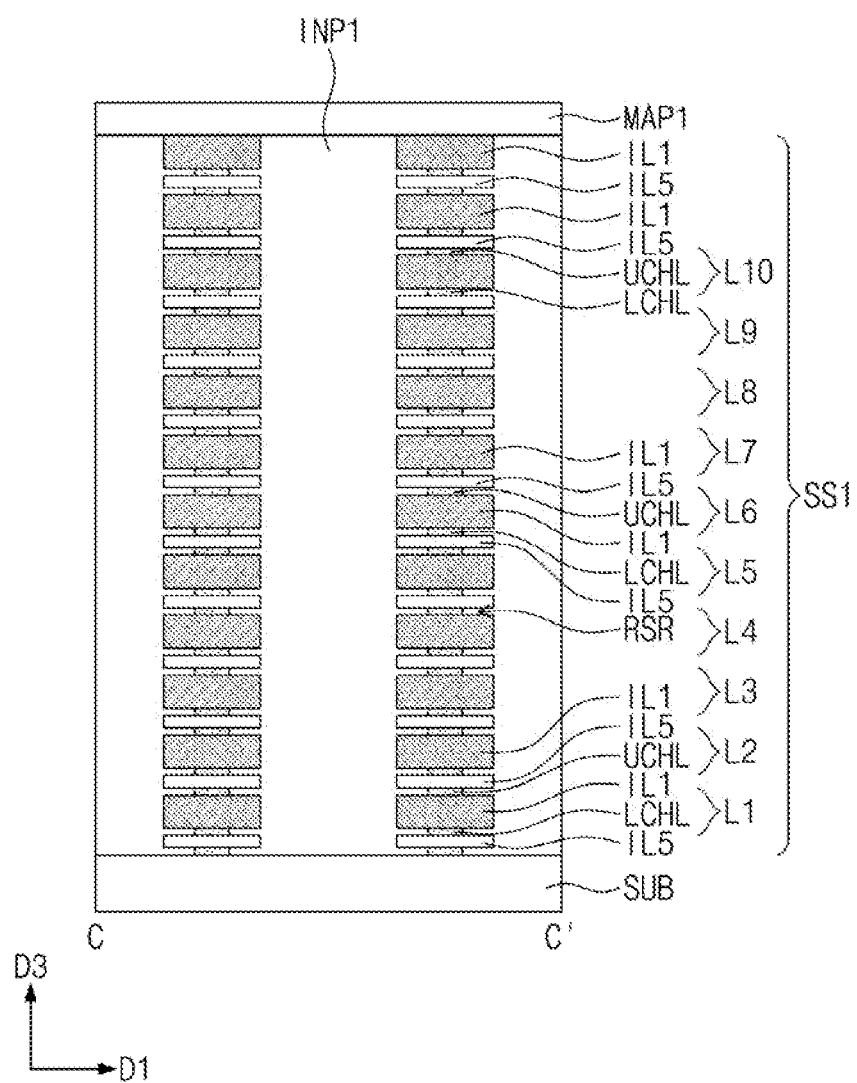
Figure 23D:
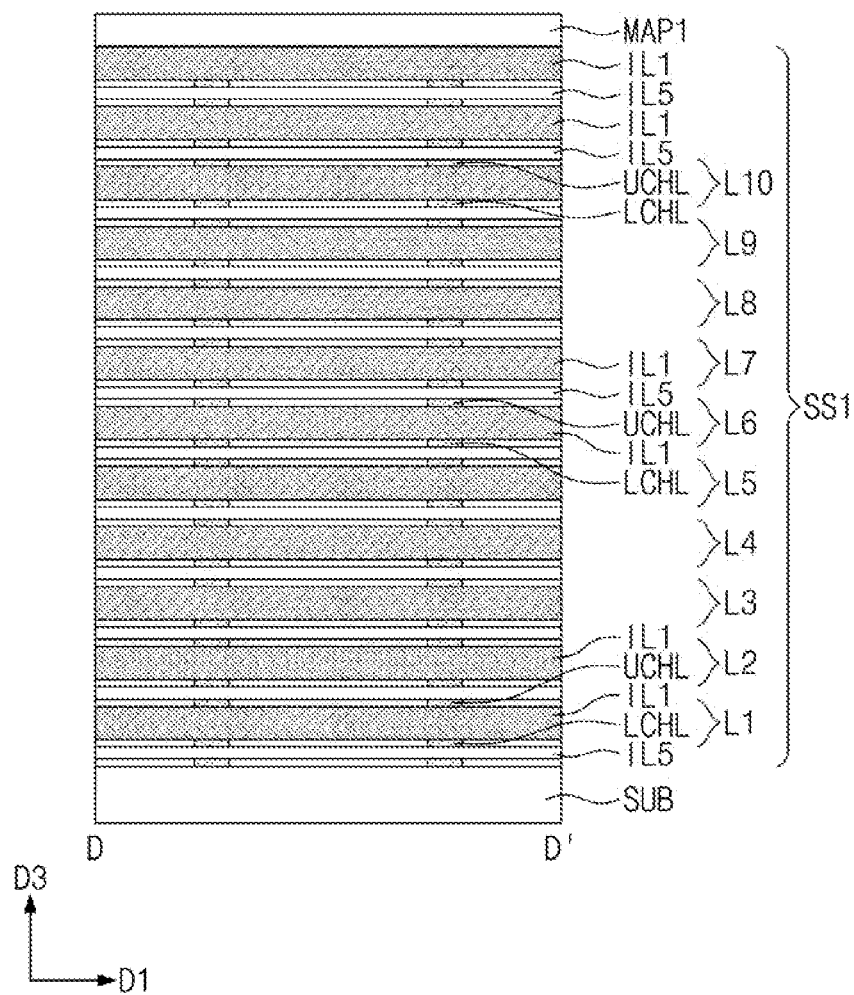
Figure 23E:
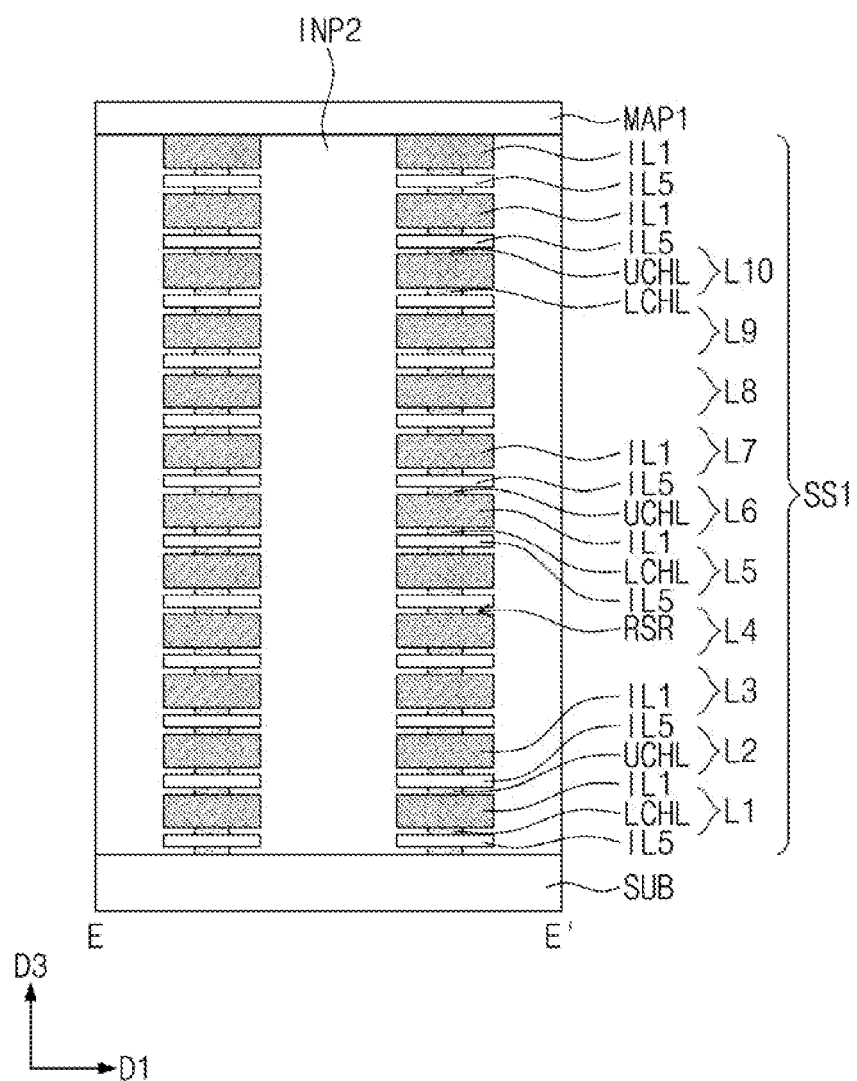
Figure 24:
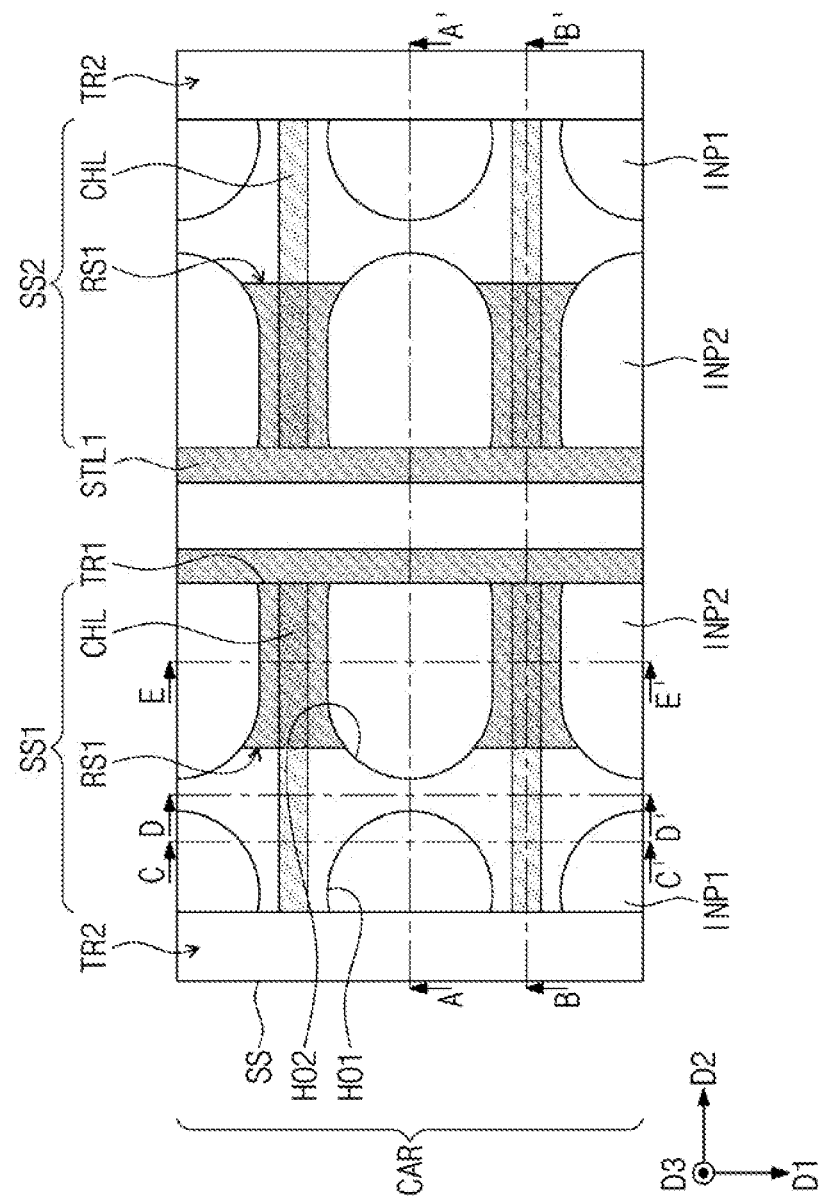

The filling insulating layers FIN may be formed during the formation of the first and second insulating pillars INP1 and INP2 (e.g., see FIG. 23A). Adjacent ones of the first and second insulating pillars INP1 and INP2 may be connected to each other by the filling insulating layers FIN. In an implementation, the filling insulating layer FIN may be formed in the recessed region RSR.

A first mask pattern MAP1 may be formed on top surfaces of the first and second stacks SS1 and SS2 and a top surface of the gap-fill layer GFL in the first trench TR1. The first mask pattern MAP1 may be formed to expose the gap-fill layer GFL in the second trench TR2.

The exposed gap-fill layer GFL may be selectively removed using the first mask pattern MAP1 as an etch mask. Thus, the first stopper layer STL1 on the sidewall of each of the first and second stacks SS1 and SS2 may be exposed to the outside. In an implementation, the first stopper layer STL1 in the second trench TR2 may be exposed.

Referring to FIGS. 24 and 25A to 25E, the first stopper layer STL1 in the second trench TR2 may be selectively removed through the second trench TR2. Next, the first insulating layers IL1 exposed through the second trench TR2 may be partially removed. In an implementation, the removal of the first stopper layer STL1 and the first insulating layers IL1 may include performing a wet etching process of selectively removing a silicon nitride layer. The wet etching process may be performed to horizontally and partially etch each of the first insulating layers IL1.

Figure 25A:
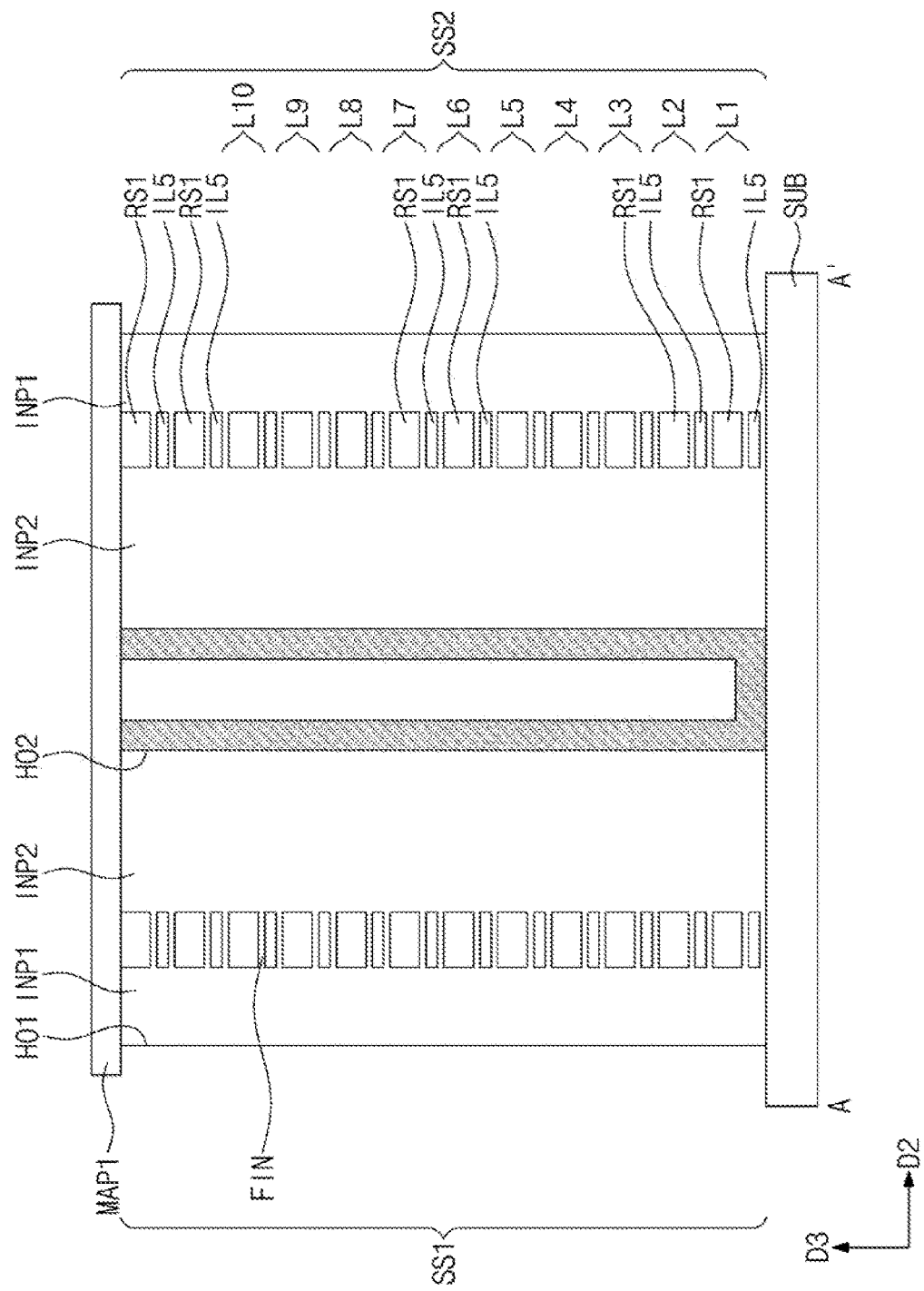
Figure 25B:
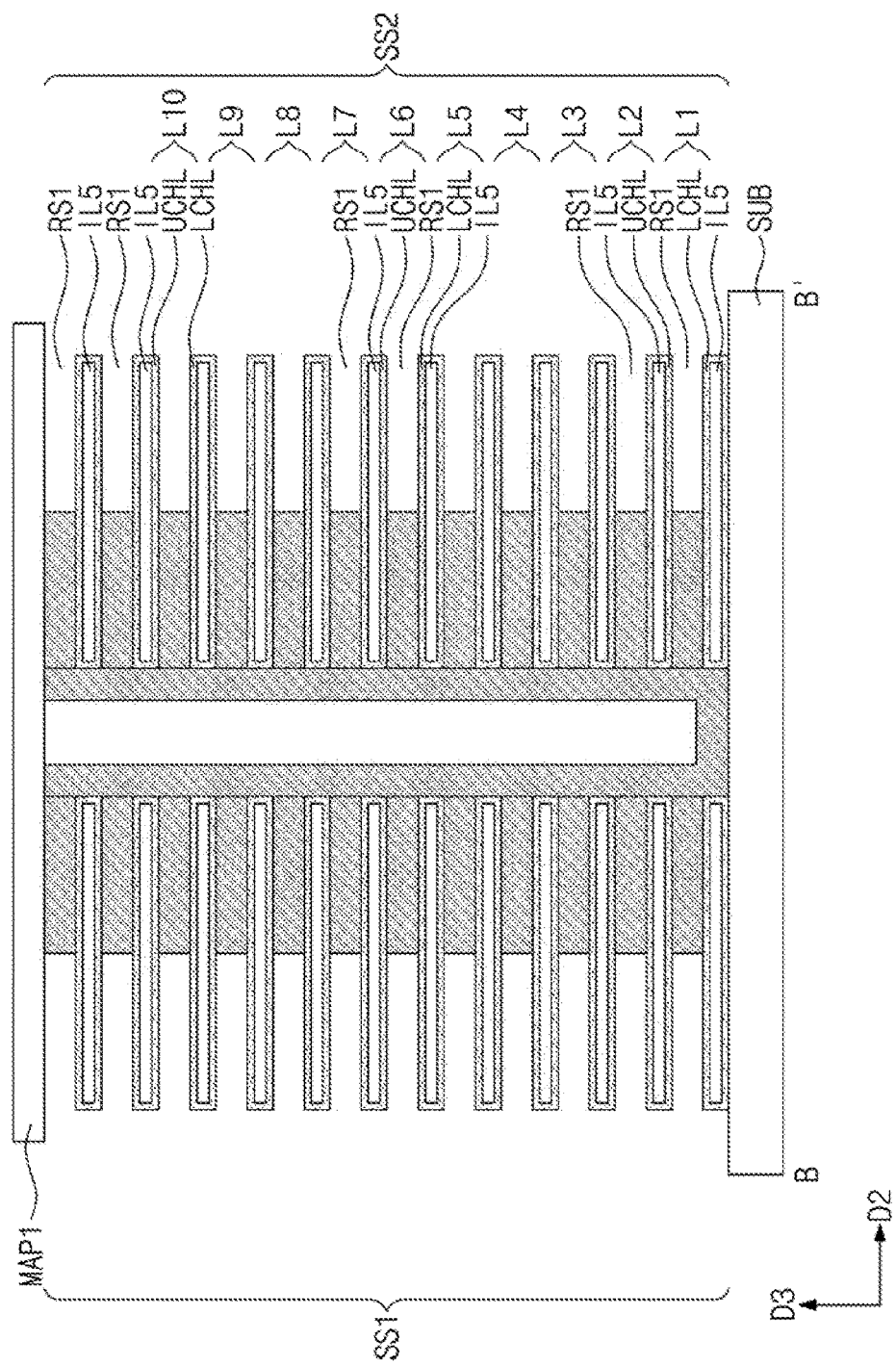
Figure 25C:
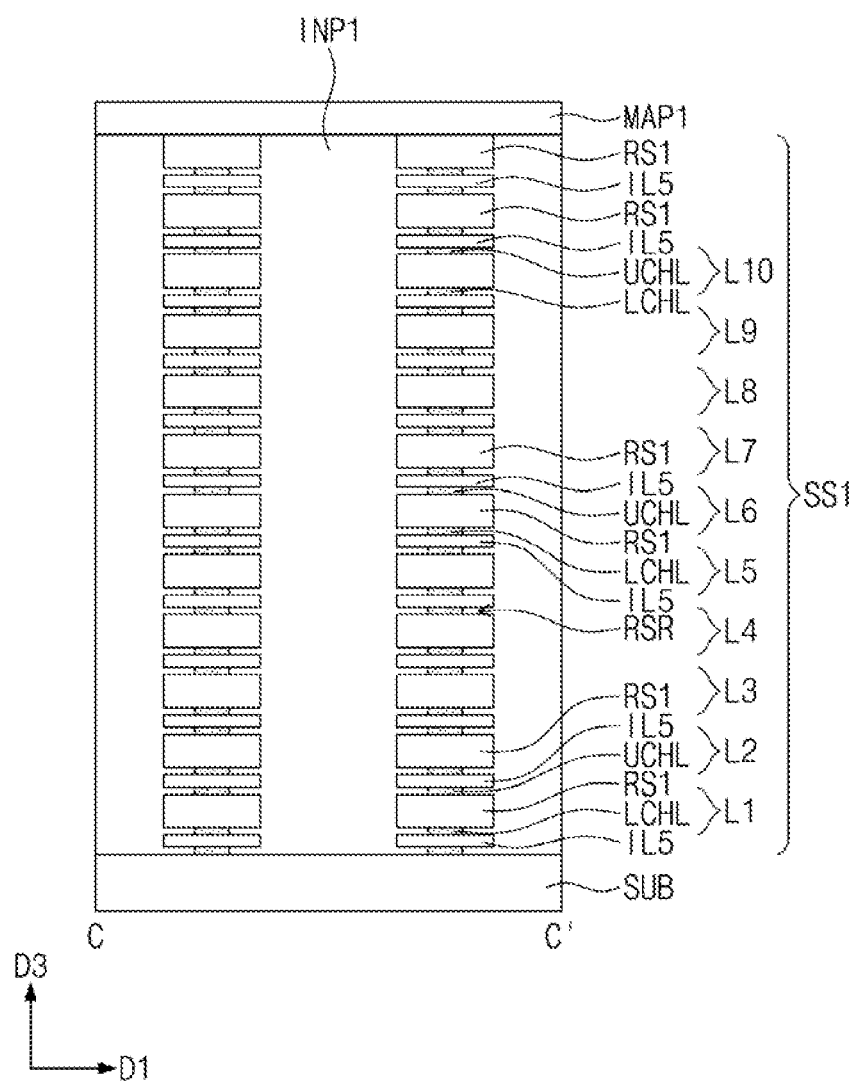
Figure 25D:
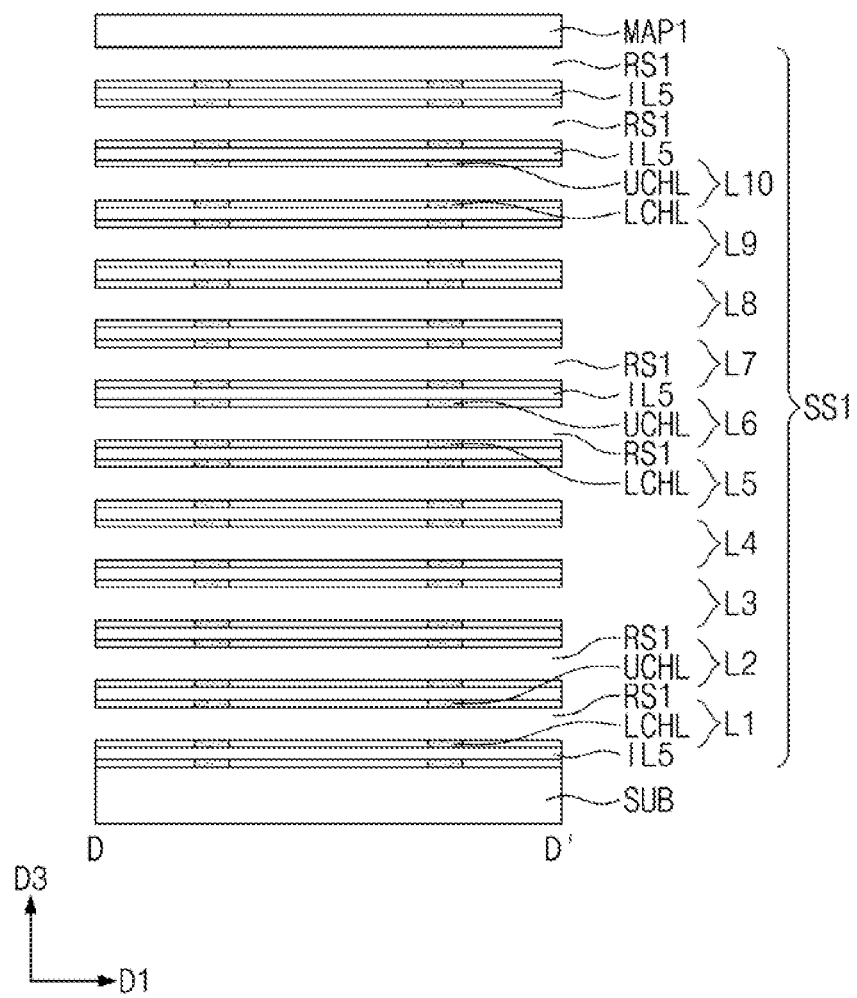
Figure 25E:
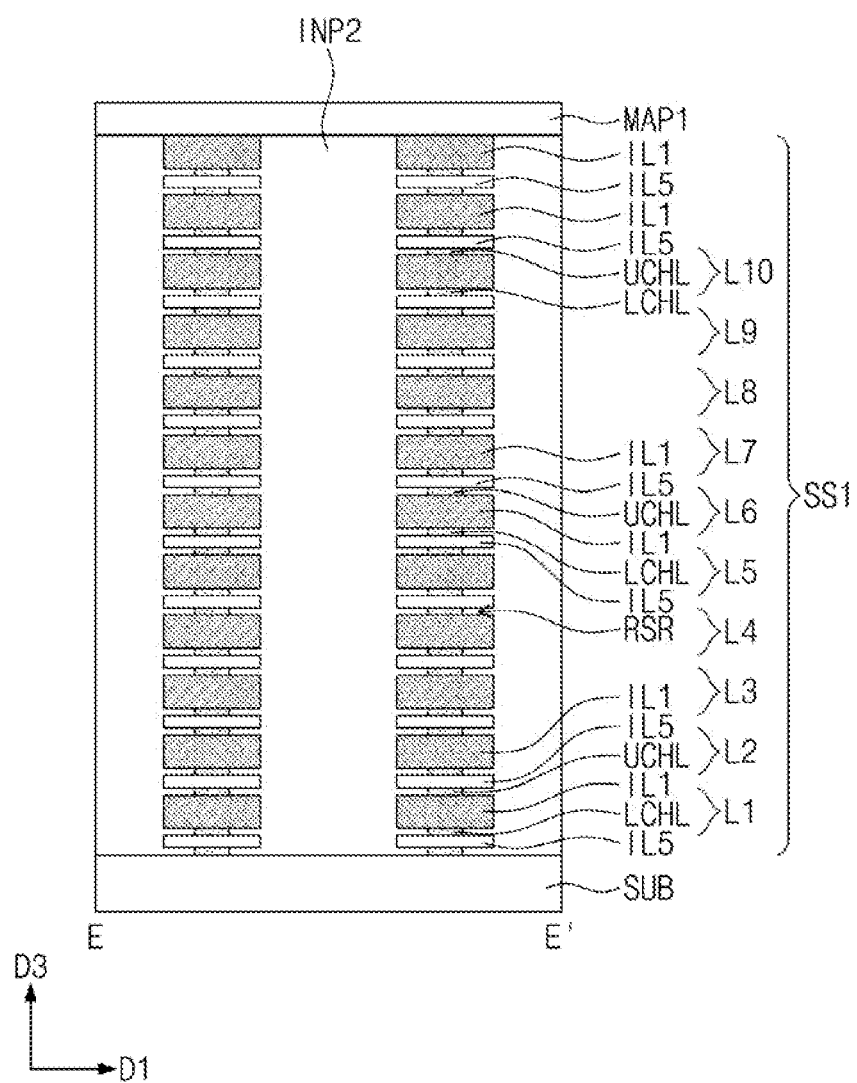
Figure 26:
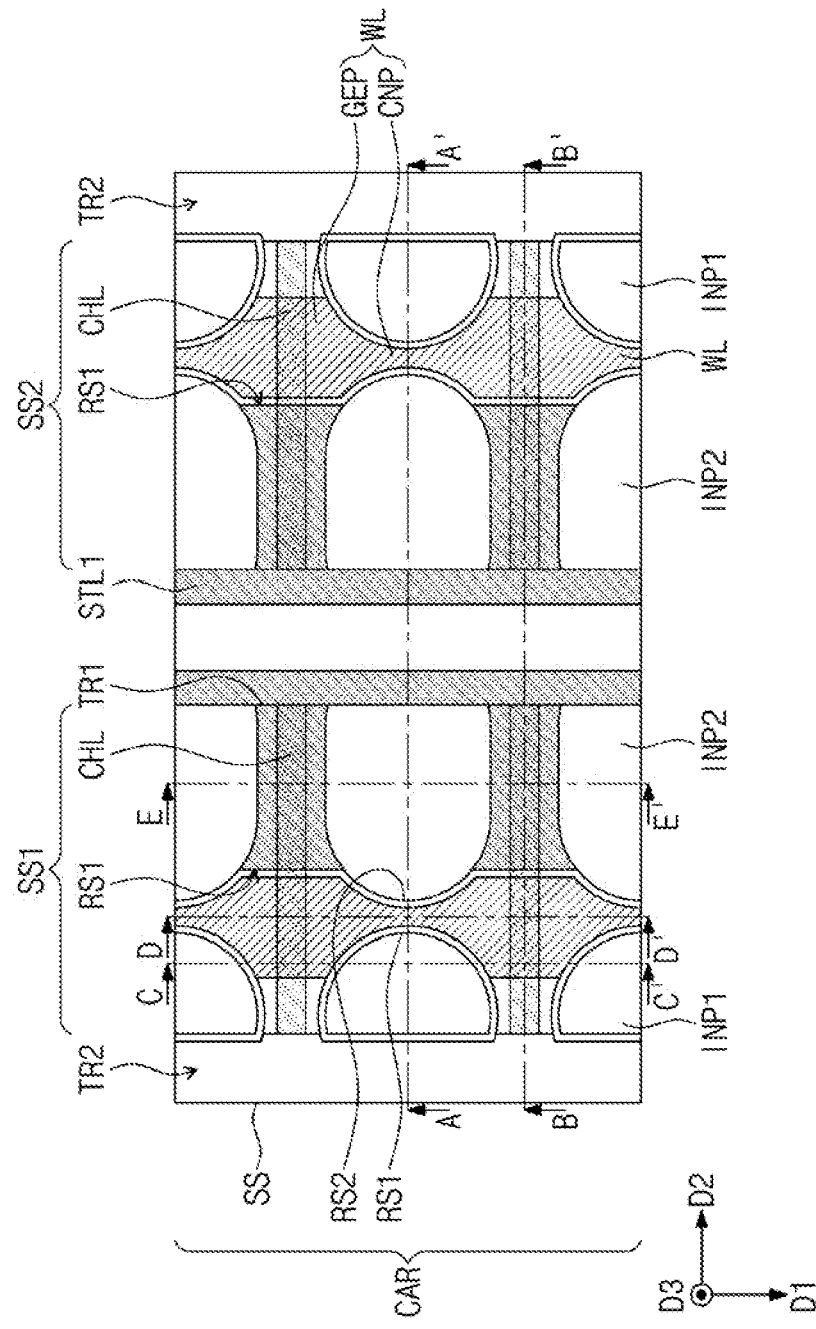
Figure 27A:
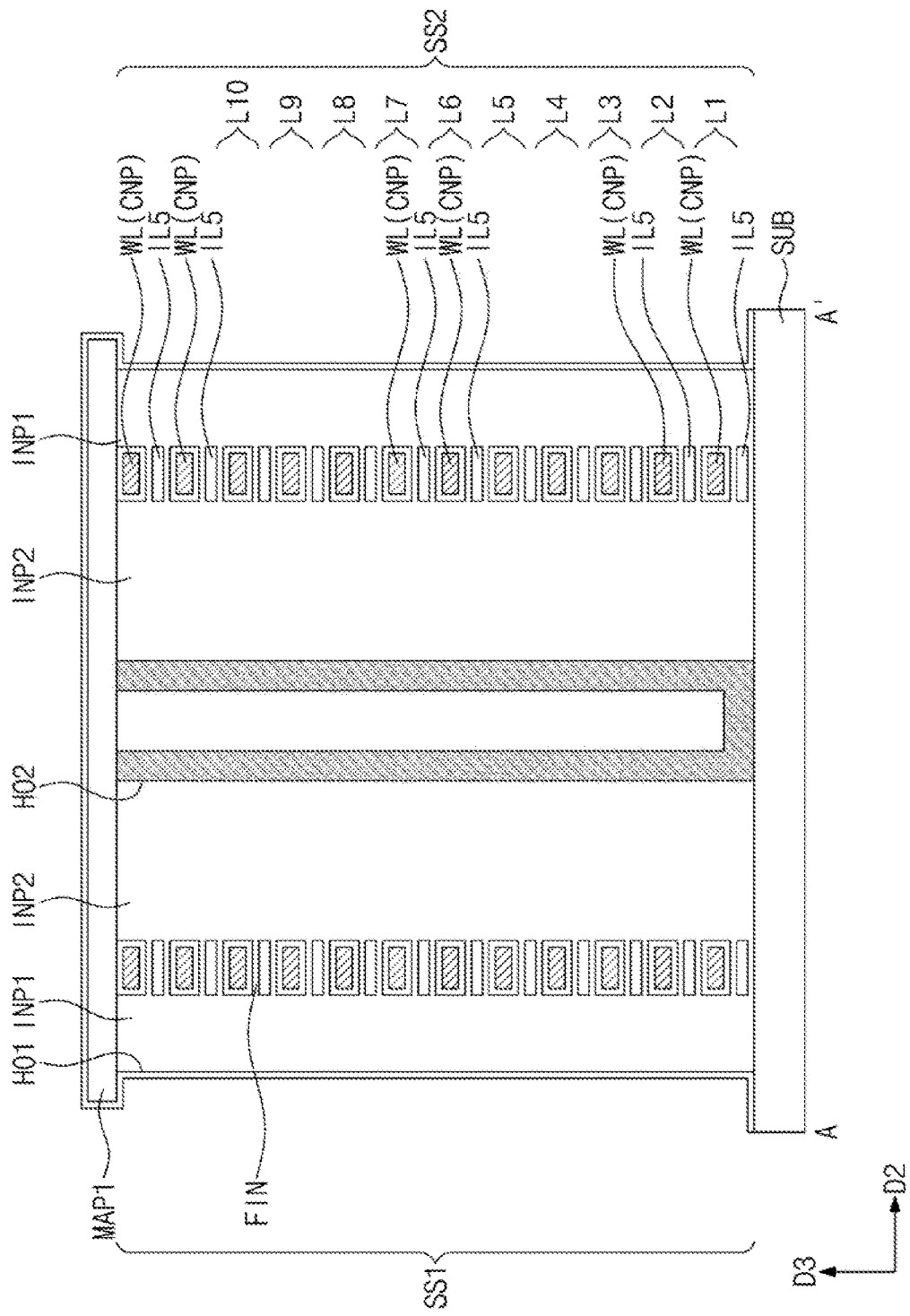
Figure 27B:
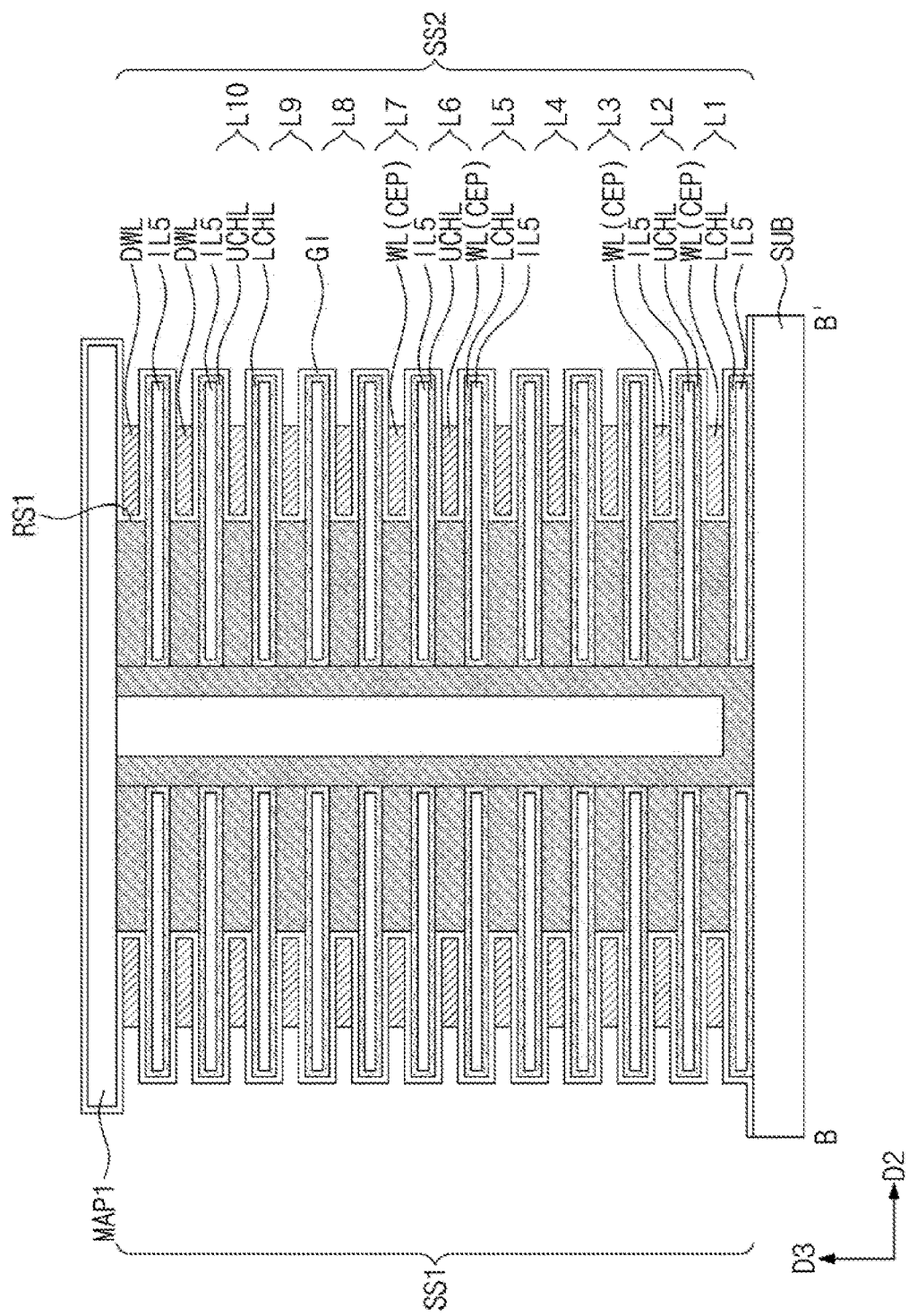
Figure 27C:
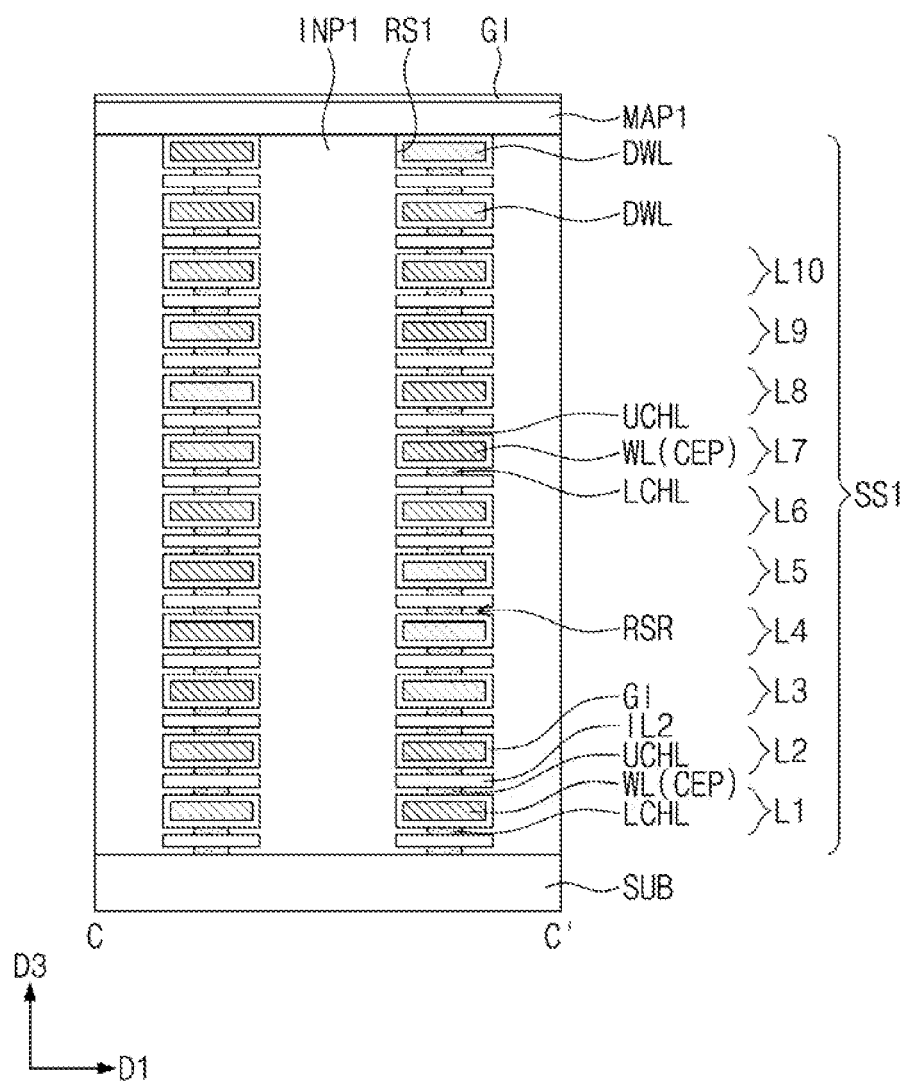
Figure 27D:
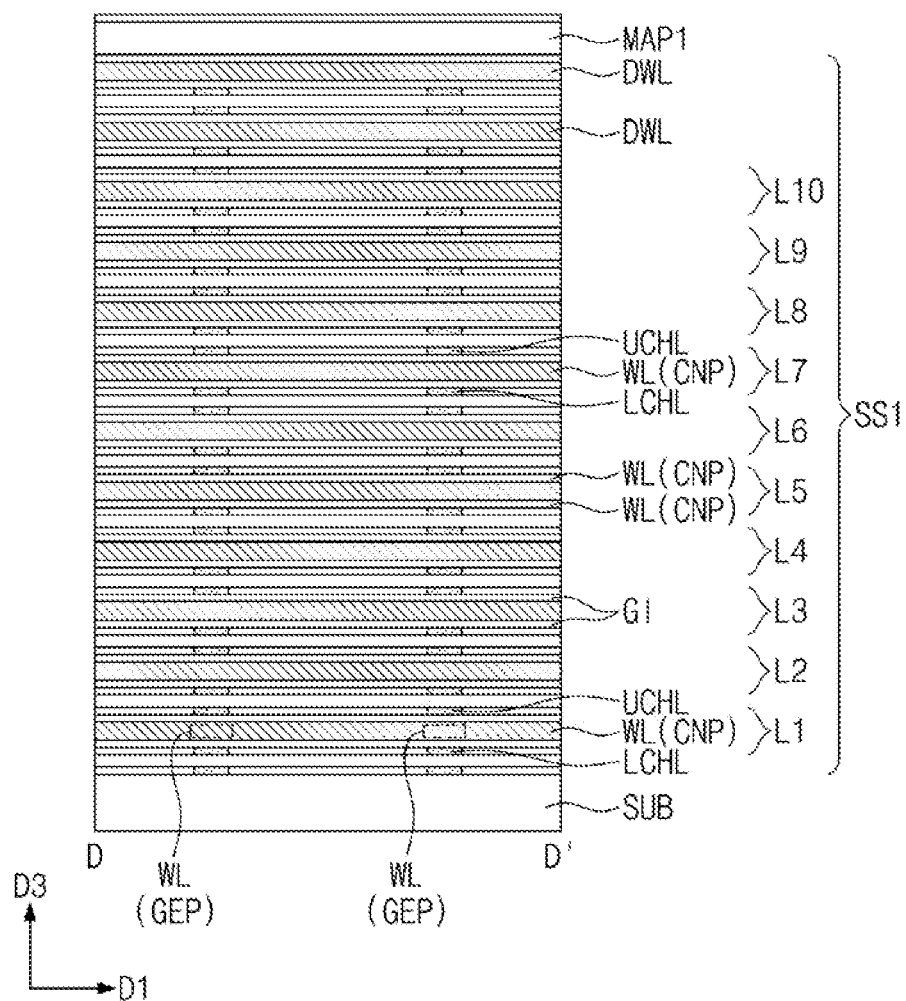
Figure 27E:
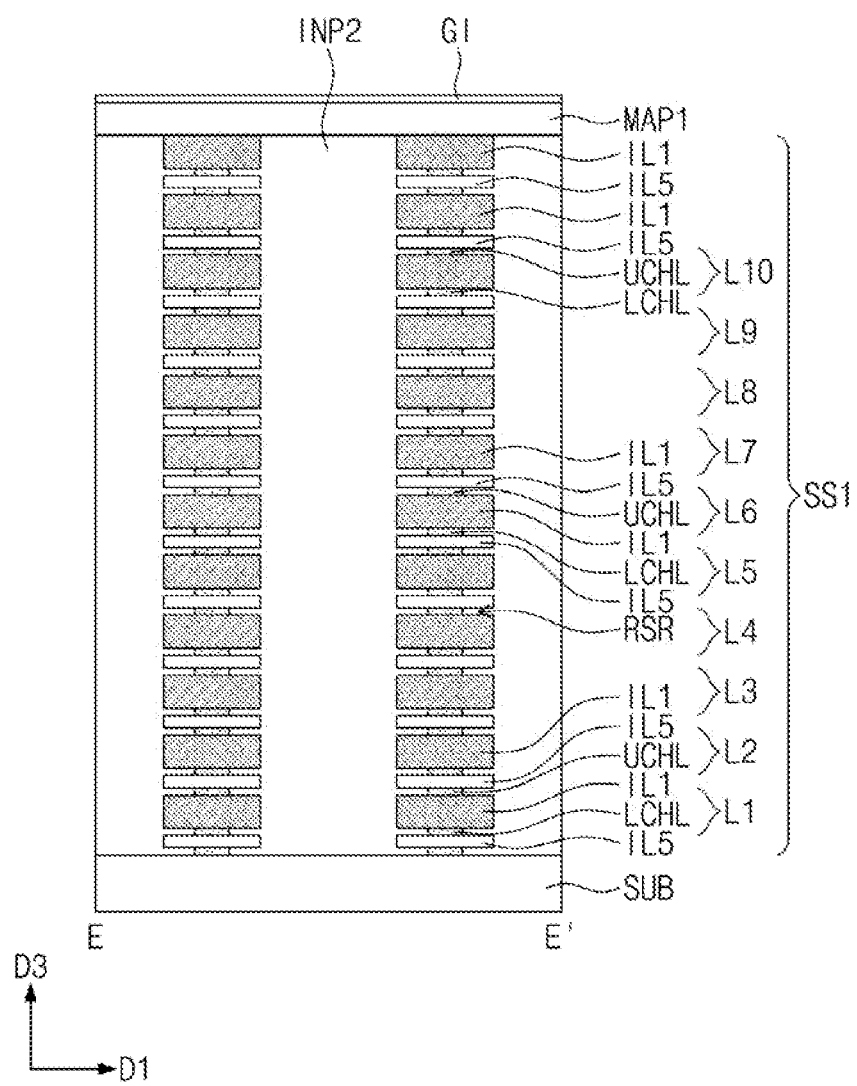
Figure 28:
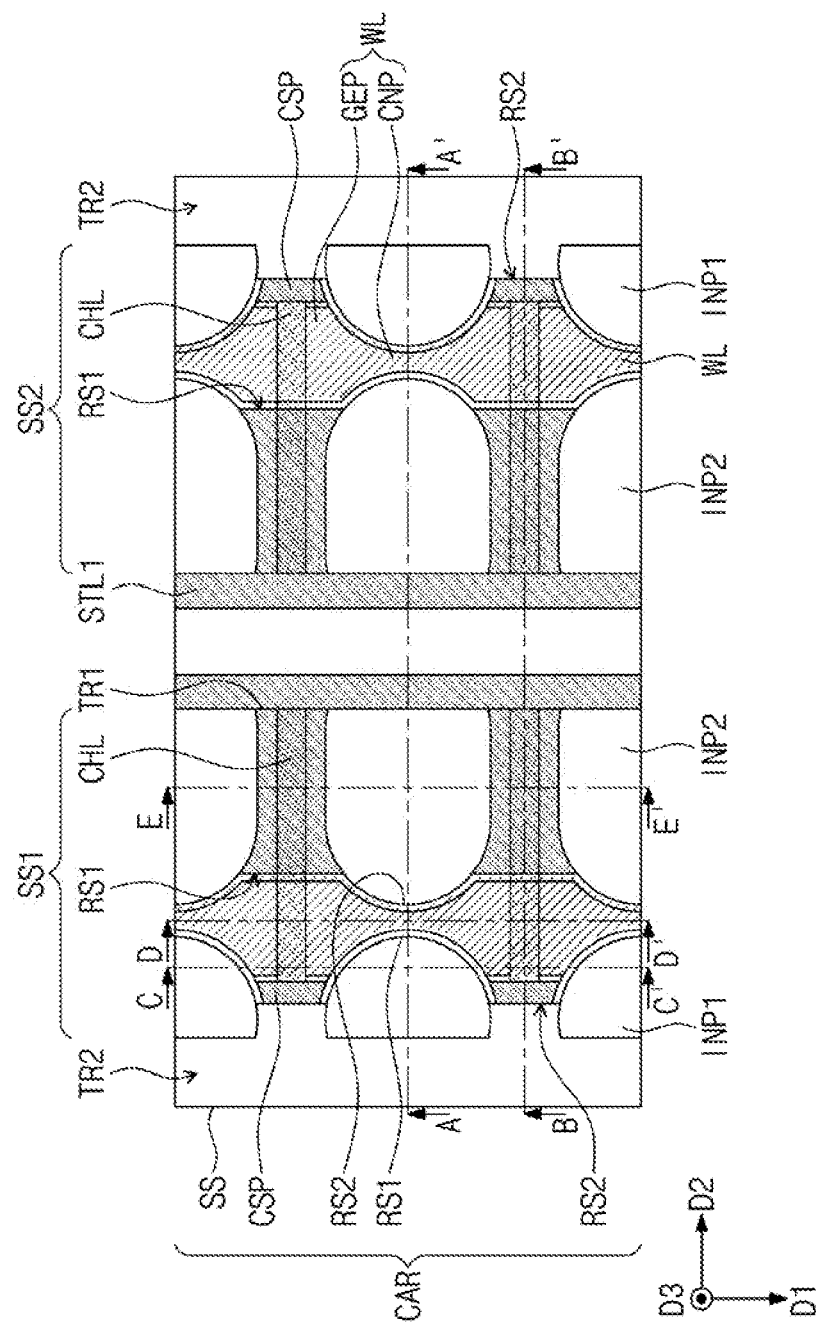

Referring to FIG. 25B, each of the first insulating layers IL1 may be horizontally etched, and a first recess RS1, which is extended from the second trench TR2 in the second direction D2, may be formed in the first stack SS1. Similarly, the first recess RS1, which extends from the second trench TR2, may be formed in the second stack SS2. The first recess RS1 may be formed between the lower and upper channel layers LCHL and UCHL.

Referring to FIGS. 26 and 27A to 27E, the gate insulating layer GI may be conformally deposited on the substrate SUB. The gate insulating layer GI may be formed in the first recess RS1 through the second trench TR2.

Next, the word line WL may be formed in the first recess RS1. The word line WL may be formed on the gate insulating layer GI. In an implementation, the formation of the word line WL may include depositing a metal layer in the first recess RS1 through the second trench TR2 and performing a wet etching process of etching the metal layer using an etchant supplied through the second trench TR2, and as a result, the word line WL may be left in the first recess RS1.

The word lines WL may be formed in the first recesses RS1, respectively, and may be stacked in the third direction D3. Each of the word lines WL may have a line shape extending in the first direction D1. The word line WL may include the first and second recessed sidewalls RSP1 and RSP2, which are respectively formed by the first and second insulating pillars INP1 and INP2 which are adjacent to each other.

The word line WL may include the gate portion GEP, which is between the upper and lower channel layers UCHL and LCHL, and the connecting portion CNP, which is between the first and second insulating pillars INP1 and INP2. The connecting portion CNP may connect the gate portions GEP, which are adjacent to each other in the first direction D1, to each other. The gate portion GEP may be formed such that a width thereof in the second direction D2 is larger than a width of the connecting portion CNP in the second direction D2.

Referring to FIGS. 28 and 29A to 29E, the capping pattern CSP may be formed on an exposed sidewall of the gate portion GEP of the word line WL. The capping pattern CSP may be formed between the first insulating pillars INP1, which are adjacent to each other in the first direction D1. Next, the gate insulating layer GI, which is exposed to the outside, may be partially removed using the capping pattern CSP as an etch mask.

Figure 29A:
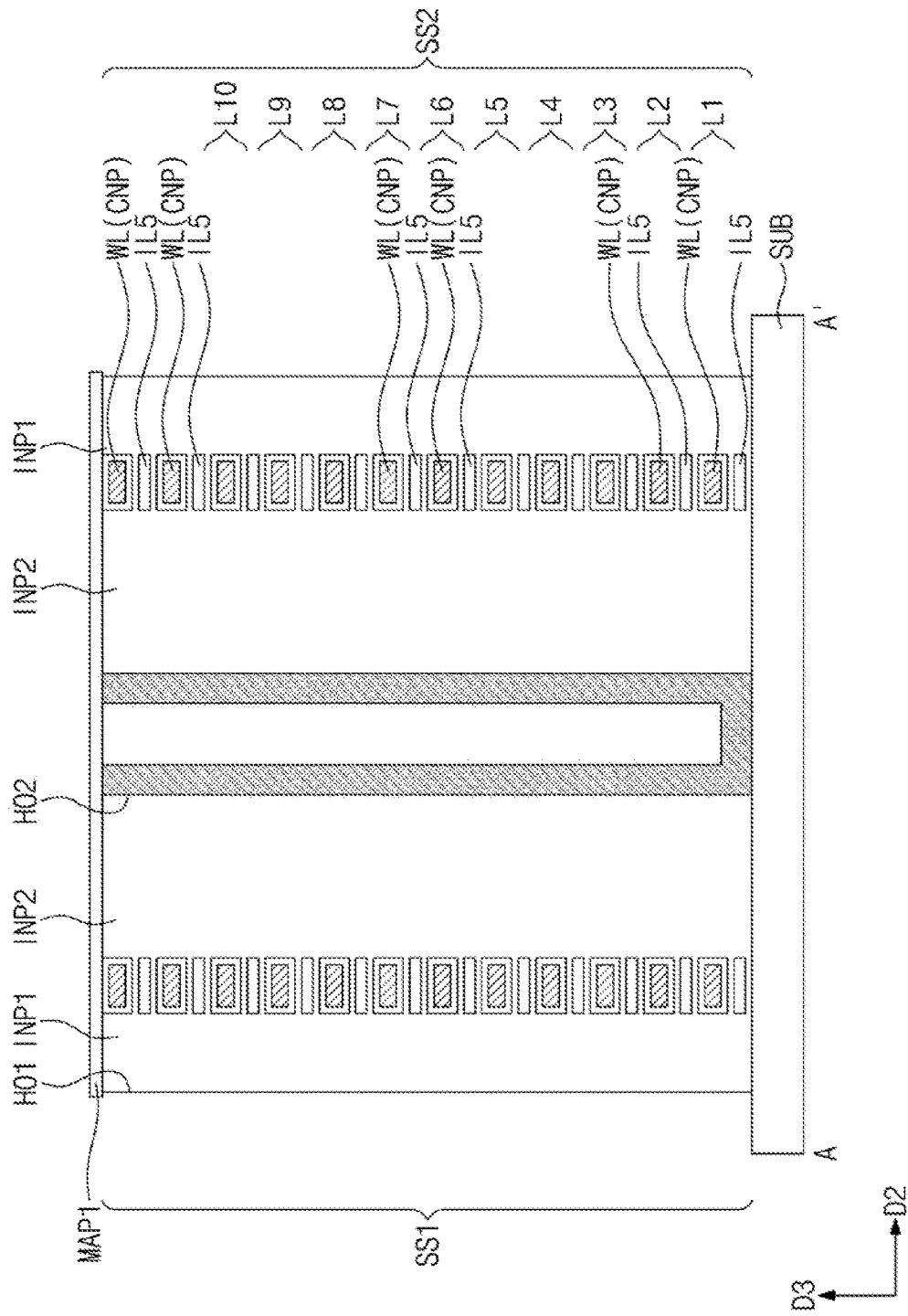
Figure 29B:
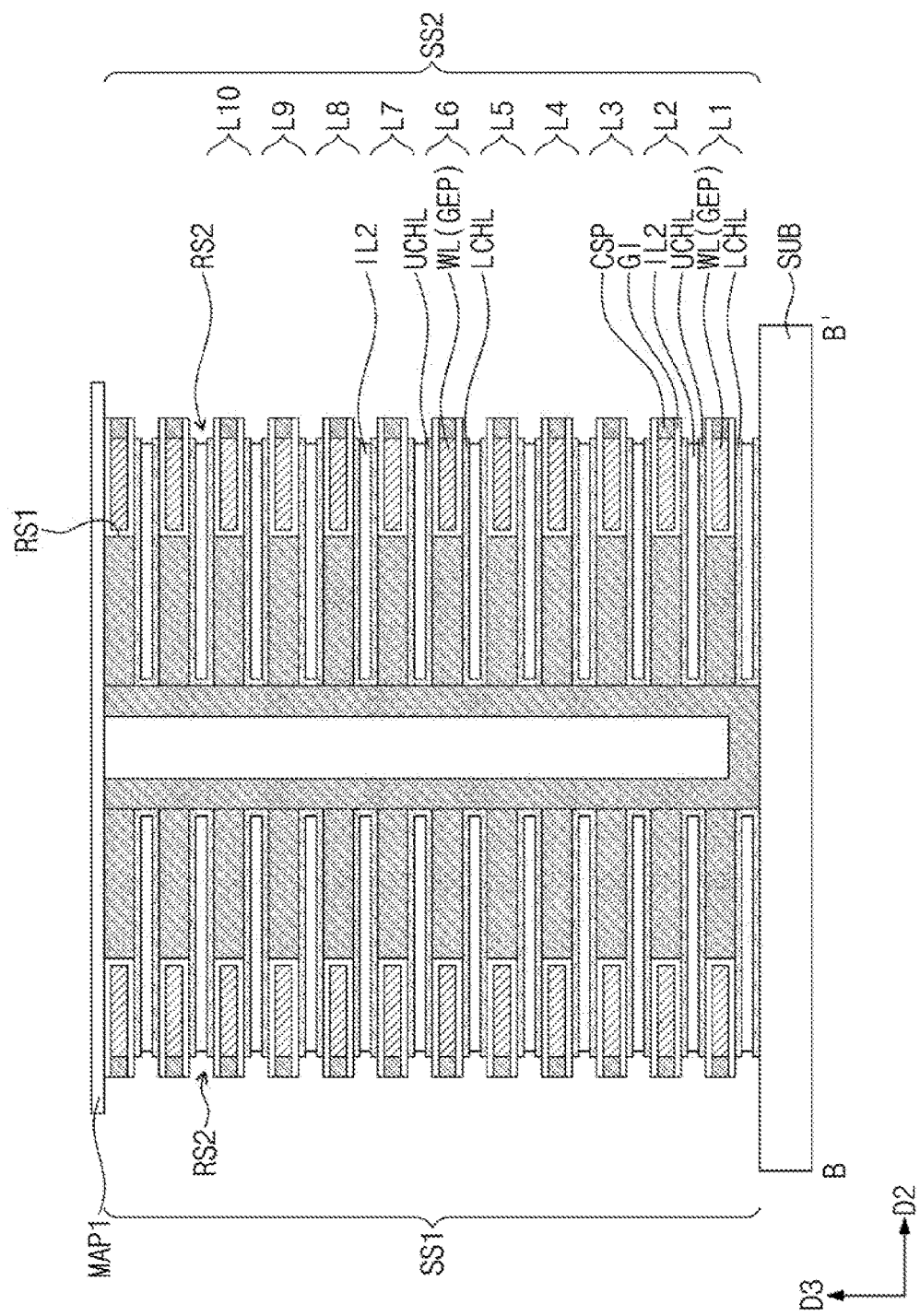
Figure 29C:
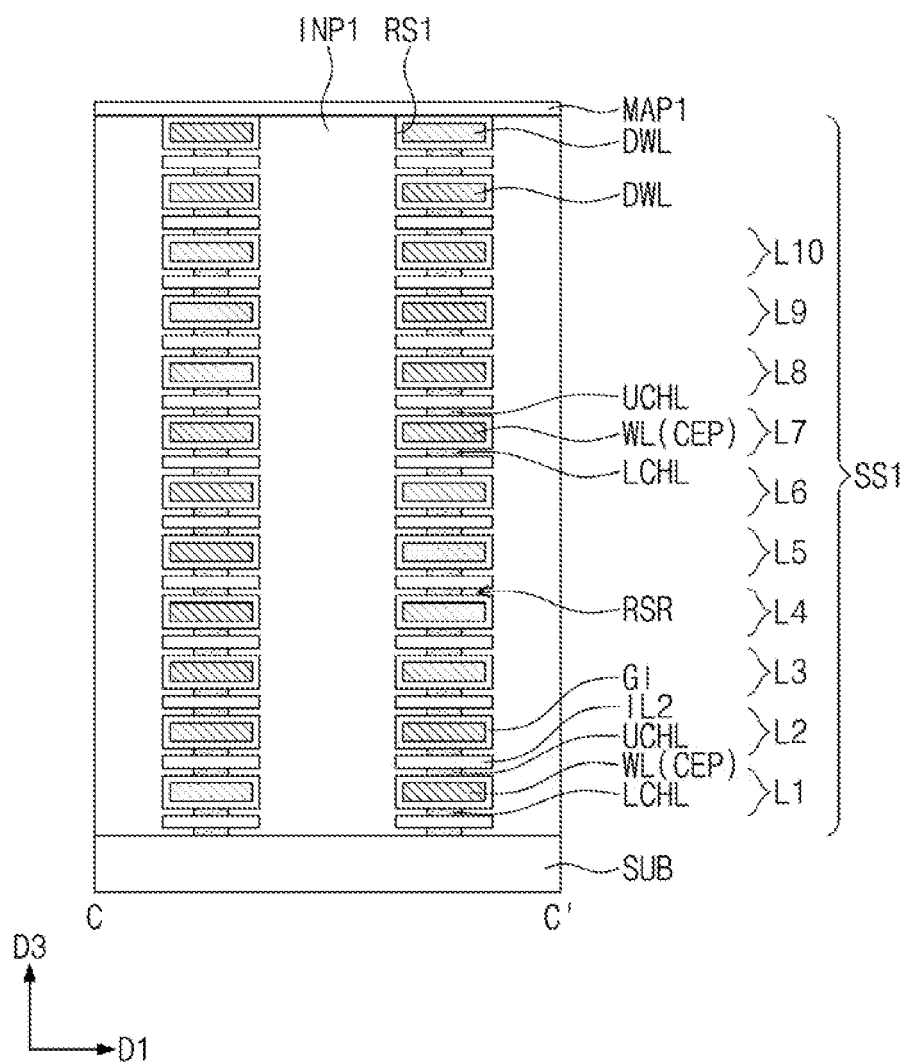
Figure 29D:
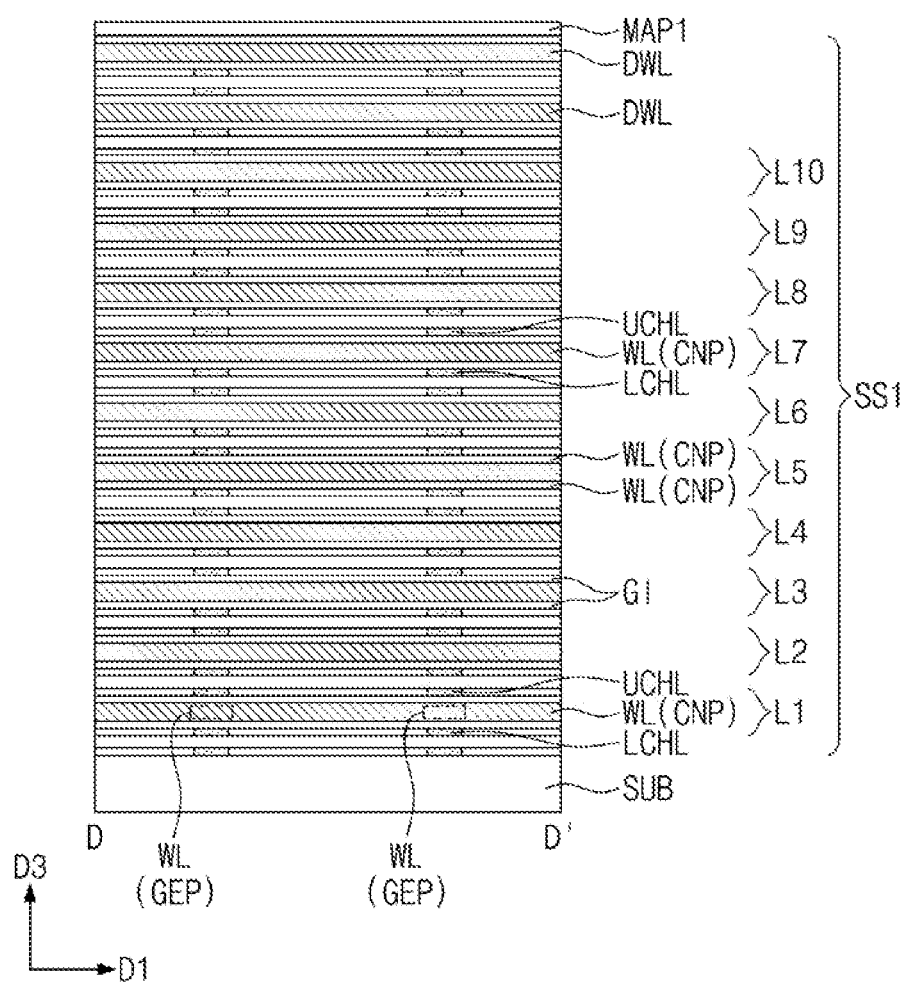
Figure 29E:
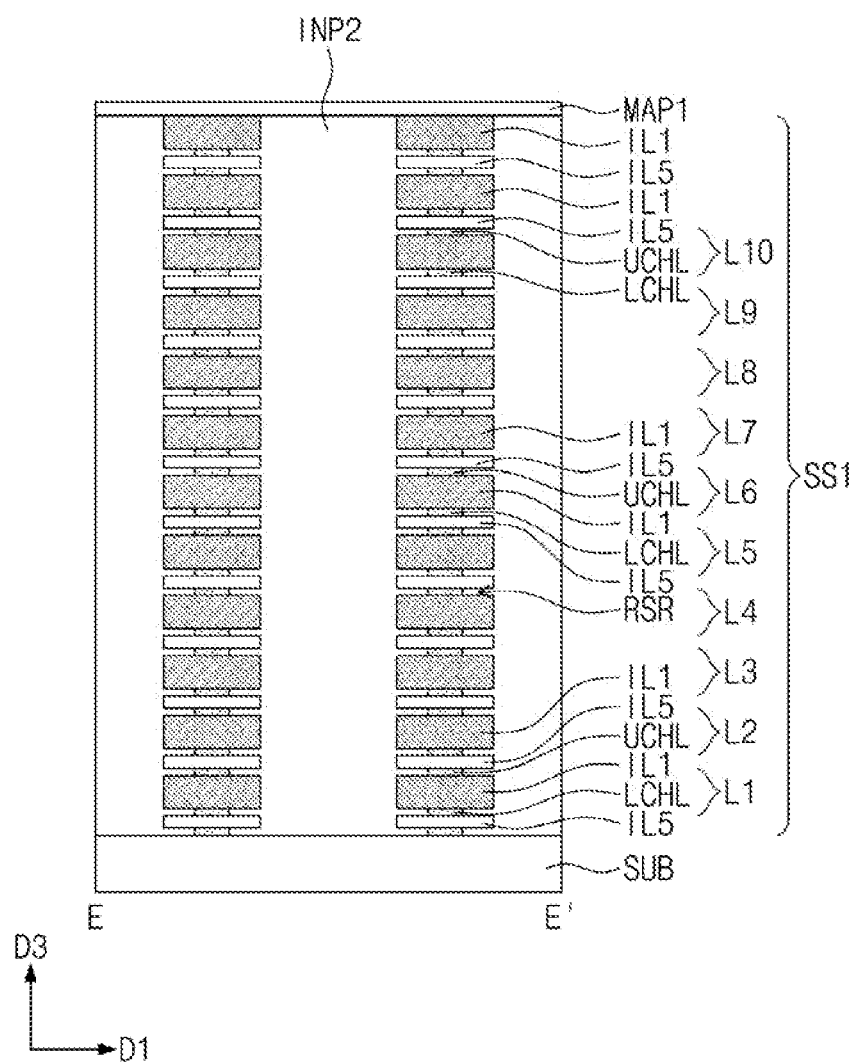
Figure 30:
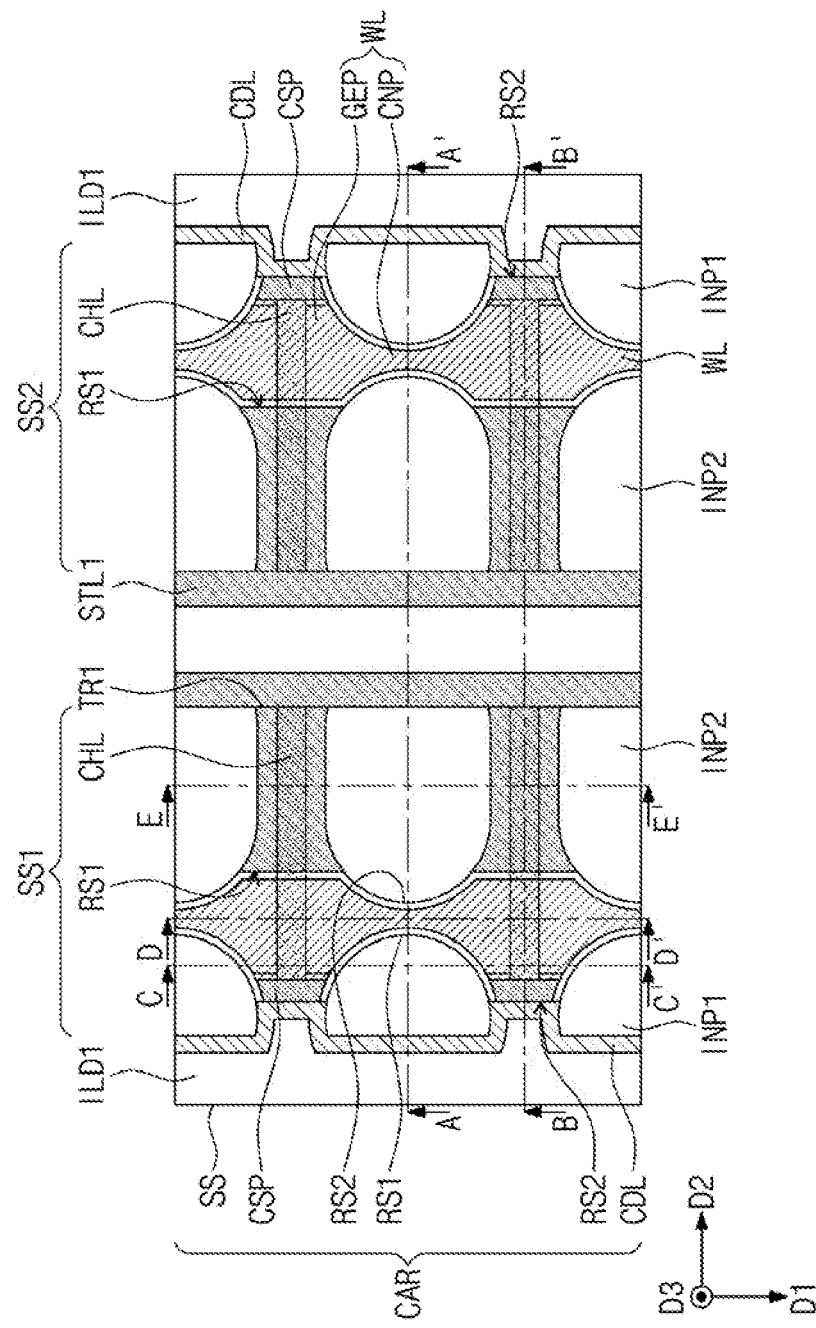
Figure 31A:
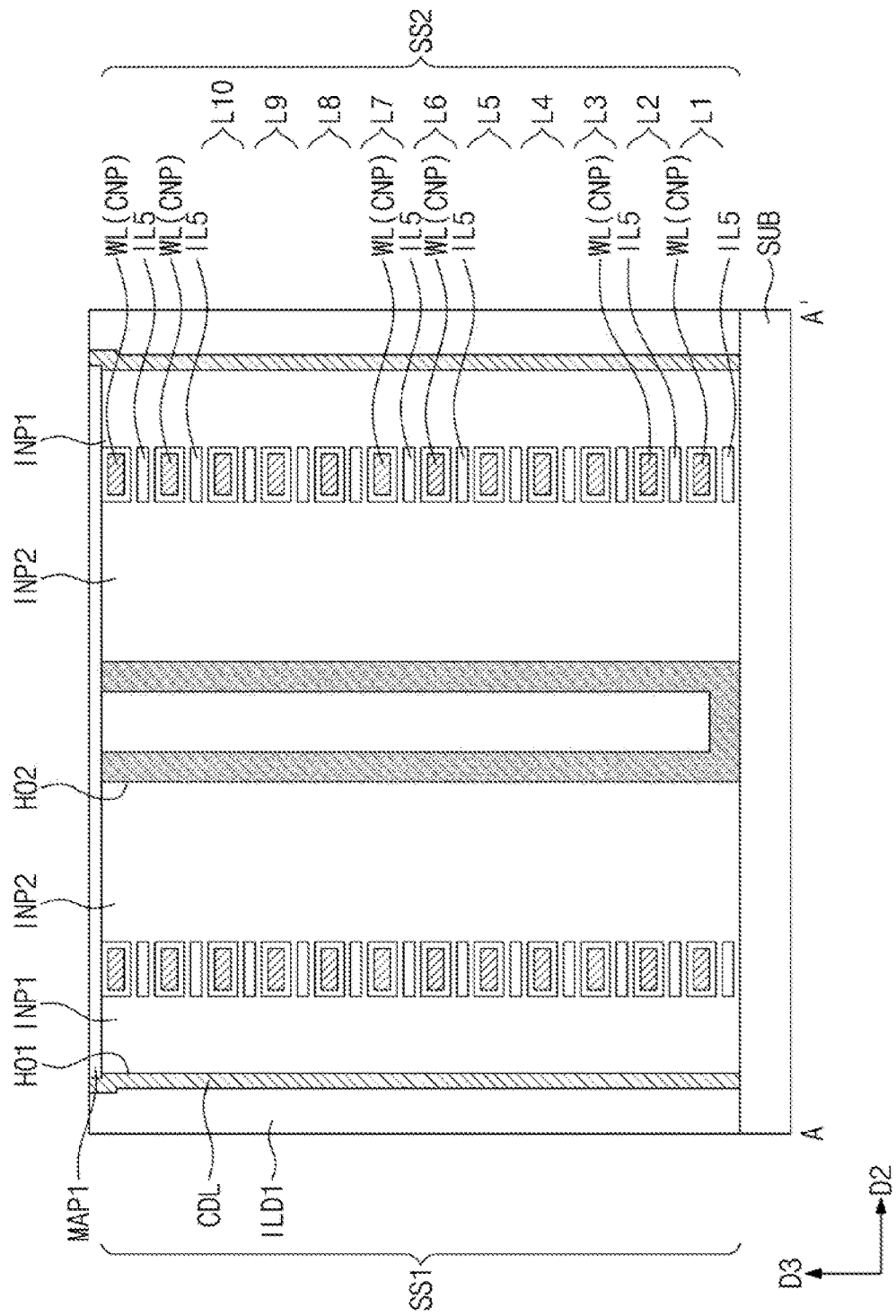
Figure 31B:
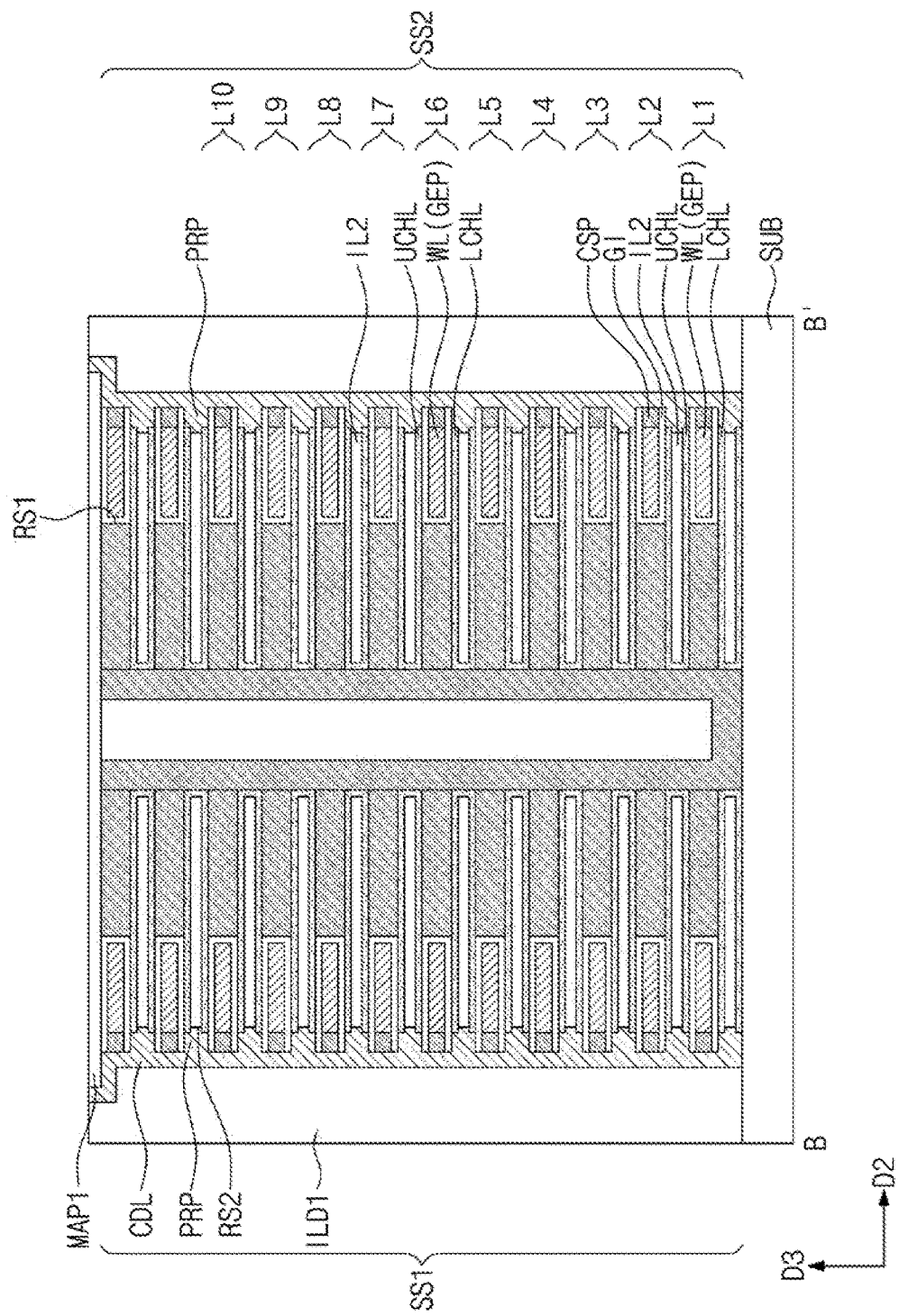
Figure 31C:
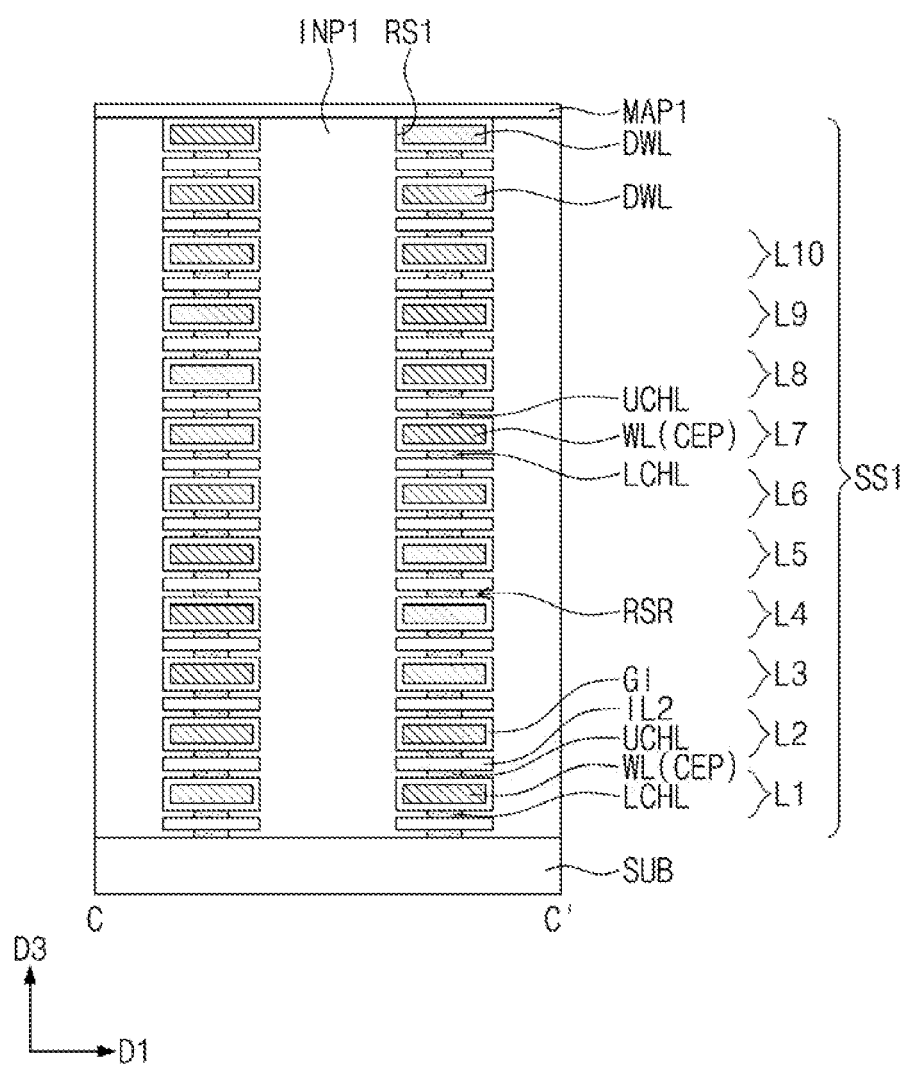
Figure 31D:
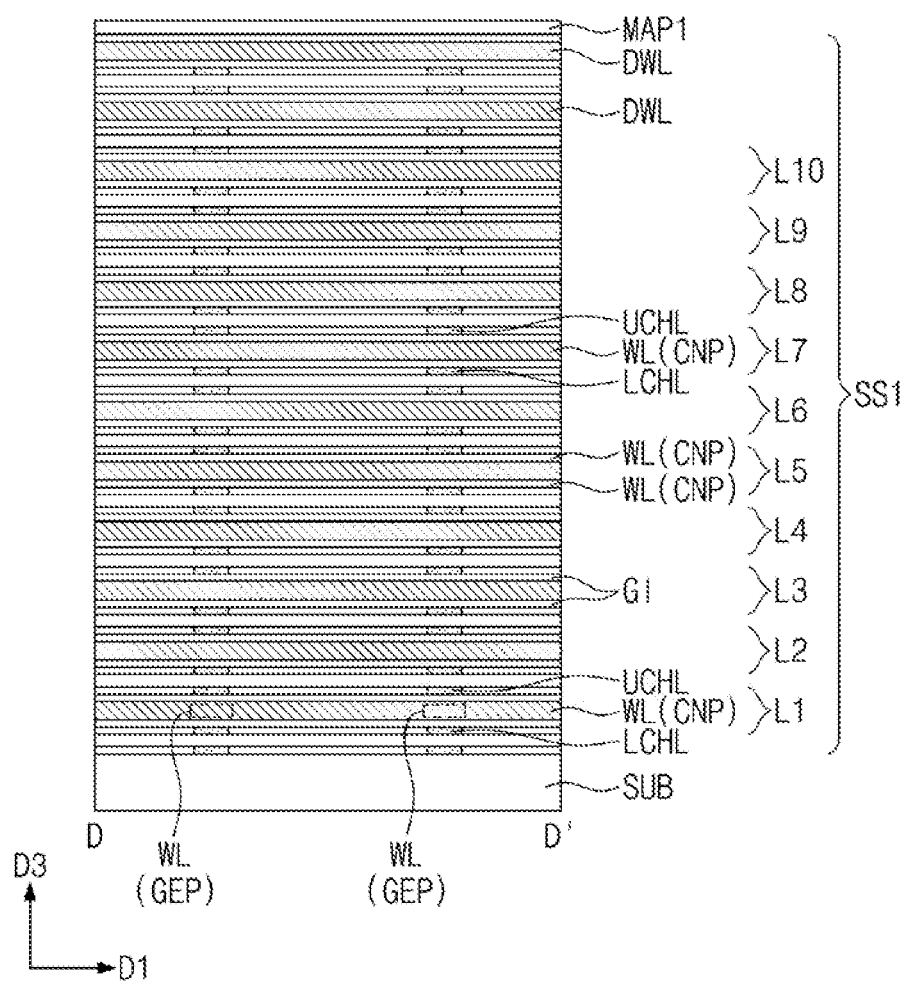
Figure 31E:
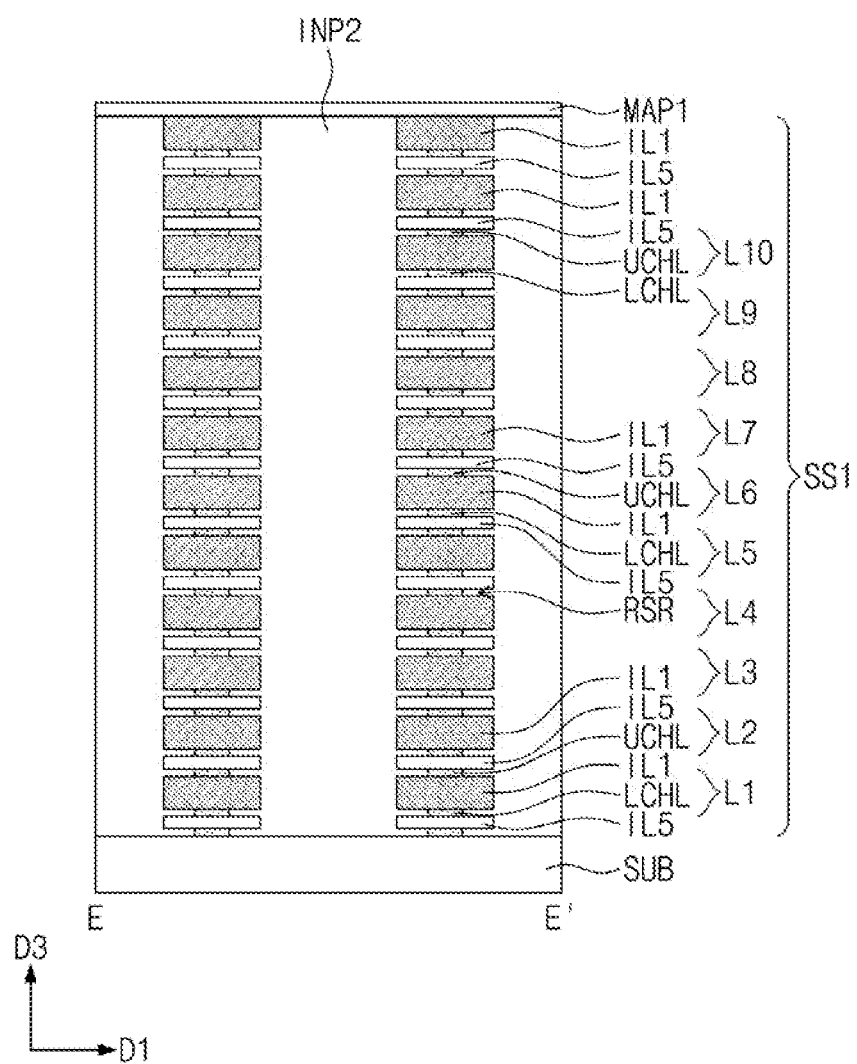
Figure 32:
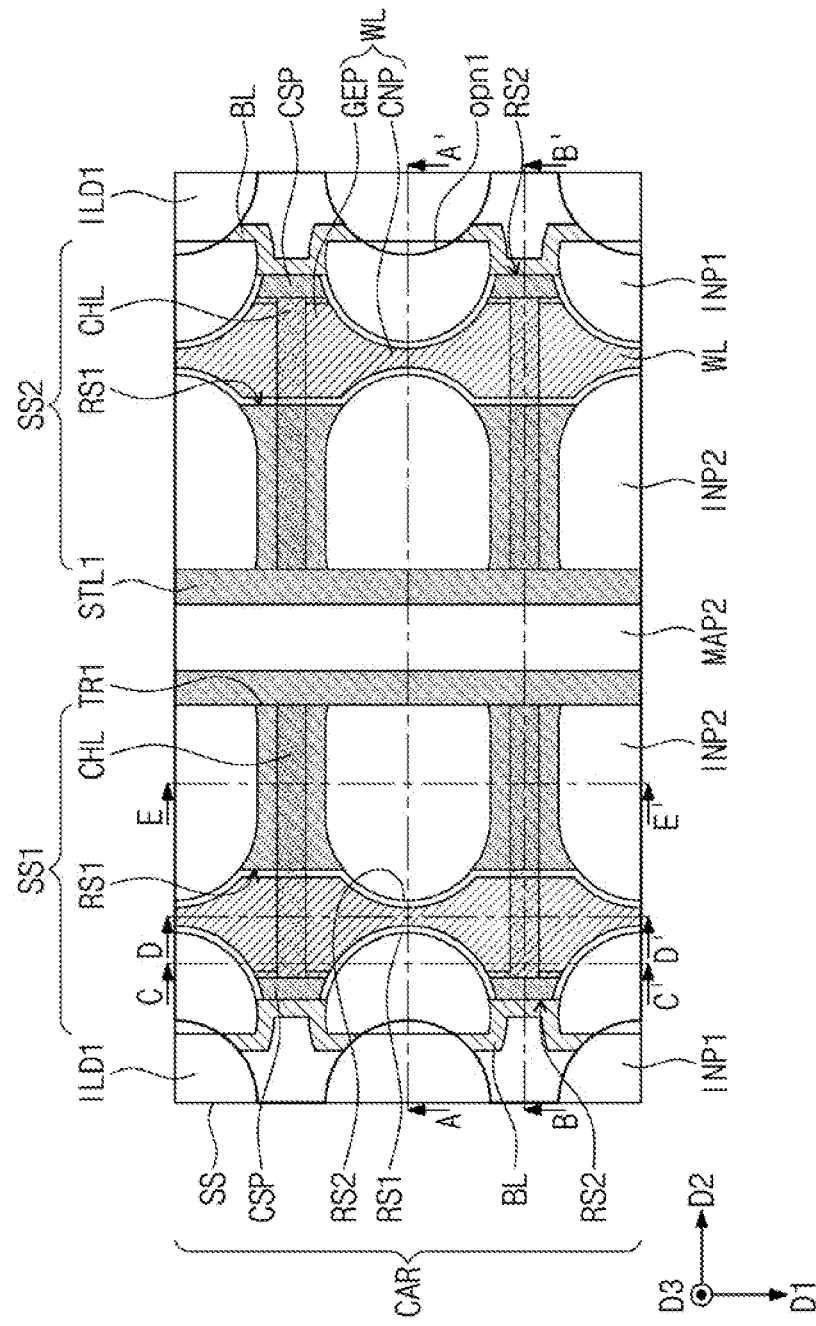
Figure 33A:
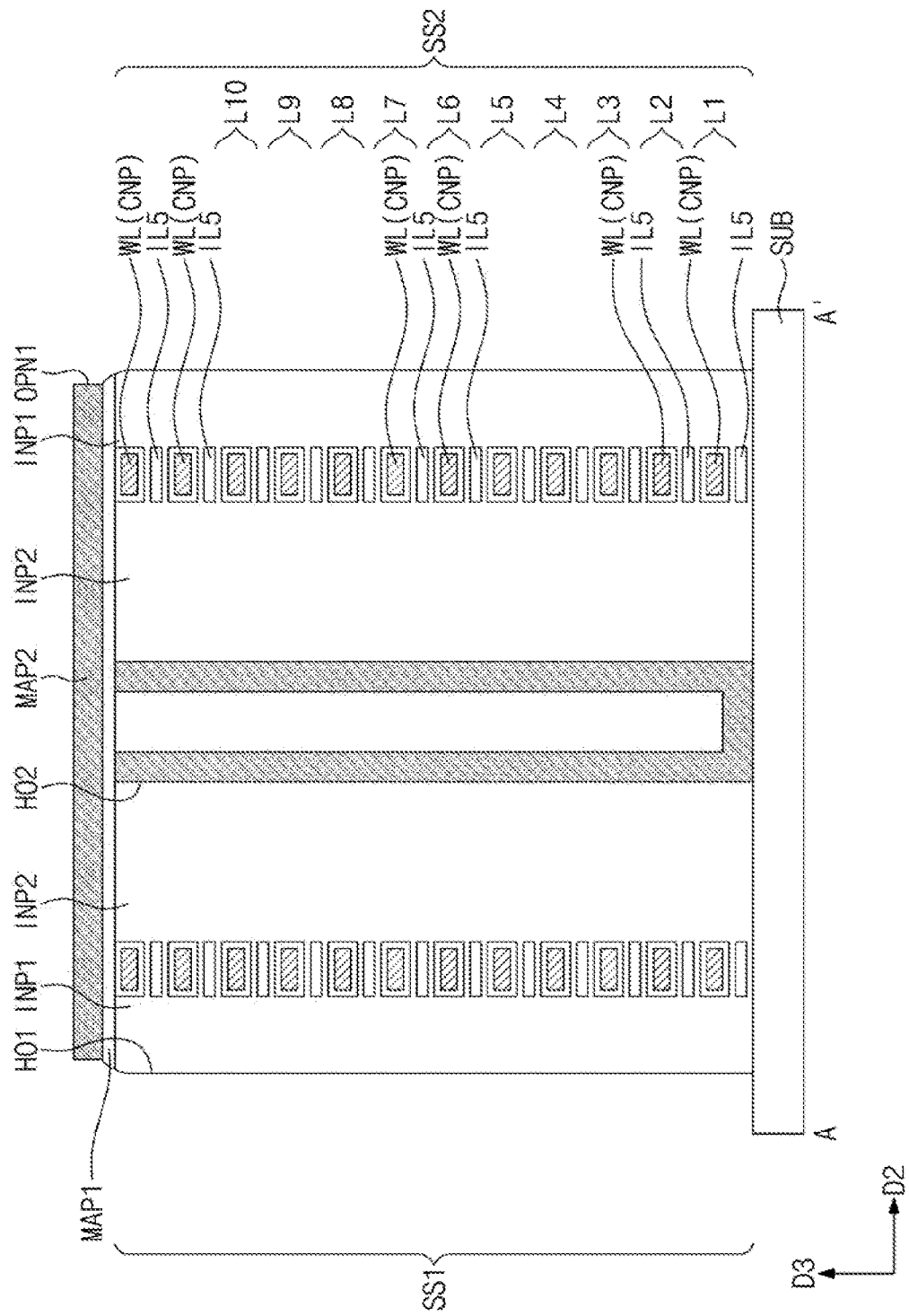
Figure 33B:
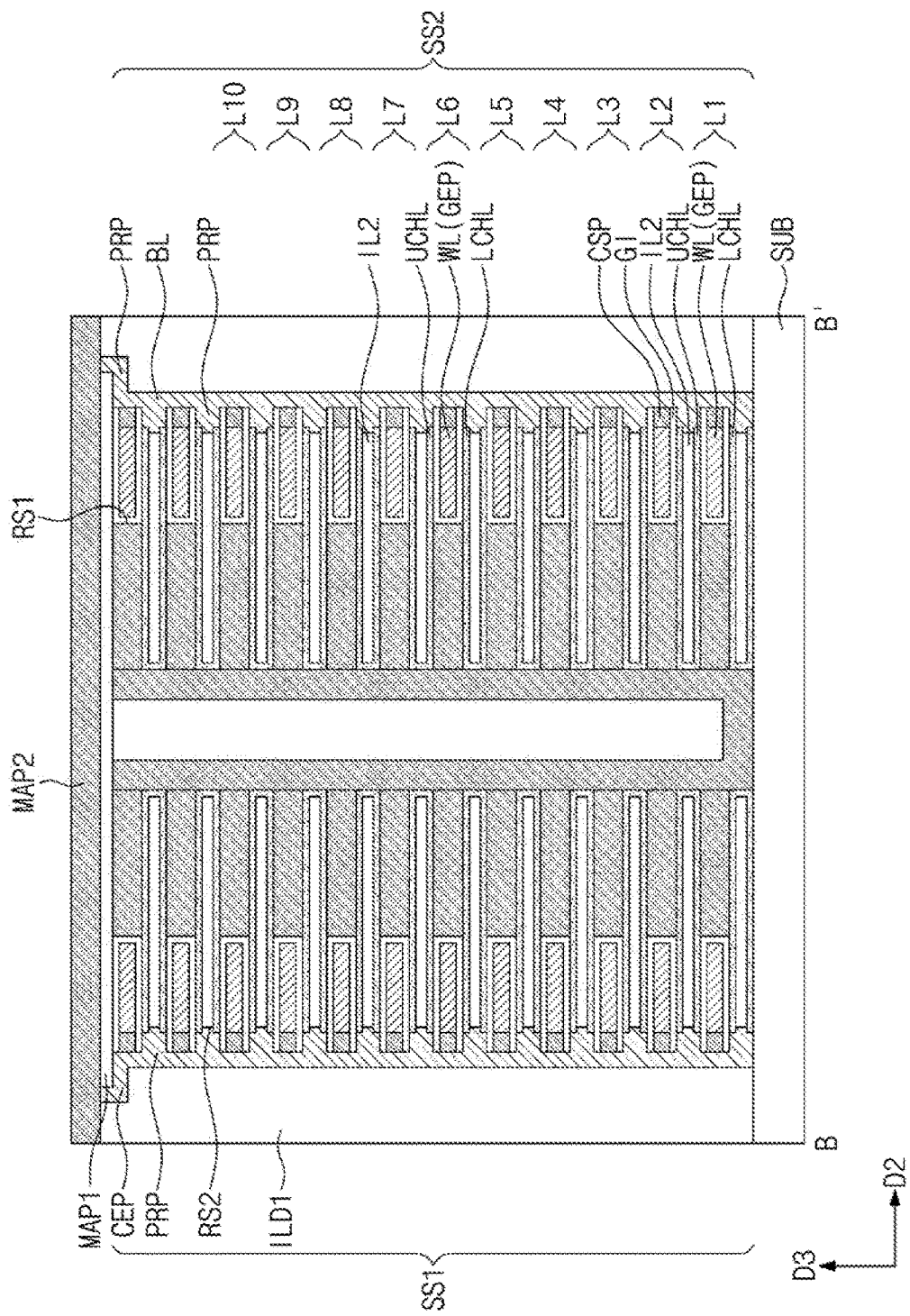
Figure 33C:
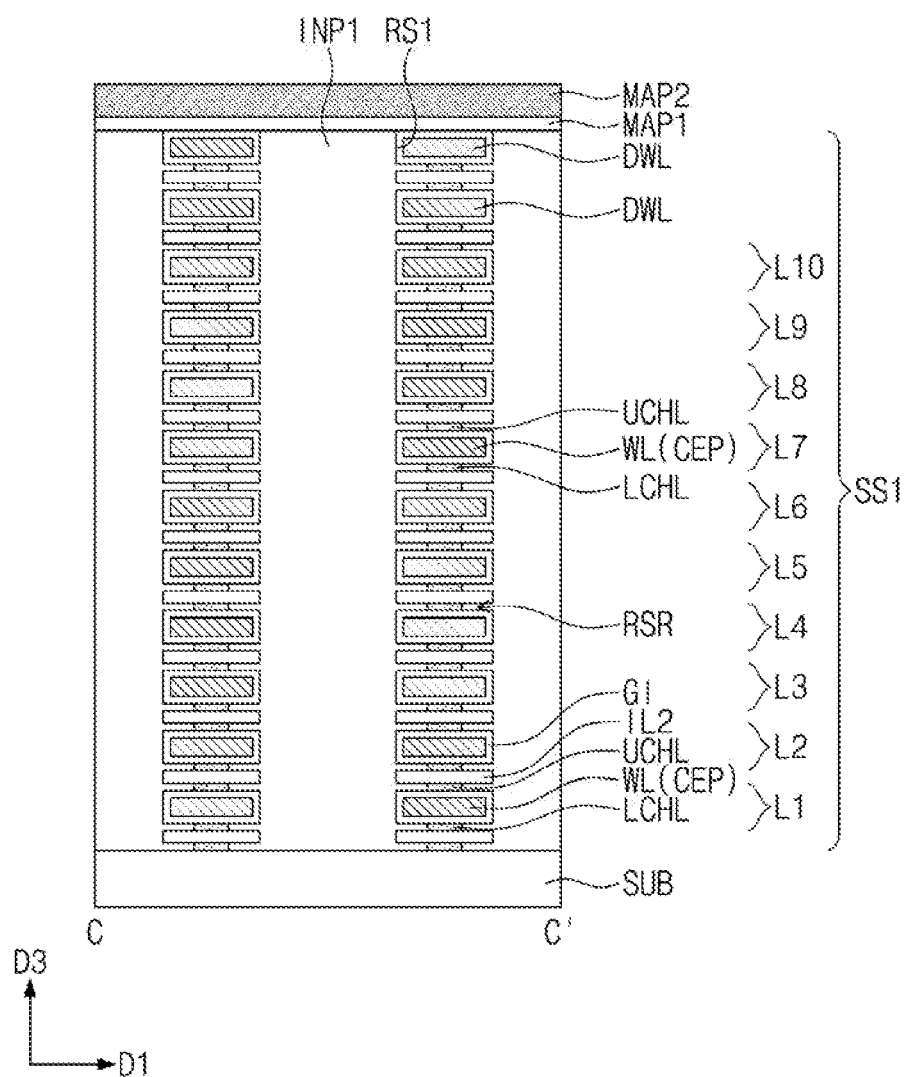
Figure 33D:
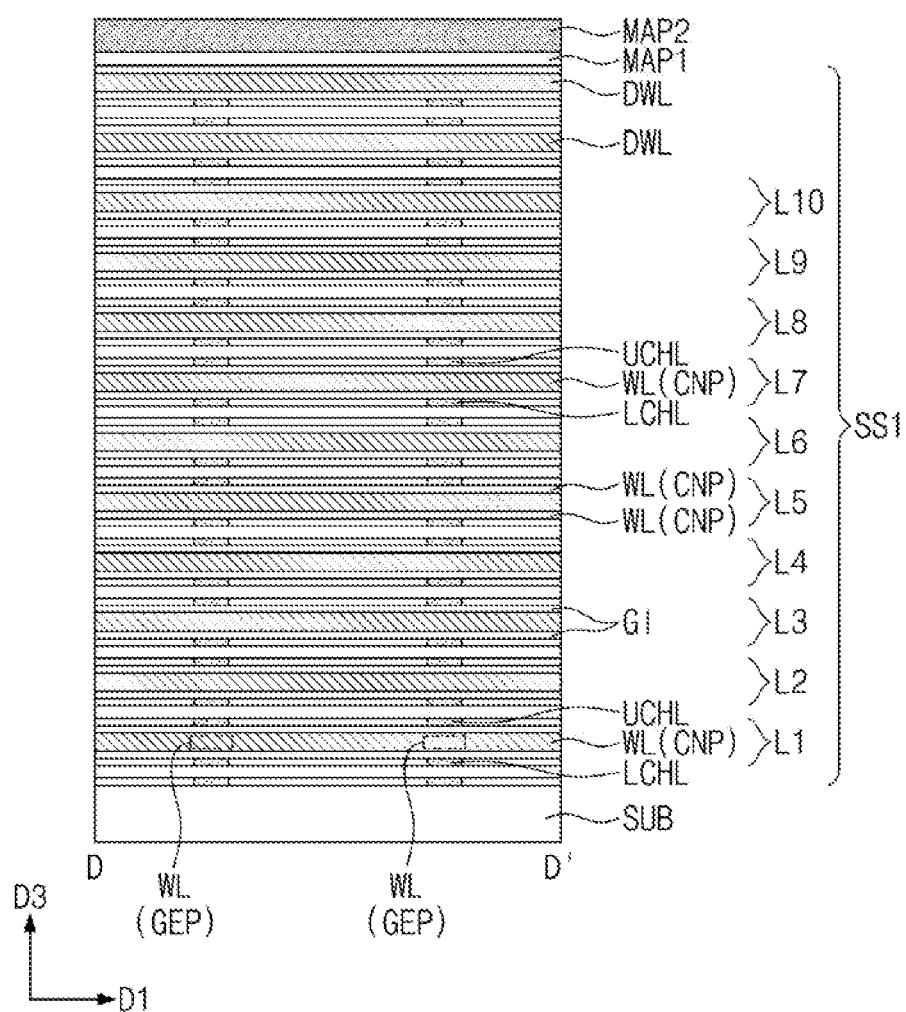
Figure 33E:
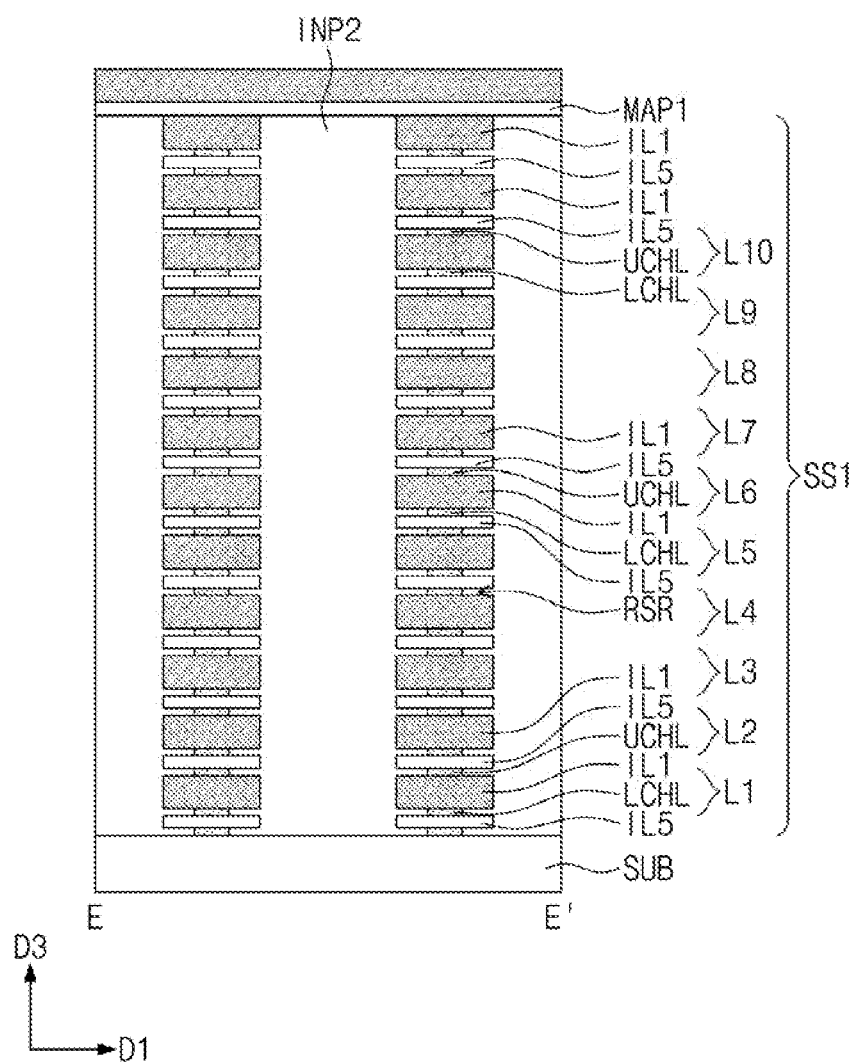
Figure 34:
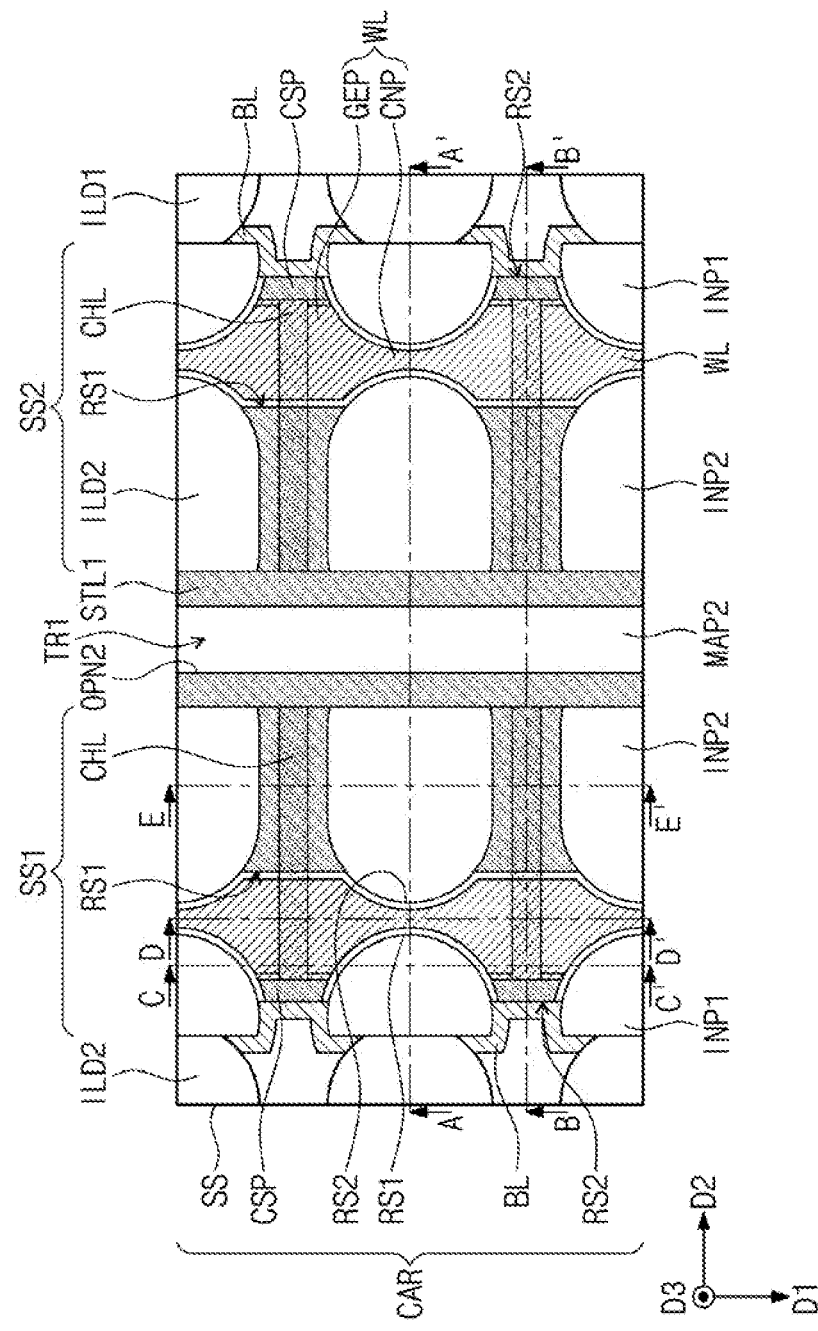
Figure 35A:
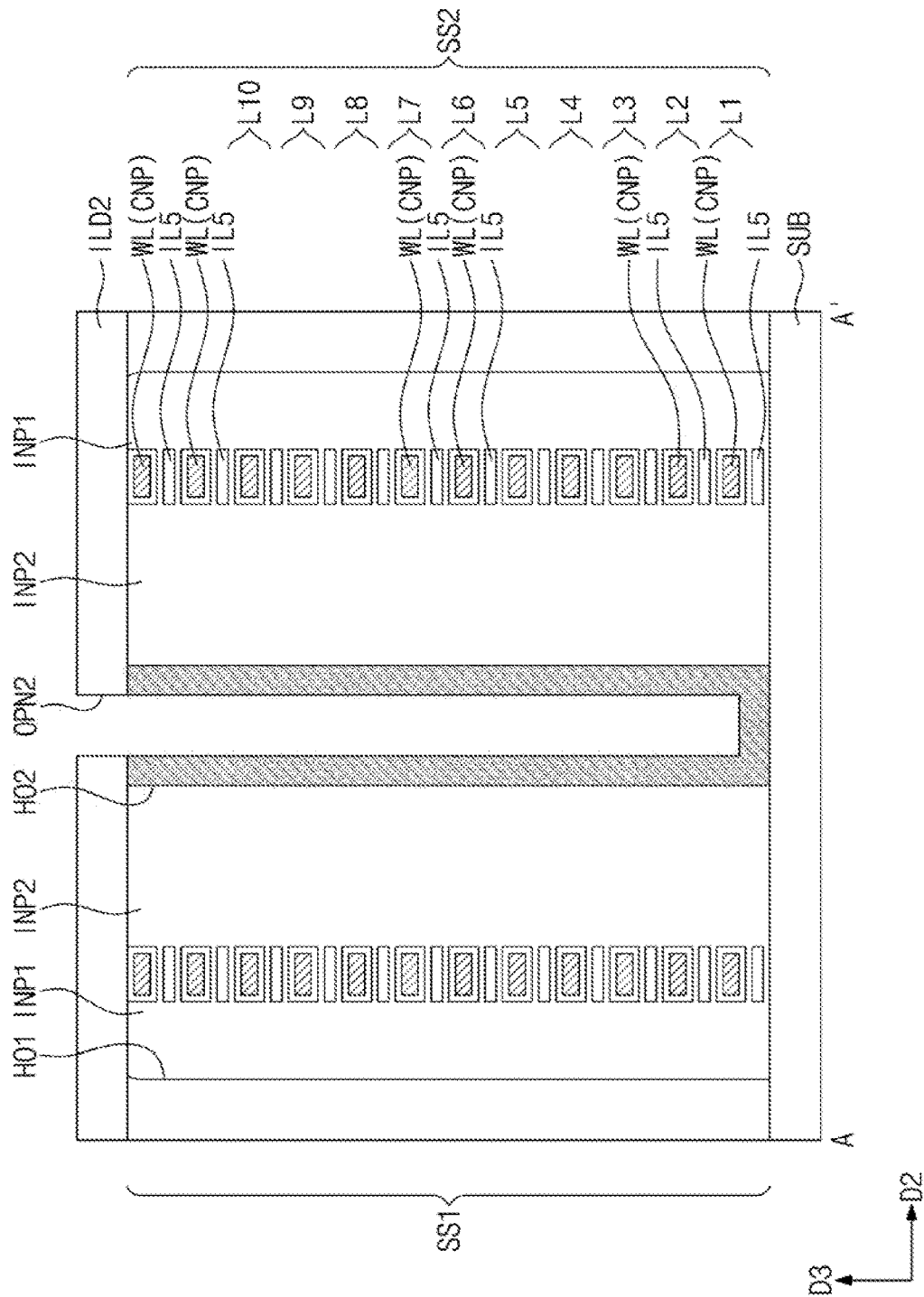
Figure 35B:
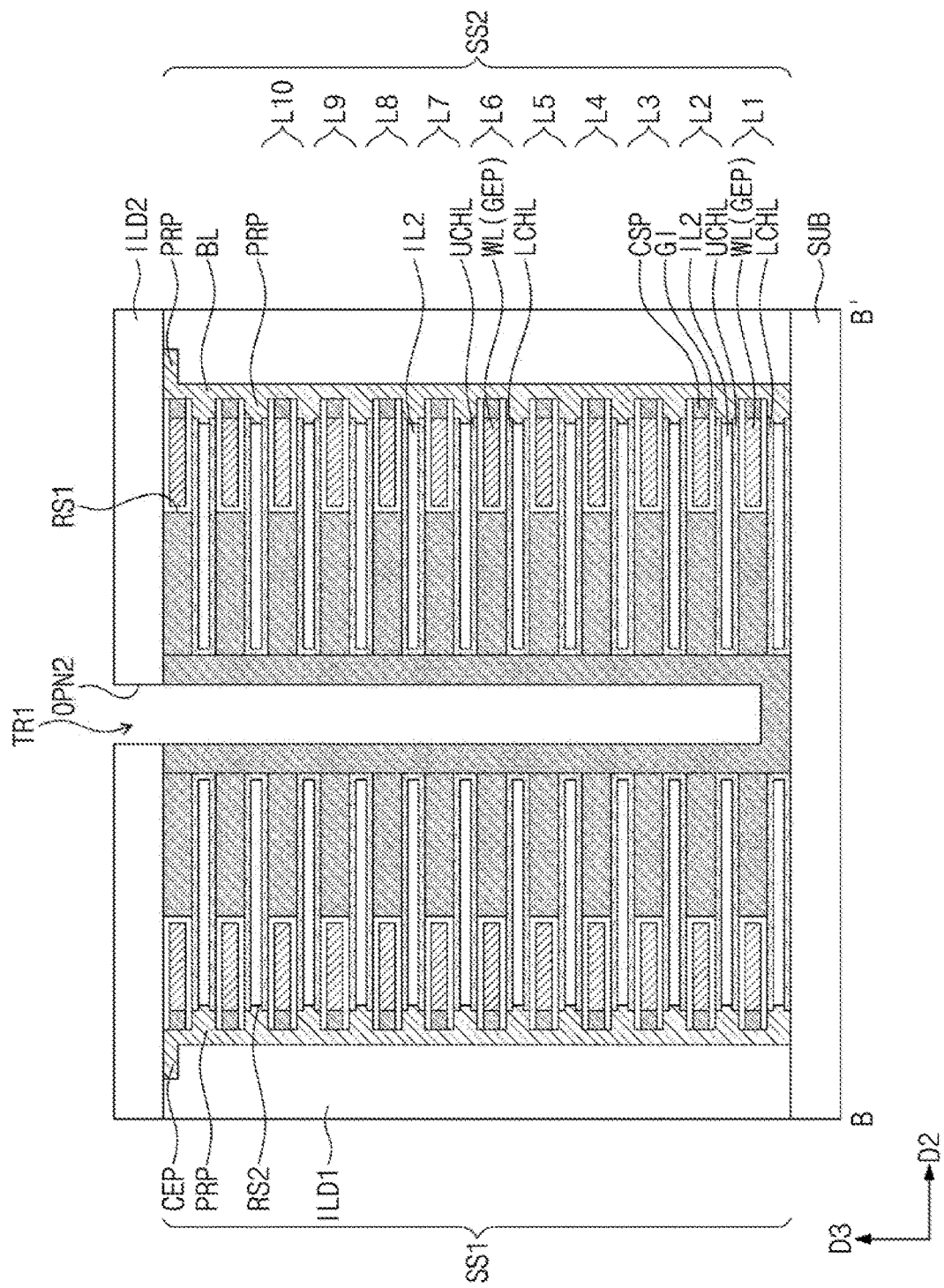
Figure 35C:
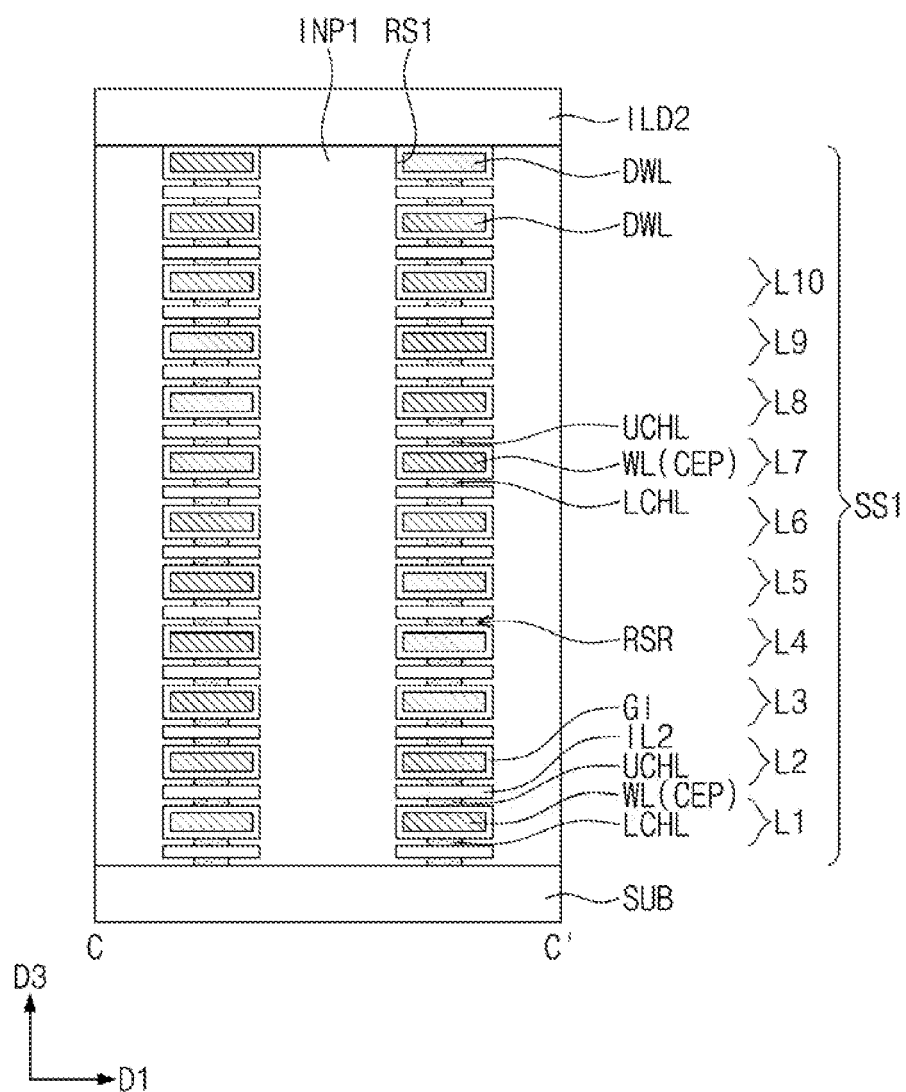
Figure 35D:
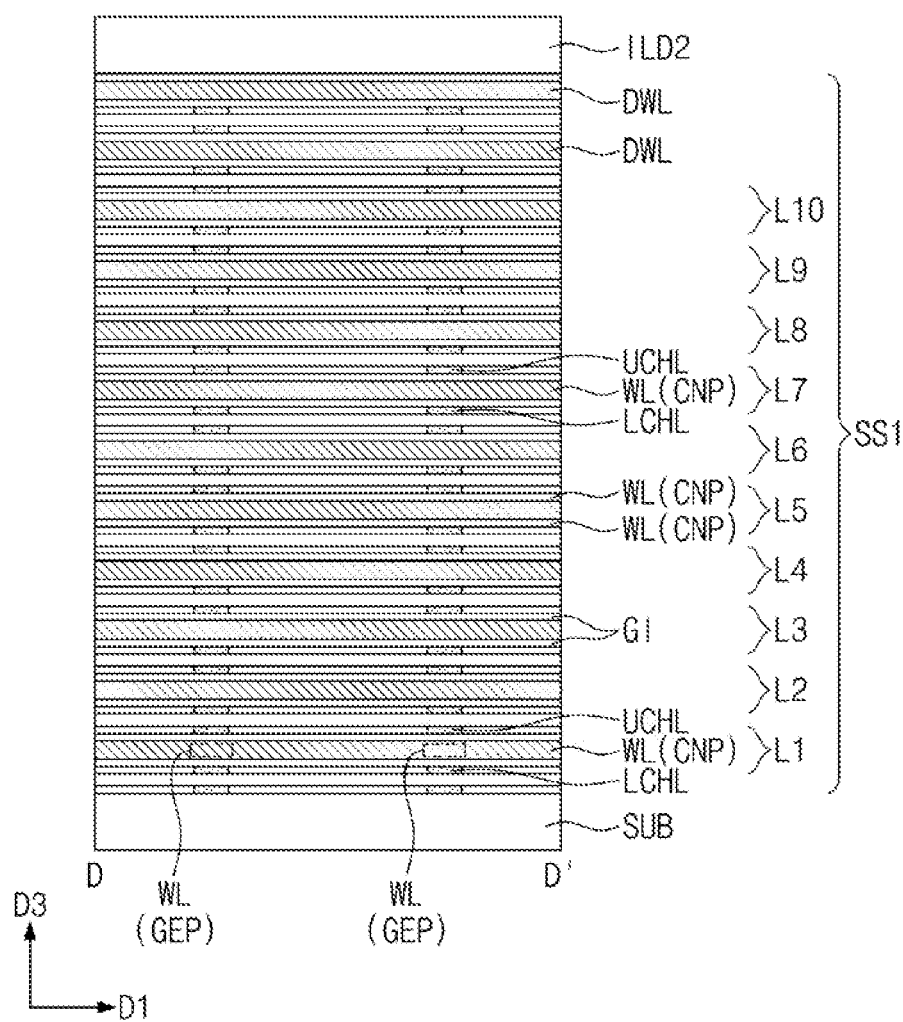
Figure 35E:
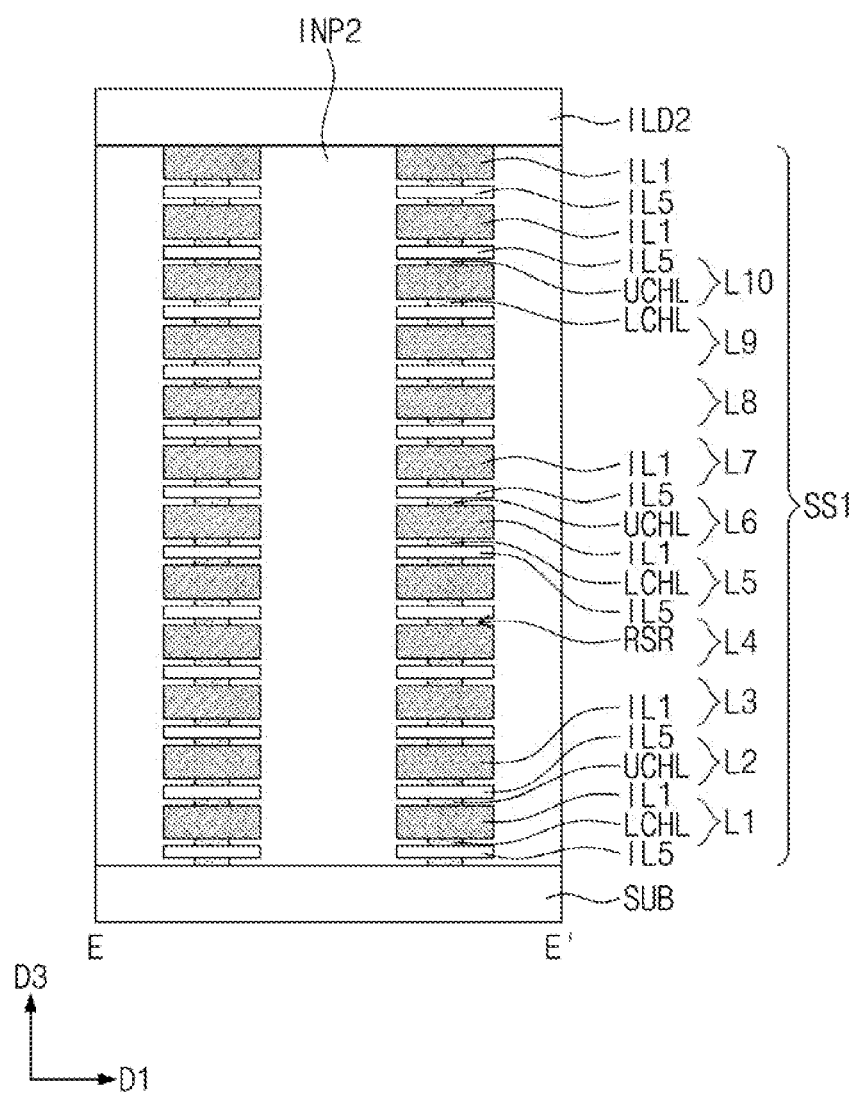
Figure 36:
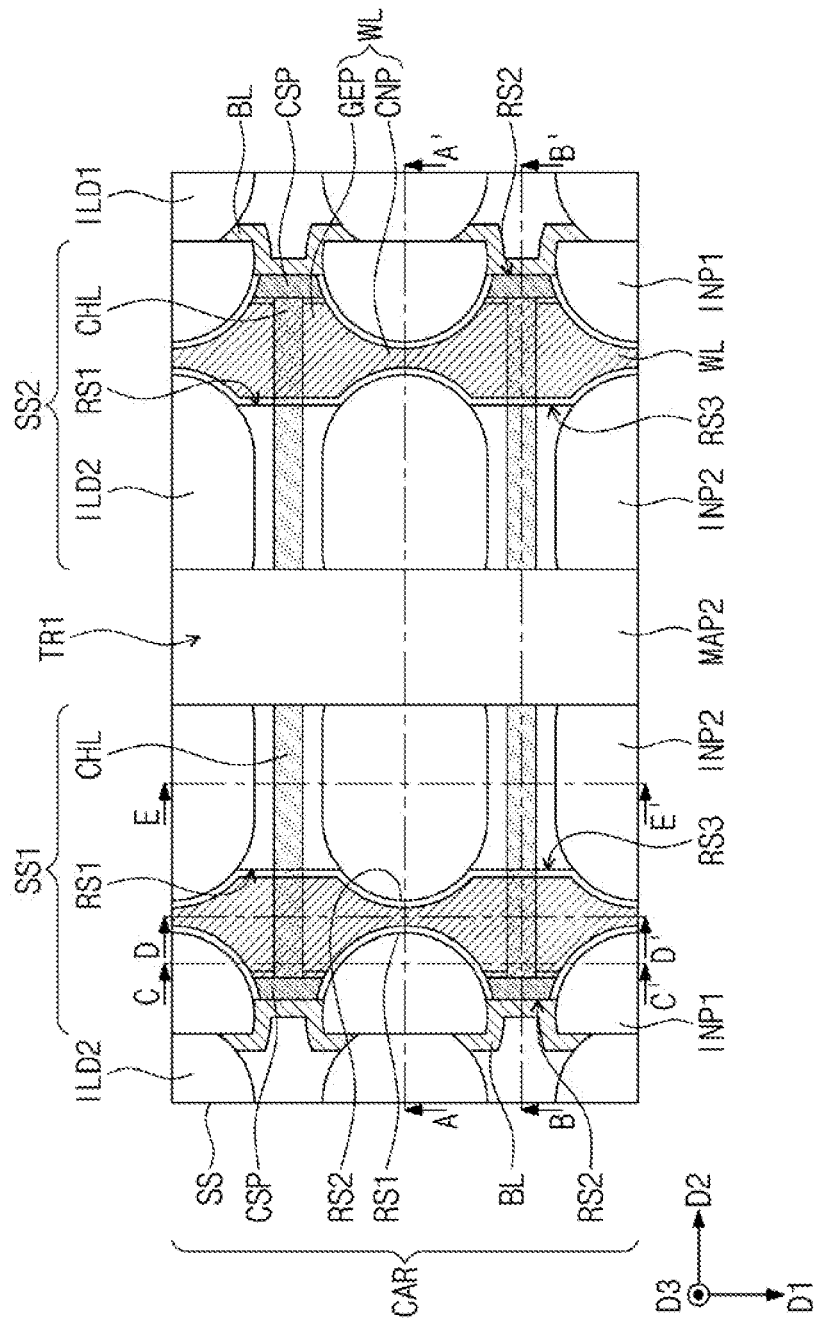

Referring to FIG. 29B, the channel layer UCHL or LCHL and the fifth insulating layer IL5 may be etched horizontally (e.g., recessed in the second direction D2) through the second trench TR2. As a result of the horizontal recessing of the channel layer UCHL or LCHL, the upper channel layer UCHL in a lower layer may be disconnected from the lower channel layer LCHL in an upper layer. The fifth insulating layer IL5 may be between the upper channel layer UCHL in the lower layer and the lower channel layer LCHL in the upper layer. As a result of the horizontal recessing process, a second recess RS2 may be formed to expose the channel layer UCHL or LCHL and the fifth insulating layer IL5.

In an implementation, a doping process may be performed on an end portion of the channel layer UCHL or LCHL exposed by the second recess RS2. The doping process may be performed to allow the end portion of the channel layer UCHL or LCHL to have electric characteristics that are suitable for a source (or drain) electrode of a memory cell transistor. In an implementation, in the case where the channel layer UCHL or LCHL includes an amorphous oxide semiconductor material, the doping process may include injecting dopants or impurities (e.g., hydrogen (H), oxygen (O), or silicon (Si) ions) into the channel layer UCHL or LCHL.

Referring to FIGS. 30 and 31A to 31E, a conductive layer CDL may be conformally deposited in the second trench TR2 and the second recess RS2. The conductive layer CDL may be formed on a sidewall of each of the first and second stacks SS1 and SS2.

The conductive layer CDL may be formed such that it is connected to an end of each of the channel layers UCHL and LCHL exposed by the second recess RS2. In an implementation, the conductive layer CDL may include the protruding portion PRP filling the second recess RS2. The protruding portion PRP may be connected in common to the upper and lower channel layers UCHL and LCHL.

The first interlayer insulating layer ILD1 may be formed on the conductive layer CDL to fill the second trench TR2. In an implementation, the first interlayer insulating layer ILD1 may include a silicon oxide layer. A top surface of the first interlayer insulating layer ILD1 may be coplanar with a top surface of the first mask pattern MAP1.

Referring to FIGS. 32 and 33A to 33E, a second mask pattern MAP2 may be formed on the first mask pattern MAP1 and the first interlayer insulating layer ILD1. The second mask pattern MAP2 may include a plurality of first openings OPN1. Each of the first openings OPN1 may be formed to partially expose the conductive layer CDL.

An exposed portion of the first interlayer insulating layer ILD1 and an exposed portion of the conductive layer CDL may be removed using the second mask pattern MAP2 as an etch mask. The conductive layer CDL may be partially removed through the first openings OPN1, and a plurality of the bit lines BL, which are separated from each other in the first direction D1, may be formed from one conductive layer CDL (e.g., see FIG. 32). Each of the bit lines BL may extend in the third direction D3 or along the sidewall of the stack SS1 or SS2. Each of the bit lines BL may be connected to the channel layer UCHL or LCHL through the protruding portion PRP. Each of the bit lines BL may include the pad CEP formed at the topmost level thereof.

Referring to FIGS. 34 and 35A to 35E, an insulating layer may be formed in spaces, which were etched through the first openings OPN1. The insulating layer, which is formed by this process, may form one first interlayer insulating layer ILD1, along with the left portion of the first interlayer insulating layer ILD1.

A planarization process may be performed to expose a top surface of the first interlayer insulating layer ILD1 and top surfaces of the first and second insulating pillars INP1 and INP2. The first and second mask patterns MAP1 and MAP2 may be removed by the planarization process.

The second interlayer insulating layer ILD2 may be formed on the first interlayer insulating layer ILD1 and the first and second stacks SS1 and SS2. The second interlayer insulating layer ILD2 may be patterned to form a second opening OPN2 overlapped with the first trench TR1. The gap-fill layer GFL exposed by the second opening OPN2 may be selectively removed.

Referring to FIGS. 36 and 37A to 37E, the first stopper layer STL1, which is exposed through the second opening OPN2, may be removed. Accordingly, the first trench TR1 may be fully exposed again. Next, the first insulating layers ILL which are exposed through the first trench TR1, may be fully removed (e.g., see FIG. 37B). In an implementation, the removal of the first stopper layer STL1 and the first insulating layers IL1 may include performing a wet etching process of selectively removing a silicon nitride layer.

Figure 37A:
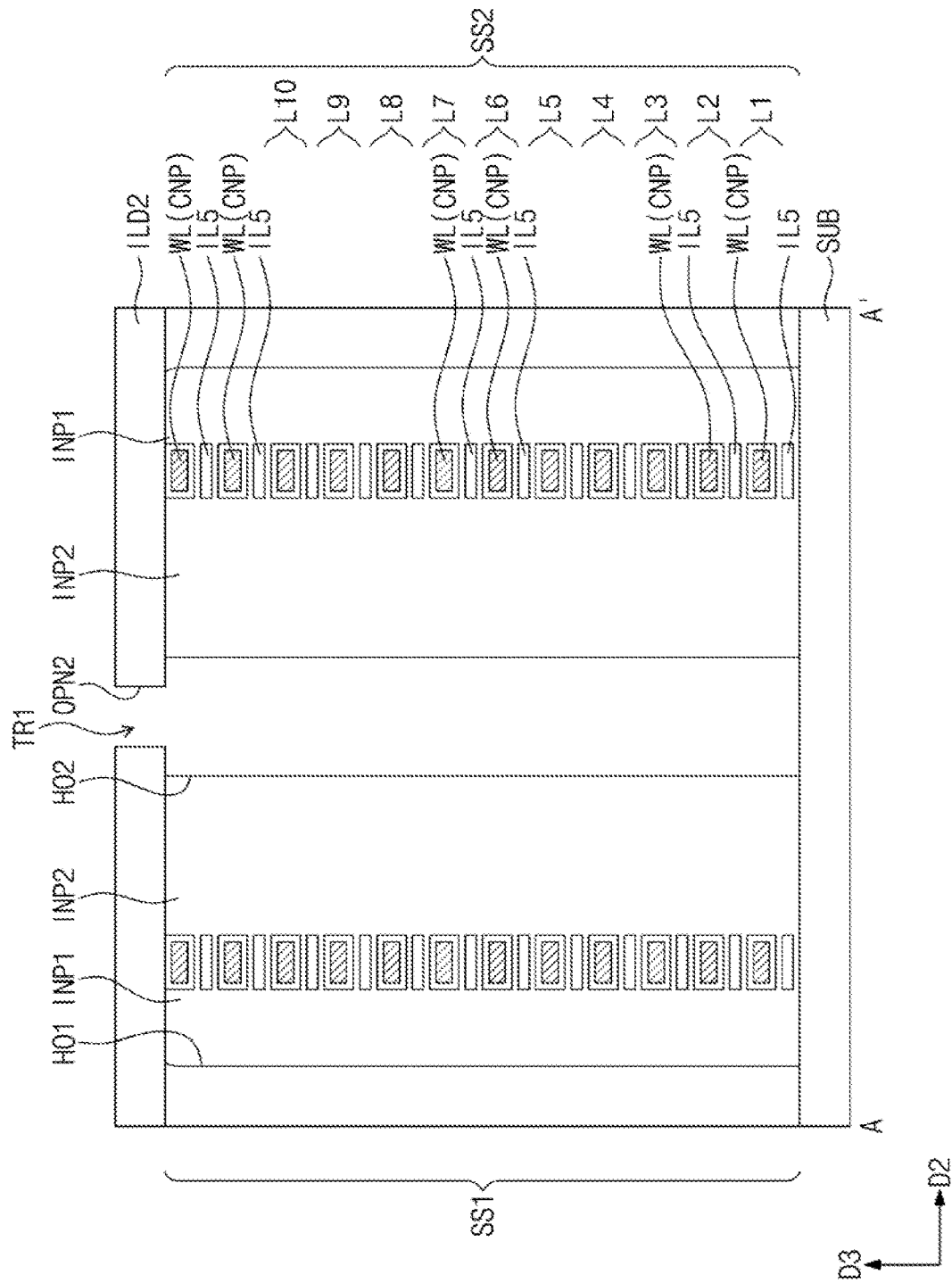
Figure 37B:
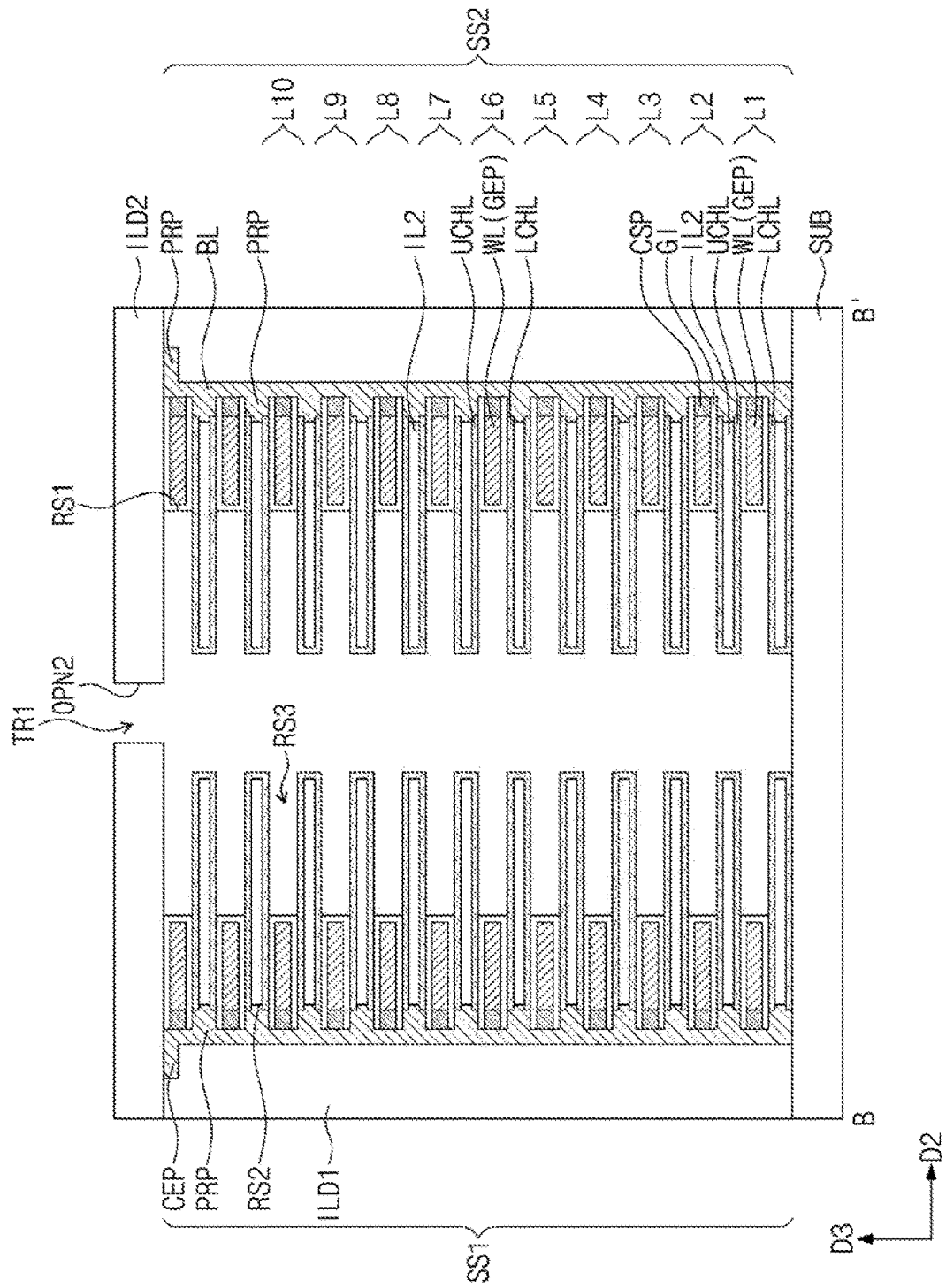
Figure 37C:
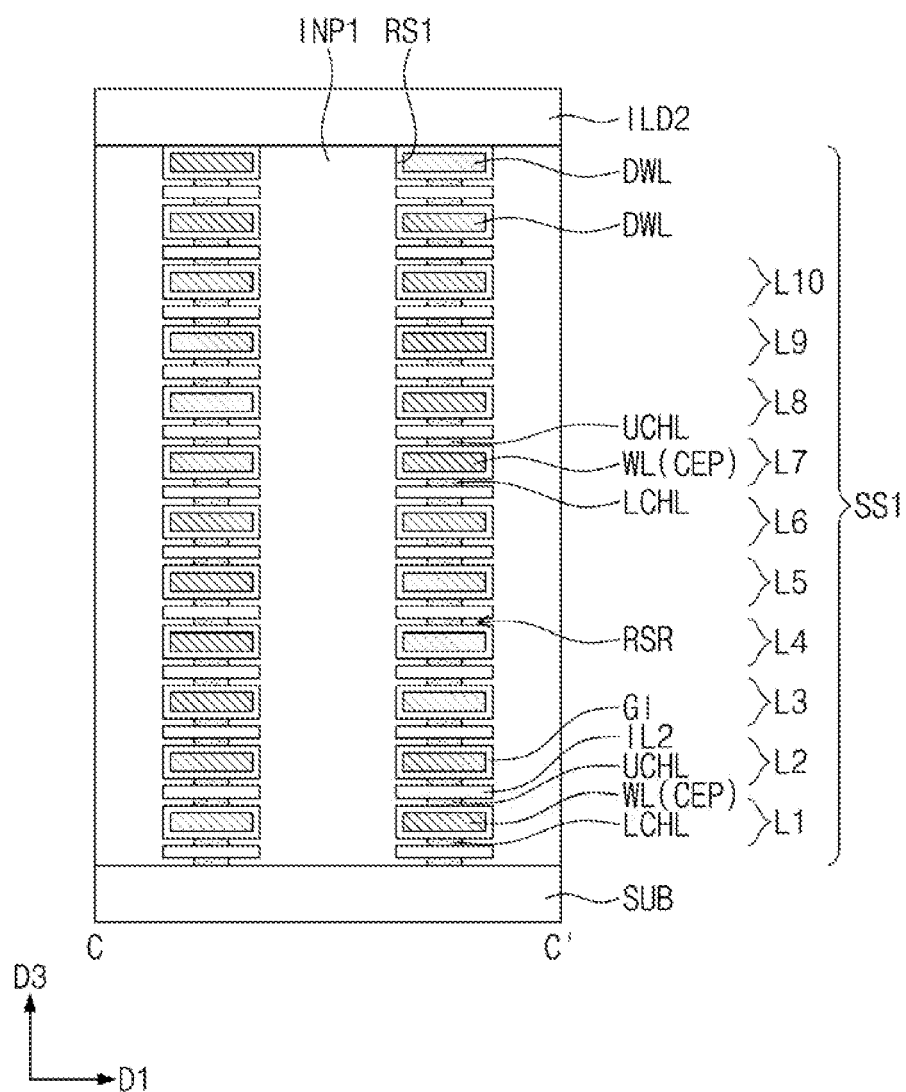
Figure 37D:
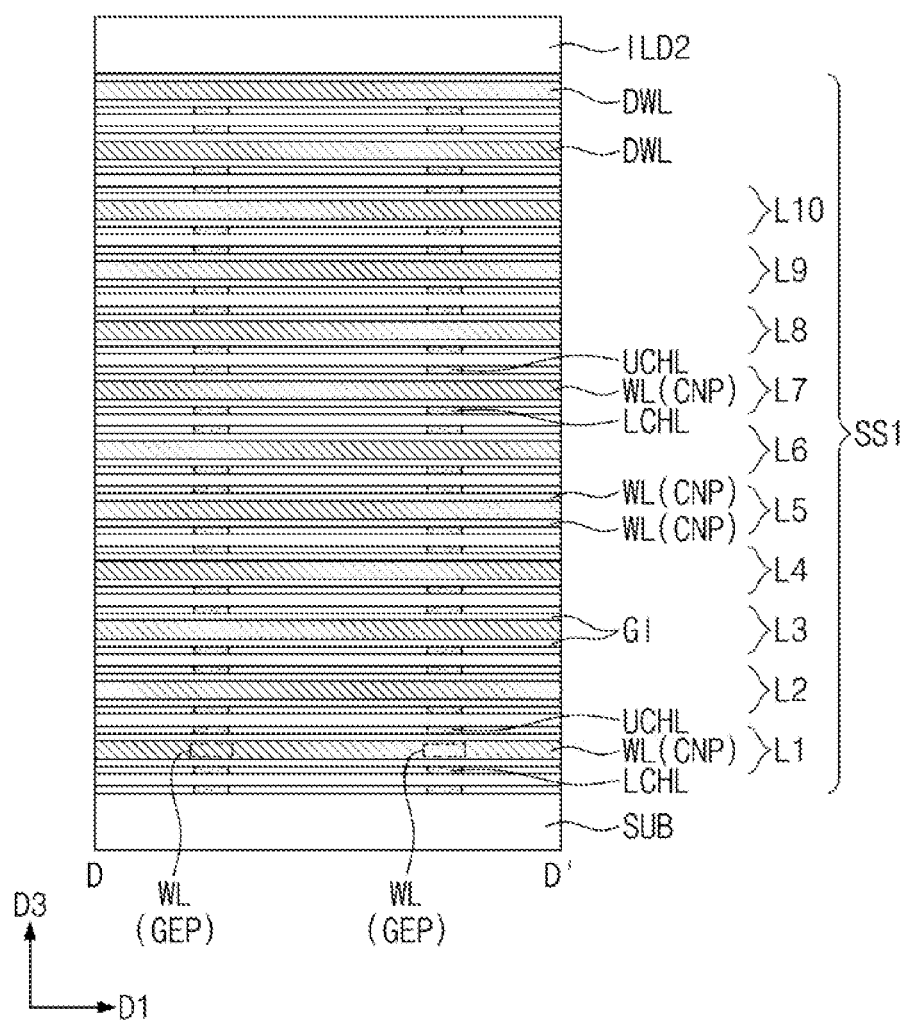
Figure 37E:
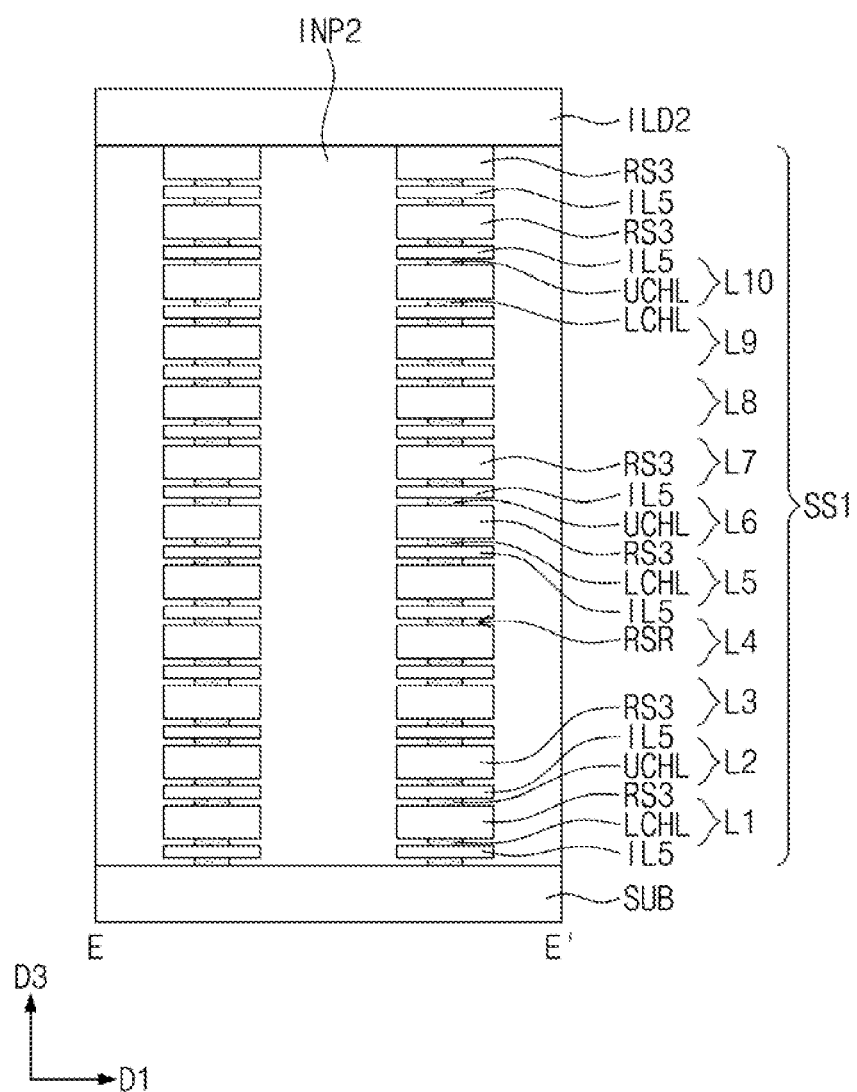
Figure 38:
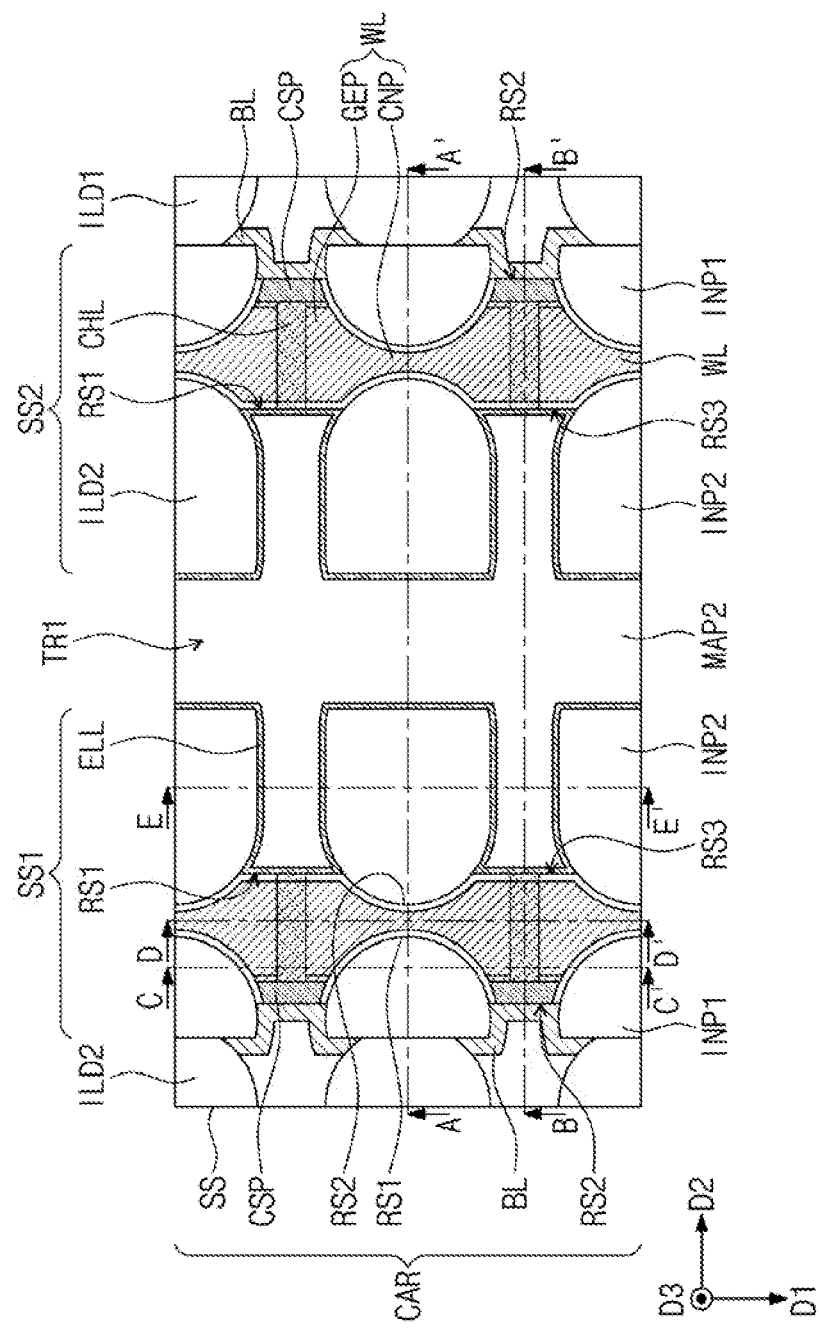

Referring to FIGS. 37B and 37E, third recesses RS3, which horizontally extend from the first trench TR1, may be formed, as a result of the removal of the first insulating layers IL1. Each of the third recesses RS3 may be formed between a pair of the channel layers UCHL or LCHL, which are respectively included in a vertically adjacent pair of the layers. The third recess RS3 may be formed to expose the gate insulating layer GI.

Referring to FIGS. 38 and 39A to 39E, a wet etching process may be performed on the channel layers UCHL and LCHL exposed through the third recesses RS3 and the first trench TR1. The wet etching process may be performed to etch each of the channel layers UCHL and LCHL partially. The wet etching process may be performed to selectively etch only the channel layers UCHL and LCHL.

Figure 39A:
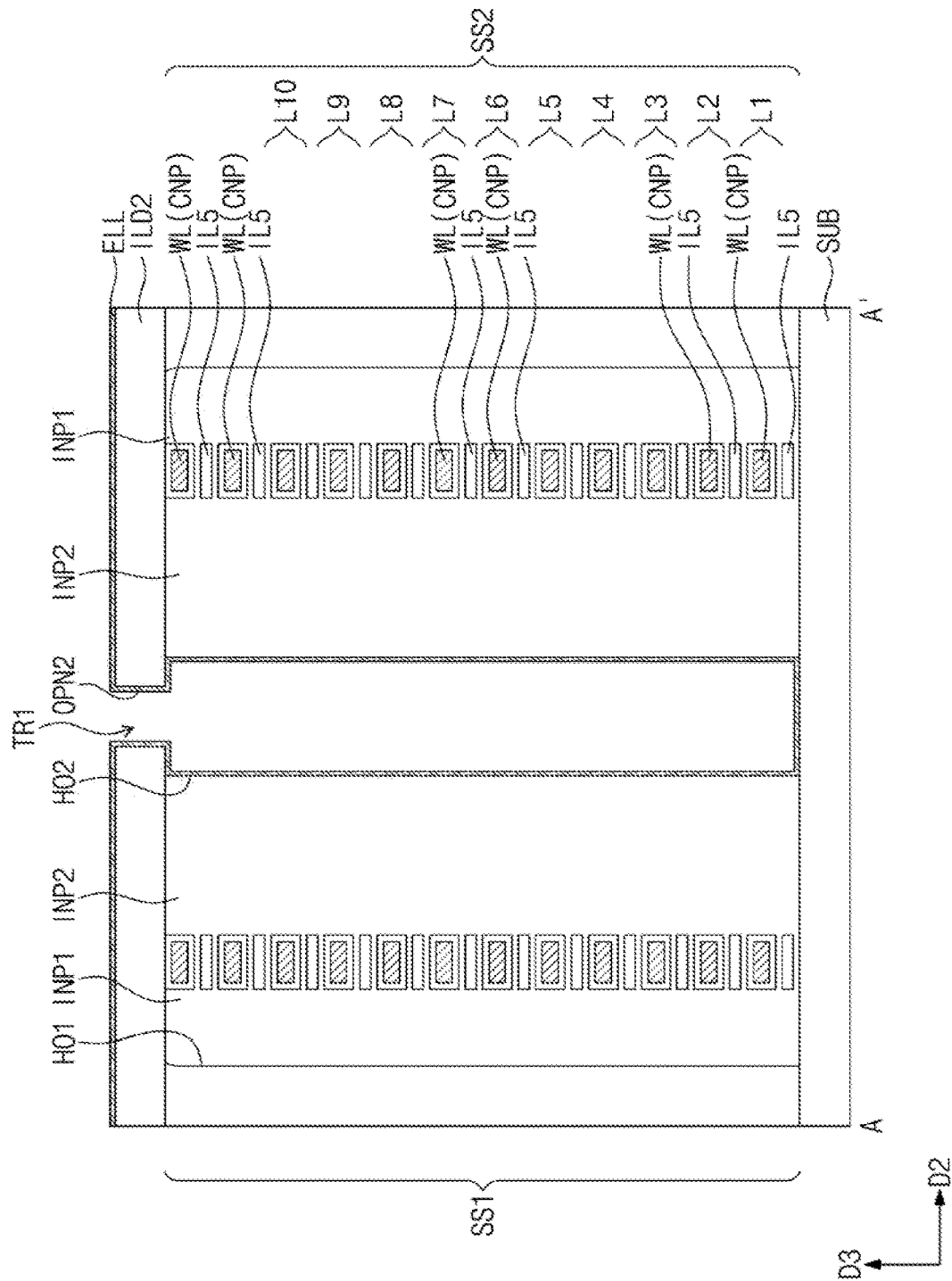
Figure 39B:
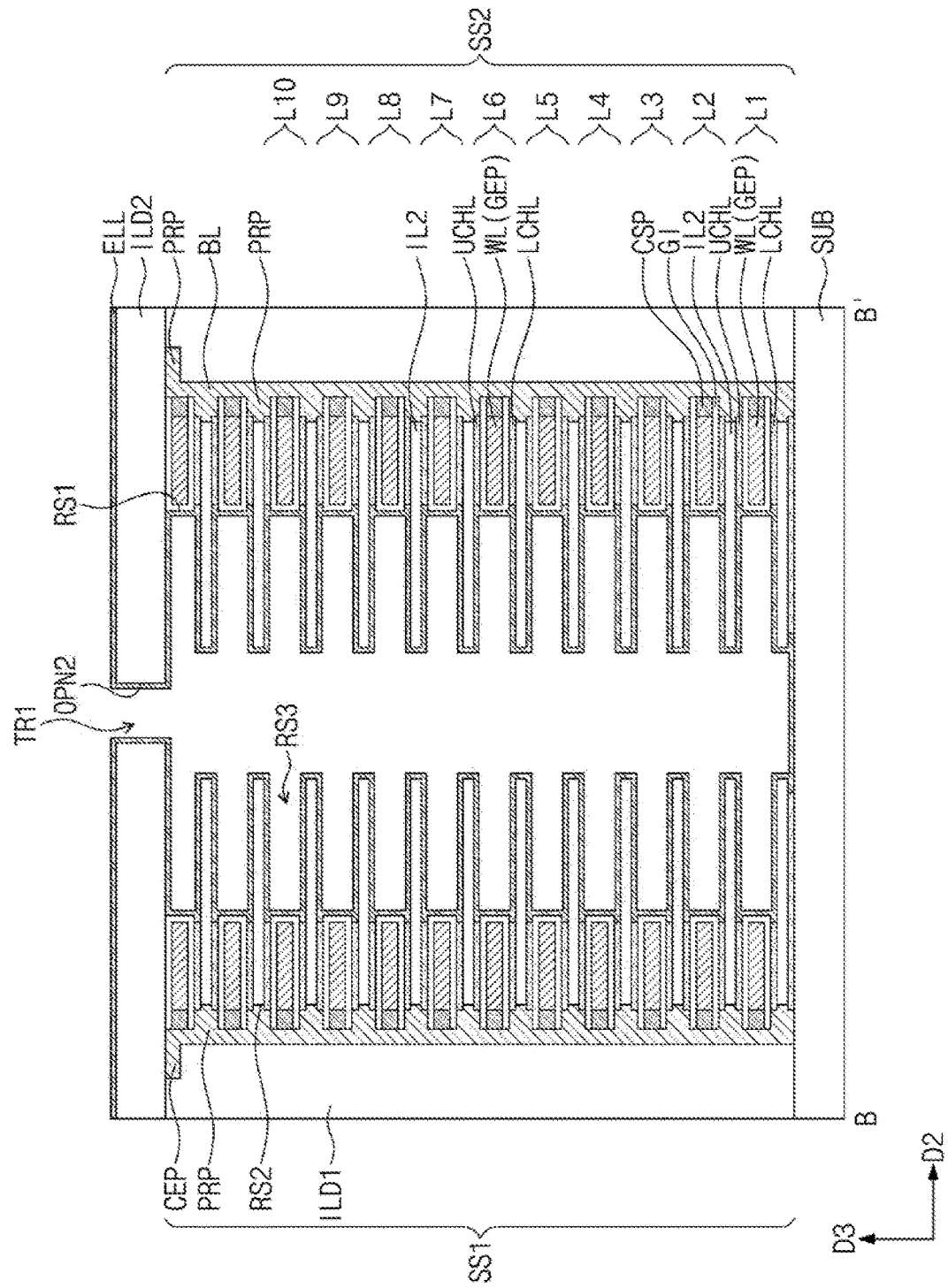
Figure 39C:
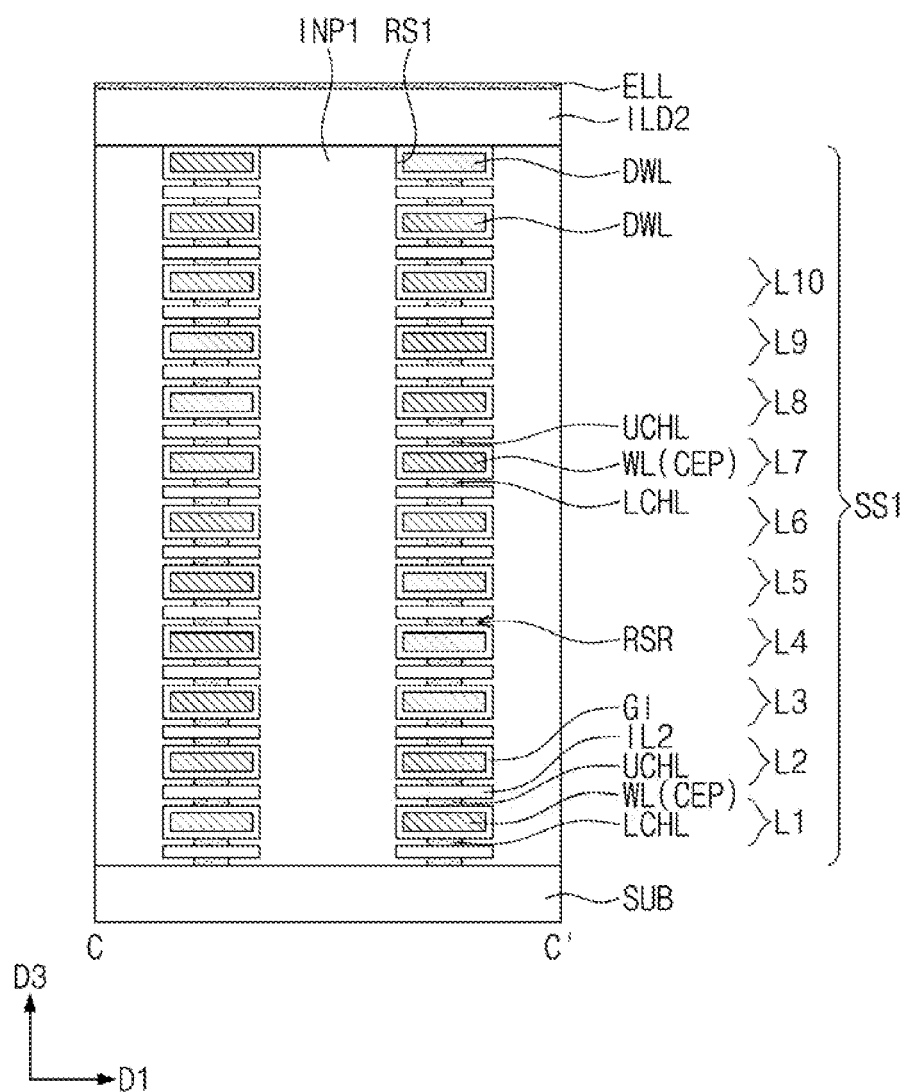
Figure 39D:
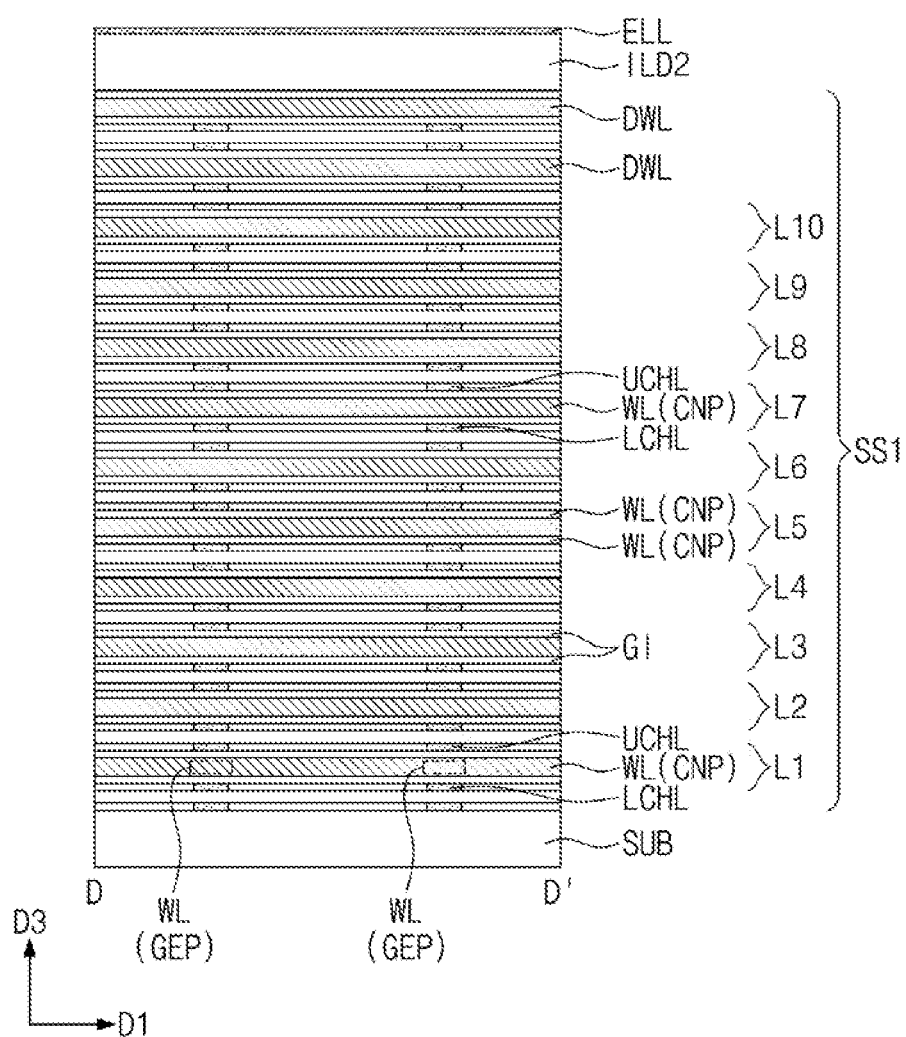
Figure 39E:
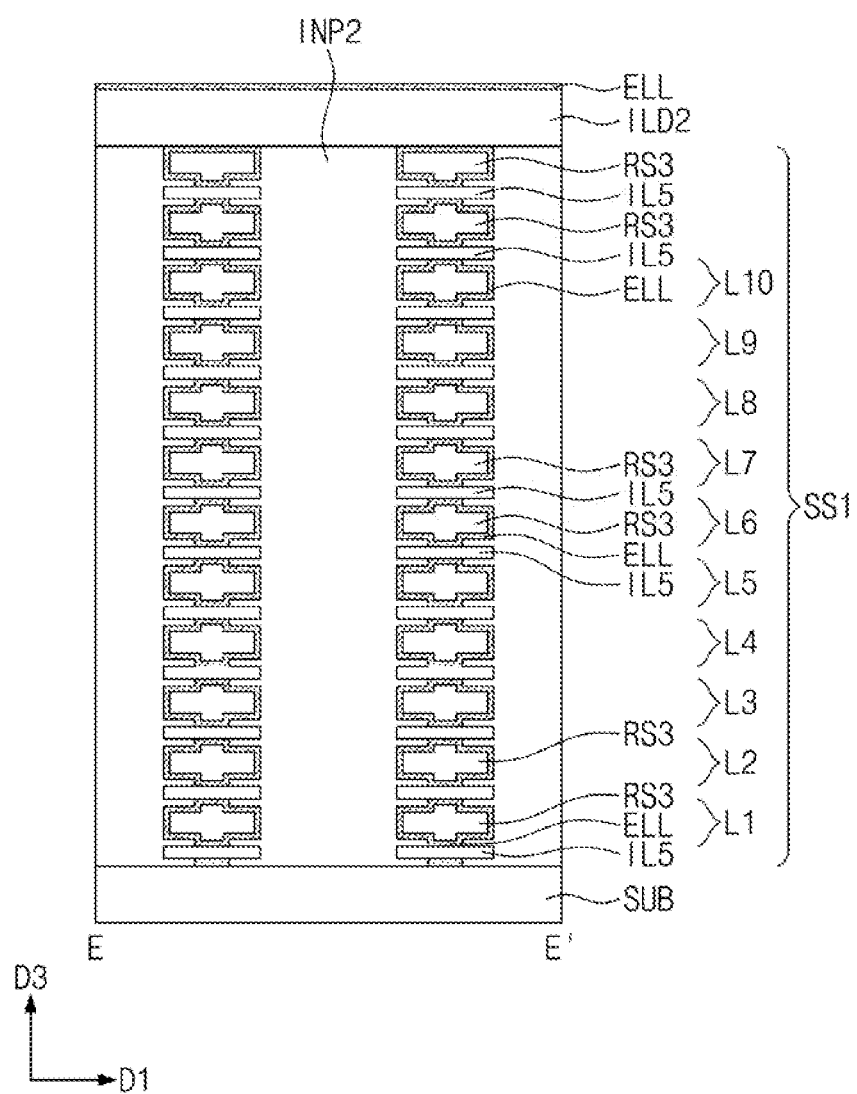
Figure 40:
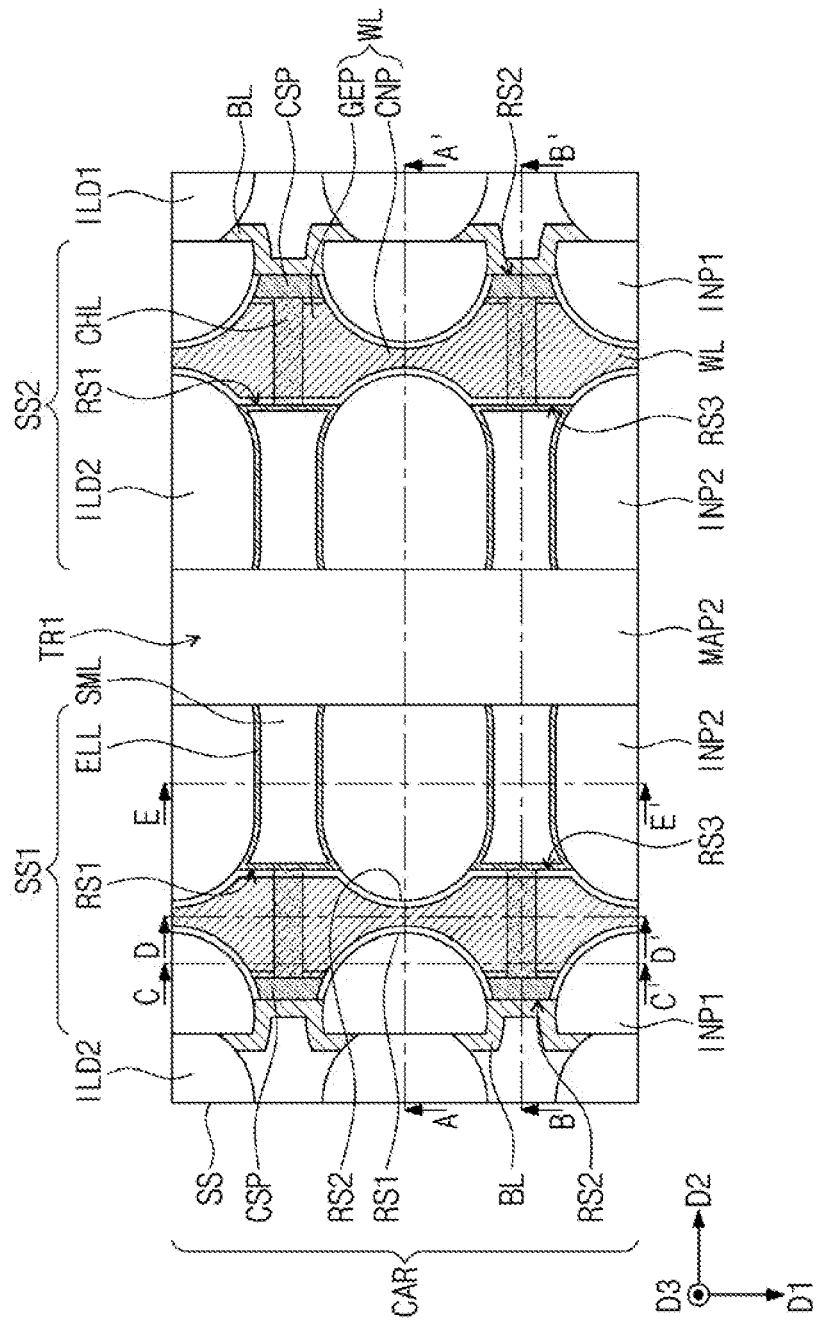
Figure 41B:
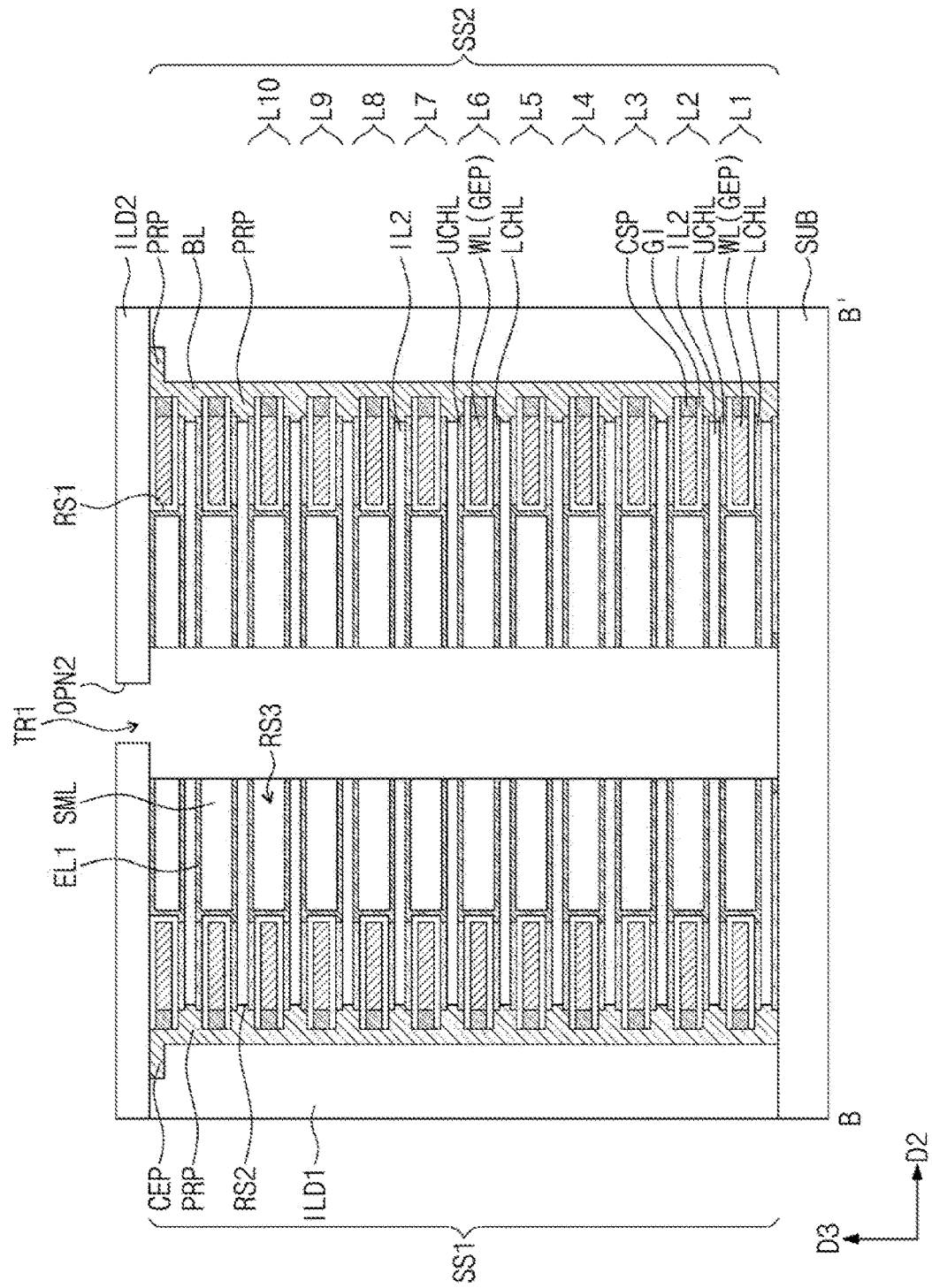
Figure 41C:
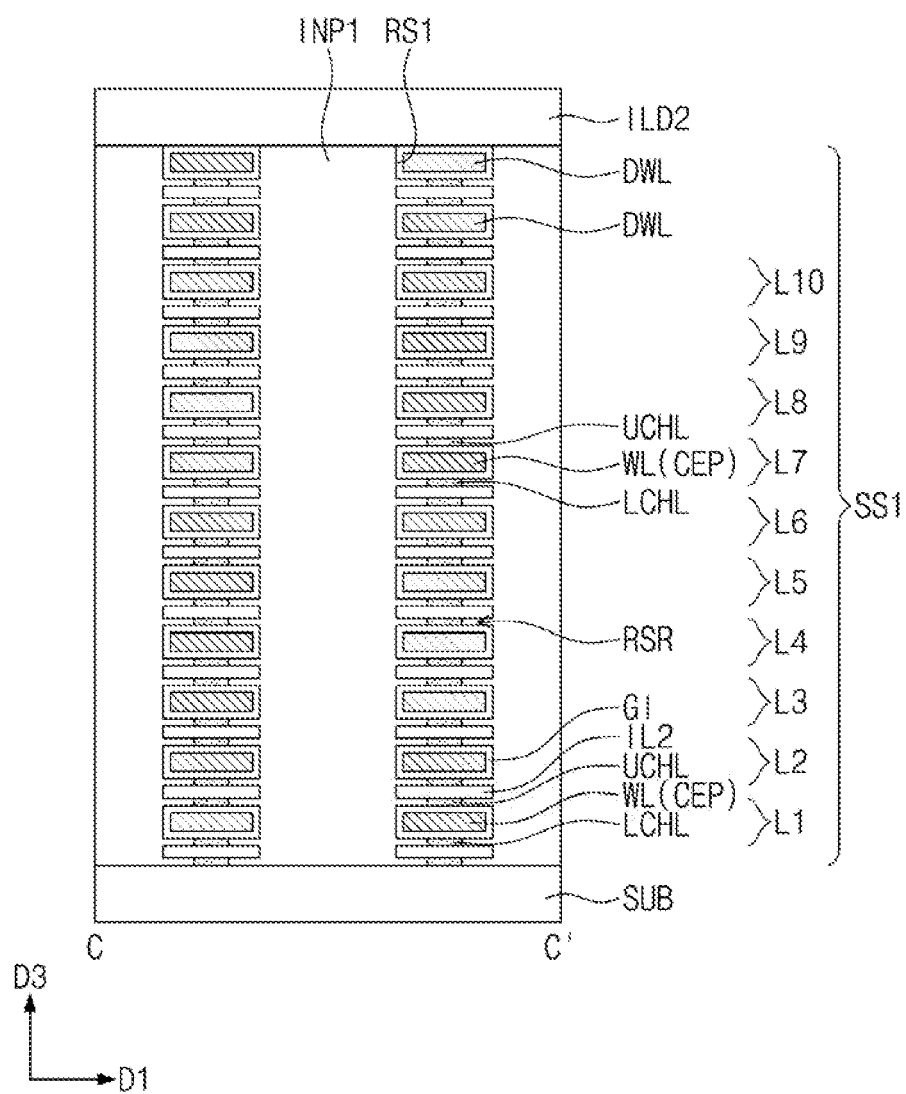
Figure 41D:
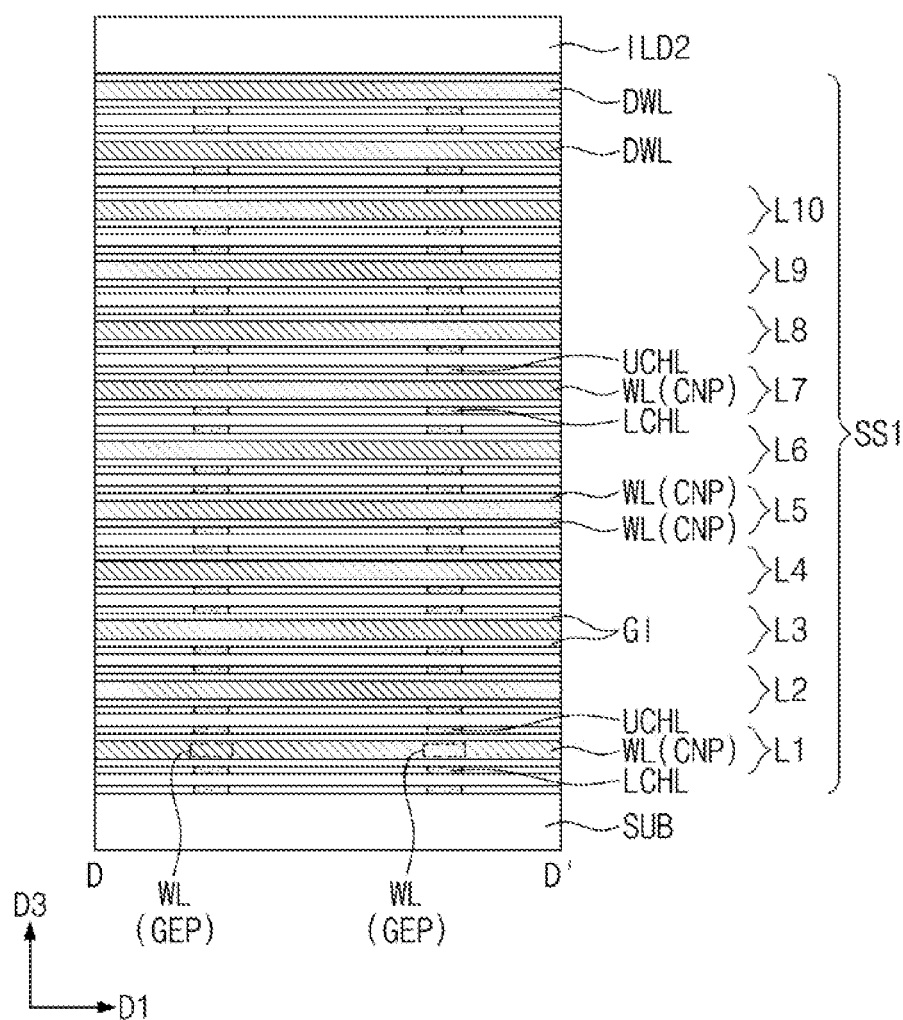
Figure 41E:
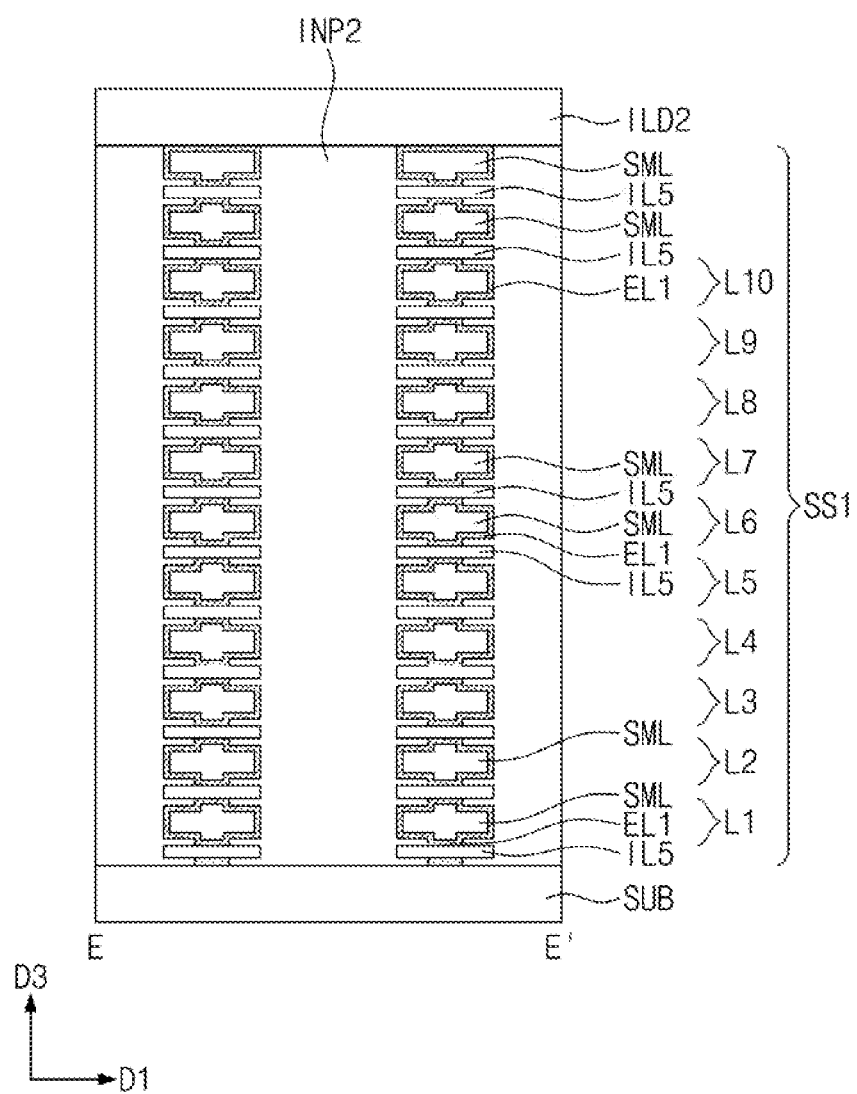
Figure 42:
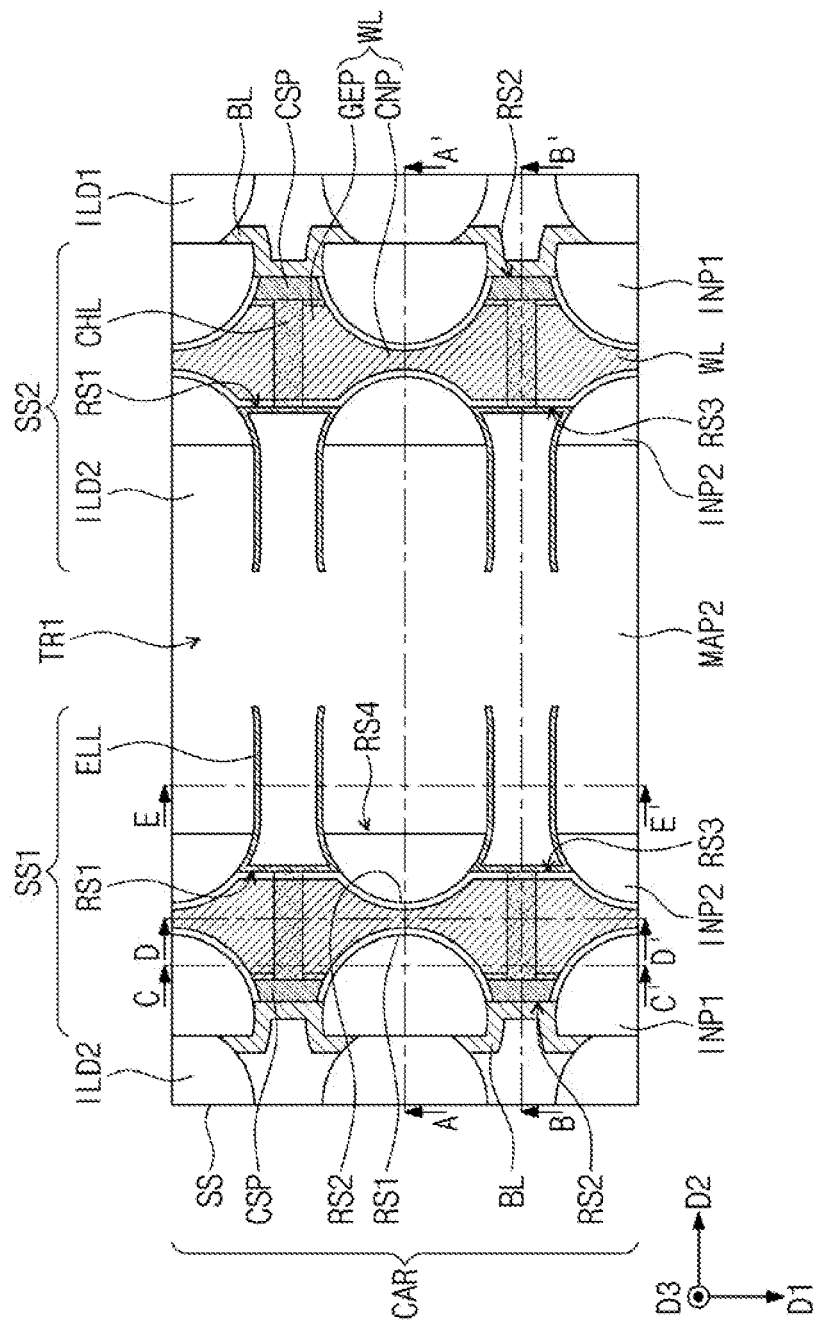
Figure 43A:
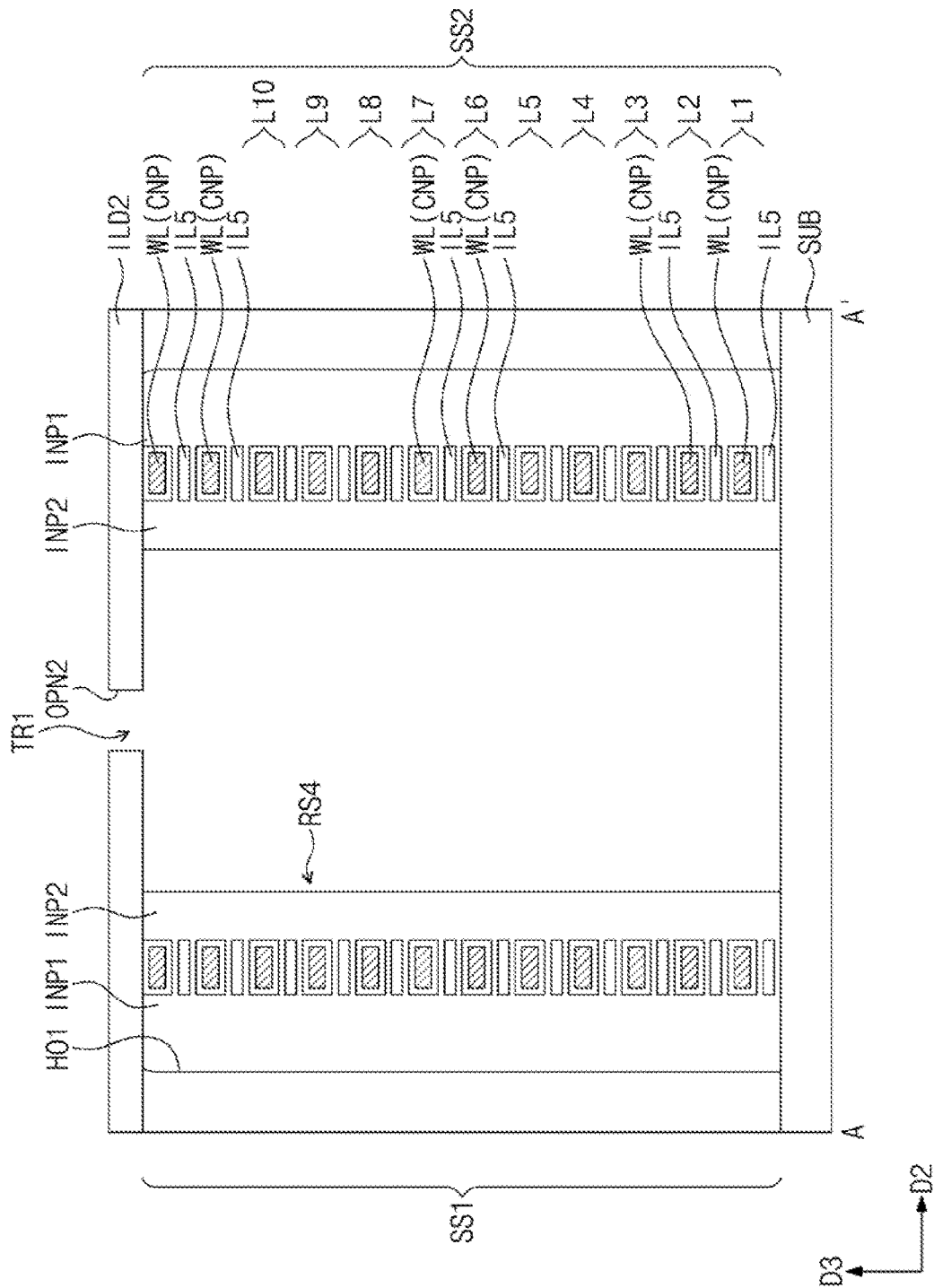
Figure 43B:
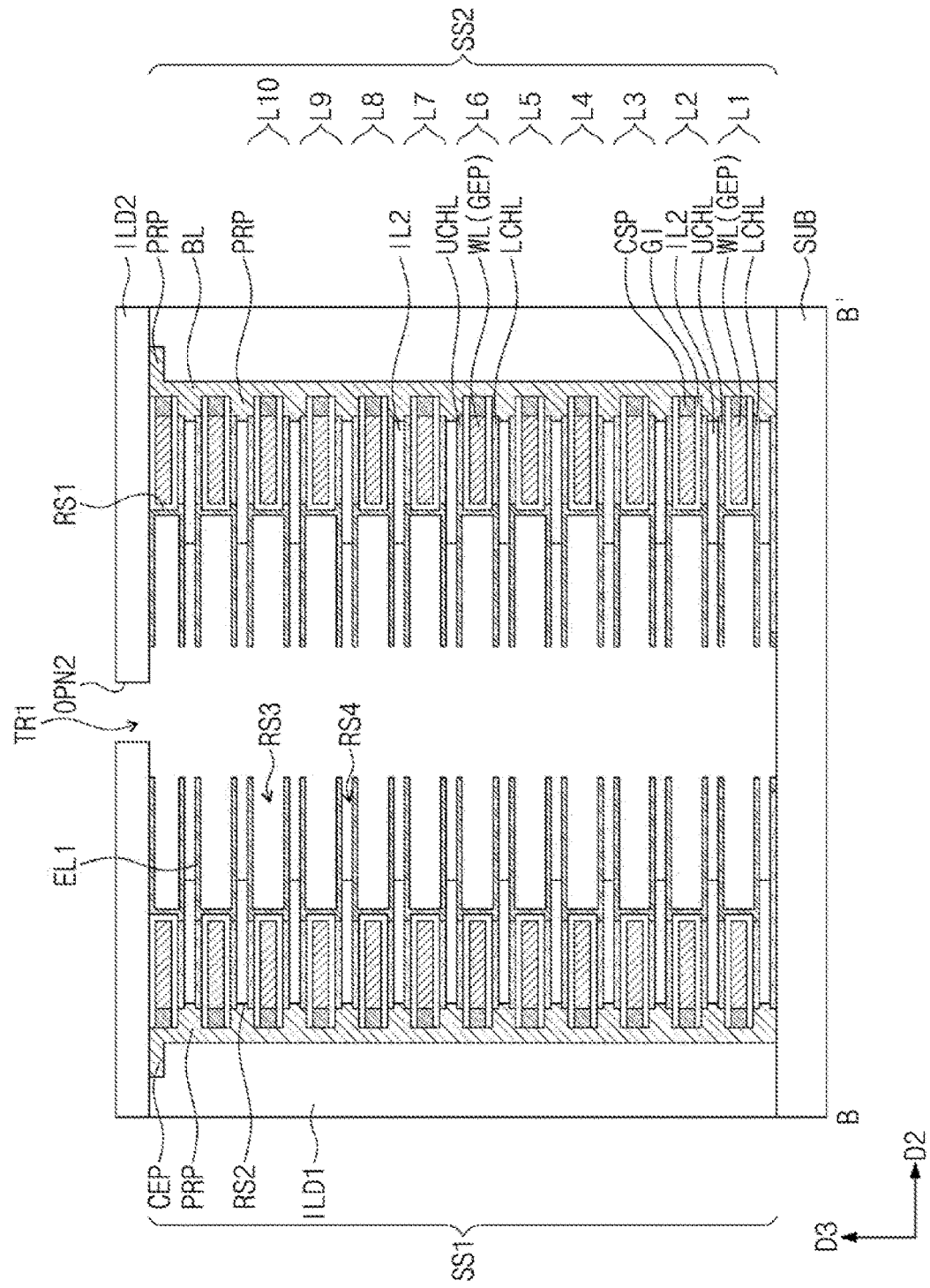
Figure 43C:
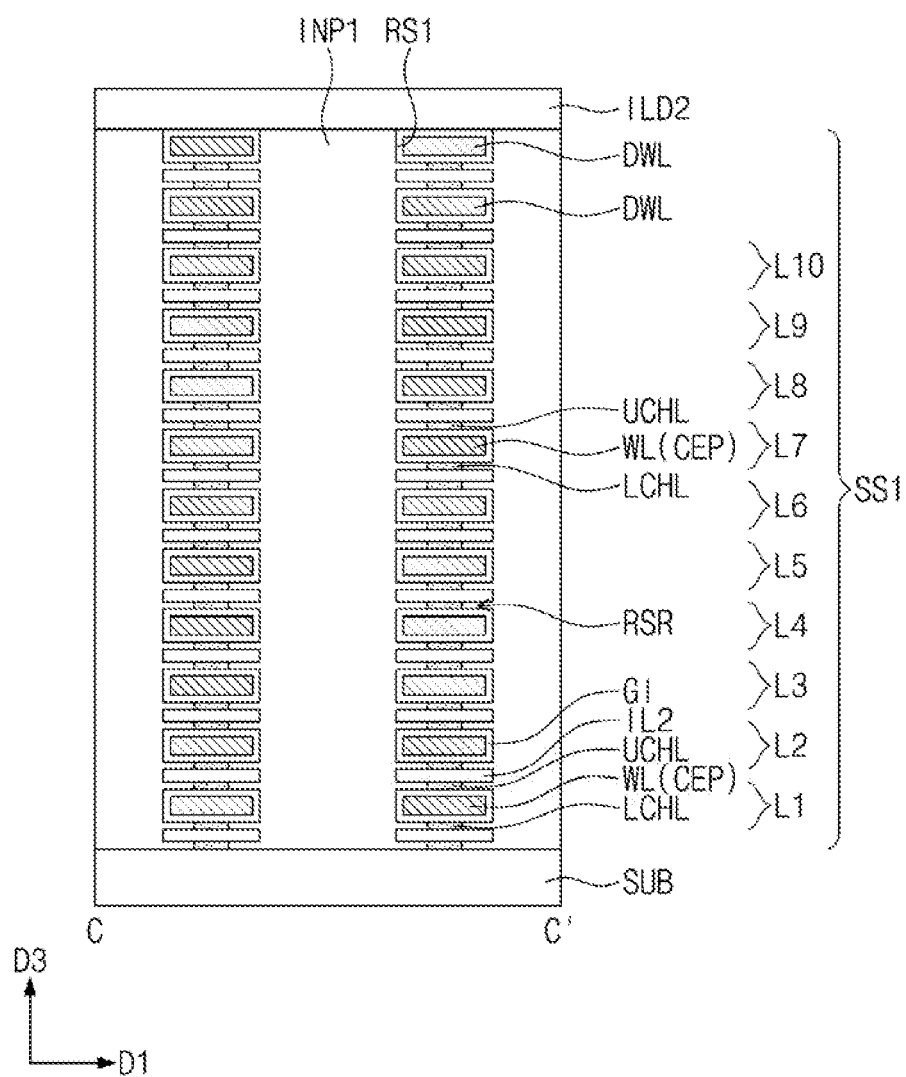
Figure 43D:
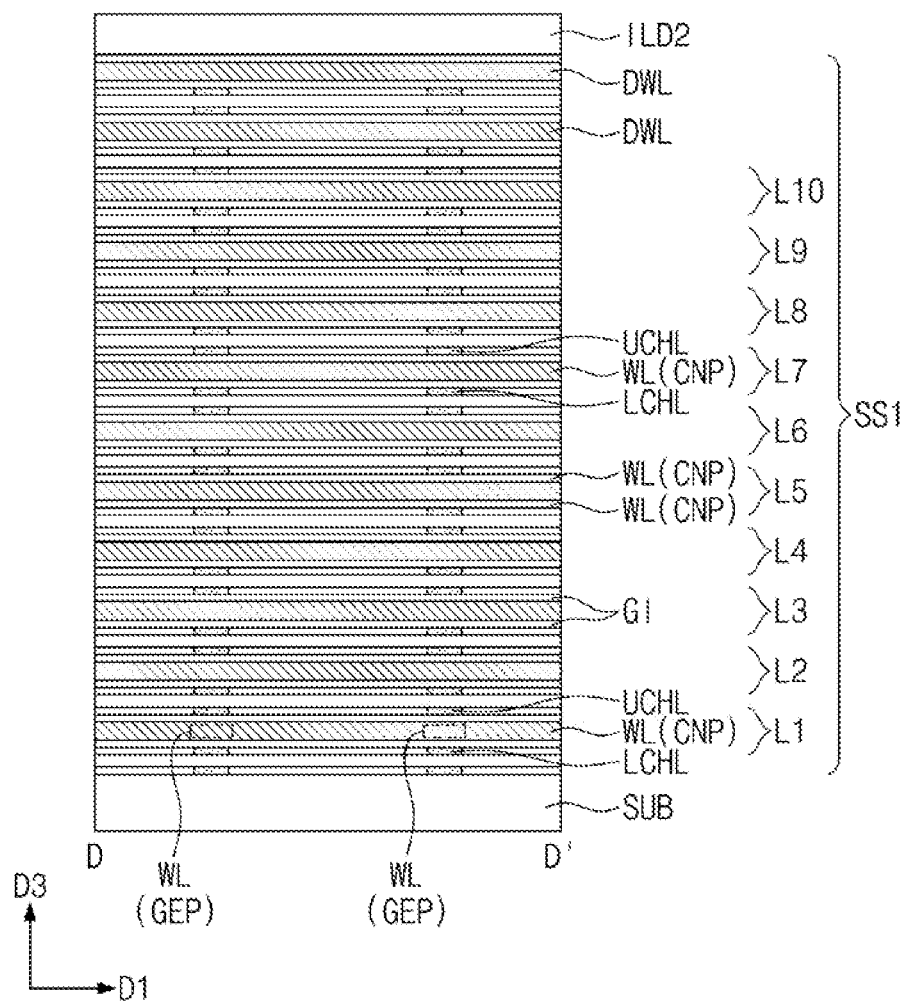
Figure 43E:
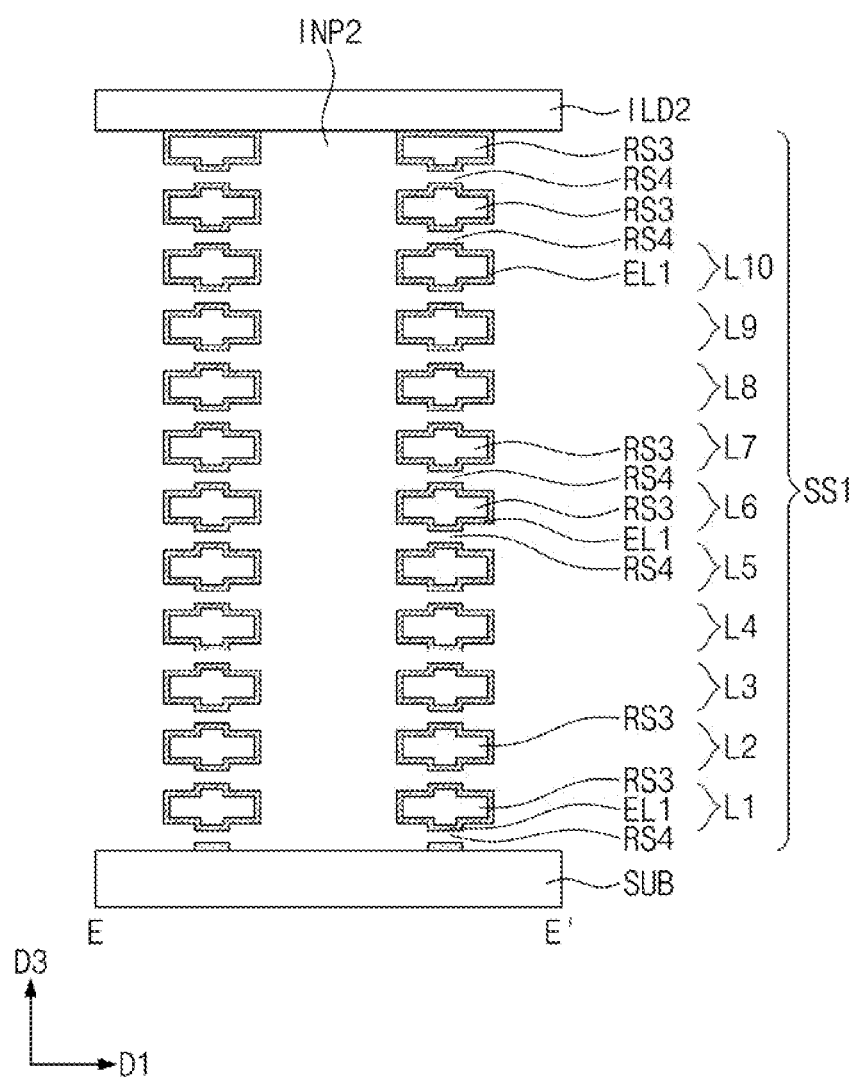

Referring to FIG. 39B, as a result of the etching process, the lower and upper channel layers LCHL and UCHL may be completely separated from each other with the fifth insulating layer IL5 therebetween. In an implementation, an end portion of the channel layer UCHL or LCHL may be vertically aligned to a sidewall of the word line WL by the etching process.

In an implementation, a doping process may be performed on the end portion of the channel layer UCHL or LCHL exposed through the third recess RS3. The doping process may be performed to allow the end portion of the channel layer UCHL or LCHL to have electric characteristics that are suitable for a source (or drain) electrode of a memory cell transistor. In an implementation, in the case where the channel layer UCHL or LCHL includes an amorphous oxide semiconductor material, the doping process may include injecting dopants (e.g., hydrogen (H), oxygen (O), or silicon (Si) ions) into the channel layer UCHL or LCHL.

An electrode layer ELL may be conformally deposited in the third recess RS3 through the first trench TR1. The electrode layer ELL may be connected to a portion of the channel layer UCHL or LCHL, which is exposed though the third recess RS3.

Referring to FIGS. 40 and 41A to 41E, a sacrificial mask layer SML may be formed on the electrode layer ELL to fill the third recess RS3. The sacrificial mask layer SML may be formed of or include a material having an etch selectivity with respect to the electrode layer ELL.

The first electrode EL1 may be formed by partially removing exposed portions of the electrode layer ELL using the sacrificial mask layer SML as an etch mask. The first electrode EL1 may be formed to have a hollow cylinder shape left in the third recess RS3 (e.g., see FIG. 41E).

Referring to FIGS. 42 and 43A to 43E, the sacrificial mask layers SML may be selectively removed. When the sacrificial mask layers SML are removed, the second insulating pillars INP2, which are exposed through the first trench TR1, may be horizontally etched. Thus, a fourth recess RS4 may be formed between the first electrodes EL1, which are adjacent to each other in the first direction D1 (e.g., see FIG. 42).

Figure 44:
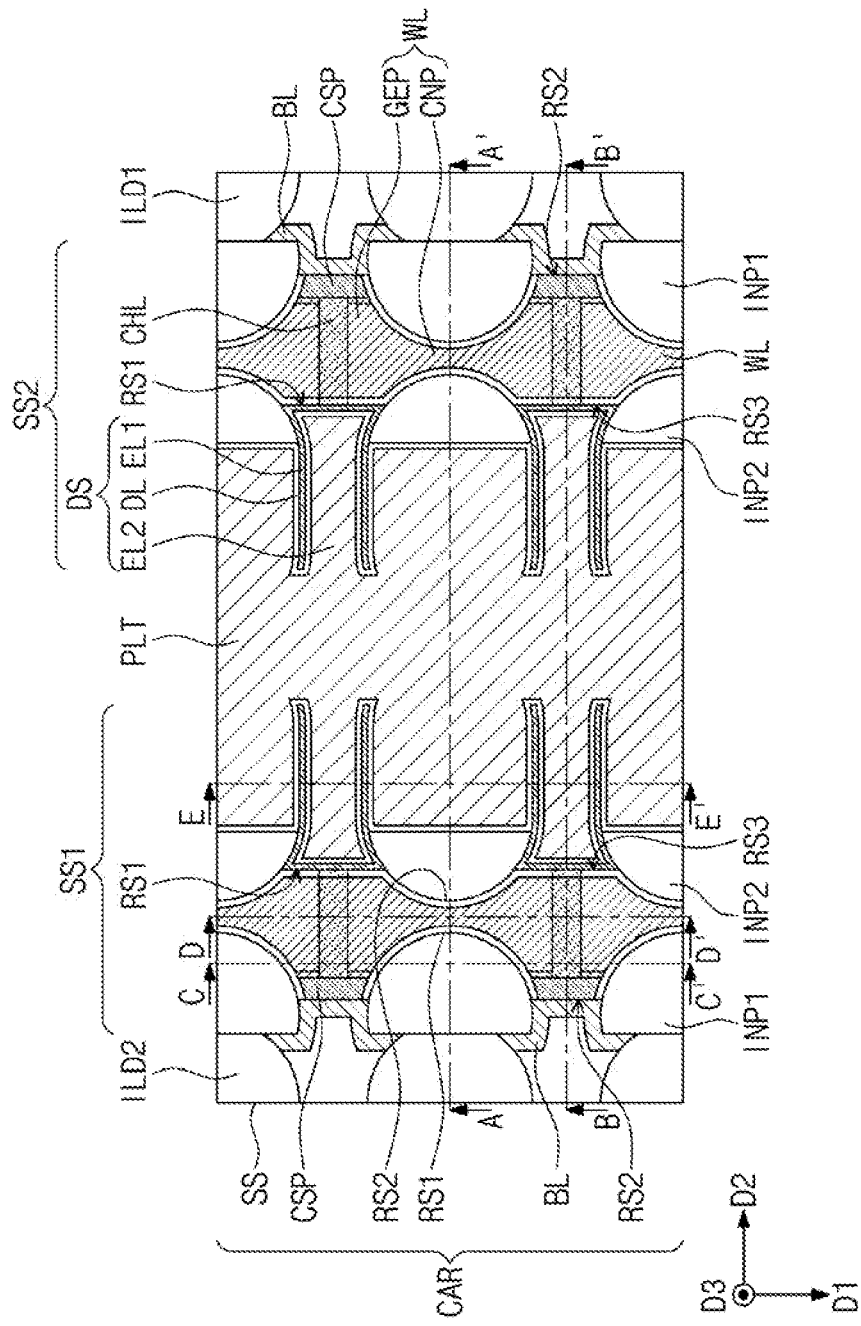
Figure 45A:
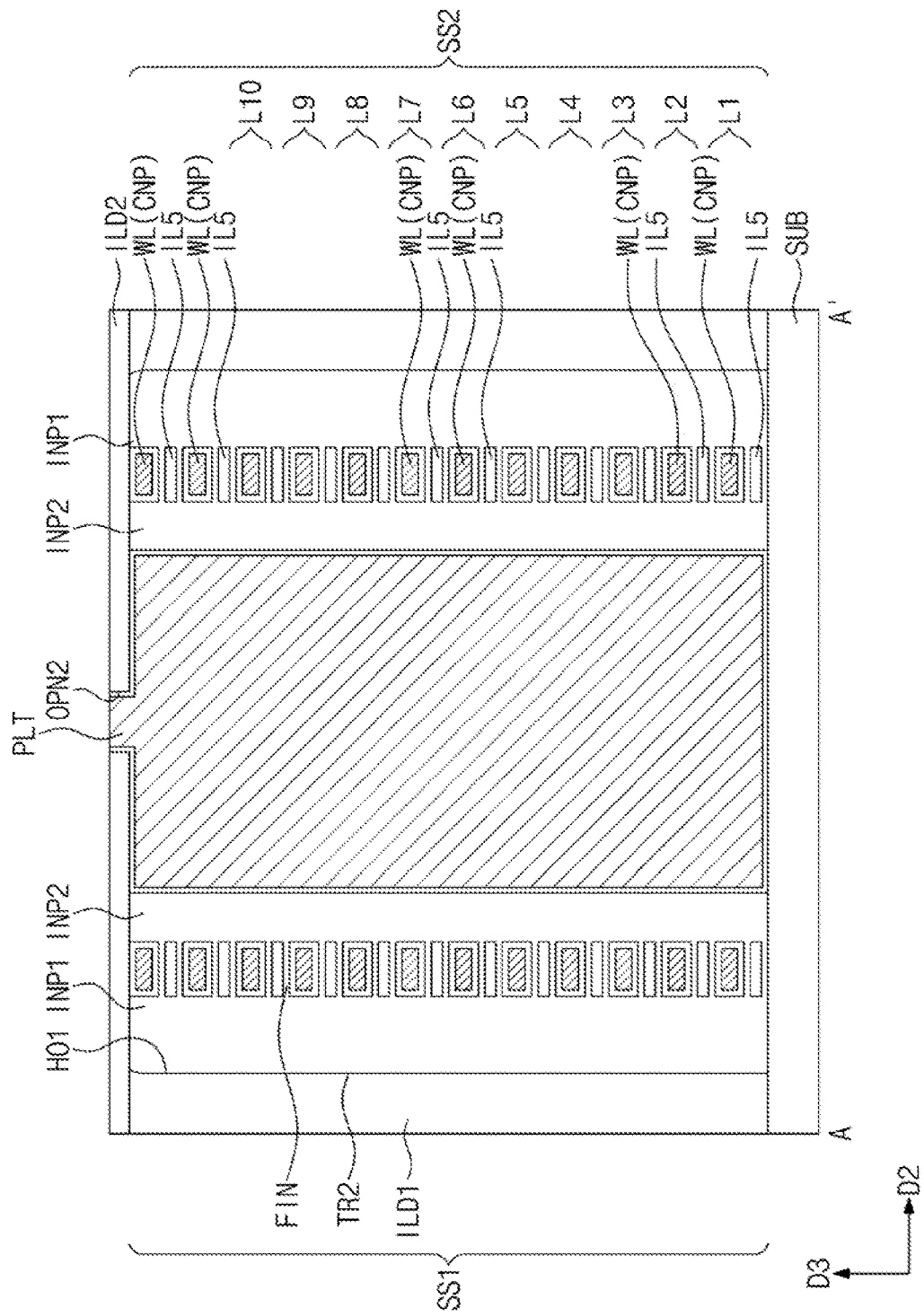
Figure 45B:
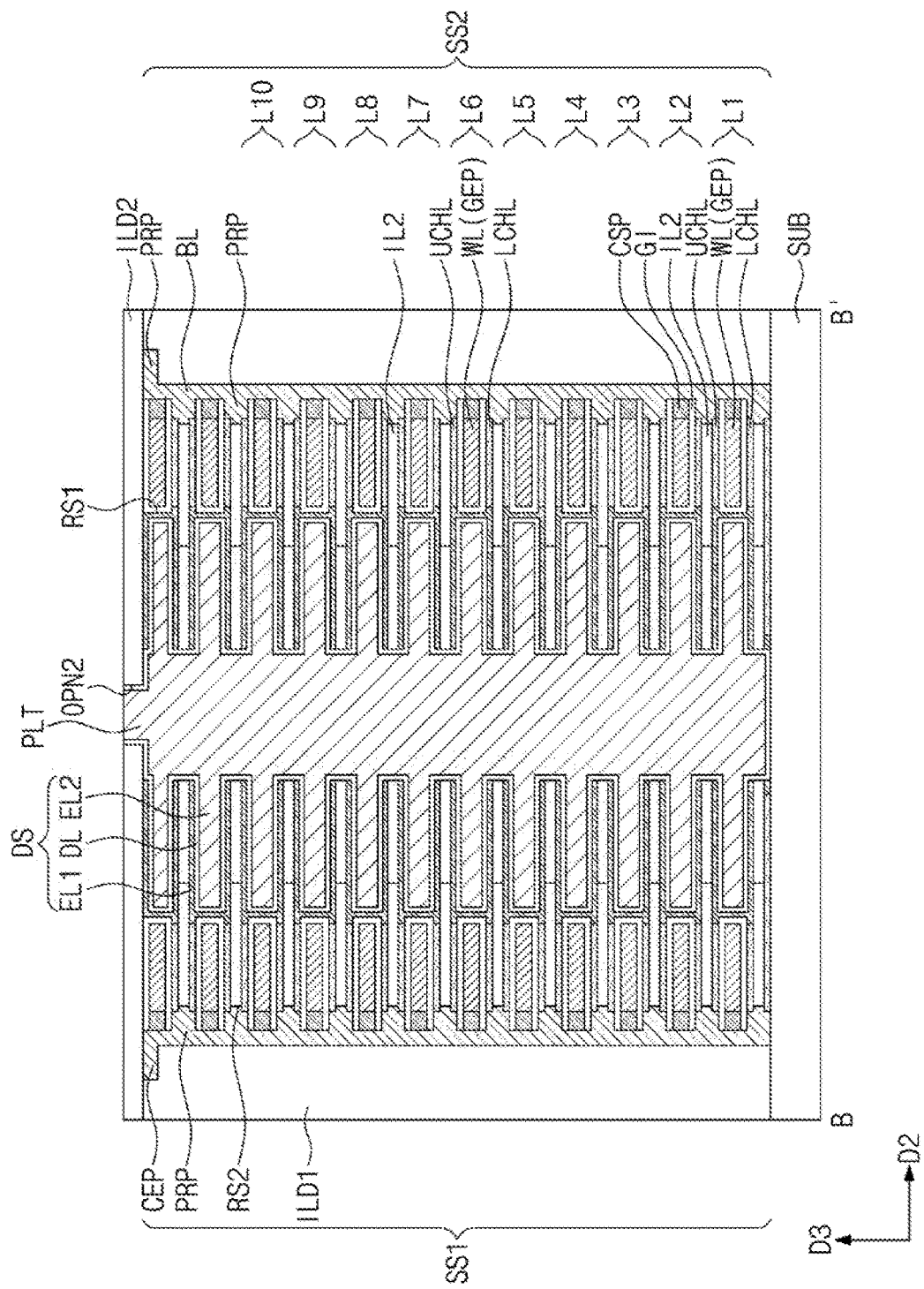
Figure 45C:
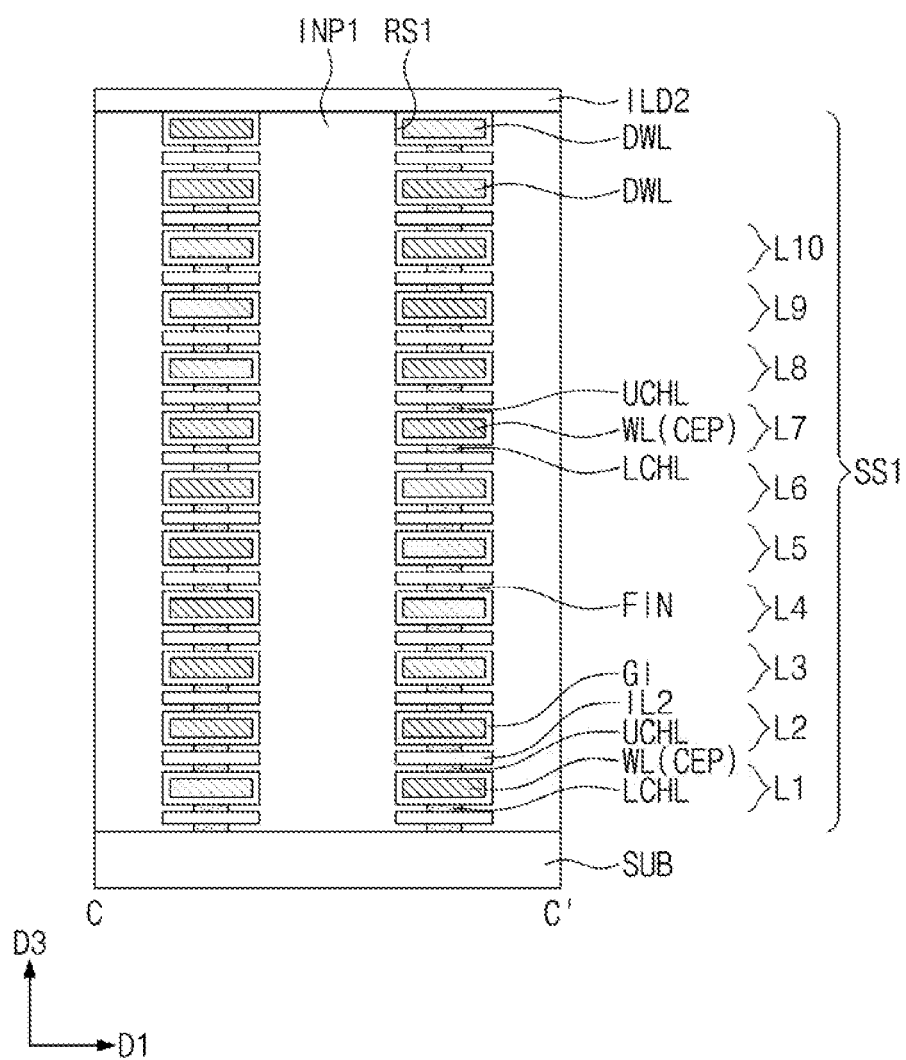
Figure 45D:
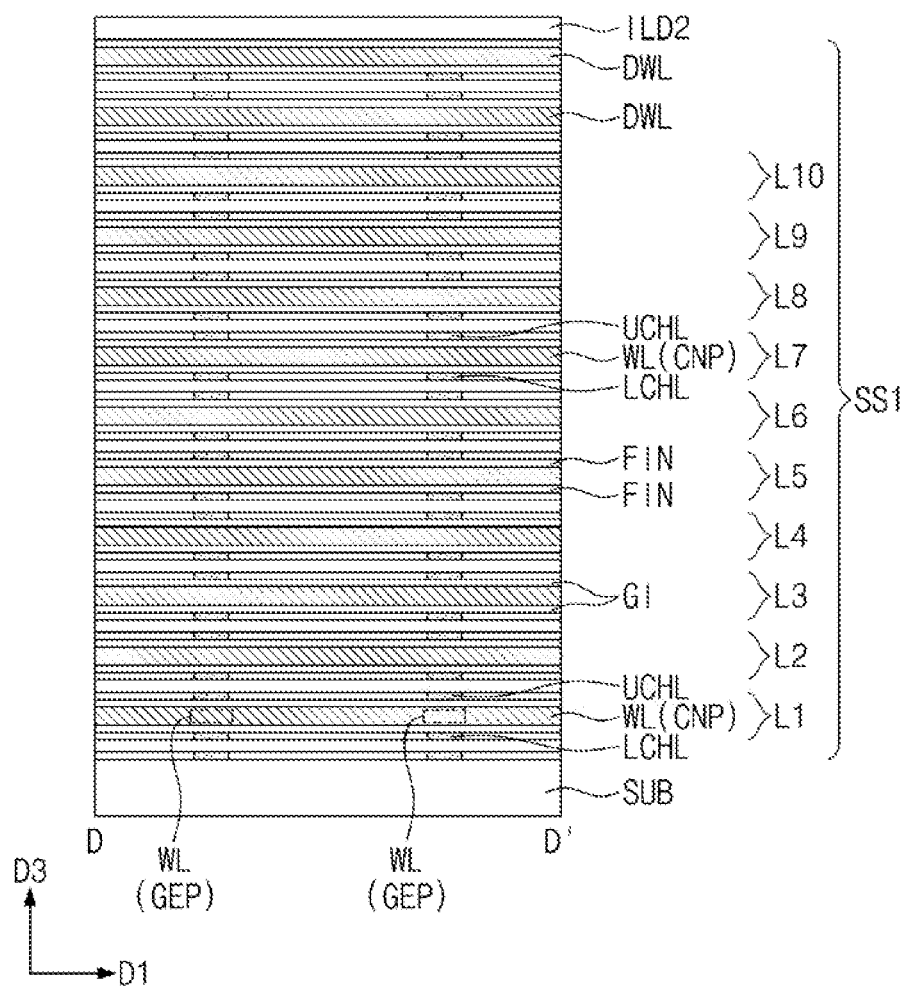
Figure 45E:
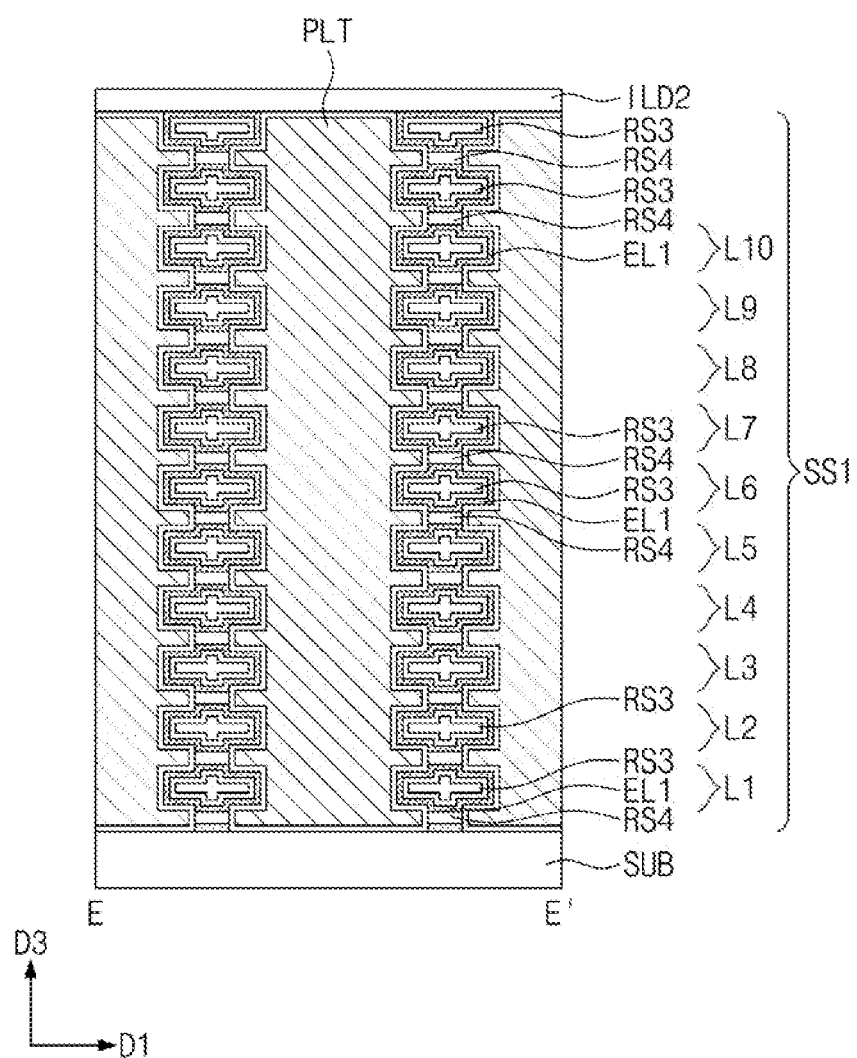

Referring to FIGS. 44 and 45A to 44E, the dielectric layer DL and the second electrode EL2 may be sequentially formed on the first electrode EL1 through the first trench TR1. The second electrode EL2 between the first and second stacks SS1 and SS2 may serve as the plate PLT. An upper portion of the plate PLT may be exposed through the first trench TR1.

Referring back to FIGS. 8 and 9A to 9E, the third interlayer insulating layer ILD3 and the fourth interlayer insulating layer ILD4 may be sequentially formed on the second interlayer insulating layer ILD2. The plate contact PLCT may be formed to penetrate the third and fourth interlayer insulating layers ILD3 and ILD4 and to be coupled to the plate PLT. The bit-line contact BLCT may be formed to penetrate the second to fourth interlayer insulating layers ILD2, ILD3, and ILD4 and to be coupled to the pad CEP of the bit line BL. The bit-line strap BLIL may be formed on the bit-line contact BLCT.

In an implementation, each of the silicon oxide layer and the silicon nitride layer, which may be used in the aforedescribed fabrication method, may further contain carbon (C), nitrogen (N), oxygen (O), or boron (B).

By way of summation and review, extremely expensive process equipment may be used to increase pattern fineness and may a practical limitation on increasing integration for two-dimensional or planar semiconductor devices. To overcome such a limitation, three-dimensional semiconductor memory devices including three-dimensionally arranged memory cells have recently been considered.

According to an embodiment, a three-dimensional semiconductor memory device may include a channel layer, which may be realized using an amorphous oxide semiconductor material or a two-dimensional semiconductor material, and in this case, it is possible to help prevent a floating body effect in a memory cell transistor. In addition, the channel layer may be formed by a deposition process, it is possible to easily realize a three-dimensional array of memory cells.

According to an embodiment, a three-dimensional semiconductor memory device may include word lines, which are sequentially stacked and may have end portions serving as contact pads, respectively. A signal applied to the contact pad may be directly delivered to a cell array region through the word line. This may make it possible to improve an operation speed and electric characteristics of the memory device.

In a three-dimensional semiconductor memory device according to an embodiment, a bit line may be vertically formed, and a word line may be horizontally formed. This may make it possible to reduce a process defect in a process of forming a three-dimensional array of memory cells and to improve reliability of the device.

One or more embodiments may provide a three-dimensional semiconductor memory device with improved electrical characteristics.

One or more embodiments may provide a three-dimensional semiconductor memory device with improved electric characteristics and an increased integration density.

One or more embodiments may provide a method of fabricating a three-dimensional semiconductor memory device with improved electric characteristics and an increased integration density.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
    a stack including layer groups vertically stacked on a substrate, each of the layer groups including a word line, a lower channel layer, an upper channel layer, and a data storing element electrically connected to the lower channel layer and the upper channel layer; and
    a bit line at a side of the stack, the bit line extending vertically,
    wherein:
    the bit line includes a protruding portion connected to the lower channel layer and the upper channel layer of each layer group,
    the word line of each layer group extends in a first direction parallel to a top surface of the substrate, and
    the word line of each layer group is sandwiched between the lower channel layer and the upper channel layer of the layer group.

2. The semiconductor memory device as claimed in claim 1, wherein:
    each of the lower and upper channel layers has a first end and a second end,
    the bit line is connected to the first ends of the lower and upper channel layers, and
    the data storing element is connected to the second ends of the lower and upper channel layers.

3. The semiconductor memory device as claimed in claim 1, wherein:
    the word line of each of the layer groups includes:
        a gate portion sandwiched between and overlapped with the lower channel layer and the upper channel layer; and
        a connecting portion connecting the gate portions, which are adjacent to each other in the first direction, and
    a width of the gate portion is larger than a width of the connecting portion, as measured in a same direction.

4. The semiconductor memory device as claimed in claim 1, wherein:
the layer groups include a first layer group and a second layer group, which are sequentially stacked, and
a first vertical distance between the lower channel layer of the first layer group and the upper channel layer of the first layer group is different from a second vertical distance between the upper channel layer of the first layer group and the lower channel layer of the second layer group.

5. The semiconductor memory device as claimed in claim 1, wherein the lower channel layer and the upper channel layer of each of the layer groups each include an amorphous oxide semiconductor material or a two-dimensional semiconductor material.

6. The semiconductor memory device as claimed in claim 1, wherein the bit line further includes a pad at a topmost level thereof, the pad being connected to a bit-line contact.

7. The semiconductor memory device as claimed in claim 1, wherein the data storing element of each of the layer groups includes:
a first electrode connected in common to the lower channel layer and the upper channel layer;
a second electrode on the first electrode; and
a dielectric layer between the first electrode and the second electrode.

8. The semiconductor memory device as claimed in claim 1, wherein:
the word lines of the layer groups extend to a connection region of the substrate,
the word lines of the layer groups include pad portions, respectively, which are on the connection region,
the pad portions collectively form a staircase structure on the connection region, and
the staircase structure is configured to sequentially expose the pad portions from top to bottom.

9. The semiconductor memory device as claimed in claim 8, wherein a thickness of each pad portion is larger than a thickness of other portions of each word line, as measured in a same vertical direction.

10. The semiconductor memory device as claimed in claim 1, further comprising:
a peripheral circuit layer between the substrate and the stack; and
a penetration contact electrically connecting at least one of the word lines and bit lines to the peripheral circuit layer.

11. A semiconductor memory device, comprising:
a stack including layer groups vertically stacked on a substrate, each of the layer groups including a word line, a lower channel layer, an upper channel layer, and a data storing element electrically connected to the lower channel layer and the upper channel layer; and
a bit line at a side of the stack, the bit line extending vertically,
wherein:
in each of the layer groups, the upper channel layer and the lower channel layer are vertically separated from each other,
the word line of each of the layer groups extends horizontally between the lower channel layer and the upper channel layer,
the lower channel layer and the upper channel layer of each of the layer groups are electrically connected to the bit line,
the layer groups include a first layer group and a second layer group, which are sequentially stacked, and
a first vertical distance between the lower channel layer of the first layer group and the upper channel layer of the first layer group is different from a second vertical distance between the upper channel layer of the first layer group and the lower channel layer of the second layer group.

12. The semiconductor memory device as claimed in claim 11, wherein the bit line includes:
a first protruding portion connected in common to the lower channel layer and the upper channel layer of the first layer group; and
a second protruding portion connected in common to the lower channel layer and the upper channel layer of the second layer group.

13. The semiconductor memory device as claimed in claim 11, wherein:
the word line of each of the layer groups extends in a first direction, and
the lower channel layer and the upper channel layers of each of the layer groups extend in a second direction crossing the first direction.

14. The semiconductor memory device as claimed in claim 11, wherein the data storing element of each of the layer groups includes:
a first electrode connected in common to the lower channel layer and the upper channel layer;
a second electrode on the first electrode; and
a dielectric layer between the first electrode and the second electrode.

15. The semiconductor memory device as claimed in claim 11, wherein:
the word line of each of the layer groups includes:
a gate portion sandwiched between and overlapped with the lower channel layer and the upper channel layer; and
a connecting portion connecting the gate portions that are adjacent to each other, and
a width of the gate portion is larger than a width of the connecting portion, as measured in a same direction.

16. A semiconductor memory device, comprising:
a stack including layer groups vertically stacked on a substrate, each of the layer groups including a memory cell transistor and a data storing element electrically connected to the memory cell transistor; and
a bit line at a side of the stack, the bit line extending vertically,
wherein:
the bit line electrically connects the stacked memory cell transistors of the layer groups to each other,
the memory cell transistor of each of the layer groups includes:
a lower channel layer between the bit line and the data storing element;
an upper channel layer between the bit line and the data storing element, the upper channel layer being vertically separated from the lower channel layer; and
a word line between the lower channel layer and the upper channel layer,
the word line of each of the layer groups includes:
a gate portion sandwiched between and overlapped with the lower channel layer and the upper channel layer; and
a connecting portion connecting the gate portions that are adjacent to each other, and
a width of the gate portion is larger than a width of the connecting portion, as measured in a same direction.

17. The semiconductor memory device as claimed in claim 16, wherein the lower channel layer and the upper channel layer of each of the layer groups includes an amorphous oxide semiconductor material or a two-dimensional semiconductor material.

18. The semiconductor memory device as claimed in claim 16, wherein the bit line includes a protruding portion, which is connected in common to the lower channel layer and the upper channel layer of each of the layer groups.

19. The semiconductor memory device as claimed in claim 16, wherein:
- the word line of each of the layer groups extends in a first direction parallel to a top surface of the substrate, and
- the lower channel layer and the upper channel layer of each of the layer groups extend in a second direction, which is parallel to the top surface of the substrate and crosses the first direction.

20. The semiconductor memory device as claimed in claim 16, wherein the data storing element of each of the layer groups includes:
- a first electrode connected in common to the lower channel layer and the upper channel layer;
- a second electrode on the first electrode; and
- a dielectric layer interposed between the first electrode and the second electrode.

* * * * *